(12) United States Patent (10) Patent No.: US 9,419,231 B2
Yoshida et al. (45) Date of Patent: Aug. 16, 2016

(54) ORGANIC ELECTROLUMINESCENCE DEVICE

(71) Applicant: IDEMITSU KOSAN CO., LTD., Chiyoda-ku (JP)

(72) Inventors: Kei Yoshida, Sodegaura (JP); Toshihiro Iwakuma, Sodegaura (JP); Hideaki Nagashima, Sodegaura (JP); Ryohei Hashimoto, Sodegaura (JP)

(73) Assignee: IDEMITSU KOSAN CO., LTD., Chiyoda-ku (JP)

( * ) Notice: Subject to any disclaimer, the term of this patent is extended or adjusted under 35 U.S.C. 154(b) by 427 days.

(21) Appl. No.: 13/951,110

(22) Filed: Jul. 25, 2013

(65) Prior Publication Data

US 2014/0027744 A1 Jan. 30, 2014

Related U.S. Application Data

(60) Provisional application No. 61/675,599, filed on Jul. 25, 2012.

(51) Int. Cl.
| | | |
|---|---|---|
| *H01L 51/50* | (2006.01) | |
| *H01L 51/00* | (2006.01) | |
| *H01L 51/52* | (2006.01) | |

(52) U.S. Cl.
CPC ........ *H01L 51/0072* (2013.01); *H01L 51/0071* (2013.01); *H01L 51/0073* (2013.01); *H01L 51/5275* (2013.01); *H01L 51/5016* (2013.01)

(58) Field of Classification Search
None
See application file for complete search history.

(56) References Cited

U.S. PATENT DOCUMENTS

| 2002/0028329 A1 | 3/2002 | Ise et al. | |
|---|---|---|---|
| 2004/0146745 A1* | 7/2004 | Ise ....................... | C07D 471/04 428/690 |

(Continued)

FOREIGN PATENT DOCUMENTS

| JP | 2002-100476 A | 4/2002 |
|---|---|---|
| JP | 2007-258692 A | 10/2007 |

(Continued)

OTHER PUBLICATIONS

International Search Report issued Oct. 8, 2013 in PCT/JP2013/004523.

*Primary Examiner* — Gregory Clark
(74) *Attorney, Agent, or Firm* — Oblon, McClelland, Maier & Neustadt, L.L.P.

(57) ABSTRACT

An organic electroluminescence device including two or more organic thin film layers including an emitting layer between an anode and a cathode,
  the emitting layer including at least one compound represented by the following formula (1), and
  an organic thin film layer that is in contact with the emitting layer on the cathode side comprising at least one benzimidazole compound represented by the following formula (A):

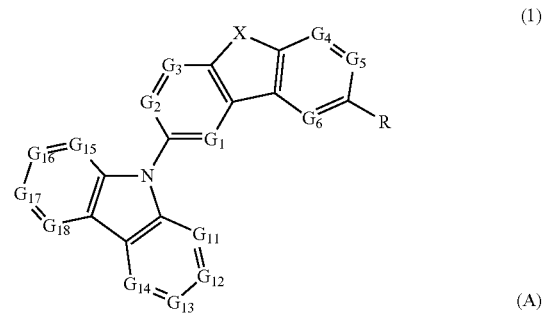

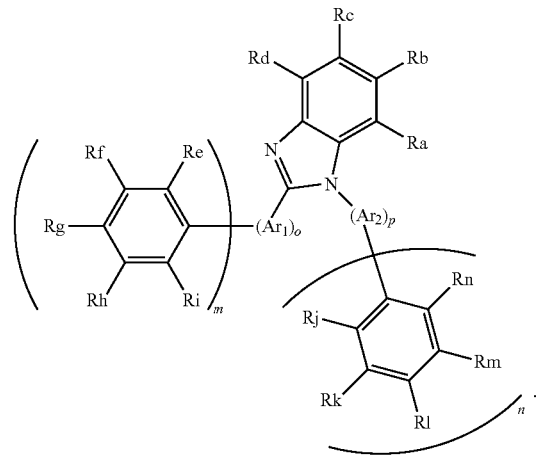

28 Claims, 1 Drawing Sheet

(56) References Cited

U.S. PATENT DOCUMENTS

| | | |
|---|---|---|
| 2005/0260452 A1 | 11/2005 | Ise et al. |
| 2007/0138950 A1 | 6/2007 | Yamamoto et al. |
| 2007/0202357 A1 | 8/2007 | Osaka et al. |
| 2010/0044638 A1 | 2/2010 | Ise et al. |
| 2011/0147792 A1 | 6/2011 | Kawata et al. |
| 2011/0260138 A1 | 10/2011 | Xia et al. |
| 2011/0278552 A1 | 11/2011 | Numata et al. |
| 2012/0007063 A1 | 1/2012 | Langer et al. |
| 2012/0012821 A1 | 1/2012 | Langer et al. |
| 2013/0020565 A1 | 1/2013 | Numata et al. |

FOREIGN PATENT DOCUMENTS

| | | | |
|---|---|---|---|
| JP | 2009-155300 A | 7/2009 | |
| JP | 2009-158848 A | 7/2009 | |
| JP | 2010-118591 A | 5/2010 | |
| JP | 2011-148780 A | 8/2011 | |
| JP | 2012-514618 A | 6/2012 | |
| KR | 10-2009-0073852 | 7/2009 | |
| WO | WO 2007/063993 A1 | 6/2007 | |
| WO | WO 2009/060779 A1 | 5/2009 | |
| WO | WO 2011/125680 A1 | 10/2011 | |
| WO | WO 2011/137072 A1 | 11/2011 | |
| WO | WO 2012/004765 A2 * | 1/2012 | ........... C07D 405/14 |

* cited by examiner

ORGANIC ELECTROLUMINESCENCE DEVICE

TECHNICAL FIELD

The invention relates to an organic electroluminescence device.

BACKGROUND ART

An organic electroluminescence (EL) device includes a fluorescent organic EL device or a phosphorescent organic EL device, and a device design optimum for the emission mechanism of each type of organic EL device has been studied. It is known that a highly efficient phosphorescent organic EL device cannot be obtained by merely applying fluorescent device technology due to the emission characteristics. The reasons therefor are generally considered to be as follows.

Specifically, since phosphorescence utilizes triplet excitons, a compound used for forming an emitting layer must have a large energy gap. This is because the energy gap (hereinafter often referred to as "singlet energy") of a compound is normally larger than the triplet energy (in the invention, the difference in energy between the lowest excited triplet state and the ground state) of the compound.

In order to confine the triplet energy of a phosphorescent dopant material efficiently in an emitting layer, it is required to use, in an emitting layer, a host material having a triplet energy larger than that of the phosphorescent dopant material.

In order to reduce the driving voltage of an organic EL device, it is necessary to use a material having excellent carrier-injecting properties and carrier-transporting properties. However, when a material having excellent carrier-injecting properties and carrier-transporting properties is used, although the driving voltage is not lowered, but the carrier balance in an emitting layer is deteriorated, leading to shortening of the device life. That is, a carrier-transporting material that reduces the driving voltage while maintaining the life of the device is required.

It is thus necessary to select materials and a device design differing from those of the fluorescent organic EL device in order to obtain a highly efficient phosphorescent organic EL device.

Research on the materials has been extensively made, and some reports were made (Patent Documents 1 to 3).

In Patent Document 1 and Patent Document 2, a benzimidazole compound is exemplified and used as an electron-transporting layer material. However, since the triplet energy of a host material of an emitting layer which is used in combination is small, and the efficiency is low. In addition, a host material to be combined has a structure that does not contain a dibenzofuran ring or a dibenzothiophene ring, carrier injection/transportation properties is low, and hence, the driving voltage tends to be high.

Patent Document 3 exemplifies a benzimidazole compound, which is used as an electron-transporting layer material. The triplet energy thereof is small, and as a result, the energy of an emitting layer is leaked to the electron-transporting layer side, leading to a lowering of the efficiency.

RELATED ART DOCUMENTS

Patent Documents

Patent Document 1: JP-A-2009-155300
Patent Document 2: JP-A-2009-158848
Patent Document 3: JP-A-2010-118591

SUMMARY OF THE INVENTION

An object of the invention is to provide an organic EL device which can be driven at a low voltage and has a long lifetime.

As a result of extensive studies, the inventors have found that, by using in combination a benzimidazole compound with a specific structure having excellent electron-injection/transportation properties in a layer which is adjacent to an emitting layer and using a compound having a specific structure in an emitting layer, it is possible to prevent triplet energy from leaking to the electron-transporting layer side, whereby a low-voltage, high-efficient and long-lived organic EL device can be obtained.

According to the invention, the following organic EL device or the like can be obtained.
1. An organic electroluminescence device comprising two or more organic thin film layers including an emitting layer between an anode and a cathode,
    the emitting layer comprising at least one compound represented by the following formula (1), and
    an organic thin film layer that is in contact with the emitting layer on the cathode side comprising at least one benzimidazole compound represented by the following formula (A),

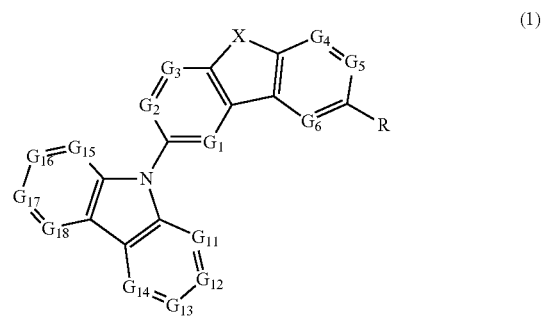

(1)

wherein
in the formula (1),
    $G_1$ to $G_6$ are independently C—$R_1$ or a nitrogen atom;
    $G_{11}$ to $G_{18}$ are independently C—$R_2$ or a nitrogen atom;
    R and $R_1$ are independently a hydrogen atom, a substituted or unsubstituted alkyl group having 1 to 20 carbon atoms, a substituted or unsubstituted cycloalkyl group having 3 to 20 carbon atoms that form a ring (hereinafter referred to as "ring carbon atoms"), a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaryl oxy group having 5 to 18 atoms that form a ring (hereinafter referred to as "ring atoms"), a substituted or unsubstituted arylthio group having 6 to 18 ring carbon atoms, a substituted or unsubstituted heteroaryl thio group having 5 to 18 ring atoms, a substituted or unsubstituted arylsulfonyl group having 6 to 18 ring carbon atoms, a substituted or unsubstituted heteroaryl sulfonyl group having 5 to 18 ring atoms, a substituted or unsubstituted heteroaromatic ring group having 5 to 18 ring atoms, a substituted or unsubstituted silyl group, a fluorine atom, a substituted or unsubstituted fluoroalkyl group, a substituted or unsubstituted fluoroalkoxy group or a cyano group;

when plural C—R$_1$ are present, plural R$_1$ may be the same or different, provided that when G$_2$ and/or G$_5$ is C—R$_1$, R$_1$ of G$_2$ and G$_5$ are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted silyl group, a fluorine atom, a substituted or unsubstituted fluoroalkyl group having 1 to 20 carbon atoms, or a substituted or unsubstituted fluoroalkoxy group having 1 to 20 carbon atoms;

R$_2$ are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms or a cyano group;

when plural C—R$_2$ are present, plural R$_2$ may be the same or different;

when R, R$_1$ and R$_2$ have a substituent, the substituent R' is a hydrogen atom, an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aromatic hydrocarbon ring group having 6 to 18 ring carbon atoms, an aryloxy group having 6 to 18 ring carbon atoms, a heteroaromatic ring group having 5 to 18 ring atoms, a silyl group, a fluorine atom, a fluoroalkyl group having 1 to 20 carbon atoms, a fluoroalkoxy group having 1 to 20 carbon atoms or a cyano group; and X is an oxygen atom or a sulfur atom,

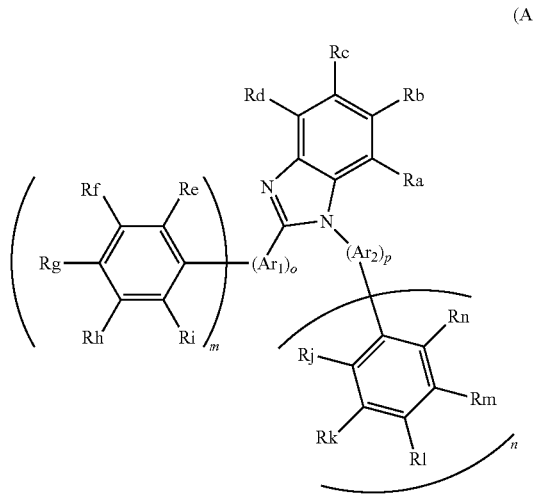

(A)

wherein
in the formula (A),
Ra to Rd, Re to Rf, Rh to Ri, Rj to Rk and Rm to Rn are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted amino group, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms or a cyano group;

Rg and Rl are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted silyl group, a fluorine atom, a substituted or unsubstituted fluoroalkyl group having 1 to 20 carbon atoms, or a substituted or unsubstituted fluoroalkoxy group having 1 to 20 carbon atoms, provided that at least one of Re to Rf, Rh to Ri, Rj to Rk and Rm to Rn is a substituted or unsubstituted carbazolyl group, a substituted or unsubstituted azacarbazolyl group, a substituted or unsubstituted dibenzofuranyl group or a substituted or unsubstituted dibenzothiophenyl group;

Ar$_1$ is a single bond, a substituted or unsubstituted alkyl group or alkylene group having 1 to 20 carbon atoms, a substituted or unsubstituted phenyl group or meta-phenylene group, a substituted or unsubstituted meta-biphenylyl group or meta-biphenylylene group, a substituted or unsubstituted meta-terphenylyl group or meta-terphenylylene group, a substituted or unsubstituted 3-pyridyl group or 3,5-pyridylene group, a substituted or unsubstituted 2-pyridyl group or 2,6-pyridylene group, a substituted or unsubstituted 2-pyridyl group or 2,4-pyridylene group, a substituted or unsubstituted 2-dibenzofuranyl group or 2,8-dibenzofuranylene group, a substituted or unsubstituted 2-dibenzothiophenyl group or 2,8-dibenzothiophenylene group, or a substituted or unsubstituted 3-carbazolyl group or 3,6-carbazolylene group;

Ar$_2$ is a single bond, a substituted or unsubstituted alkyl group or alkylene group having 1 to 20 carbon atoms, a substituted or unsubstituted phenyl group or meta-phenylene group, a substituted or unsubstituted para-phenylene group, a substituted or unsubstituted meta-biphenylyl group or meta-biphenylylene group, a substituted or unsubstituted meta-terphenylyl group or meta-terphenylylene group, a substituted or unsubstituted 3-pyridyl group or 3,5-pyridylene group, a substituted or unsubstituted 2-pyridyl group or 2,6-pyridylene group, a substituted or unsubstituted 2-pyridyl group or 2,4-pyridylene group, a substituted or unsubstituted 2-dibenzofuranyl group or 2,8-dibenzofuranylene group, a substituted or unsubstituted 2-dibenzothiophenyl group or 2,8-dibenzothiophenylene group, or a substituted or unsubstituted 3-carbazolyl group or 3,6-carbazolylene group;

when Ra to Rn, Ar$_1$ and Ar$_2$ have a substituent, the substituent R'' is a hydrogen atom, an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aromatic hydrocarbon ring group having 6 to 18 ring carbon atoms, an aryloxy group having 6 to 18 ring carbon atoms, a heteroaromatic ring group having 5 to 18 ring atoms, a silyl group, a fluorine atom, a fluoroalkyl group having 1 to 20 carbon atoms, a fluoroalkoxy group having 1 to 20 carbon atoms or a cyano group;

m and n are independently 0 or 1; and o and p are independently an integer of 0 to 3, provided that m, n, o and p satisfy the relationships that m+o is more than or equal to 1 and n+p is more than or equal to 1;

when o is 2 or 3, plural $Ar_1$ may be the same or different and when p is 2 or 3, plural $Ar_2$ may be the same or different.

2. The organic electroluminescence device according to 1, wherein the compound represented by the formula (1) is a compound represented by the following formula (2a), a compound represented by the following formula (2b) or a compound represented by the following formula (2c);

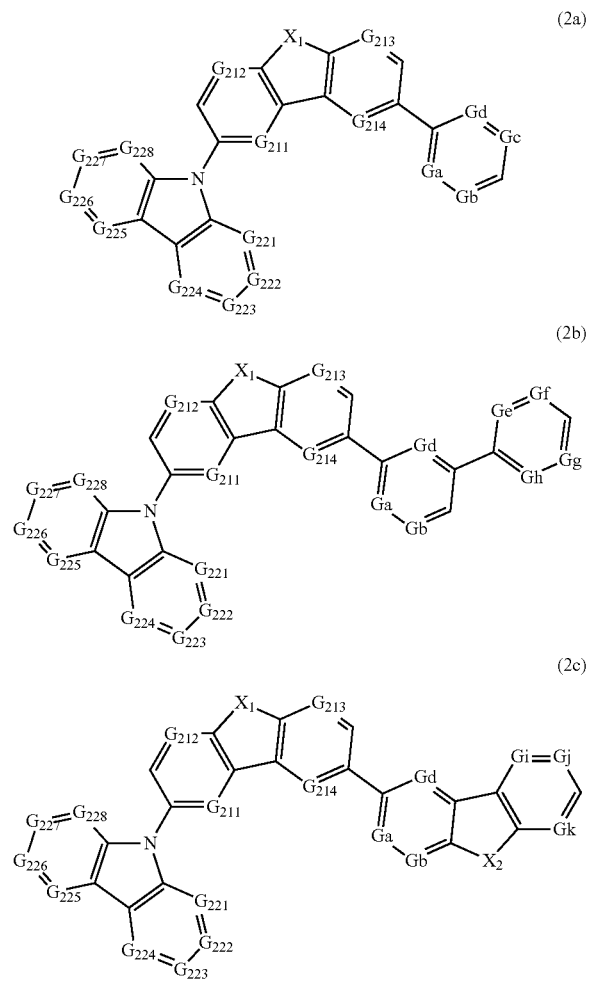

wherein
in the formulas (2a) to (2c), $G_{211}$ to $G_{214}$ are independently C—$R_{21}$ or a nitrogen atom;

$G_{221}$ to $G_{228}$ are independently C—$R_{22}$ or a nitrogen atom;

Ga to Gk are independently C—$R_{23}$ or a nitrogen atom;

$R_{21}$ are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms or a cyano group;

when plural C—$R_{21}$ are present, plural $R_{21}$ may be the same or different;

$R_{22}$ are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms or a cyano group;

when plural C—$R_{22}$ are present, plural $R_{22}$ may be the same or different;

$R_{23}$ are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms or a cyano group;

when plural C—$R_{23}$ are present, plural $R_{23}$ may be the same or different;

when $R_{21}$, $R_{22}$ and $R_{23}$ have a substituent, the substituent R' is a hydrogen atom, an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aromatic hydrocarbon ring group having 6 to 18 ring carbon atoms, an aryloxy group having 6 to 18 ring carbon atoms, a heteroaromatic ring group having 5 to 18 ring atoms, a silyl group, a fluorine atom, a fluoroalkyl group having 1 to 20 carbon atoms, a fluoroalkoxy group having 1 to 20 carbon atoms or a cyano group;

$X_1$ is an oxygen atom or a sulfur atom; and $X_2$ is an oxygen atom, a sulfur atom or =$C(CH_3)_2$.

3. The organic electroluminescence device according to 1, wherein the compound represented by the formula (1) is a compound represented by the following formula (3a), a compound represented by the following formula (3b) or a compound represented by the following formula (3c);

(3a)

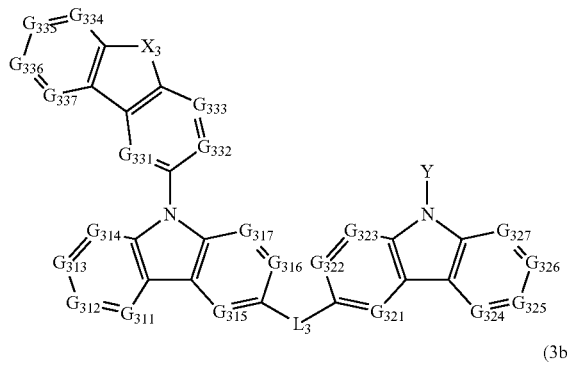

(3b)

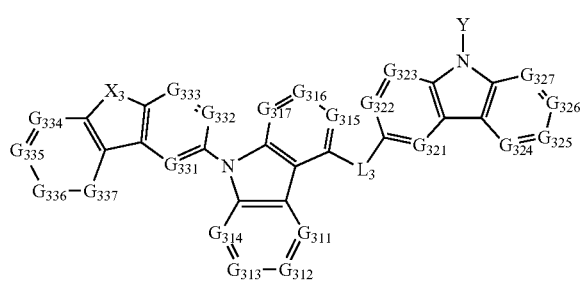

(3c)

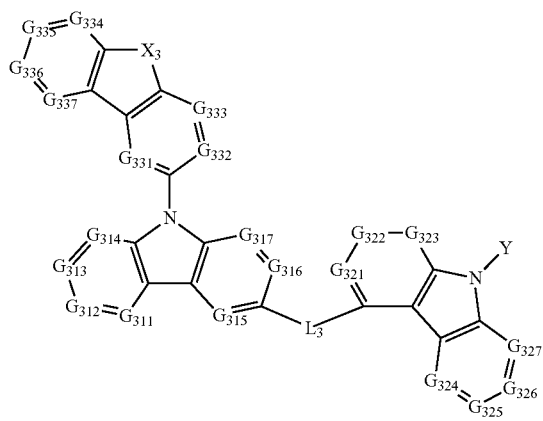

wherein
in the formulas (3a) to (3c),

Y is a substituted or unsubstituted aromatic hydrocarbon ring group having 6 to 18 ring carbon atoms, a substituted or unsubstituted monocyclic heteroaromatic ring group having 5 to 7 ring atoms or a group represented by the following formula (3-1);

to $G_{317}$, $G_{321}$ to $G_{327}$ and $G_{331}$ to $G_{337}$ are independently C—$R_{31}$ or a nitrogen atom;

$R_{31}$ are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms or a cyano group;

when plural C—$R_{31}$ are present, plural $R_{31}$ may be the same or different, $L_3$ is a single bond, a divalent linkage group containing an oxygen atom, a divalent linkage group containing a silicon atom, a divalent linkage group containing a sulfur atom, an alkylene group having 1 to 5 carbon atoms, a cycloalkylene group having 3 to 6 ring carbon atoms, an aromatic hydrocarbon ring group having 6 to 18 ring carbon atoms or a heteroaromatic ring group having 5 to 18 ring atoms;

when $R_{31}$ has a substituent, the substituent R' is a hydrogen atom, an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aromatic hydrocarbon ring group having 6 to 18 ring carbon atoms, an aryloxy group having 6 to 18 ring carbon atoms, a heteroaromatic ring group having 5 to 18 ring atoms, a silyl group, a fluorine atom, a fluoroalkyl group, a fluoroalkoxy group or a cyano group; and $X_3$ is an oxygen atom or a sulfur atom, (3-1)

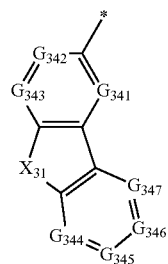

wherein
in the formula (3-1),

* is a bonding with a nitrogen atom;

$G_{341}$ to $G_{347}$ are independently C—$R_{31}$ or a nitrogen atom, and $R_{31}$ is the same as $R_{31}$ in the formulas (3a) to (3c); and $X_{31}$ is a nitrogen atom, an oxygen atom or a sulfur atom which has a substituent.

4. The organic electroluminescence device according to 1, wherein the compound represented by the formula (1) is a compound represented by the following formula (4);

(4)

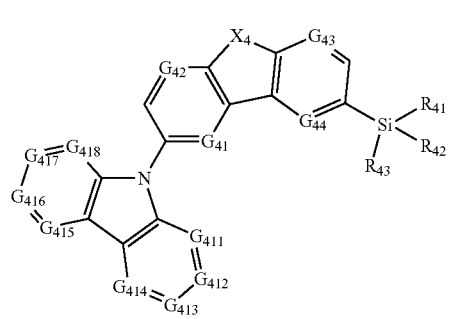

wherein
in the formula (4), $R_{41}$, $R_{42}$ and $R_{43}$ are independently a substituted or unsubstituted alkyl group having 1 to 20 carbon atoms, a substituted or unsubstituted cycloalkyl group having 3 to 20 ring carbon atoms, a substituted or unsubstituted aromatic hydrocarbon group having 6 to 18 ring carbon atoms, or a substituted or unsubstituted heteroaromatic ring group having 5 to 18 ring atoms;

$R_{41}$, $R_{42}$ and $R_{43}$ may be directly bonded to each other to form a ring, may be bonded to each other through an oxygen atom to form a ring, may be bonded to each other through a sulfur atom to form a ring, or may be bonded to each other through a silicon atom to form a ring;

$G_{41}$ to $G_{44}$ are independently C—$R_{44}$ or a nitrogen atom;

$R_{44}$ is a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms or a cyano group;

when plural C—$R_{44}$ are present, plural $R_{44}$ may be the same or different;

$G_{411}$ to $G_{418}$ are independently C—$R_{45}$ or a nitrogen atom;

$R_{45}$ is a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms or a cyano group;

when plural C—$R_{45}$ are present, plural $R_{45}$ may be the same or different;

when $R_{41}$, $R_{42}$, $R_{43}$, $R_{44}$ and $R_{45}$ have a substituent, the substituent R' is a hydrogen atom, an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aromatic hydrocarbon ring group having 6 to 18 ring carbon atoms, an aryloxy group having 6 to 18 ring carbon atoms, a heteroaromatic ring group having 5 to 18 ring atoms, a silyl group, a fluorine atom, a fluoroalkyl group having 1 to 20 carbon atoms, a fluoroalkoxy group having 1 to 20 carbon atoms or a cyano group; and $X_4$ is an oxygen atom or a sulfur atom.

5. The organic electroluminescence device according to any of 1 to 4, wherein at least one of Rf, Rh, Rk and Rm in the above-mentioned formula (A) is a substituted or unsubstituted carbazolyl group, a substituted or unsubstituted azacarbazolyl group, a substituted or unsubstituted 2-dibenzofuranyl group, a substituted or unsubstituted 4-dibenzofuranyl group, a substituted or unsubstituted 2-dibenzothiophenyl group or a substituted or unsubstituted 4-dibenzothiophenyl group.

6. The organic electroluminescence device according to any of 1 to 5 wherein both of Rf and Rh in the formula (A) or both of Rk and Rm in the formula (A) are independently a substituted or unsubstituted carbazolyl group, a substituted or unsubstituted azacarbazolyl group, a substituted or unsubstituted 2-dibenzofuranyl group, a substituted or unsubstituted 4-dibenzofuranyl group, a substituted or unsubstituted 2-dibenzothiophenyl group or a substituted or unsubstituted 4-dibenzothiophenyl group.

7. The organic electroluminescence device according to any of 1 to 6, wherein $Ar_1$ in the formula (A) is a single bond, a substituted or unsubstituted alkyl group or alkylene group having 1 to 20 carbon atoms, a substituted or unsubstituted phenyl group or meta-phenylene group, a substituted or unsubstituted 2-dibenzofuranyl group or 2,8-dibenzofuranylene group, or a substituted or unsubstituted 2-dibenzothiophenyl group or 2,8-dibenzothiophenylene group.

8. The organic electroluminescence device according to any of 1 to 7, wherein $Ar_2$ in the formula (A) is a single bond, a substituted or unsubstituted alkyl group or alkylene group having 1 to 20 carbon atoms, a substituted or unsubstituted phenyl group, or meta-phenylene group, or a substituted or unsubstituted para-phenylene group, a substituted or unsubstituted 2-dibenzofuranyl group or 2,8-dibenzofuranylene group, or a substituted or unsubstituted 2-dibenzothiophenyl group or 2,8-dibenzothiophenylene group.

9. The organic electroluminescence device according to any of 1 to 8, wherein the emitting layer comprises a phosphorescent material, and the phosphorescent material is an ortho-metal complex of one or more metal atoms selected from iridium (Ir), osmium (Os) and platinum (Pt).

10. The organic electroluminescence device according to any of 1 to 9, wherein an electron donating dopant is contained in the interface region between the cathode and the organic thin film layers.

11. A compound represented by the following formula (a);

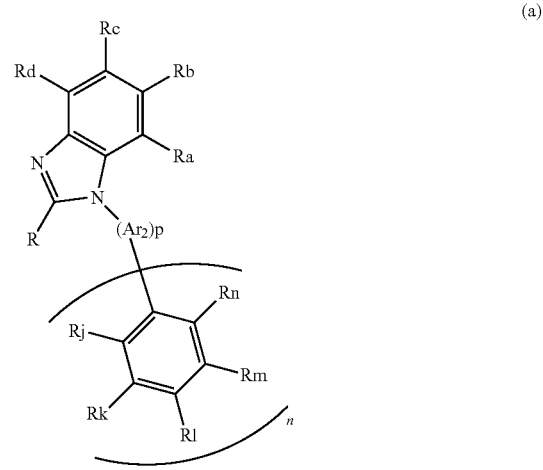

wherein
in the formula (a),
R is a substituted or unsubstituted alkyl group having 1 to 20 carbon atoms, or a substituted or unsubstituted cycloalkyl group having 3 to 20 ring carbon atoms;

Ra to Rd and Rj to Rn are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted amino group, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms or a cyano group, provided that at least one of Rm and Rk is a substituted or unsubstituted carbazolyl group, a substituted or unsubstituted azacarbazolyl group, a substituted or unsubstituted dibenzofuranyl group, a substituted or unsubstituted dibenzothiophenyl group, a substituted or unsubstituted azadibenzofuranyl group or a substituted or unsubstituted azadibenzothiophenyl group;

$Ar_2$ is a single bond, a substituted or unsubstituted alkyl group or alkylene group having 1 to 20 carbon atoms, a substituted or unsubstituted phenyl group, or meta-phenylene group, or a substituted or unsubstituted para-phenylene group, a substituted or unsubstituted meta-biphenylyl group or meta-biphenylylene group, a substituted or unsubstituted meta-terphenylyl group or meta-terphenylylene group, a substituted or unsubstituted 3-pyridyl group or 3,5-pyridylene group, a substituted or unsubstituted 2-pyridyl group or 2,6-pyridylene group, a substituted or unsubstituted 2-pyridyl group or 2,4-pyridylene group, a substituted or unsubstituted 2-dibenzofuranyl group or 2,8-dibenzofuranylene group, a substituted or unsubstituted 2-dibenzothiophenyl group or 2,8-dibenzothiophenylene group, or a substituted or unsubstituted 3-carbazolyl group or 3,6-carbazolylene group;

n is 0 or 1;

p is 0 or 1; and n+p is more than or equal to 1.

12. The compound according to 11, wherein in the formula (a), both of Rm and Rk are independently a substituted or unsubstituted carbazolyl group, a substituted or unsubstituted azacarbazolyl group, a substituted or unsubstituted dibenzofuranyl group, a substituted or unsubstituted dibenzothiophenyl group, a substituted or unsubstituted azadibenzofuranyl group, or a substituted or unsubstituted azadibenzothiophenyl group.

13. The compound according to 11, wherein in the formula (a), at least one of Rm and Rk is a substituted or unsubstituted carbazolyl group.

According to the invention, a highly efficient and long-lived organic EL device which can be driven at a low voltage can be provided.

MODE FOR CARRYING OUT THE INVENTION

Figure 1:
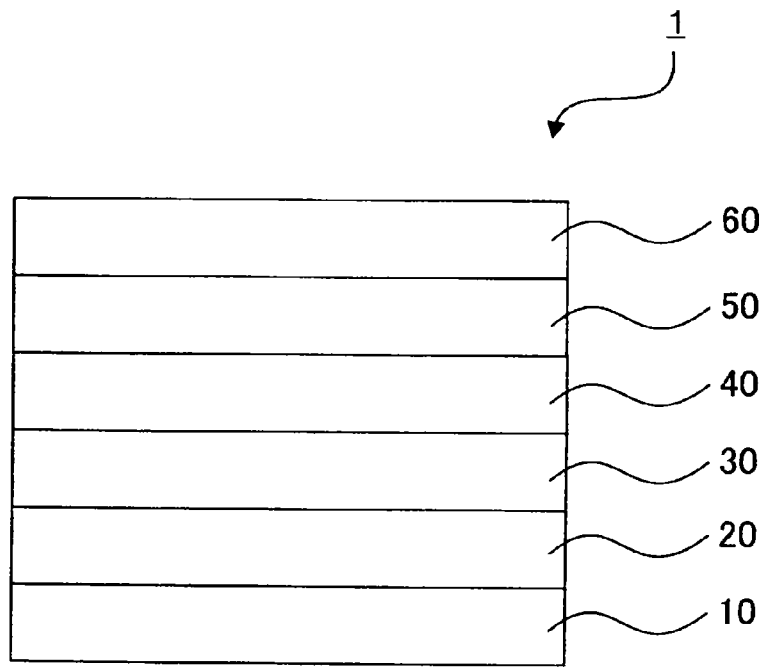
FIG. 1 is a view showing one embodiment of the organic EL device of the invention.

The organic EL device of the invention comprises two or more organic thin film layers including an emitting layer between an anode and a cathode, the emitting layer comprising at least one compound represented by the following formula (1), and an organic thin film layer that is in contact with the emitting layer on the cathode side comprising at least one benzimidazole compound represented by the following formula (A).

Hereinbelow, an explanation is made on these compounds.

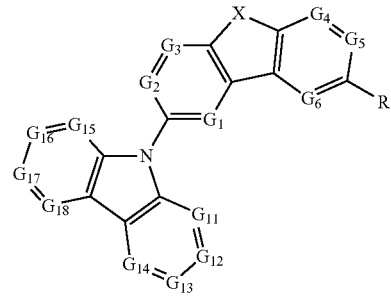

(1)

[Compound Represented by the Formula (A)]

The compound represented by the formula (A) is the following compound having a benzimidazole skeleton.

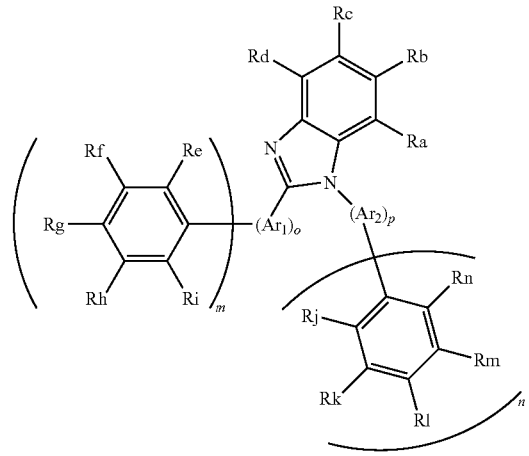

(A)

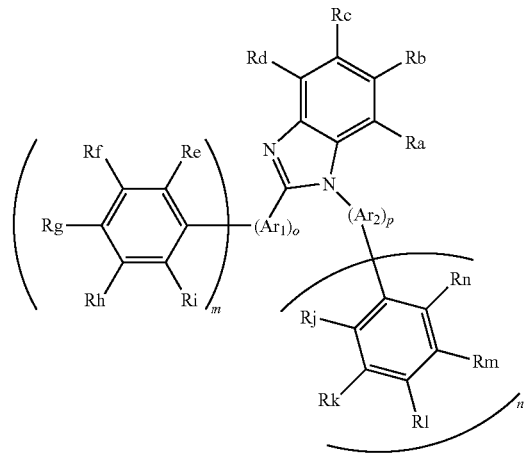

(A)

wherein in the formula (A),

Ra to Rd, Re to Rf, Rh to Ri, Rj to Rk and Rm to Rn are independently a hydrogen atom, a substituted or unsubstituted alkyl group having 1 to 20 carbon atoms, a substituted or unsubstituted cycloalkyl group having 3 to 20 carbon atoms that form a ring (hereinafter referred to as "ring carbon atoms"), a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having to 18 atoms that form a ring (hereinafter referred to as "ring atoms"), a substituted or unsubstituted amino group, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms or a cyano group;

Rg and Rl are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted silyl group, a fluorine atom, a substituted or unsubstituted fluoroalkyl group having 1 to 20 carbon atoms, or a substituted or unsubstituted fluoroalkoxy group having 1 to 20 carbon atoms, provided that at least one of Re and Rf, Rh and Ri, Rj and Rk and Rm and Rn is a substituted or unsubstituted carbazolyl group, a substituted or unsubstituted azacarbazolyl group, a substituted or unsubstituted dibenzofuranyl group or a substituted or unsubstituted dibenzothiophenyl group;

$Ar_1$ is a single bond, a substituted or unsubstituted alkyl group or alkylene group having 1 to 20 carbon atoms, a substituted or unsubstituted phenyl group or meta-phenylene group, a substituted or unsubstituted meta-biphenylyl group or meta-biphenylylene group, a substituted or unsubstituted meta-terphenylyl group or meta-terphenylylene group, a substituted or unsubstituted 3-pyridyl group or 3,5-pyridylene group, a substituted or unsubstituted 2-pyridyl group or 2,6-pyridylene group, a substituted or unsubstituted 2-pyridyl group or 2,4-pyridylene group, a substituted or unsubstituted 2-dibenzofuranyl group or 2,8-dibenzofuranylene group, a substituted or unsubstituted 2-benzothiophenyl group or 2,8-dibenzothiophenylene group, or a substituted or unsubstituted 3-carbazolyl group or 3,6-carbazolylene group;

$Ar_2$ is a single bond, a substituted or unsubstituted alkyl group or alkylene group having 1 to 20 carbon atoms, a substituted or unsubstituted phenyl group or meta-phenylene group, a substituted or unsubstituted para-phenylene group, a substituted or unsubstituted meta-biphenylyl group or meta-biphenylylene group, a substituted or unsubstituted meta-terphenylyl group or meta-terphenylylene group, a substituted or unsubstituted 3-pyridyl group or 3,5-pyridylene group, a substituted or unsubstituted 2-pyridyl group or 2,6-pyridylene group, a substituted or unsubstituted 2-pyridyl group or 2,4-pyridylene group, a substituted or unsubstituted 2-dibenzofuranyl group or 2,8-dibenzofuranylene group, a substituted or unsubstituted 2-dibenzothiophenyl group or 2,8-dibenzothiophenylene group, or a substituted or unsubstituted 3-carbazolyl group or 3,6-carbazolylene group;

when Ra to Rn, $Ar_1$ and $Ar_2$ have a substituent, the substituent R" is a hydrogen atom, an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aromatic hydrocarbon ring group having 6 to 18 ring carbon atoms, an aryloxy group having 6 to 18 ring carbon atoms, a heteroaromatic ring group having 5 to 18 ring atoms, a silyl group, a fluorine atom, a fluoroalkyl group having 1 to 20 carbon atoms, a fluoroalkoxy group having 1 to 20 carbon atoms or a cyano group;

m and n are independently 0 or 1; and o and p are independently an integer of 0 to 3, provided that m, n, o and p satisfy the relationships that m+o is more than or equal to 1 and n+p is more than or equal to 1;

when o is 2 or 3, plural $Ar_1$ may be the same or different and when p is 2 or 3, plural $Ar_2$ may be the same or different.

In the compounds represented by the formula (A), it is preferred that at least one of Rf, Rh, Rk and Rm in the above-mentioned formula (A) be a substituted or unsubstituted carbazolyl group, a substituted or unsubstituted azacarbazolyl group, a substituted or unsubstituted 2-dibenzofuranyl group, a substituted or unsubstituted 4-dibenzofuranyl group, a substituted or unsubstituted 2-dibenzothiophenyl group or a substituted or unsubstituted 4-dibenzothiophenyl group. It is further preferred that at least one of Rf, Rh, Rk and Rm be a substituted or unsubstituted N-carbazolyl group, a substituted or unsubstituted 2-benzofuranyl group or a substituted or unsubstituted 2-dibenzothiophenyl group.

In the compounds represented by the formula (A), it is preferred that both of Rf and Rh or both of Rk and Rm be independently a substituted or unsubstituted carbazolyl group, a substituted or unsubstituted azacarbazolyl group, a substituted or unsubstituted 2-dibenzofuranyl group, a substituted or unsubstituted 4-dibenzofuranyl group, a substituted or unsubstituted 2-dibenzothiophenyl group or a substituted or unsubstituted 4-dibenzothiophenyl group.

In the compounds represented by the formula (A), $Ar_1$ is preferably a single bond, a substituted or unsubstituted alkyl group or alkylene group having 1 to 20 carbon atoms, a substituted or unsubstituted phenyl group or meta-phenylene group, a substituted or unsubstituted 2-dibenzofuranyl group or 2,8-dibenzofuranylene group, or a substituted or unsubstituted 2-dibenzothiophenyl group or 2,8-dibenzothiophenylene group. $Ar_1$ is more preferably a single bond, a substituted or unsubstituted alkyl group or alkylene group having 1 to 5 carbon atoms, or a substituted or unsubstituted phenyl group or meta-phenylene group.

In the compounds represented by the formula (A), $Ar_2$ is preferably a single bond, a substituted or unsubstituted alkyl group or alkylene group having 1 to 10 carbon atoms, a substituted or unsubstituted phenyl group, or meta-phenylene group, or a substituted or unsubstituted para-phenylene group, a substituted or unsubstituted 2-dibenzofuranyl group or 2,8-dibenzofuranylene group, or a substituted or unsubstituted 2-dibenzothiophenyl group or 2,8-dibenzothiophenylene group. $Ar_2$ is more preferably a single bond, a substituted or unsubstituted alkyl group having 1 to 5 carbon atoms, a substituted or unsubstituted phenyl group or meta-phenylene group or a substituted or unsubstituted para-phenylene group.

In the compounds represented by the formula (A), it is preferred that m and n satisfy the relationship m+n≥1.

The compound represented by the formula (A) is preferably a compound represented by the following formula (a).

The compound of the invention is represented by the following formula (a):

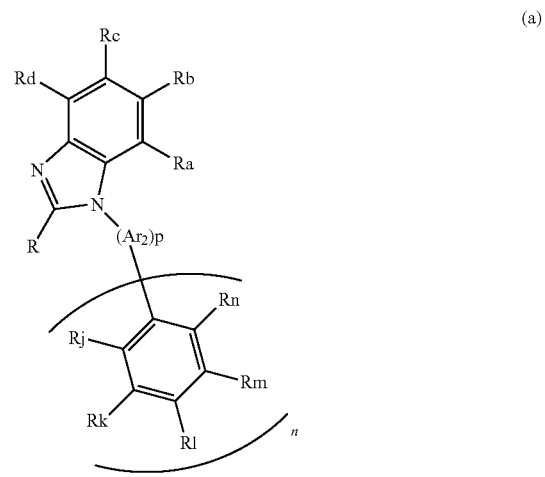

(a)

wherein in the formula (a) R is a substituted or unsubstituted alkyl group having 1 to 20 carbon atoms, or a substituted or unsubstituted cycloalkyl group having 3 to 20 ring carbon atoms.

Ra to Rd, Rj to Rn and Ar$_2$ are as defined in the formula (A).

At least one of Rm and Rk is a substituted or unsubstituted carbazolyl group, a substituted or unsubstituted azacarbazolyl group, a substituted or unsubstituted dibenzofuranyl group, a substituted or unsubstituted dibenzothiophenyl group, a substituted or unsubstituted azadibenzofuranyl group or a substituted or unsubstituted azadibenzothiophenyl group.

n is 0 or 1.

p is 0 or 1.

n+p≥1.

In the formula (a), it is preferred that both of Rm and Rk be independently a substituted or unsubstituted carbazolyl group, a substituted or unsubstituted azacarbazolyl group, a substituted or unsubstituted dibenzofuranyl group, a substituted or unsubstituted dibenzothiophenyl group, a substituted or unsubstituted azadibenzofuranyl group, or a substituted or unsubstituted azadibenzothiophenyl group.

In the formula (a), it is preferred that at least one of Rm and Rk be a substituted or unsubstituted carbazolyl group.

The triplet energy of the benzimidazole compound represented by the formula (A) is preferably 2.85 eV or more, more preferably 2.90 eV or more.

Specific examples of the compound represented by the formula (A) are given below. The compound represented by the formula (A) is not limited to the following specific examples.

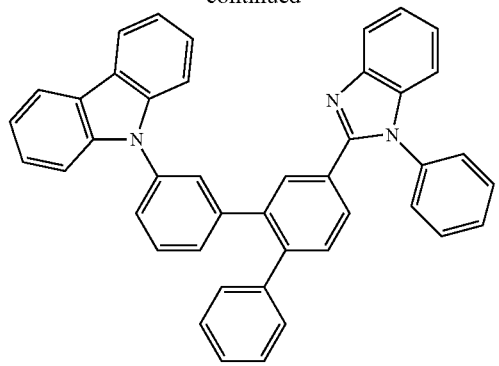

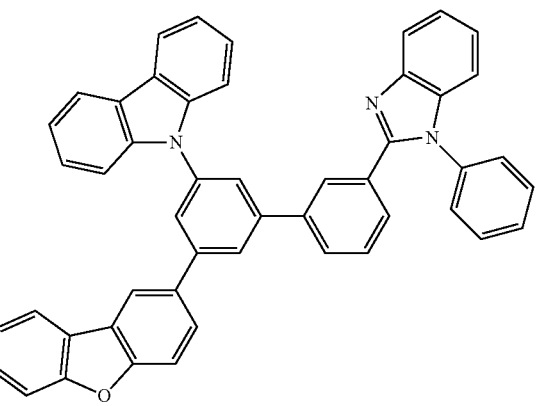

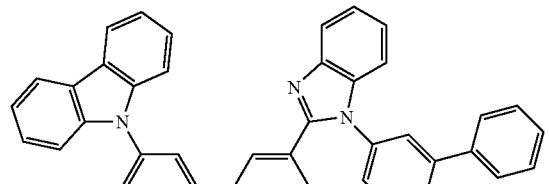

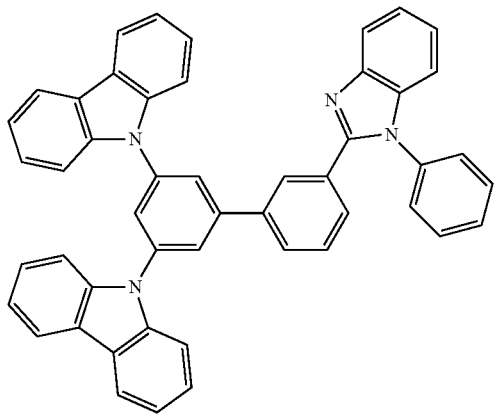

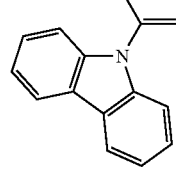

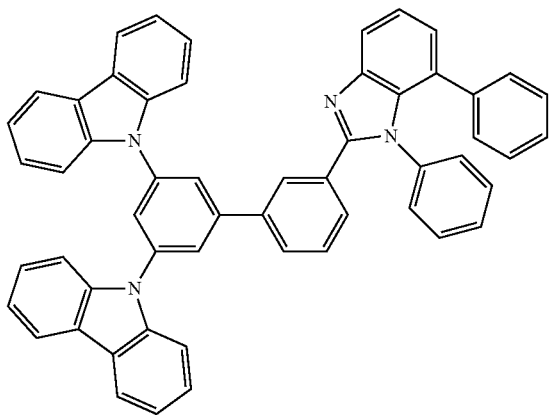

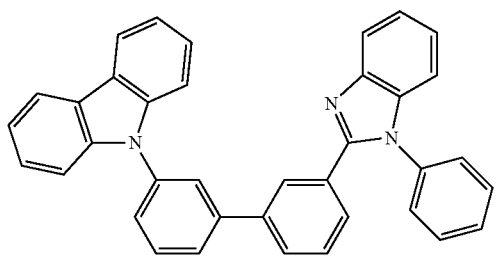

17
-continued
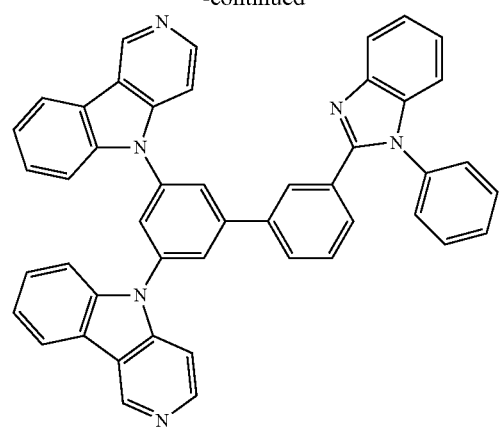
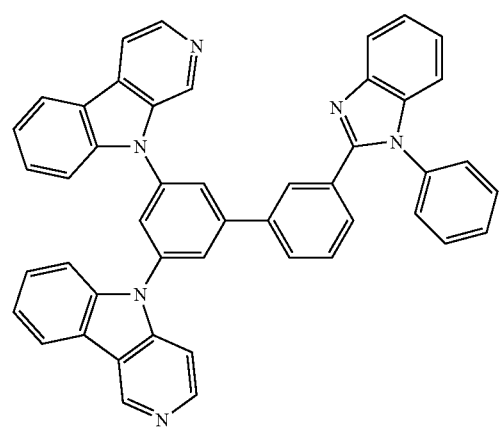
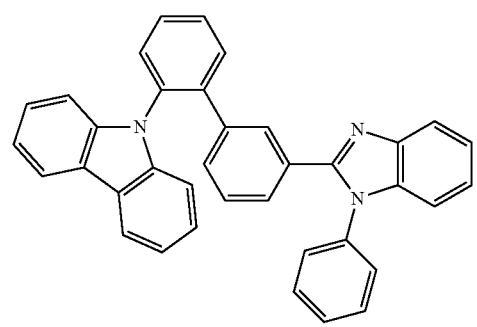
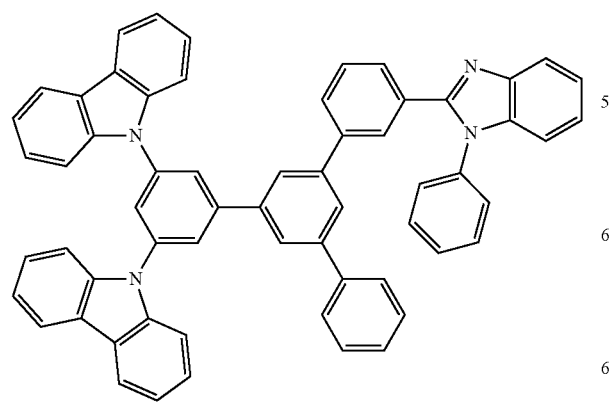
18
-continued
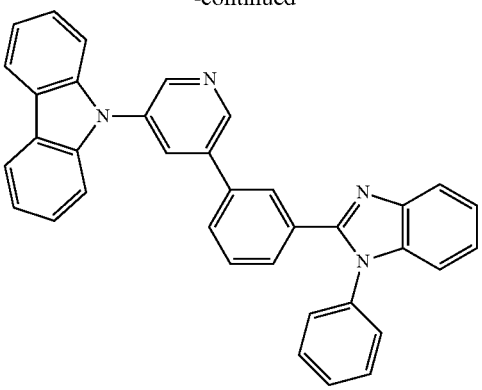
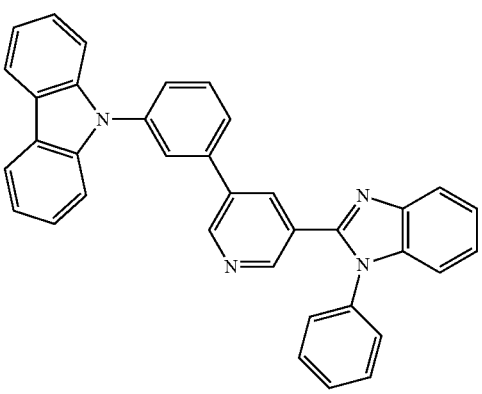
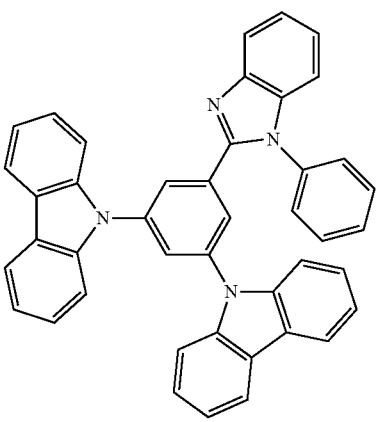
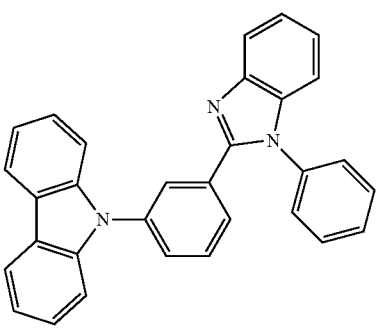

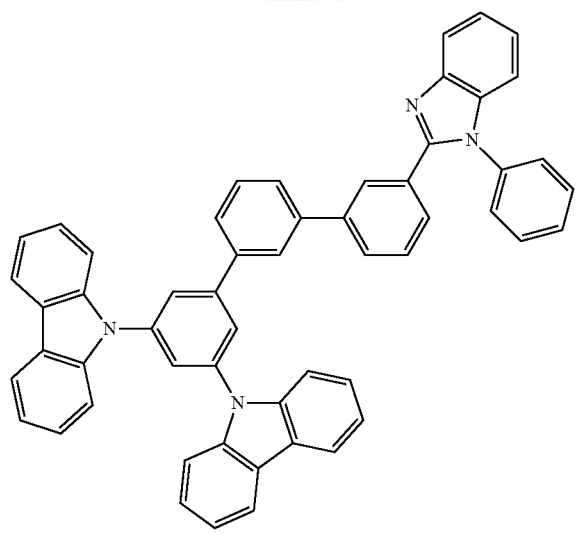
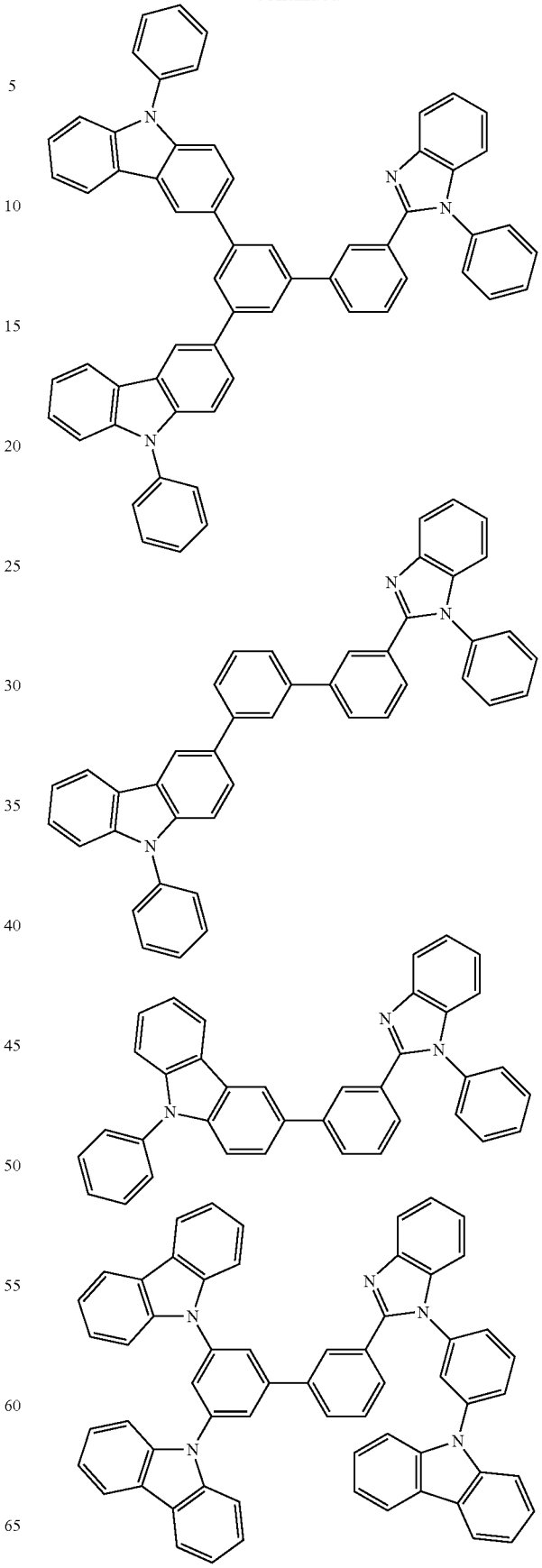

-continued
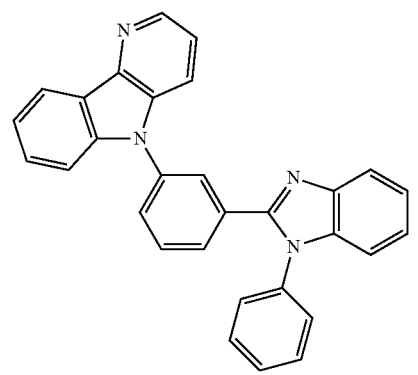
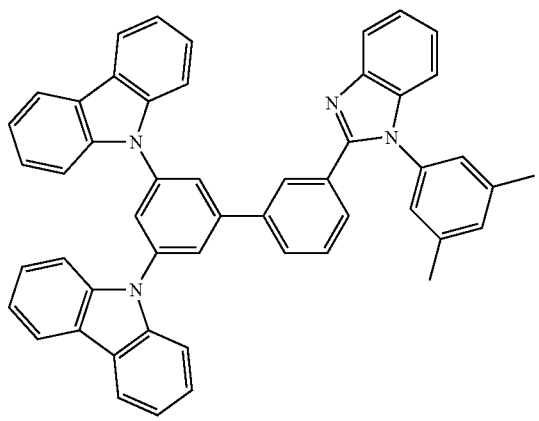
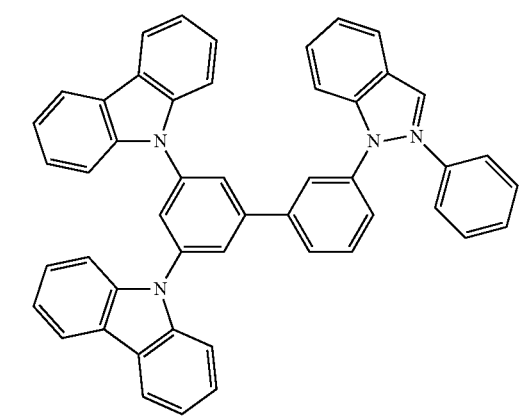
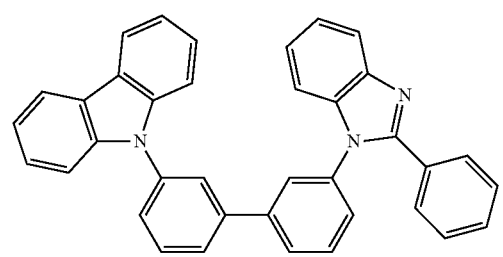
-continued
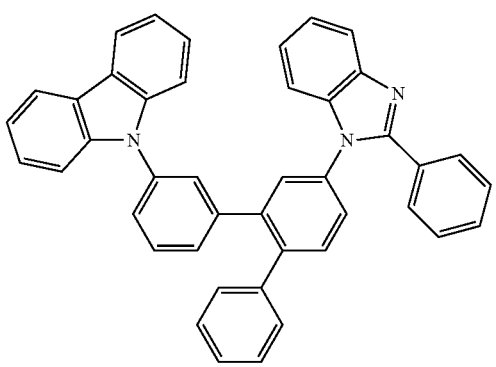
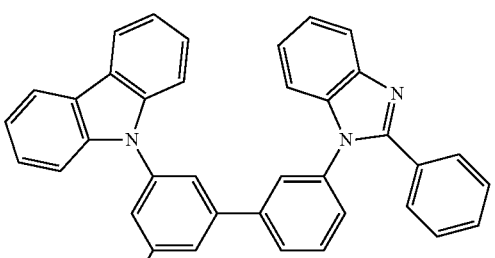
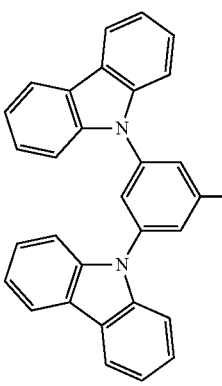
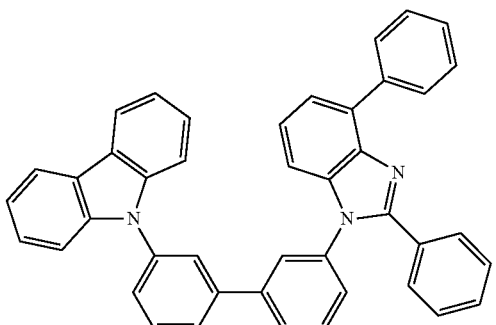

-continued
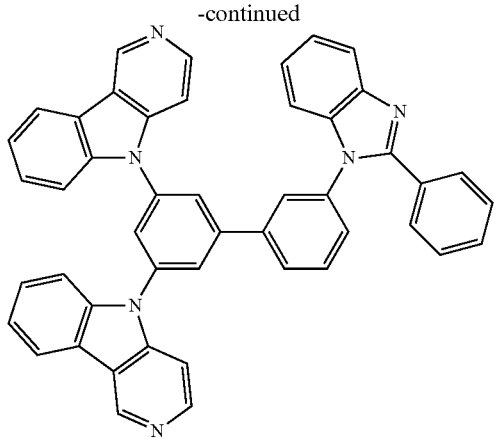
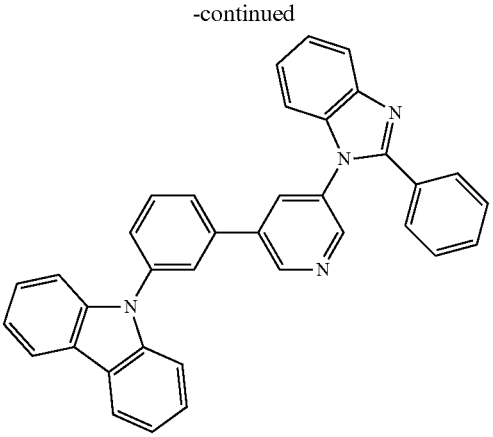
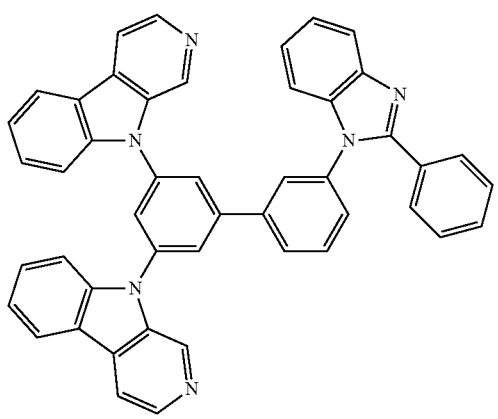
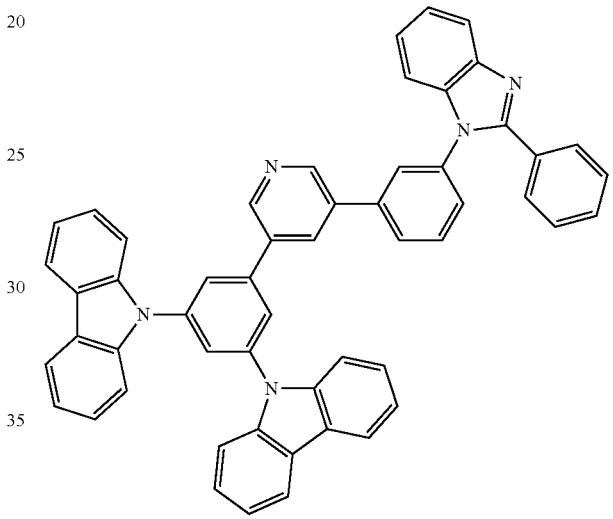
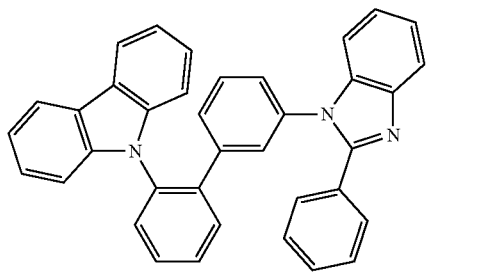
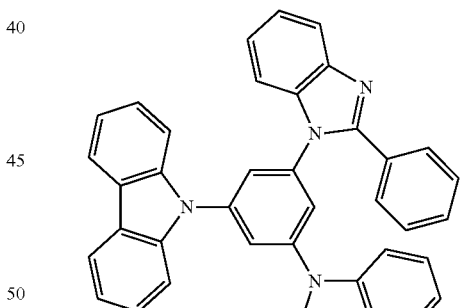
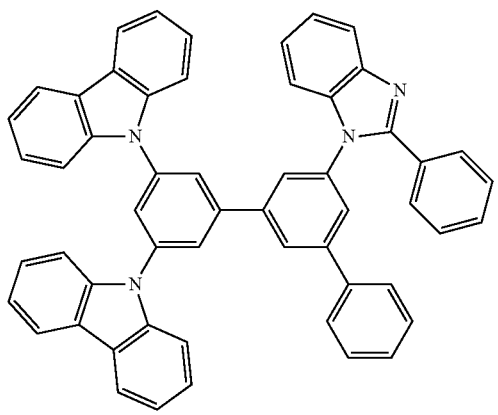
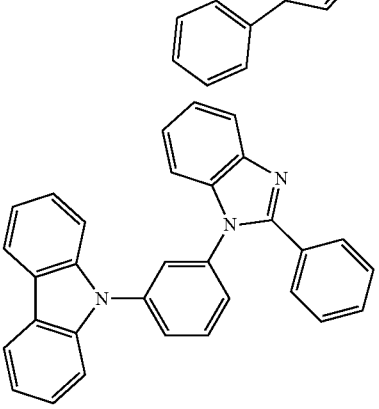

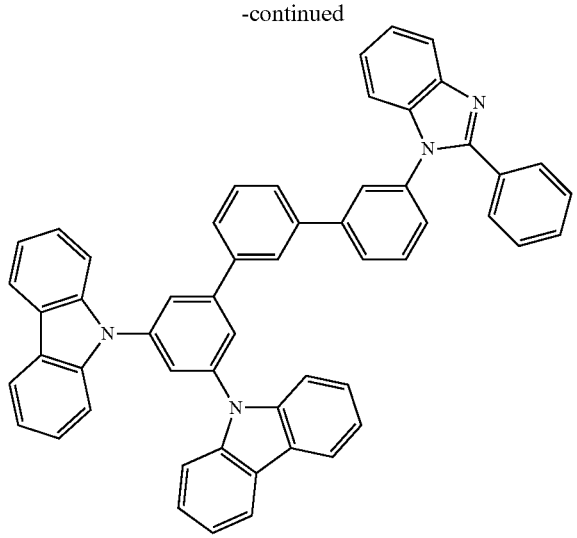
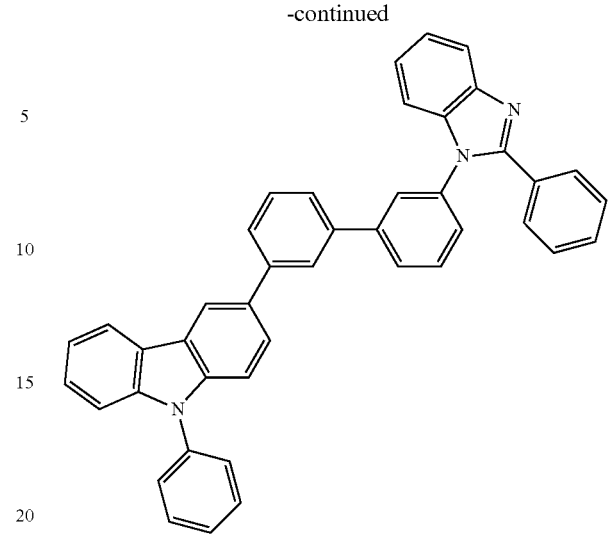
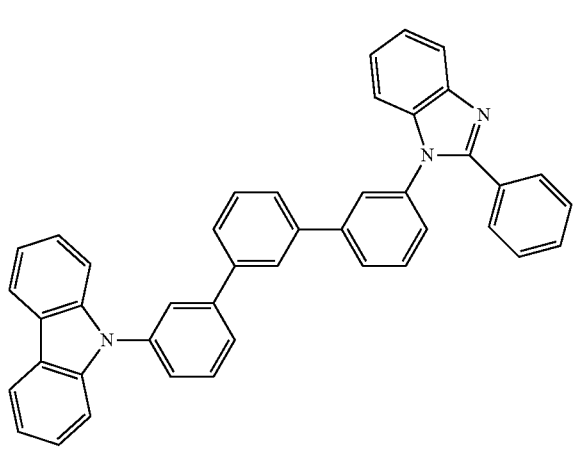
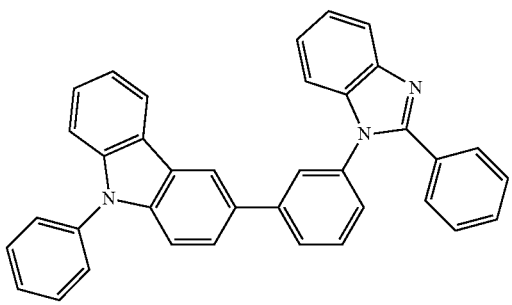
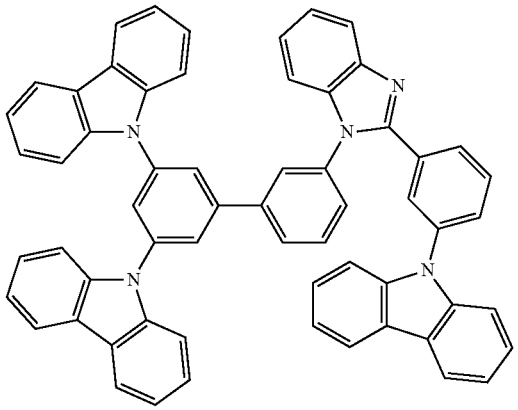
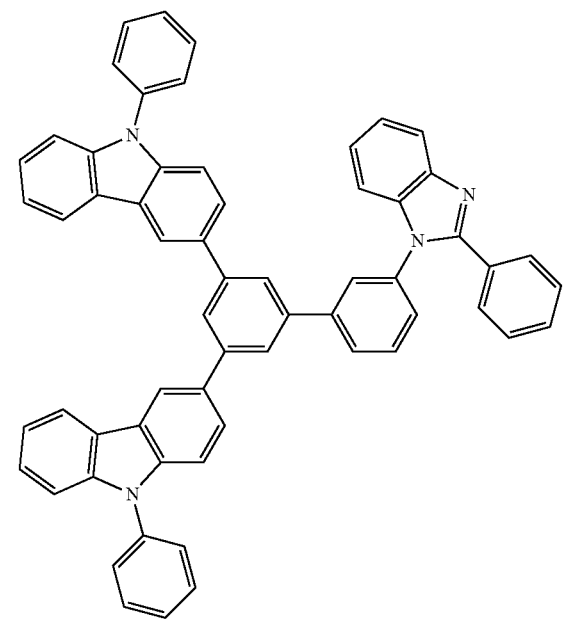
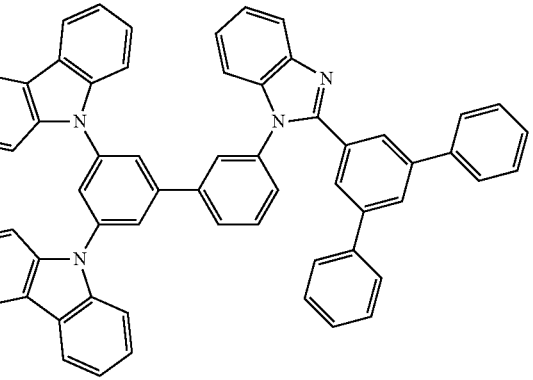

27
-continued
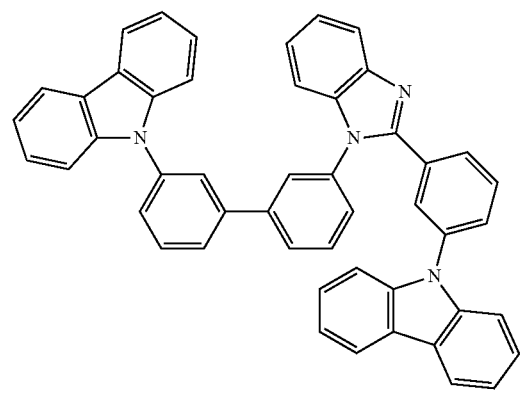
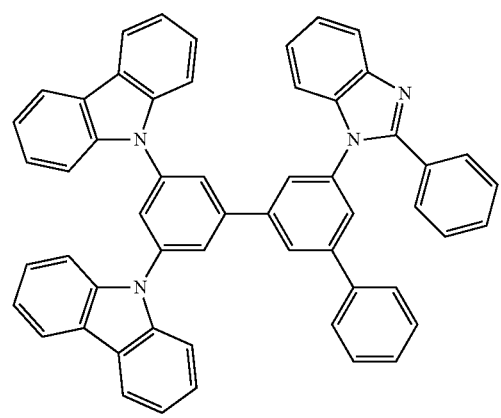
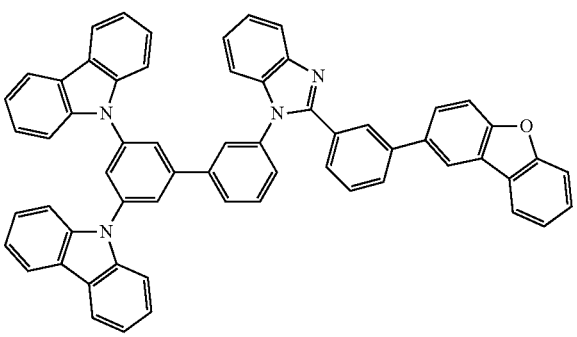
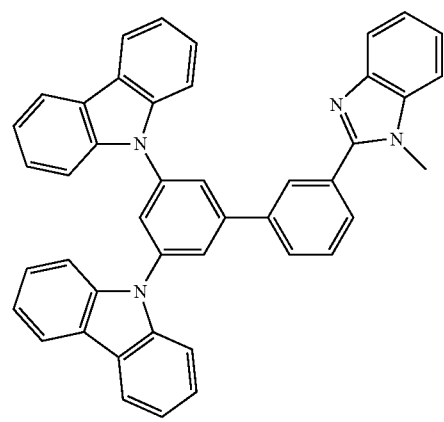
28
-continued
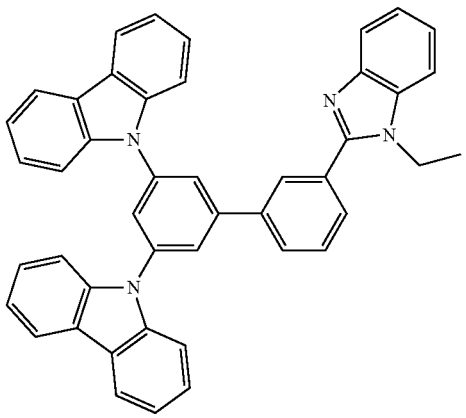
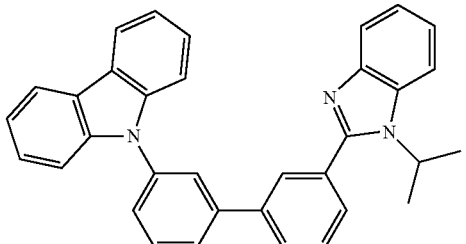
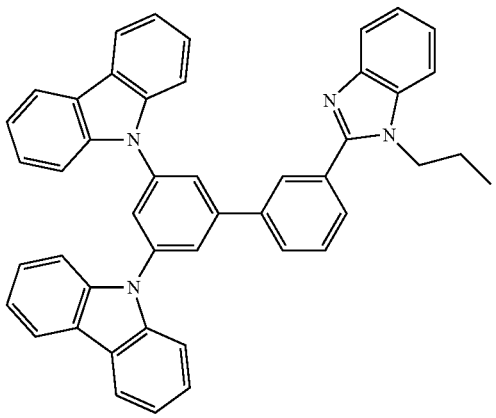
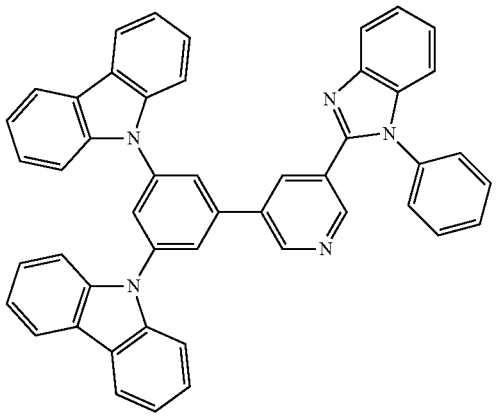

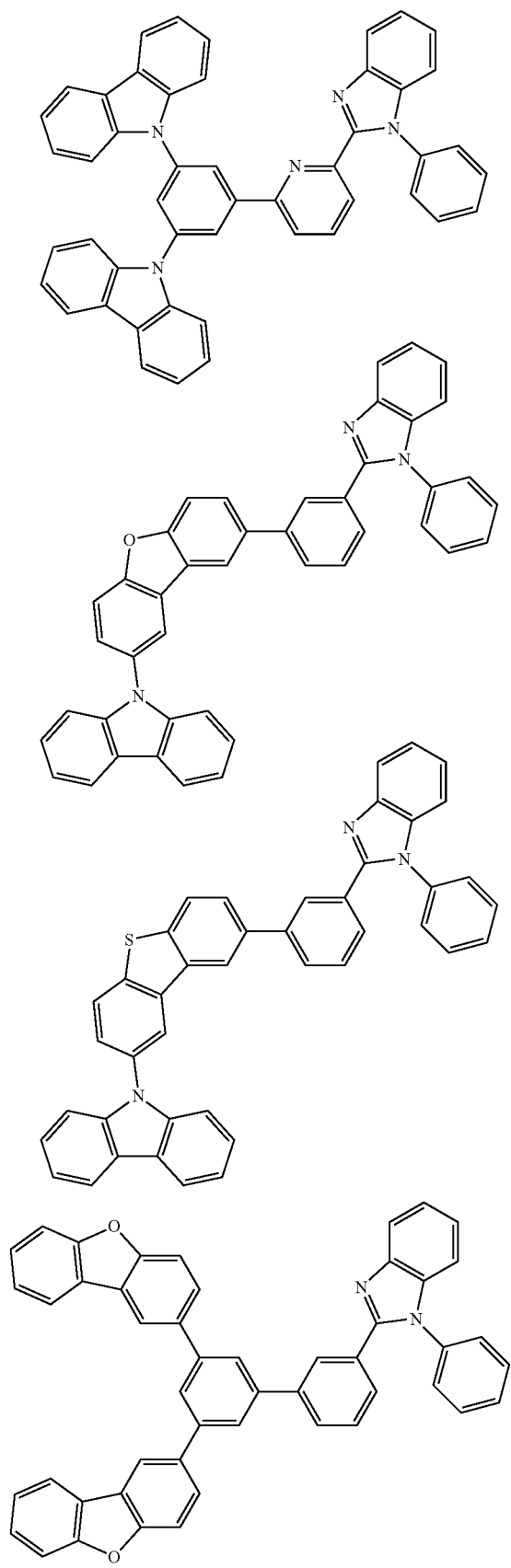
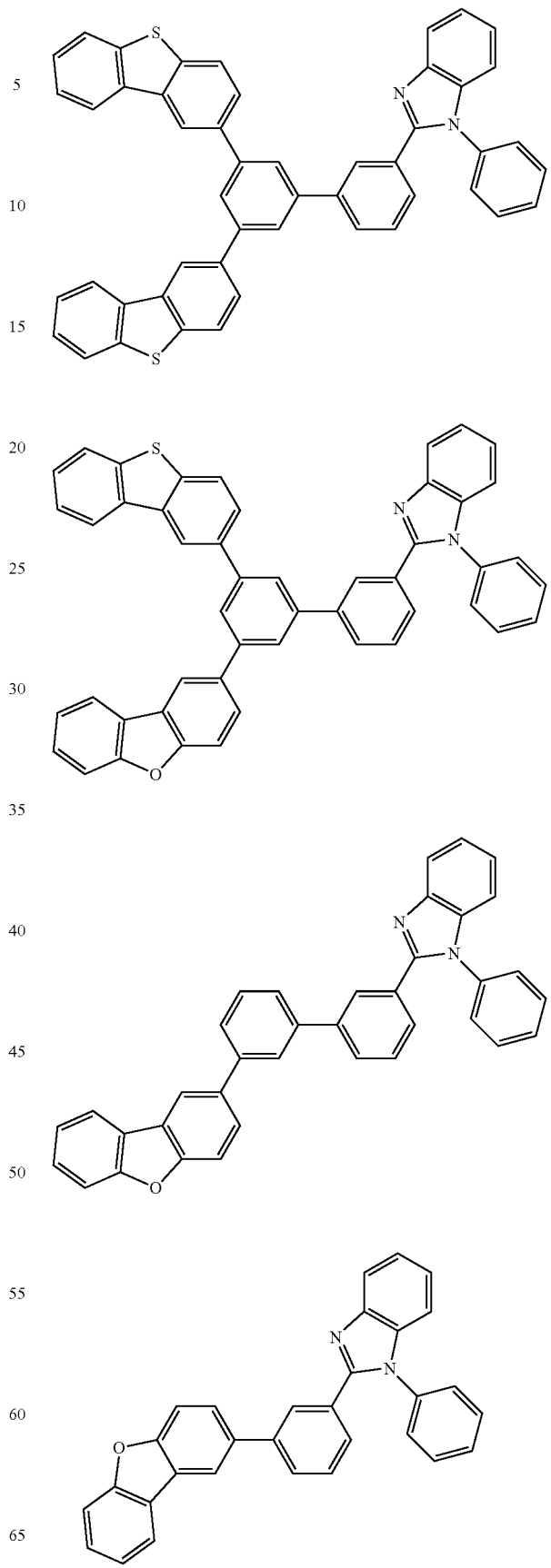

31
-continued
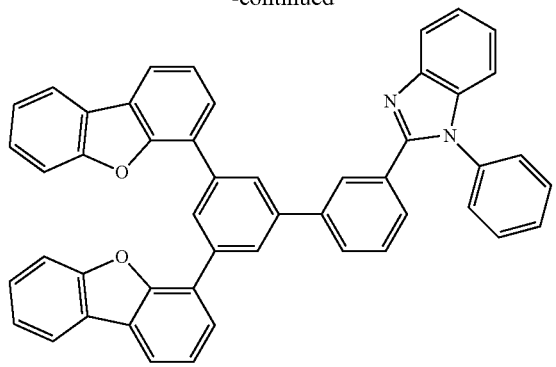
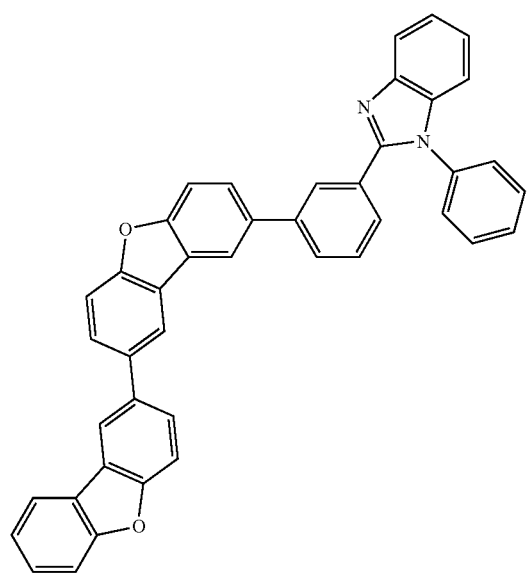
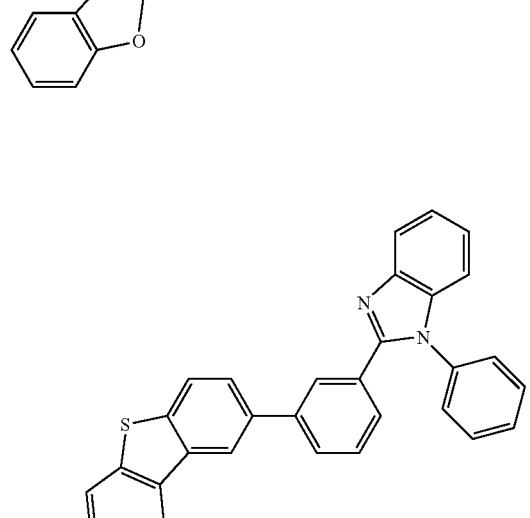
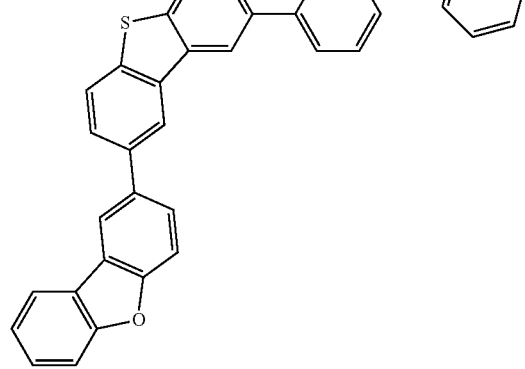
32
-continued
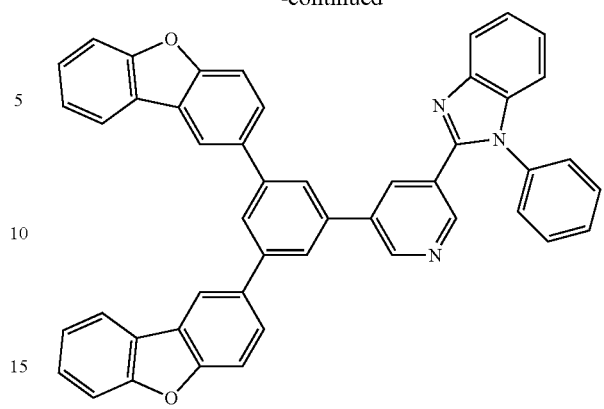
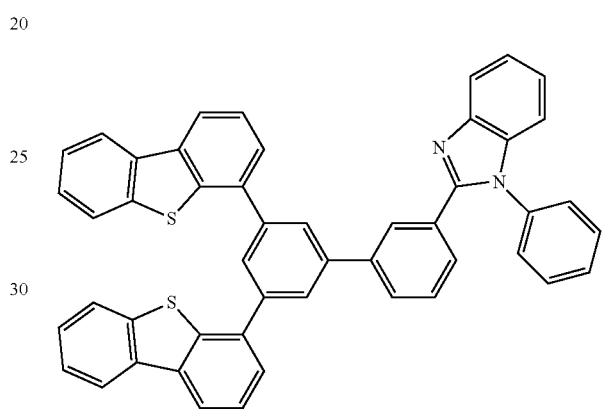
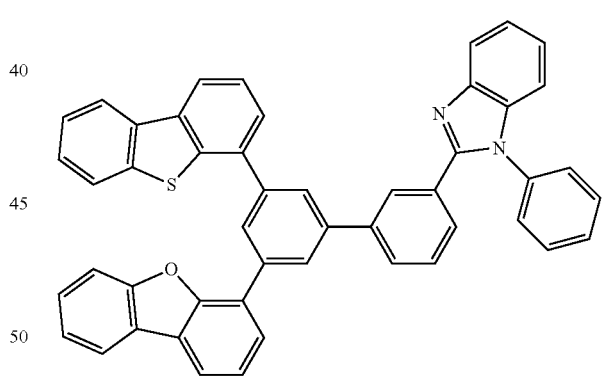
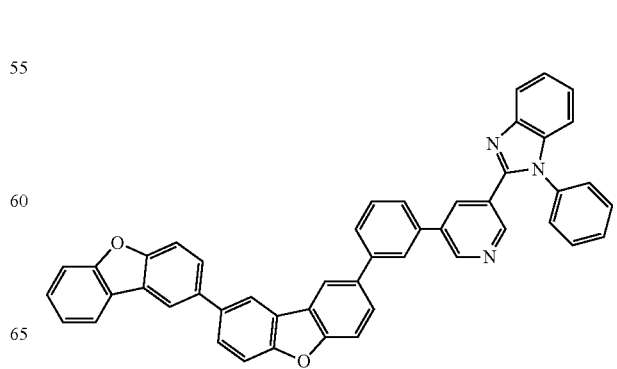

33
-continued
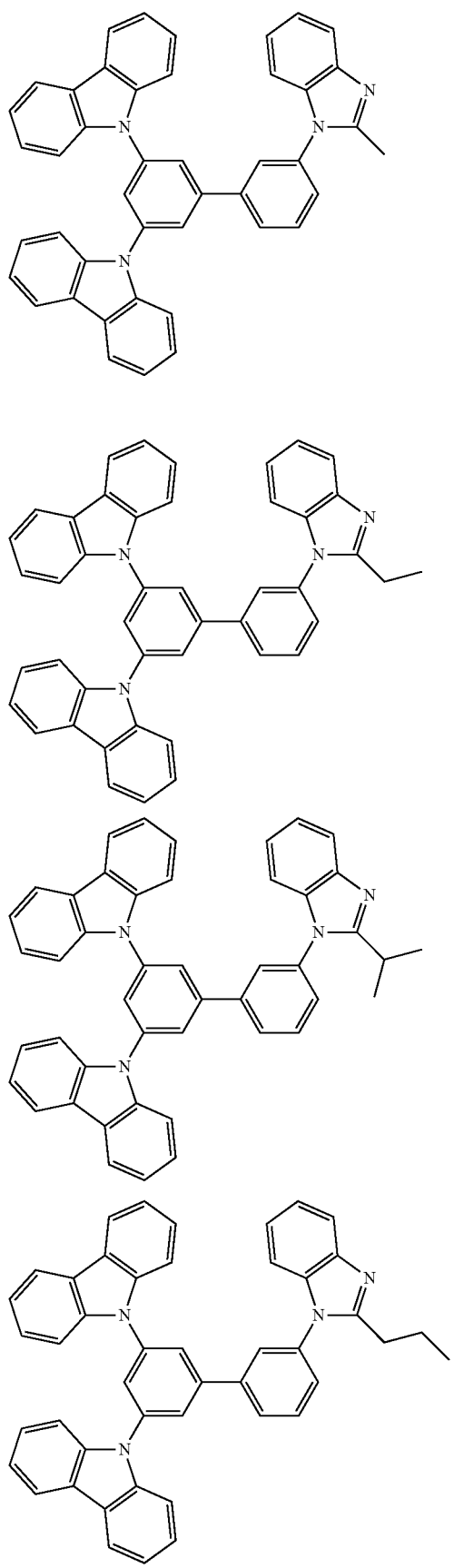
34
-continued
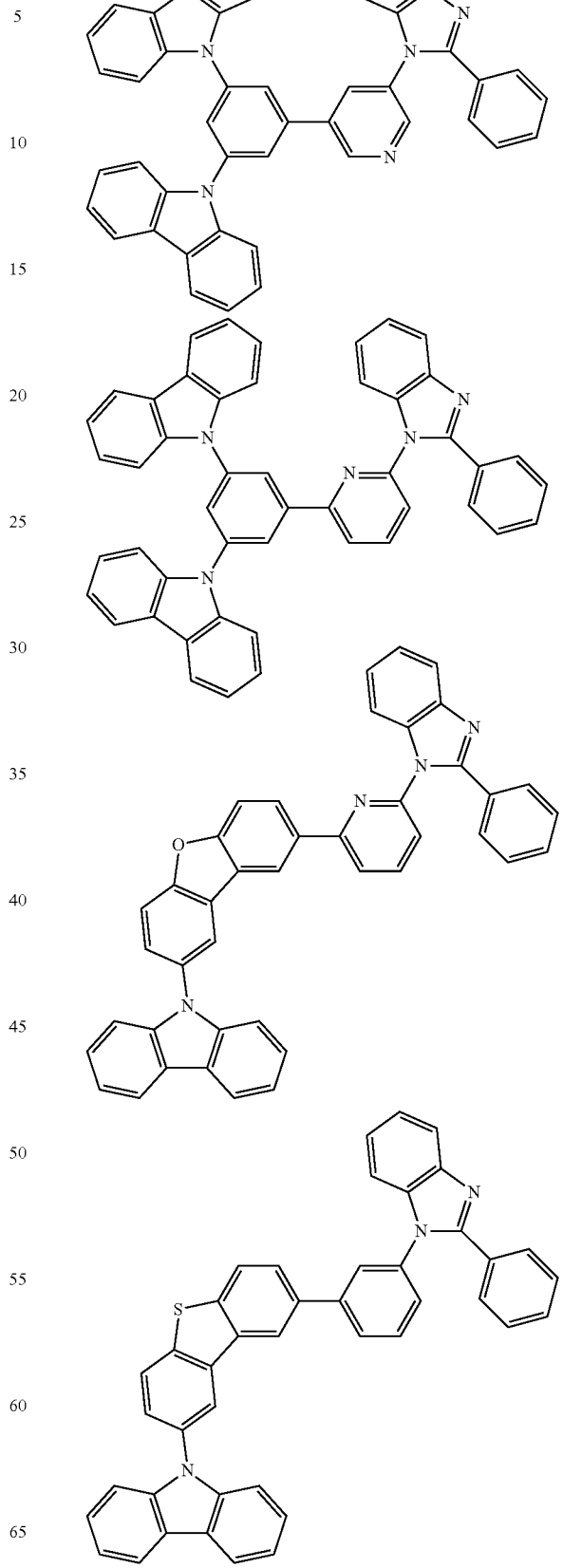

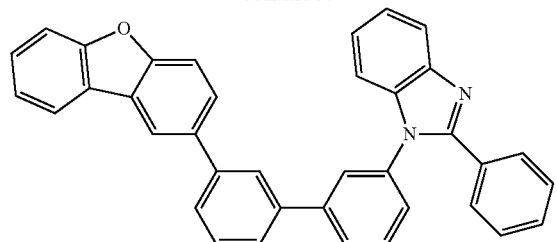
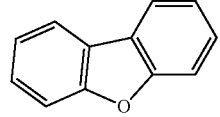
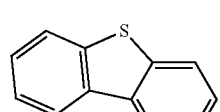
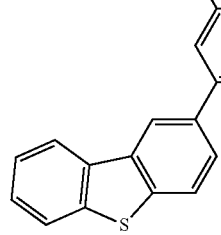
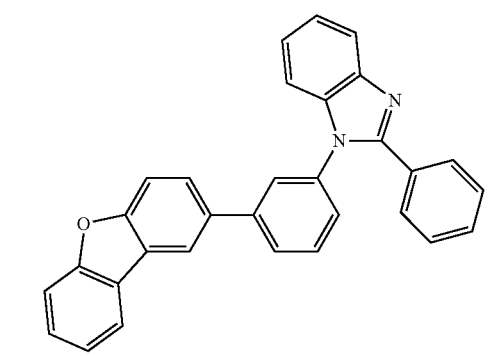
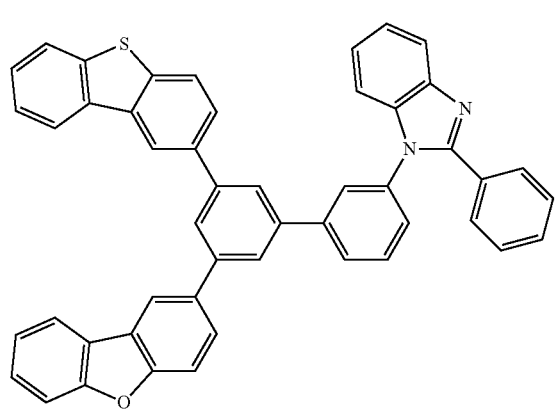
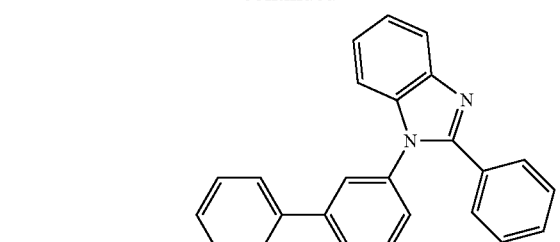
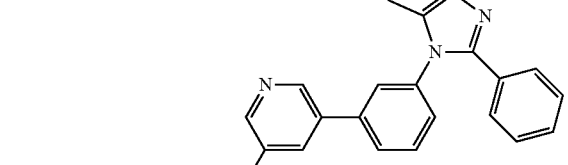
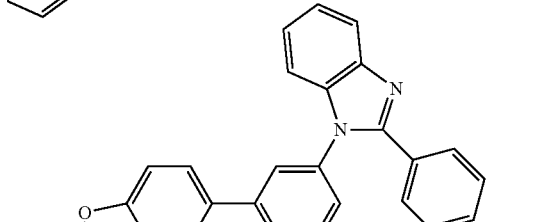
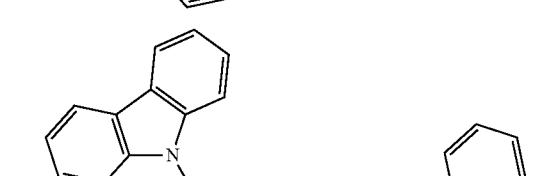

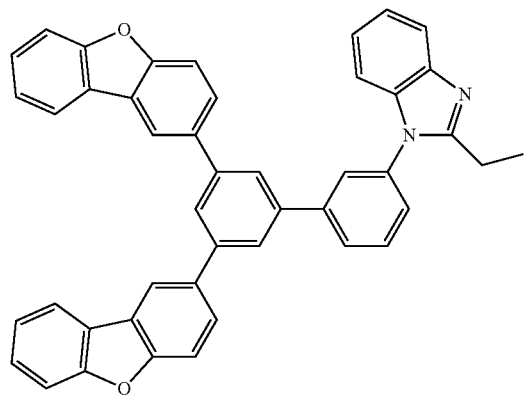
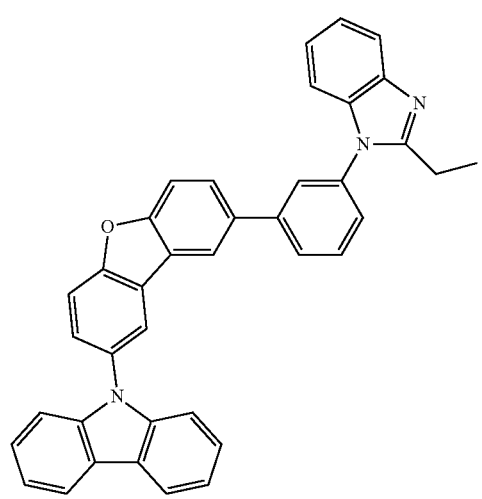
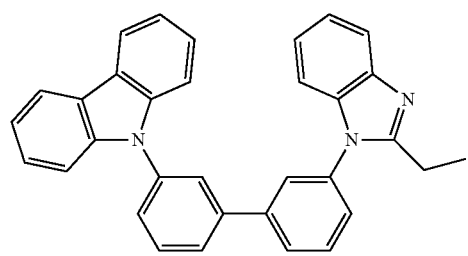
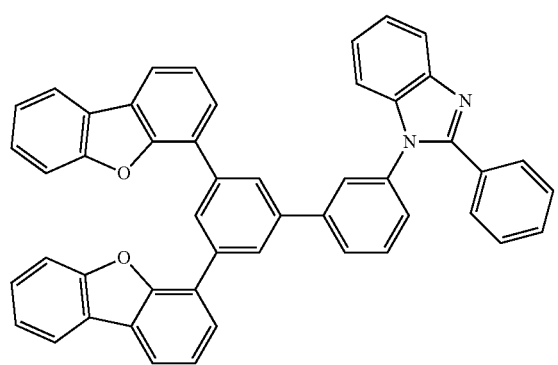
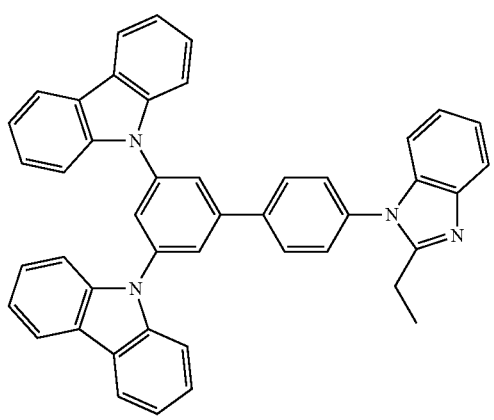
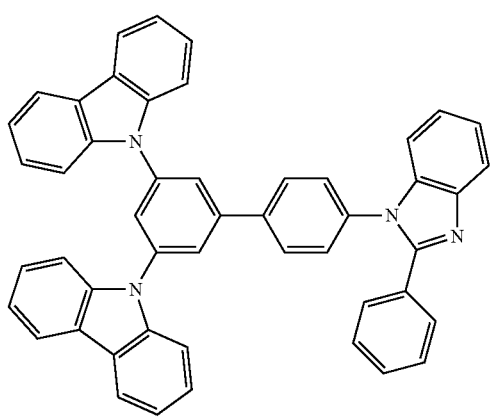
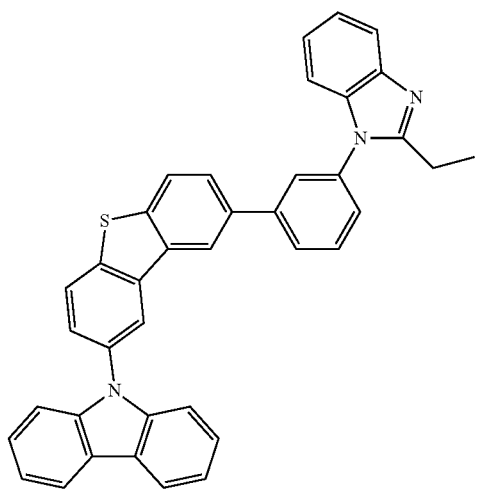

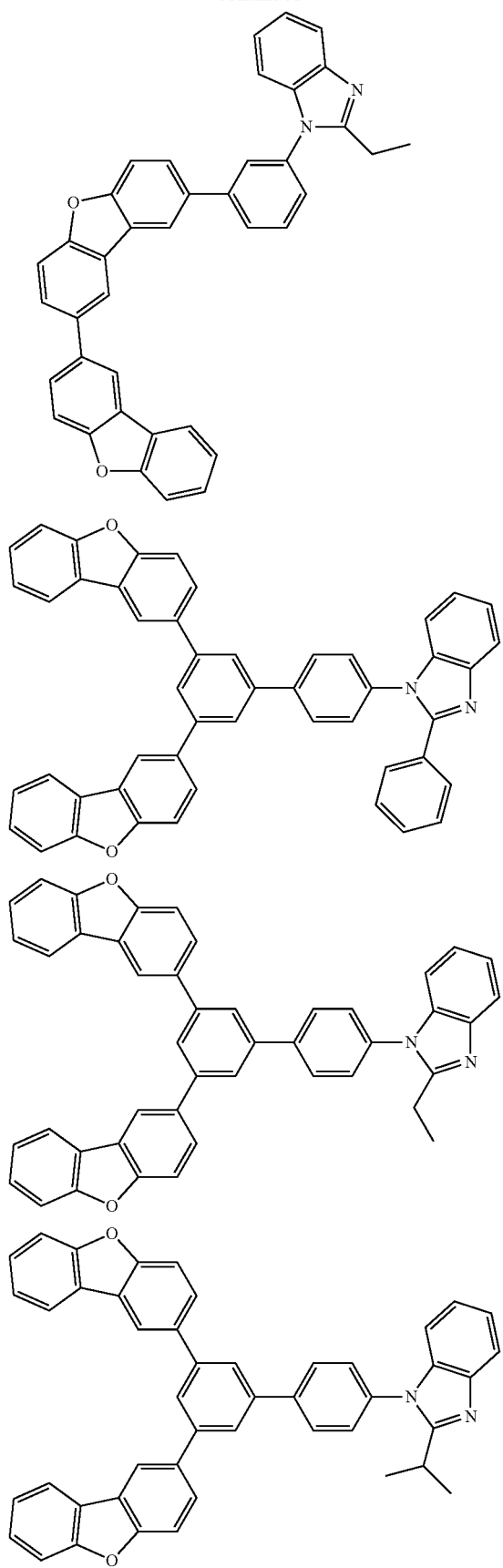
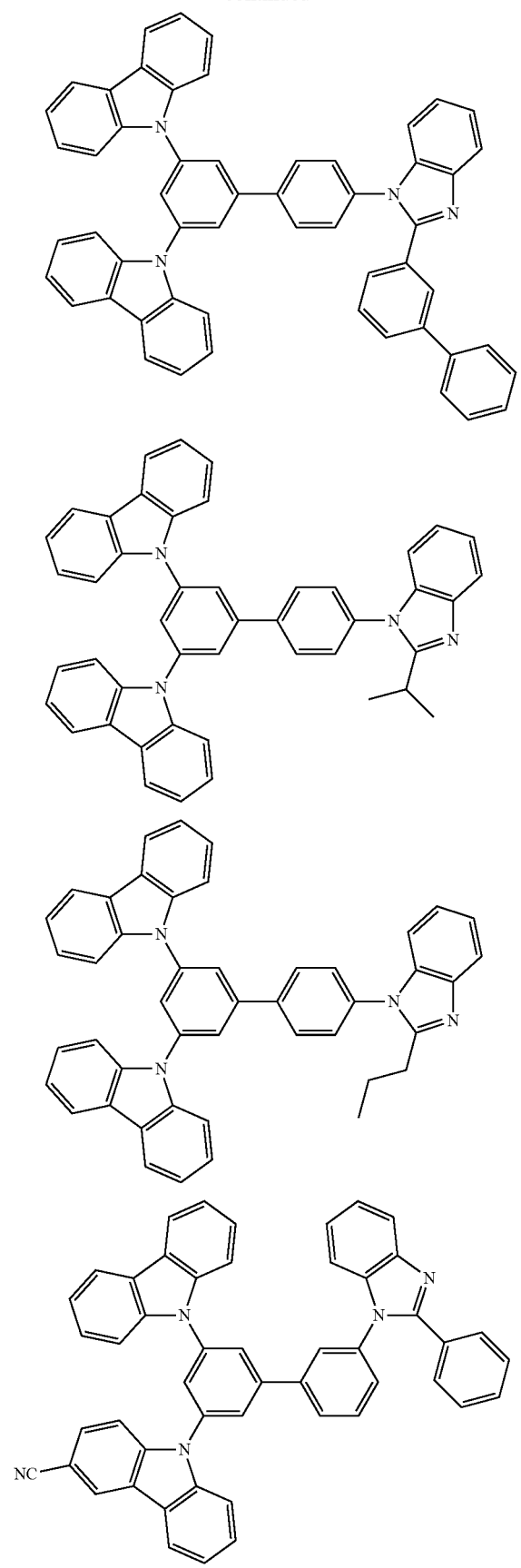

41
-continued
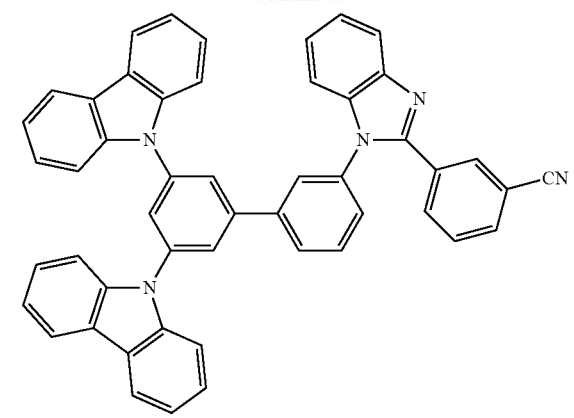
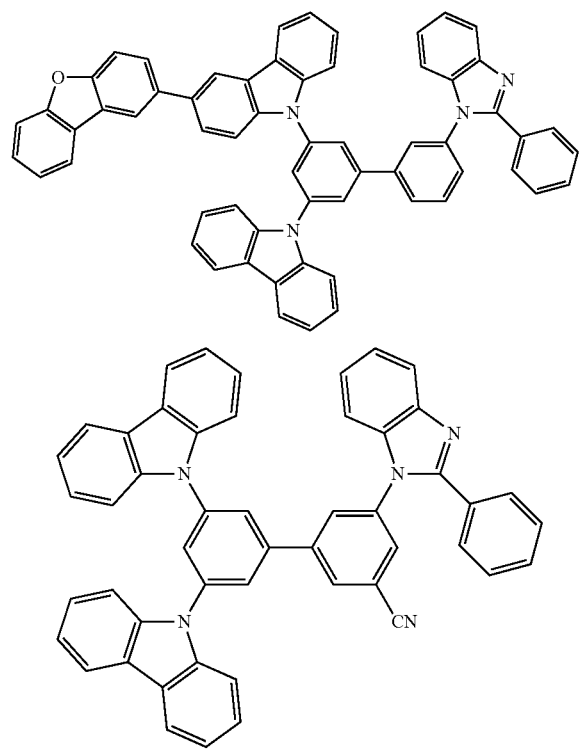
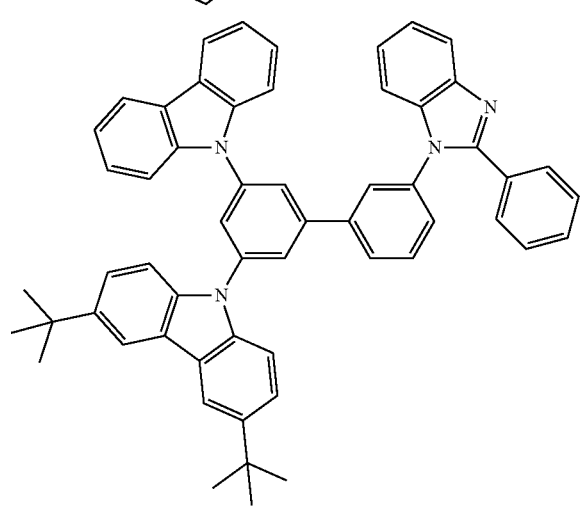
42
-continued
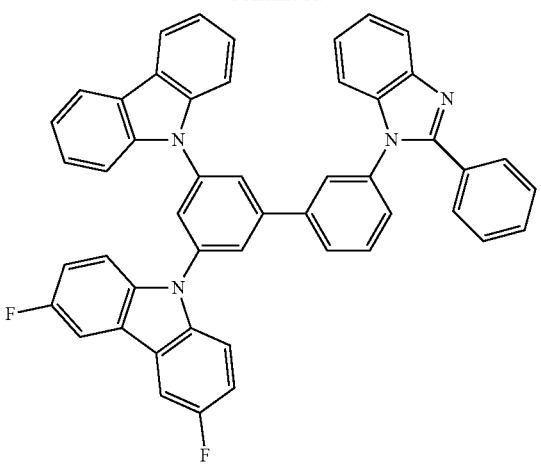
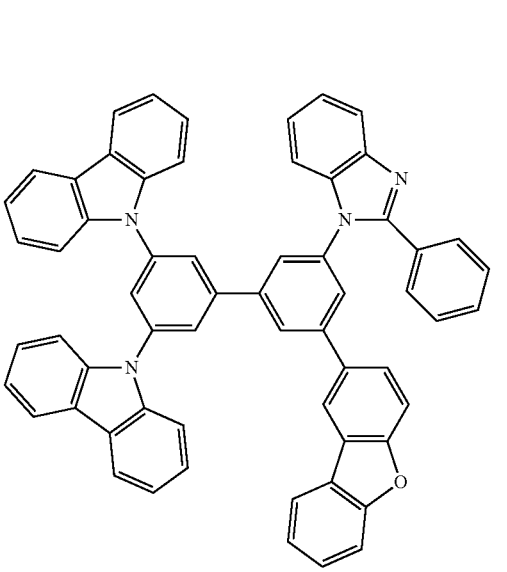
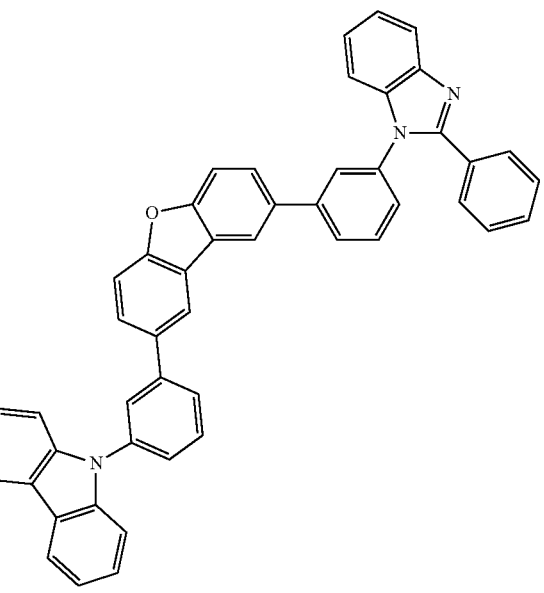

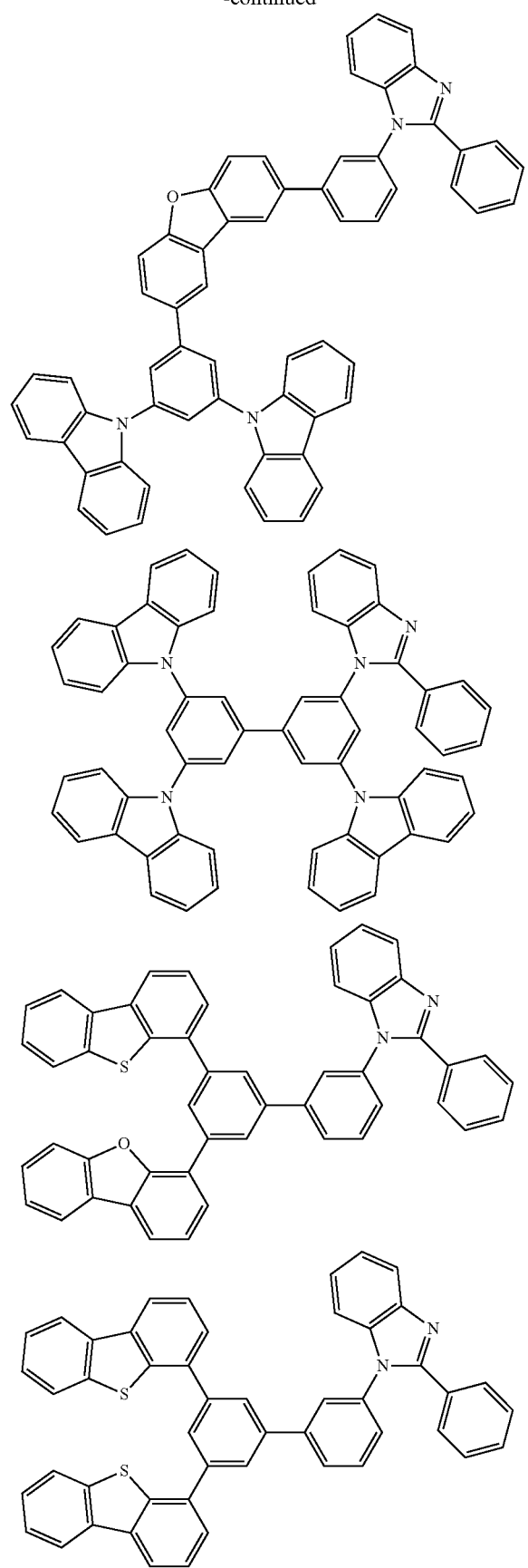
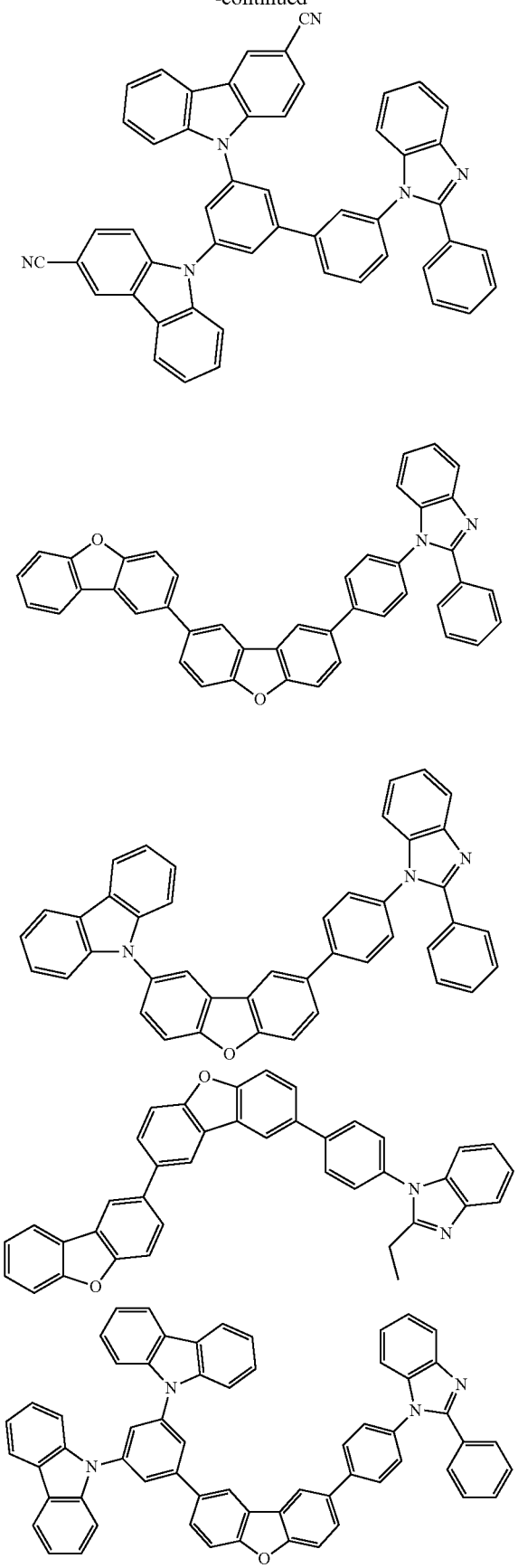

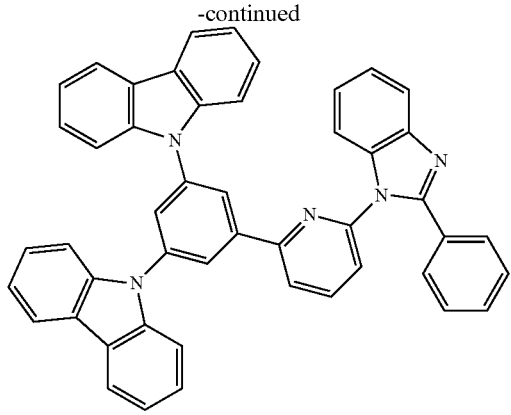
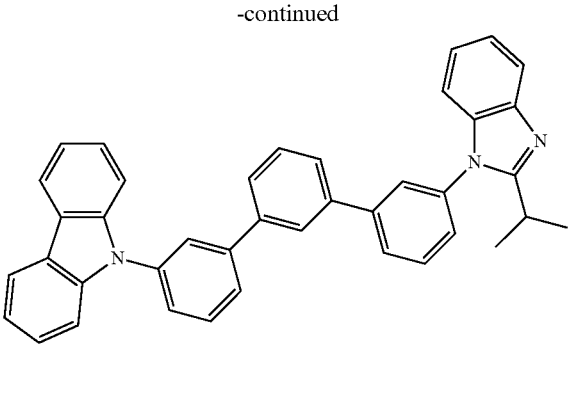
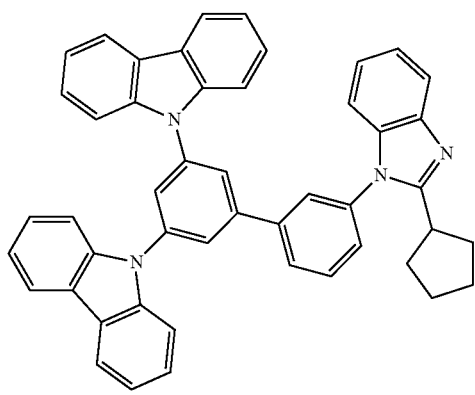
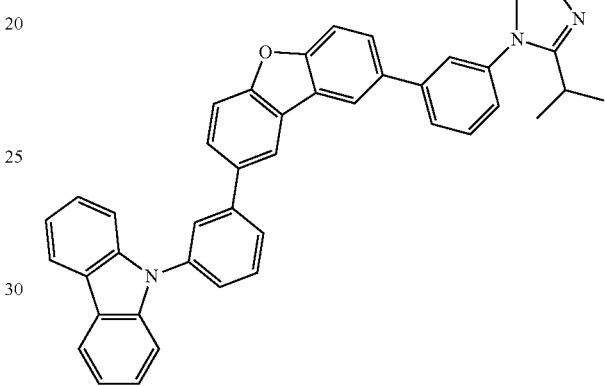
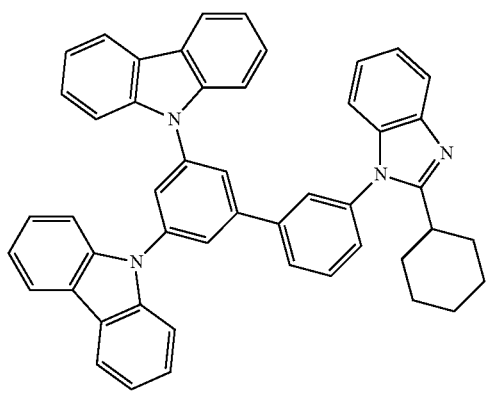
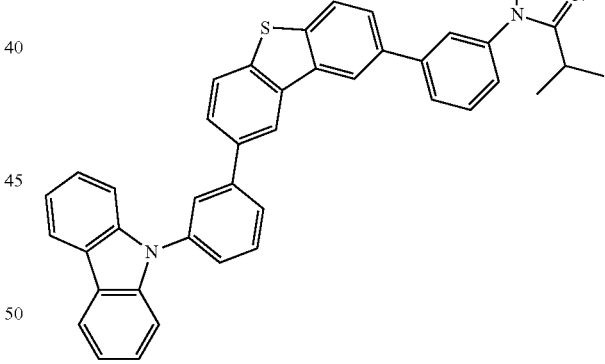
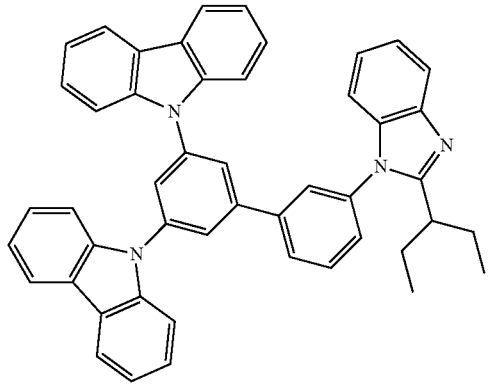
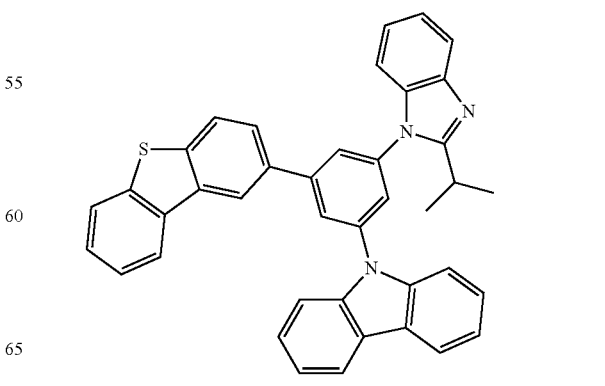

47
-continued
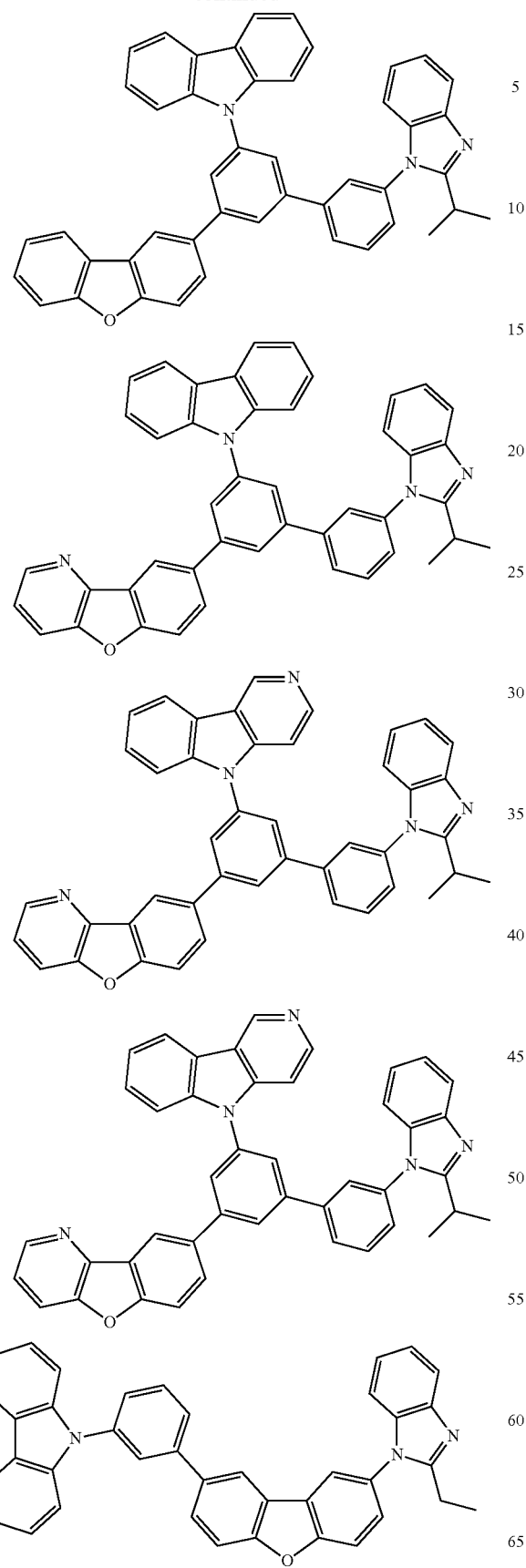
48
-continued
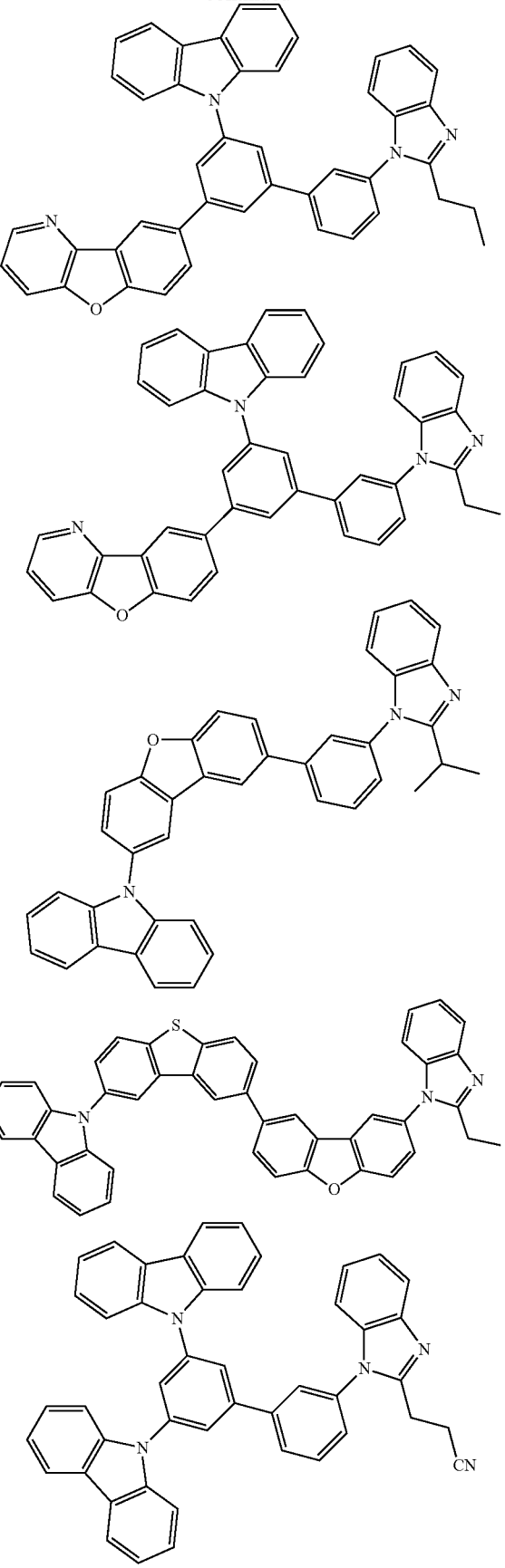

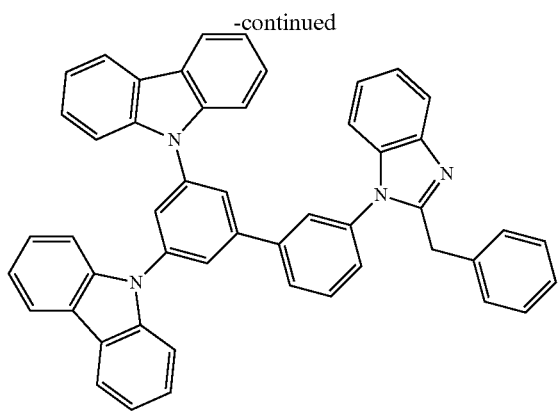

The compound represented by the formula (A) can be produced by a known method. For example, it can be produced by a method described in JP-A-2009-155300, JP-A-2009-158848 or the like.

[Compound Represented by the Formula (1)]

The compound represented by the formula (1) is the following compound.

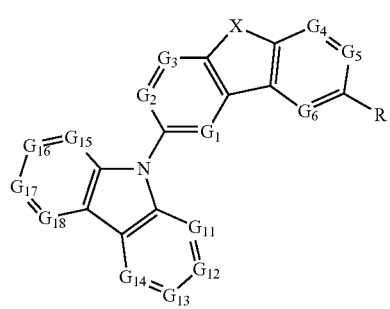

(1)

wherein
in the formula (1), $G_1$ to $G_6$ are independently C—$R_1$ or a nitrogen atom;

$G_{11}$ to $G_{18}$ are independently C—$R_2$ or a nitrogen atom;

R and $R_1$ are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbonatoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaryl oxy group having 5 to 18 ring atoms, a substituted or unsubstituted arylthio group having 6 to 18 ring carbon atoms, a substituted or unsubstituted heteroaryl thio group having 5 to 18 ring atoms, a substituted or unsubstituted arylsulfonyl group having 6 to 18 ring carbon atoms, a substituted or unsubstituted heteroaryl sulfonyl group having 5 to 18 ring atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms or a cyano group;

when plural C—$R_1$ are present, plural $R_1$ may be the same or different, provided that when $G_2$ and/or $G_5$ is C—$R_1$, $R_1$ of $G_2$ and $G_5$ are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted silyl group, a fluorine atom, a substituted or unsubstituted fluoroalkyl group having 1 to 20 carbon atoms, or a substituted or unsubstituted fluoroalkoxy group having 1 to 20 carbon atoms;

$R_2$ are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms or a cyano group;

when plural C—$R_2$ are present, plural $R_2$ may be the same or different;

when R, $R_1$ and $R_2$ have a substituent, the substituent R' is a hydrogen atom, an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aromatic hydrocarbon ring group having 6 to 18 ring carbon atoms, an aryloxy group having 6 to 18 ring carbon atoms, a heteroaromatic ring group having 5 to 18 ring atoms, a silyl group, a fluorine atom, a fluoroalkyl group having 1 to 20 carbon atoms, a fluoroalkoxy group having 1 to 20 carbon atoms or a cyano group; and X is an oxygen atom or a sulfur atom.

The compound represented by the formula (1) is preferably any of compounds represented by the following formulas (2a) to (2c), (3a) to (3c) and (4).

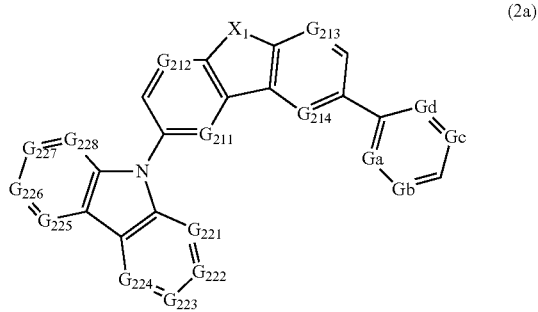

(2a)

-continued (2b)

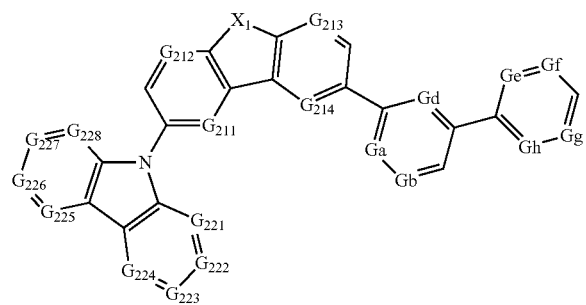

(2c)

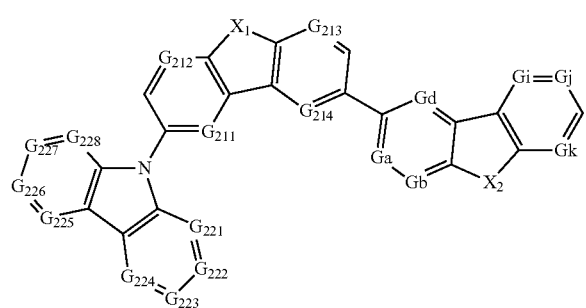

wherein
in the formulas (2a) to (2c), $G_{211}$ to $G_{214}$ are independently C—$R_{21}$ or a nitrogen atom;
$G_{221}$ to $G_{228}$ are independently C—$R_{22}$ or a nitrogen atom;
Ga to Gk are independently C—$R_{23}$ or a nitrogen atom;
$R_{21}$ are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms or a cyano group;

when plural C—$R_{21}$ are present, plural $R_{21}$ may be the same or different;

$R_{22}$ are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms or a cyano group;

when plural C—$R_{22}$ are present, plural $R_{22}$ may be the same or different;

$R_{23}$ are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms or a cyano group;

when plural C—$R_{23}$ are present, plural $R_{23}$ may be the same or different;

when $R_{21}$, $R_{22}$ and $R_{23}$ have a substituent, the substituent R' is a hydrogen atom, an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aromatic hydrocarbon ring group having 6 to 18 ring carbon atoms, an aryloxy group having 6 to 18 ring carbon atoms, a heteroaromatic ring group having 5 to 18 ring atoms, a silyl group, a fluorine atom, a fluoroalkyl group having 1 to 20 carbon atoms, a fluoroalkoxy group having 1 to 20 carbon atoms or a cyano group;

$X_1$ is an oxygen atom or a sulfur atom; and
$X_2$ is an oxygen atom, a sulfur atom or $=C(CH_3)_2$.

(3a)

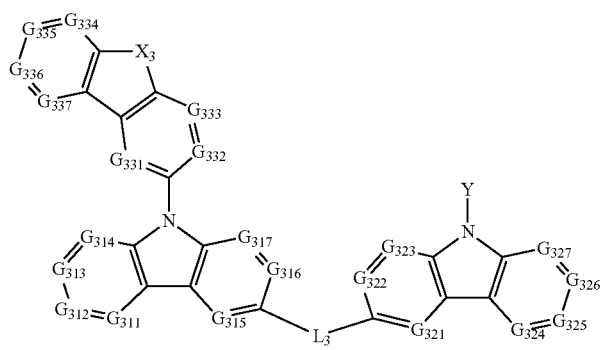

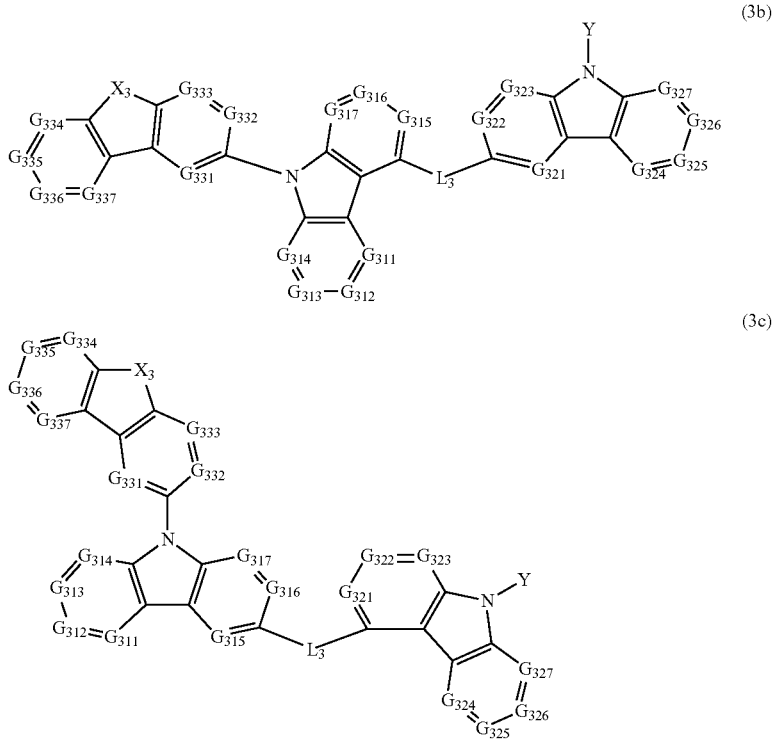

wherein
in the formulas (3a) to (3c),

Y is a substituted or unsubstituted aromatic hydrocarbon ring group having 6 to 18 ring carbon atoms, a substituted or unsubstituted monocyclic heteroaromatic ring group having 2 to 5 ring carbon atoms or a group represented by the following formula (3-1);

$G_{311}$ to $G_{317}$; $G_{321}$ to $G_{327}$ and $G_{331}$ to $G_{337}$ are independently C—$R_{31}$ or a nitrogen atom;

$R_{31}$ are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms or a cyano group;

when plural C—$R_{31}$ are present, plural $R_{31}$ may be the same or different, $L_3$ is a single bond, a divalent linkage group containing an oxygen atom, a divalent linkage group containing a silicon atom, a divalent linkage group containing a sulfur atom, an alkylene group having 1 to 5 carbon atoms, a cycloalkylene group having 3 to 6 ring carbon atoms, an aromatic hydrocarbon ring group having 6 to 18 ring carbon atoms or a heteroaromatic ring group having 5 to 18 ring atoms;

when $R_{31}$ has a substituent, the substituent R' is a hydrogen atom, an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aromatic hydrocarbon ring group having 6 to 18 ring carbon atoms, an aryloxy group having 6 to 18 ring carbon atoms, a heteroaromatic ring group having 5 to 18 ring atoms, a silyl group, a fluorine atom, a fluoroalkyl group having 1 to 20 carbon atoms, a fluoroalkoxy group having 1 to 20 carbon atoms or a cyano group; and $X_3$ is an oxygen atom or a sulfur atom.

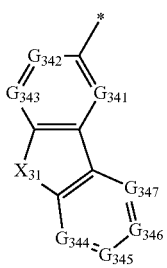

wherein
in the formula (3-1),

* is a bonding with a nitrogen atom;

$G_{341}$ to $G_{347}$ are independently C—$R_{31}$ or a nitrogen atom, and $R_{31}$ is the same as $R_{31}$ in the formulas (3a) to (3c); and $X_{31}$ is a nitrogen atom, an oxygen atom or a sulfur atom which has a substituent.

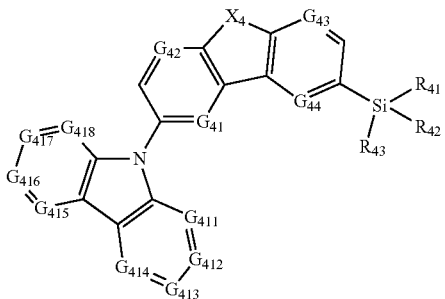

(4)

wherein
in the formula (4), $R_{41}$, $R_{42}$ and $R_{43}$ are independently a substituted or unsubstituted alkyl group having 1 to 20 carbon atoms, a substituted or unsubstituted cycloalkyl group having 3 to 20 ring carbon atoms, a substituted or unsubstituted aromatic hydrocarbon group having 6 to 18 ring carbon atoms, or a substituted or unsubstituted heteroaromatic ring group having 5 to 18 ring atoms;

$R_{41}$, $R_{42}$ and $R_{43}$ may be directly bonded to each other to form a ring, may be bonded to each other through an oxygen atom to form a ring, may be bonded to each other through a sulfur atom to form a ring, or may be bonded to each other through a silicon atom to form a ring;

$G_{41}$ to $G_{44}$ are independently C—$R_{44}$ or a nitrogen atom;

$R_{44}$ is a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms or a cyano group;

when plural C—$R_{44}$ are present, plural $R_{44}$ may be the same or different;

$G_{411}$ to $G_{418}$ are independently C—$R_{45}$ or a nitrogen atom;

$R_{45}$ is a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms or a cyano group;

when plural C—$R_{45}$ are present, plural $R_{45}$ may be the same or different;

when $R_{41}$, $R_{42}$, $R_{43}$, $R_{44}$ and $R_{45}$ have a substituent, the substituent R' is a hydrogen atom, an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aromatic hydrocarbon ring group having 6 to 18 ring carbon atoms, an aryloxy group having 6 to 18 ring carbon atoms, a heteroaromatic ring group having 5 to 18 ring atoms, a silyl group, a fluorine atom, a fluoroalkyl group having 1 to 20 carbon atoms, a fluoroalkoxy group having 1 to 20 carbon atoms or a cyano group; and $X_4$ is an oxygen atom or a sulfur atom.

It is preferred that the compounds represented by the formulas (1), (2a) to (2c), (3a) to (3c) and (4) have a triplet energy of 2.9 eV or more.

Specific examples of the compound represented by the formulas (1), (2a) to (2c), (3a) to (3c) and (4) are given below. However, the compounds represented by the formulas (1), (2a) to (2c), (3a) to (3c) and (4) are not limited to the following specific examples.

X is an oxygen atom or a sulfur atom.

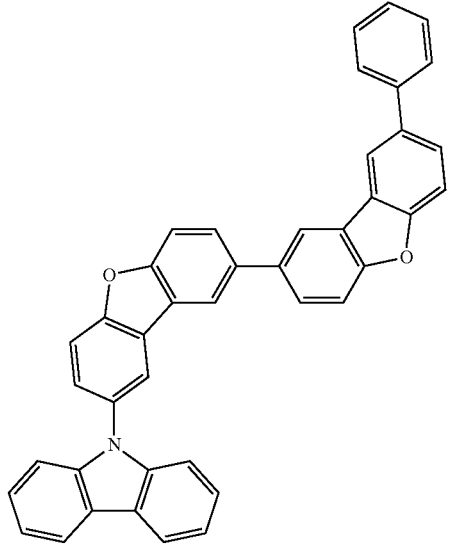

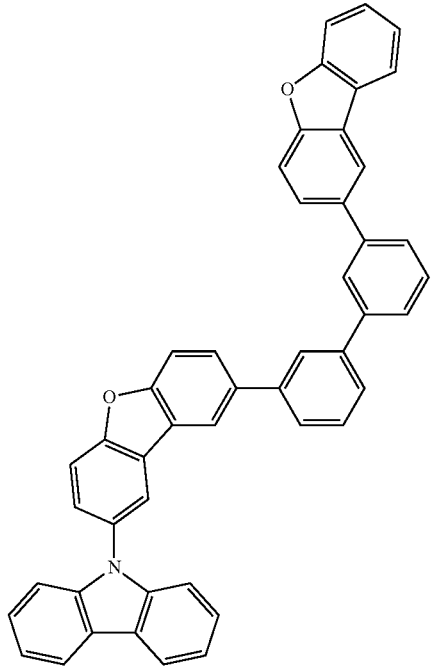

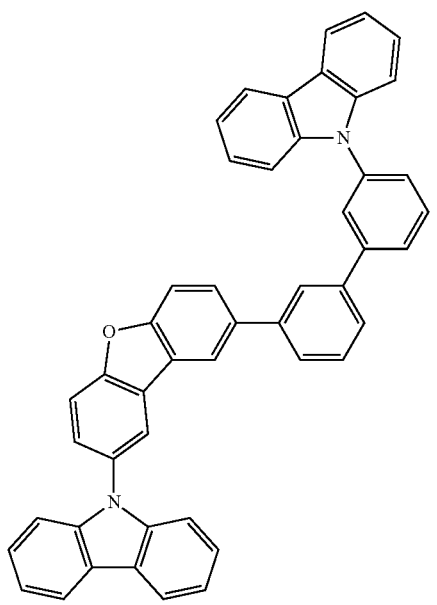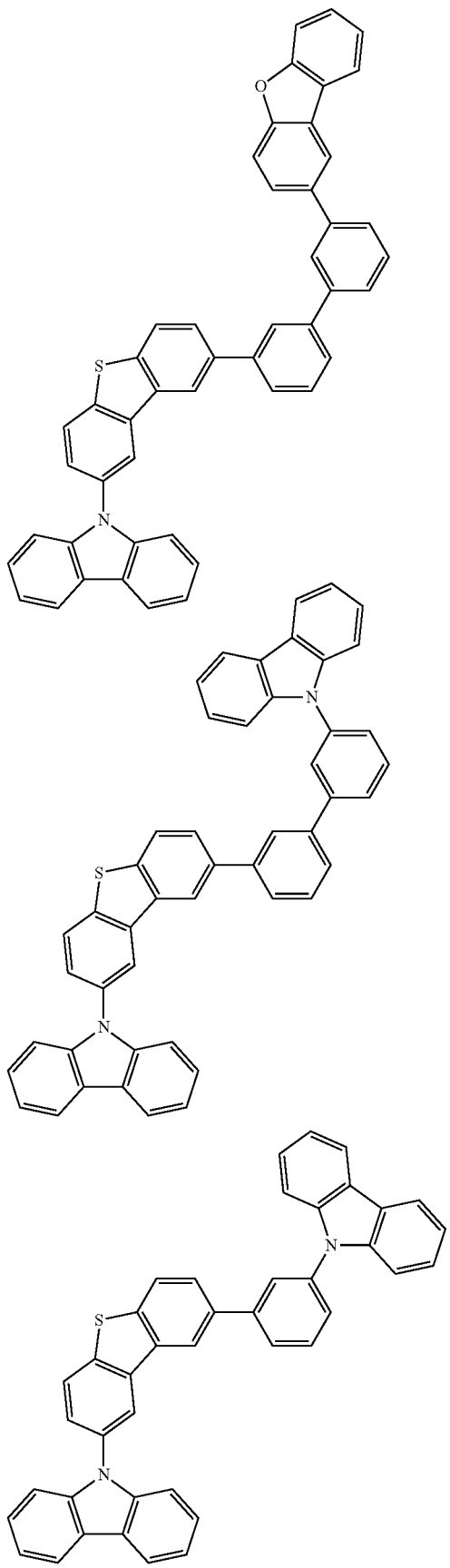

59
-continued
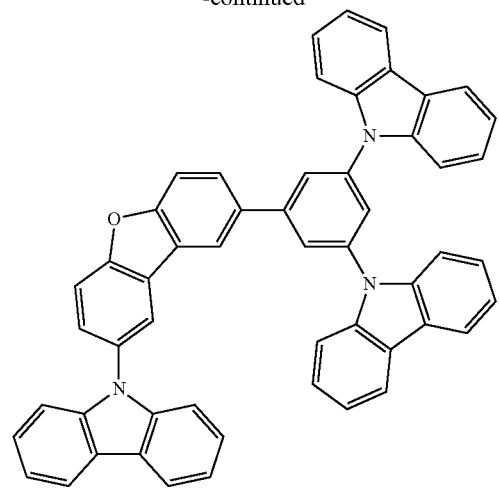
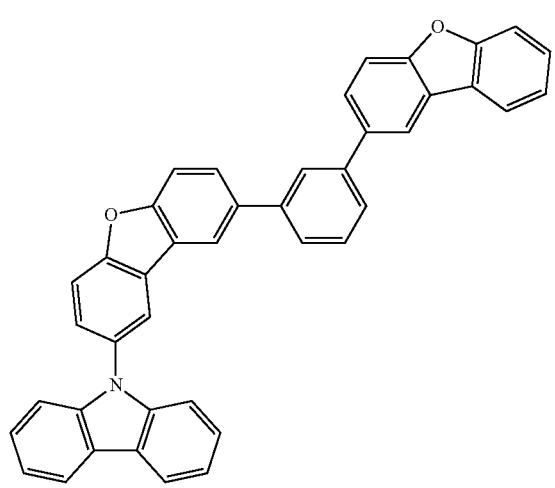
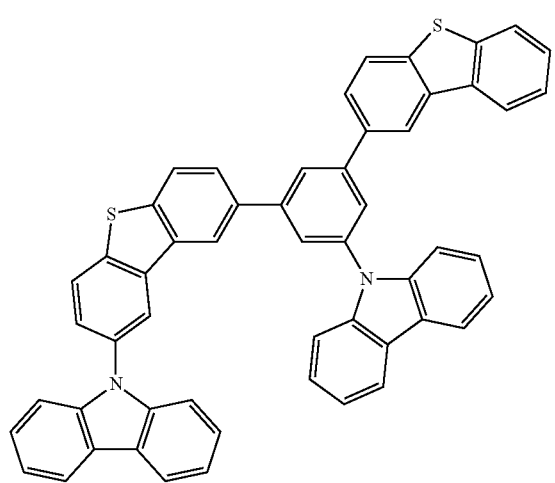
60
-continued
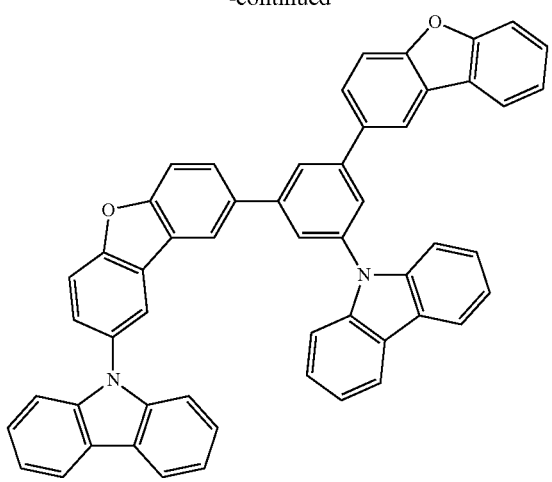
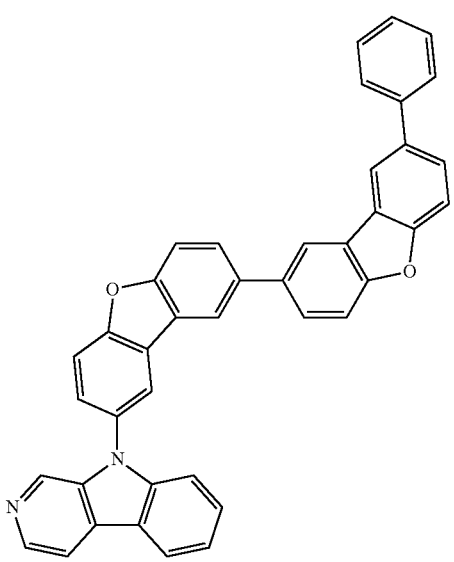
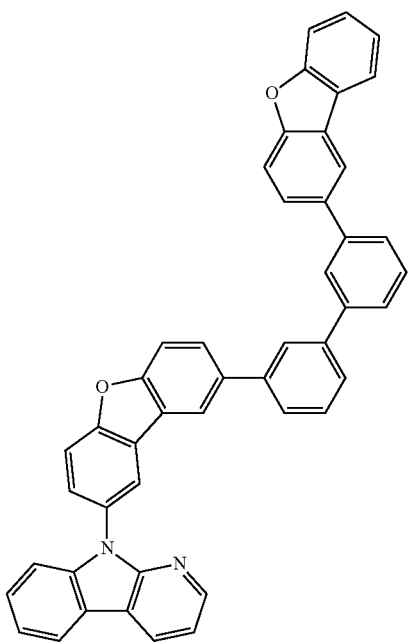

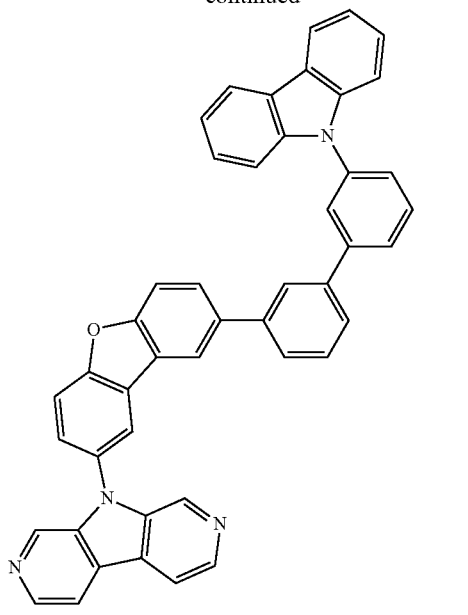
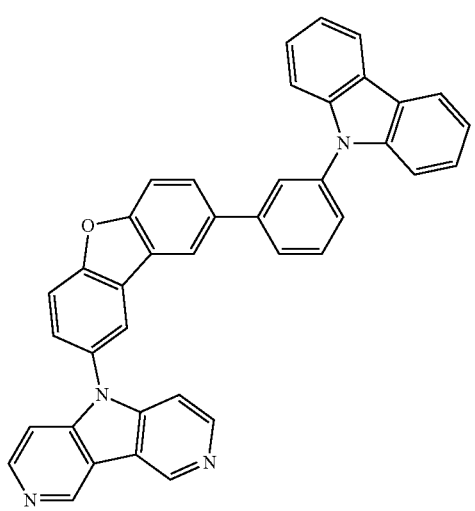
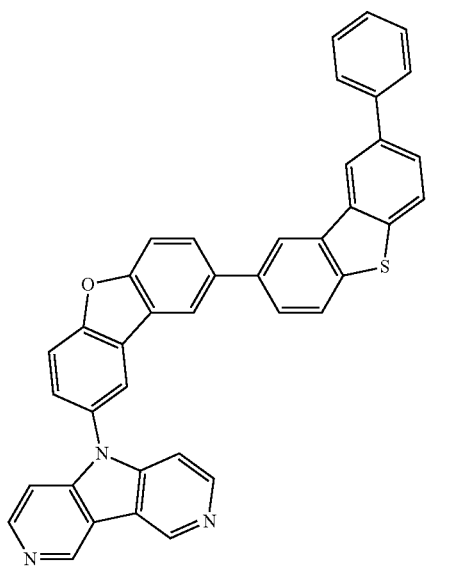
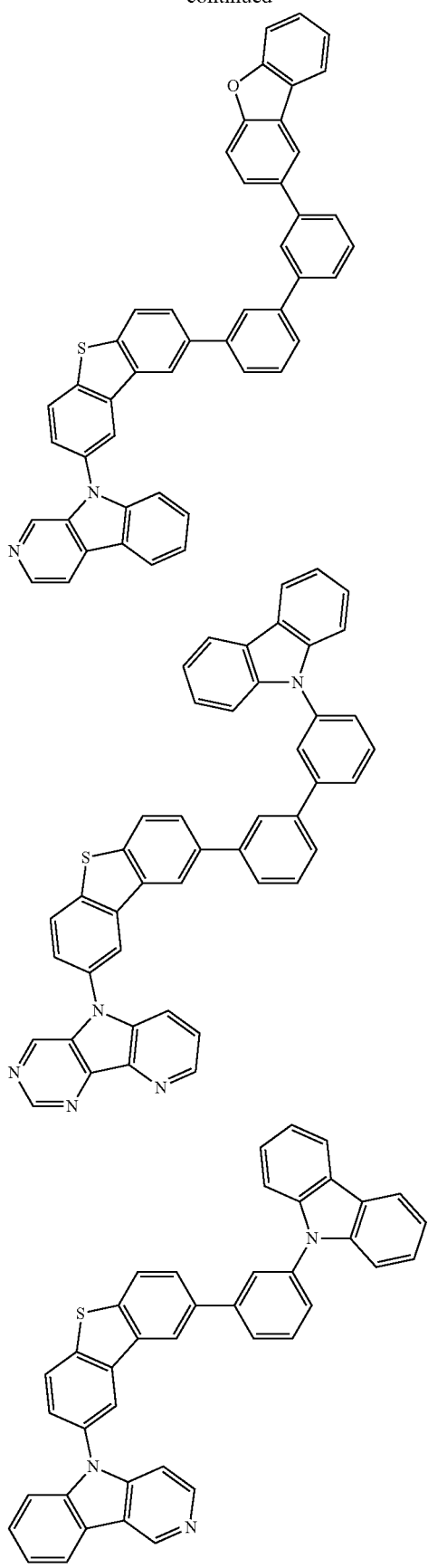

63
-continued
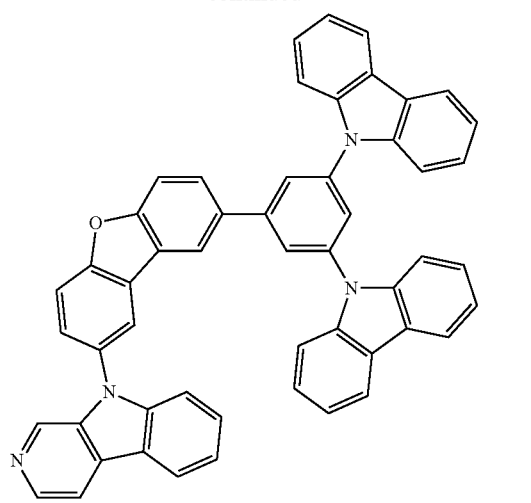
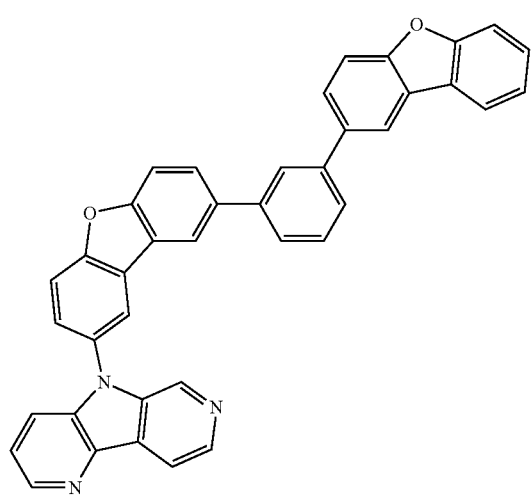
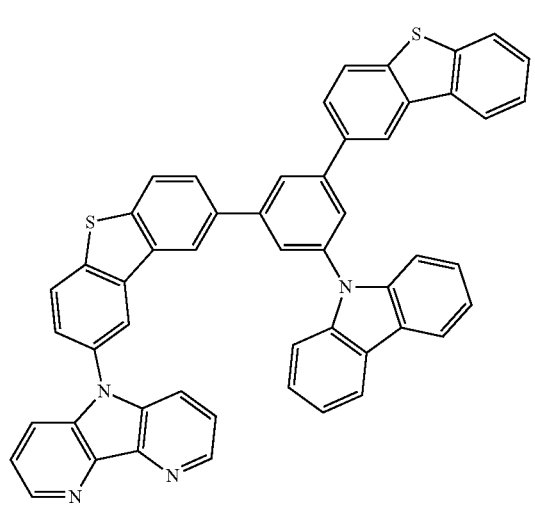
64
-continued
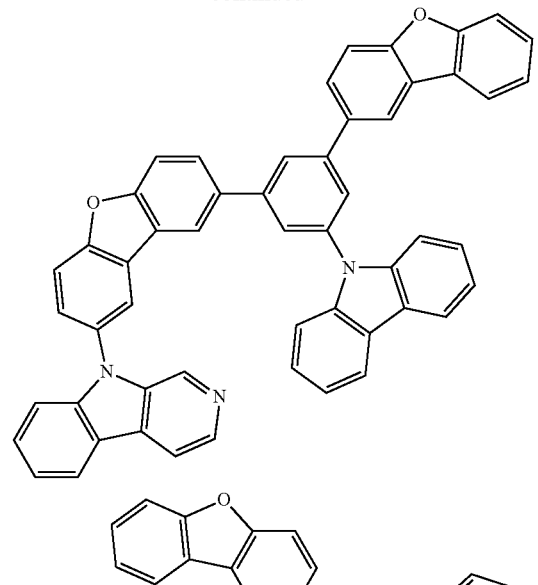
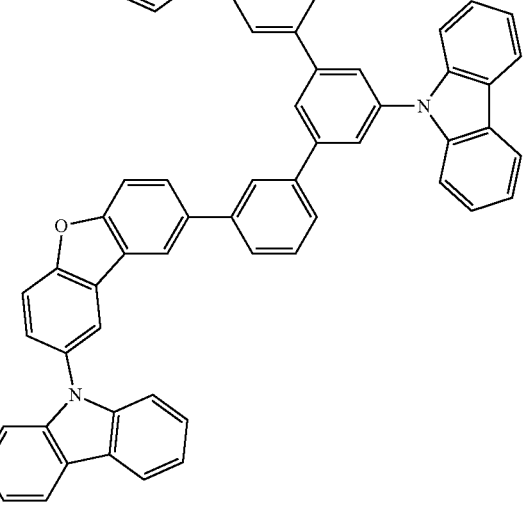
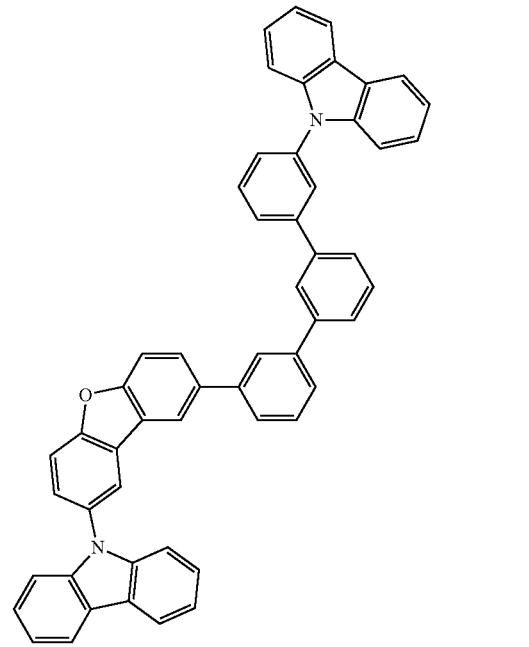

65
-continued
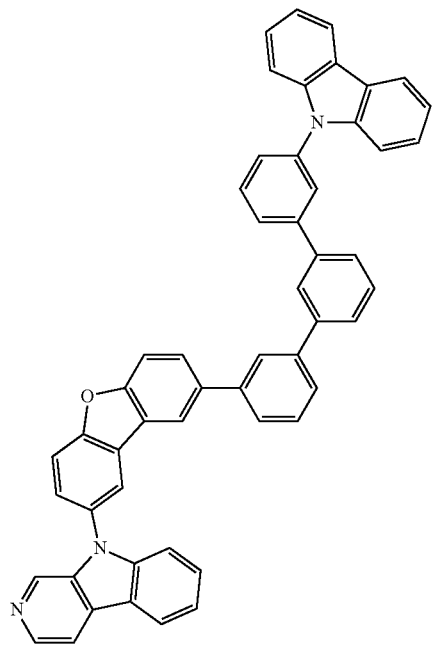
66
-continued
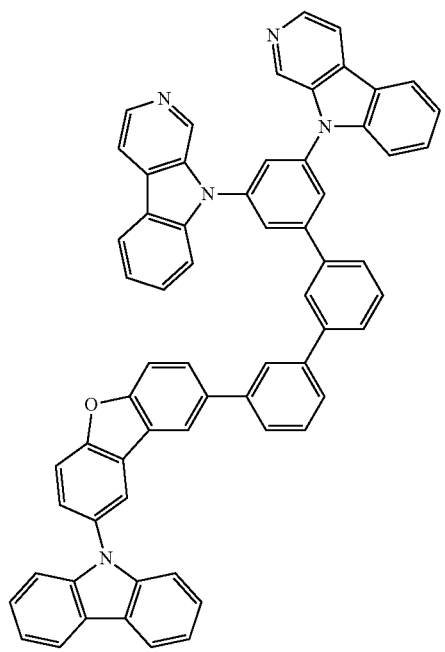
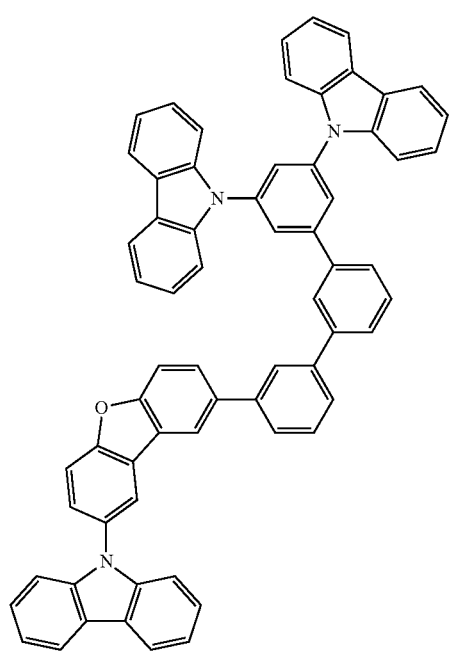
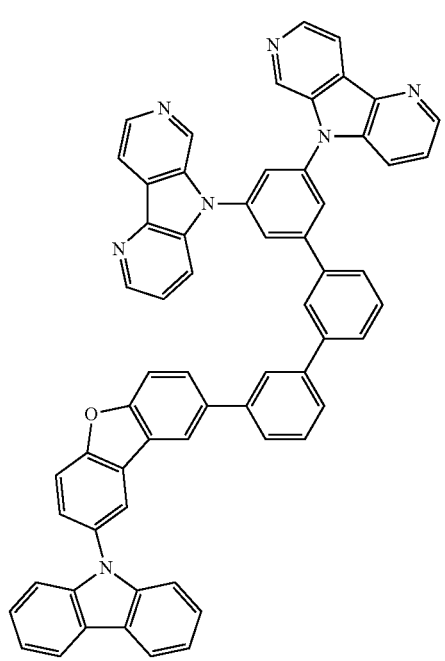

67
-continued
68
-continued
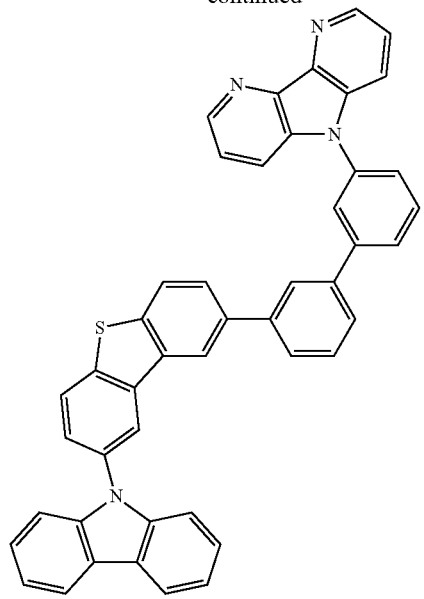
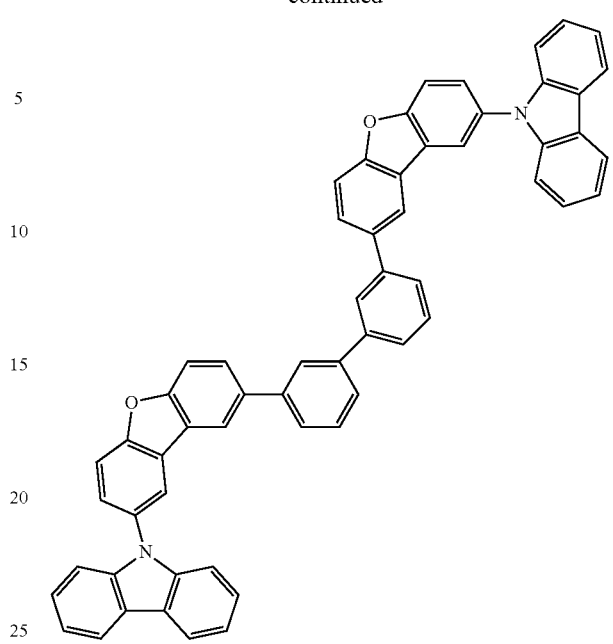
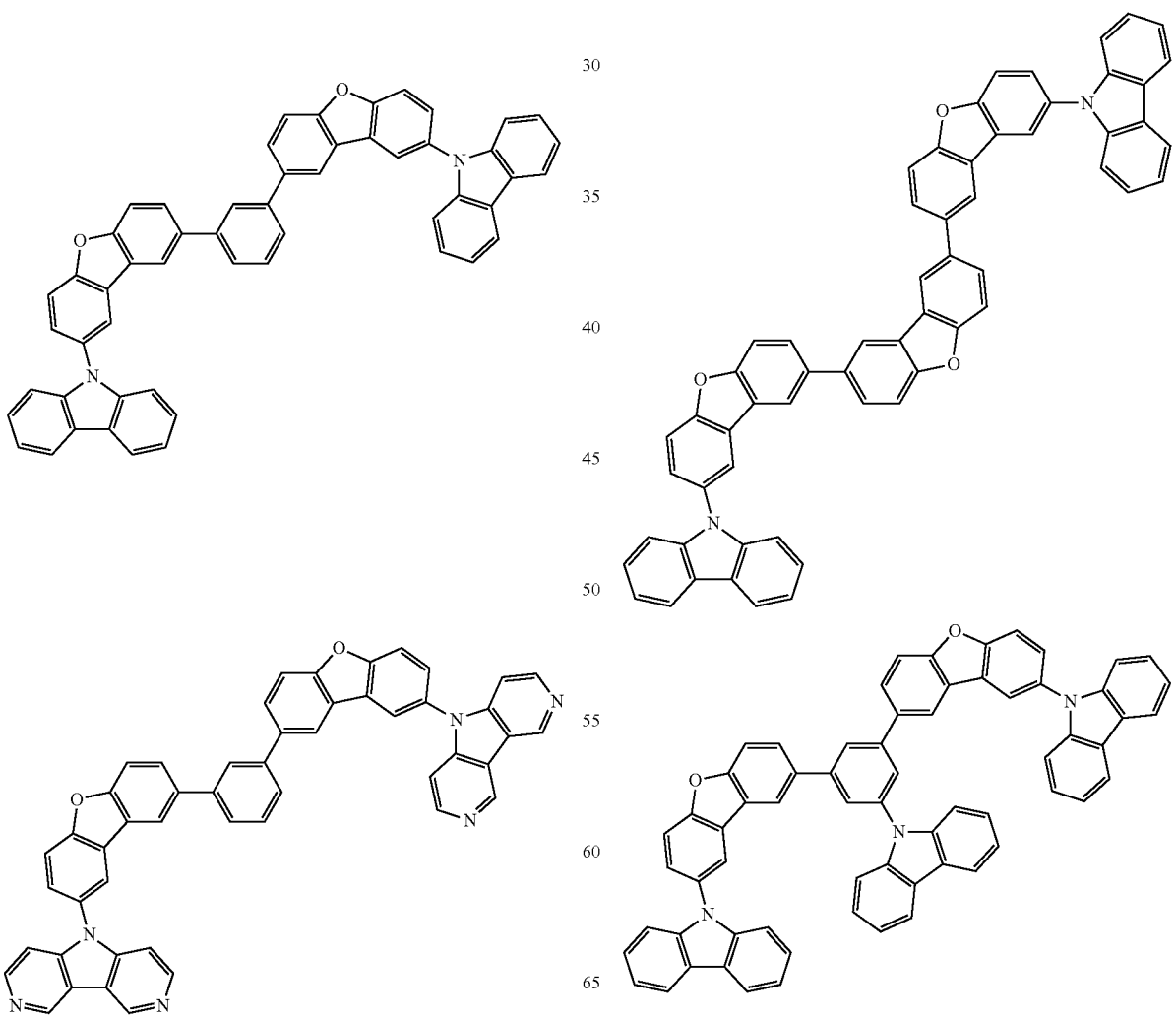

| 69 -continued | 70 -continued |
|---|---|
| 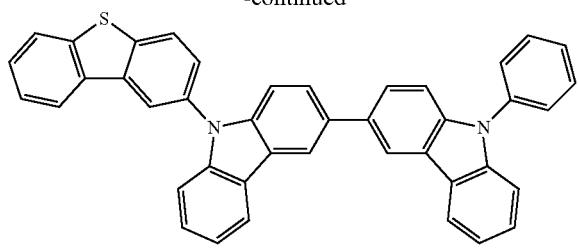 | 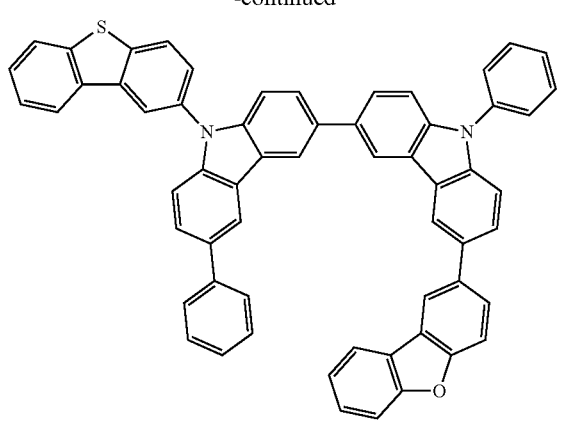 |
| 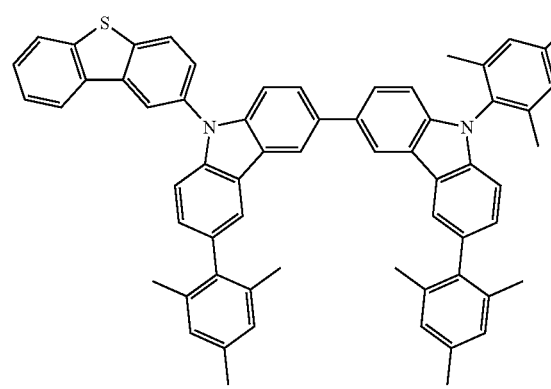 | 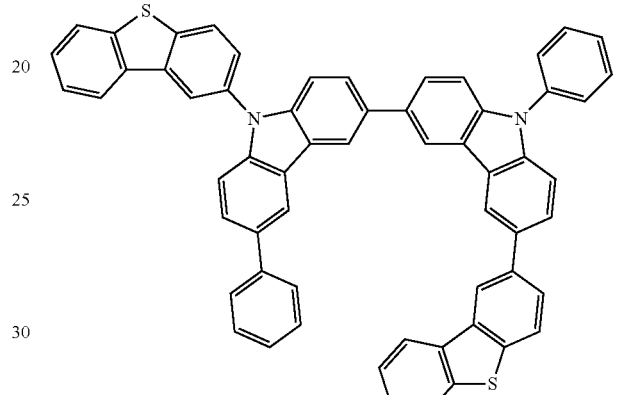 |
| 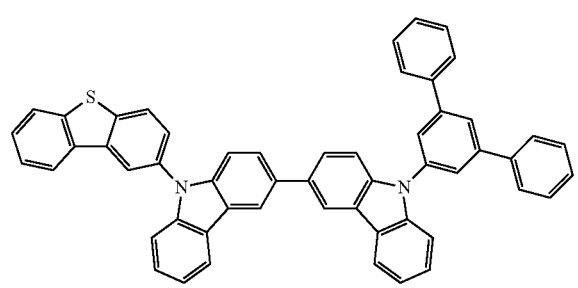 | 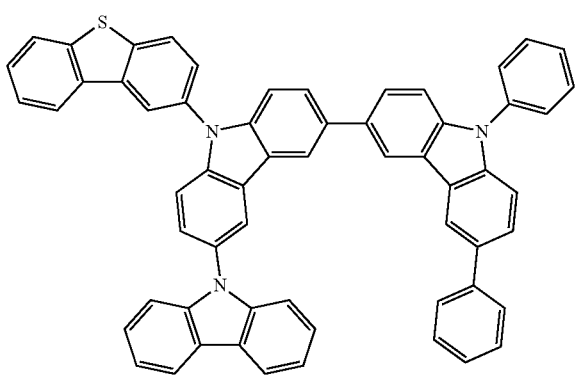 |
| 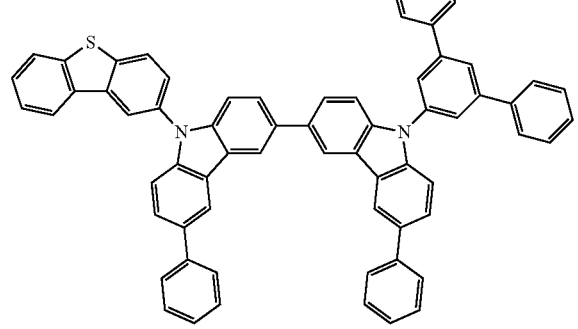 | 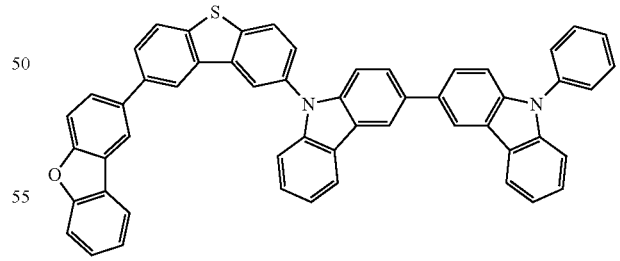 |
| 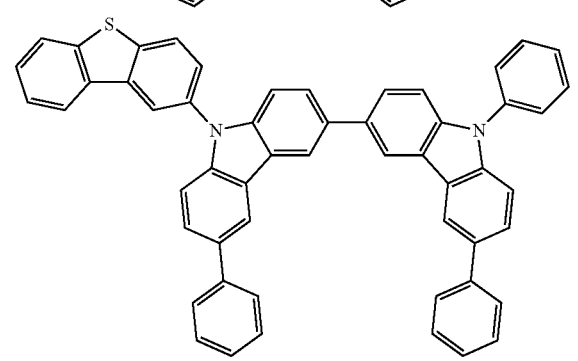 | 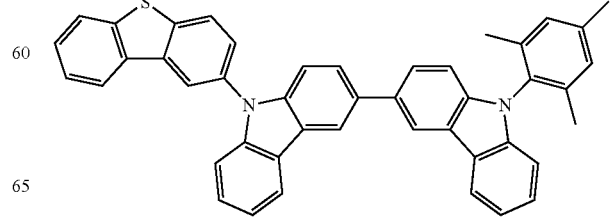 |

71
-continued
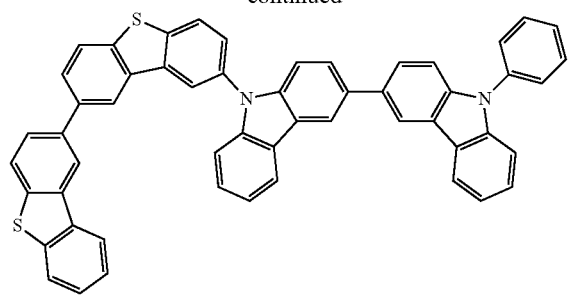
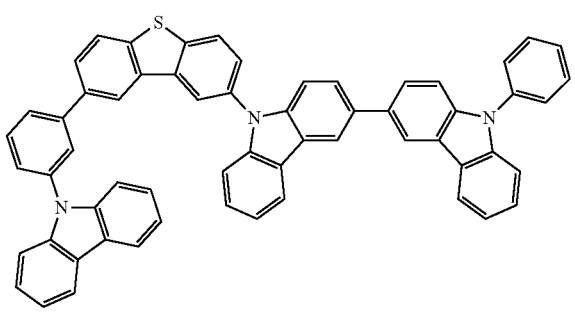
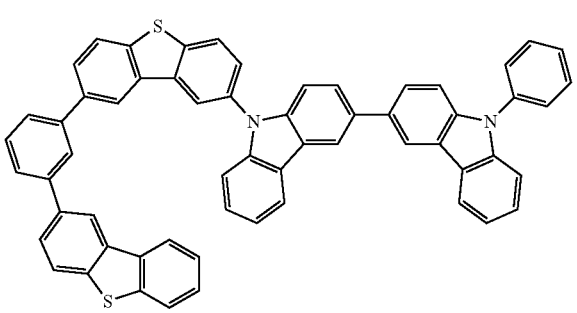
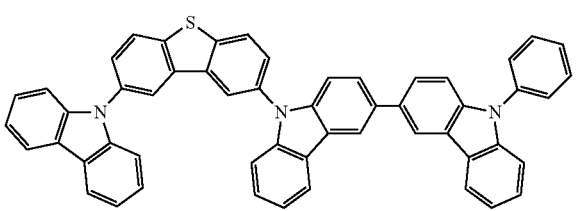
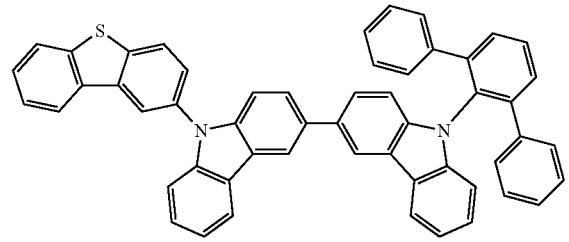
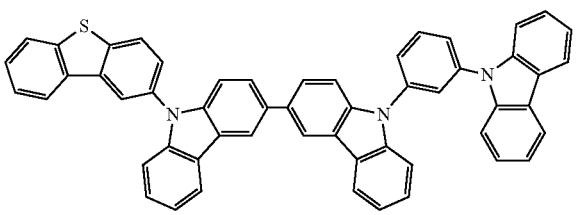
72
-continued
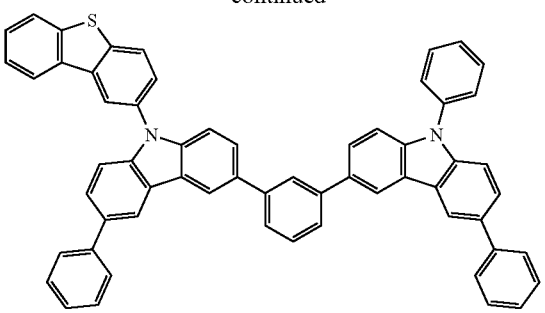
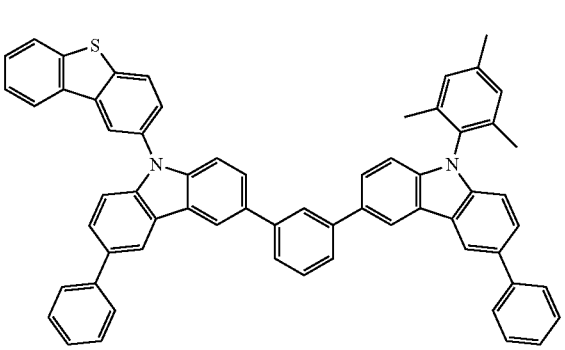
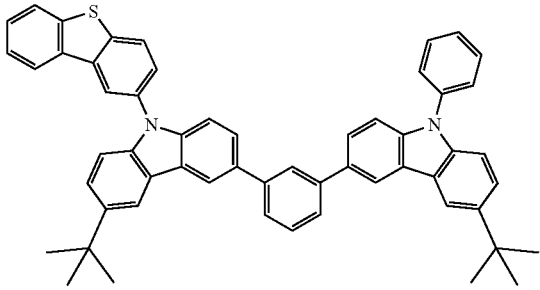
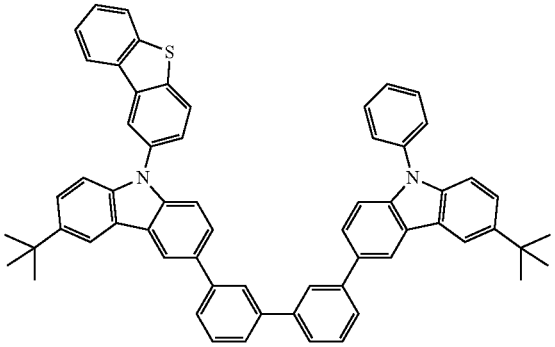
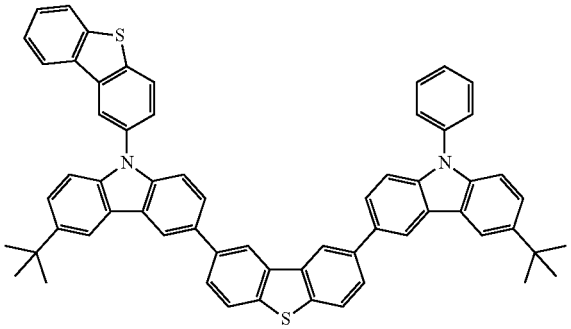

73
-continued
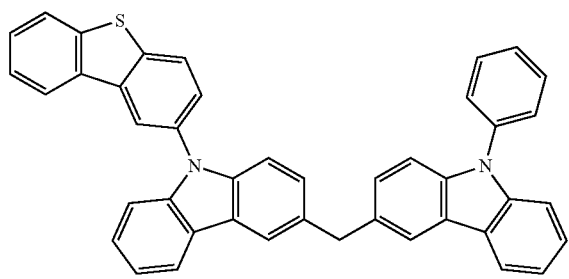
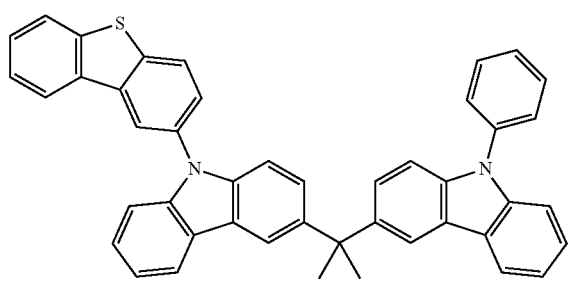
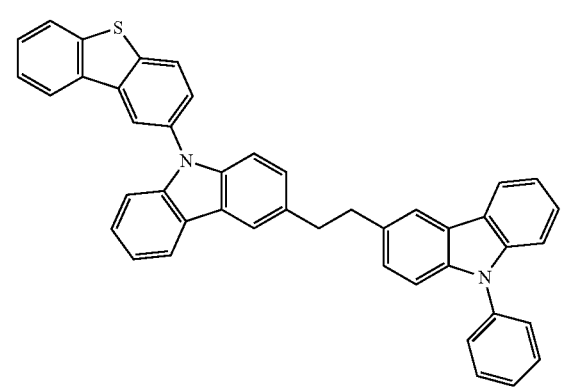
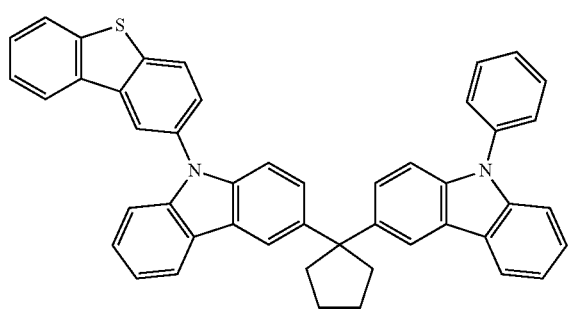
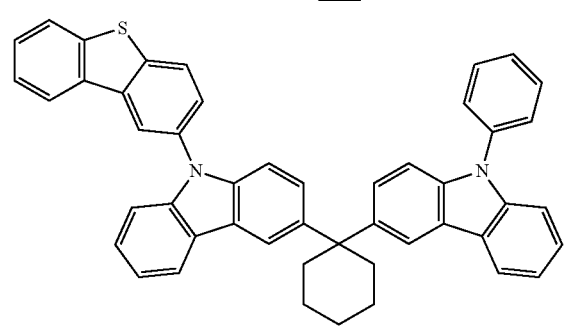
74
-continued
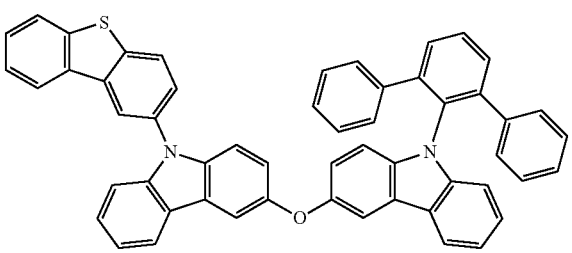
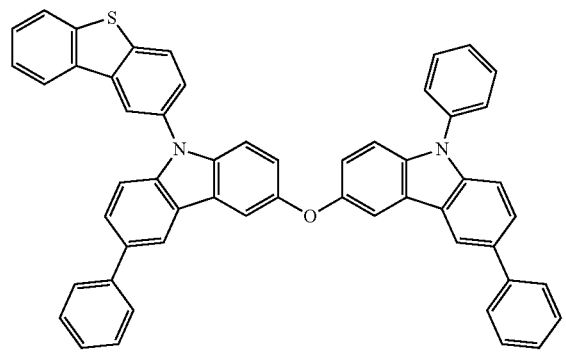
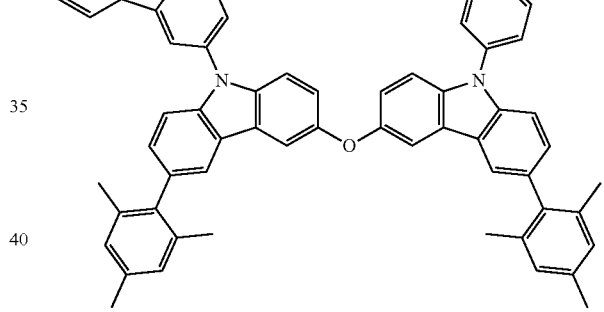
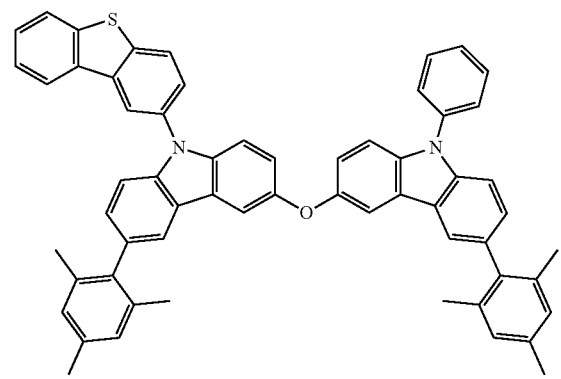
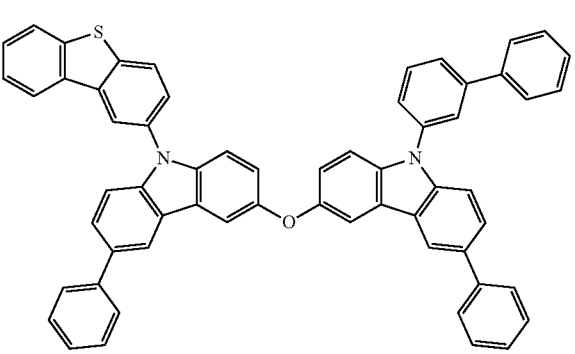
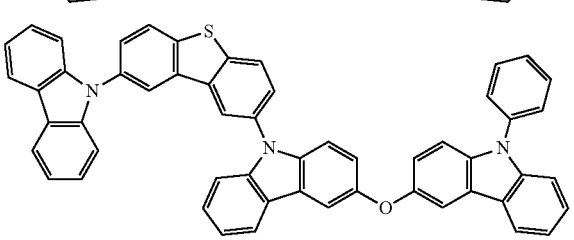

75
-continued
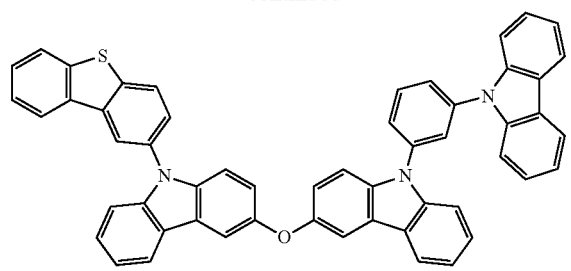
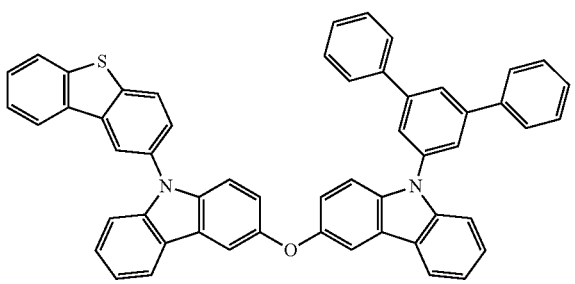
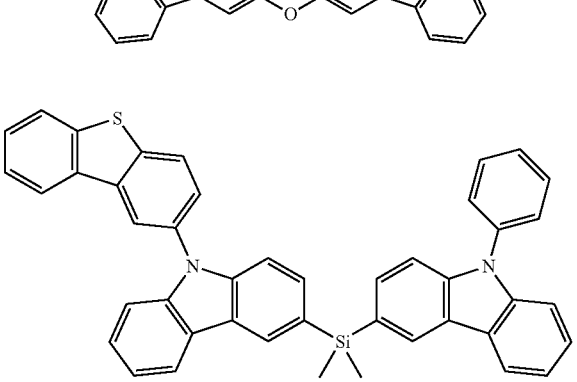
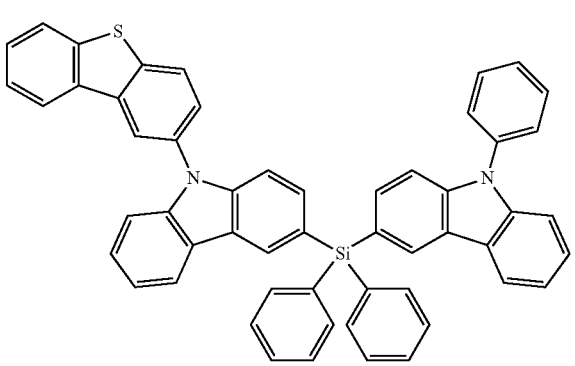
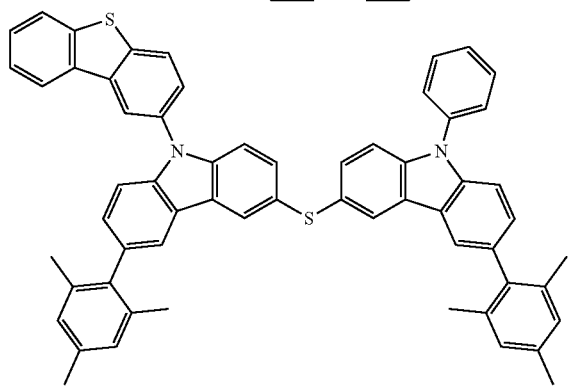
76
-continued
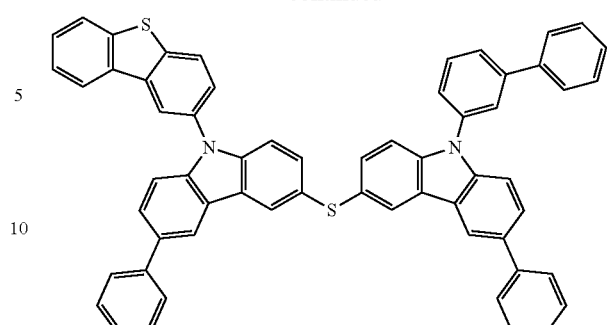
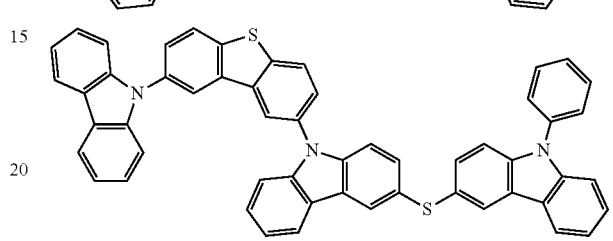
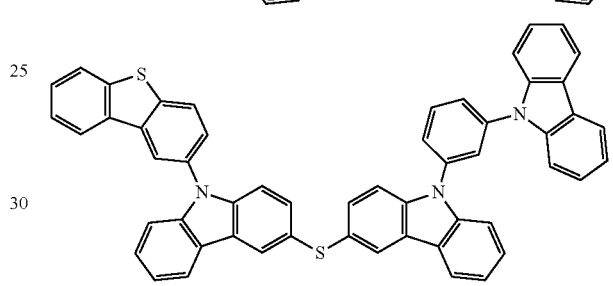
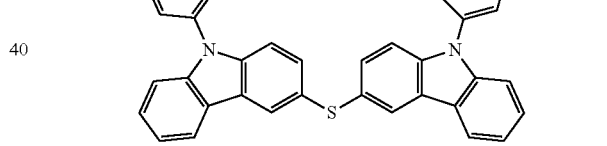
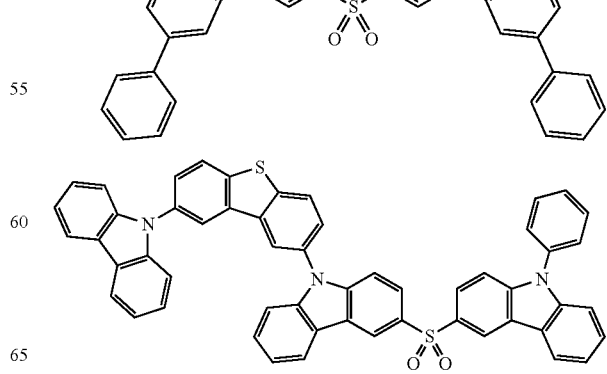

77
-continued
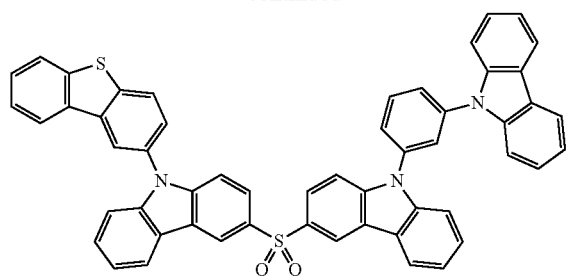
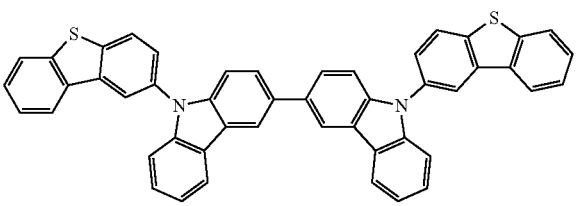
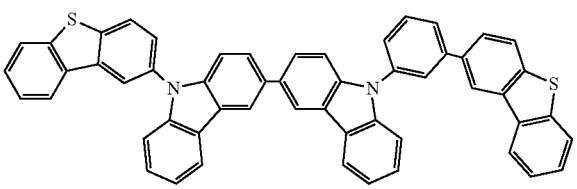
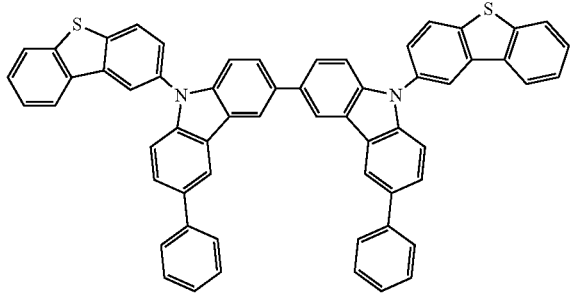
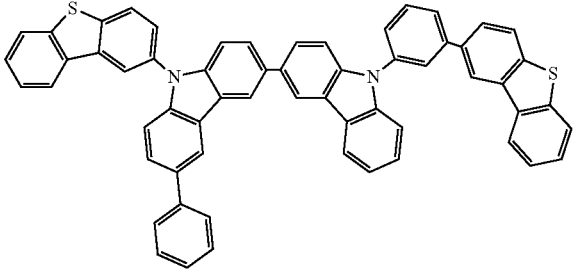
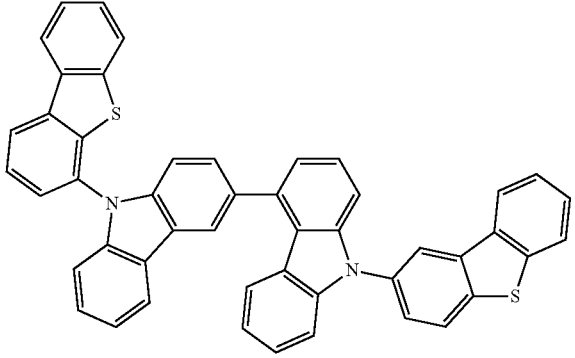
78
-continued
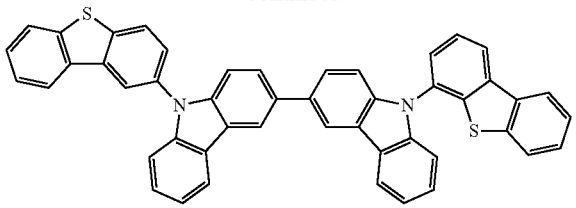
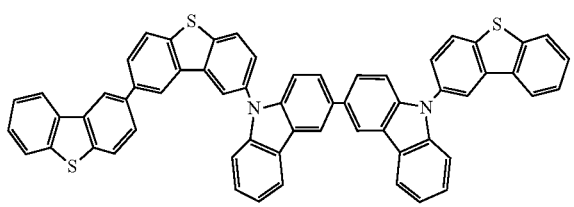
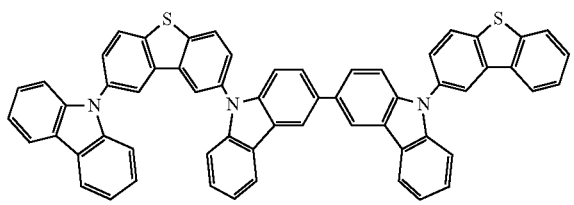
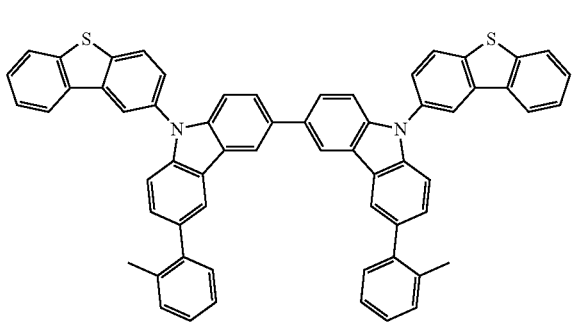
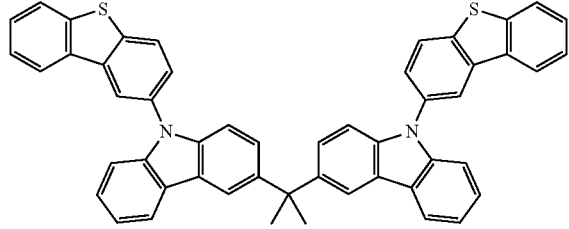
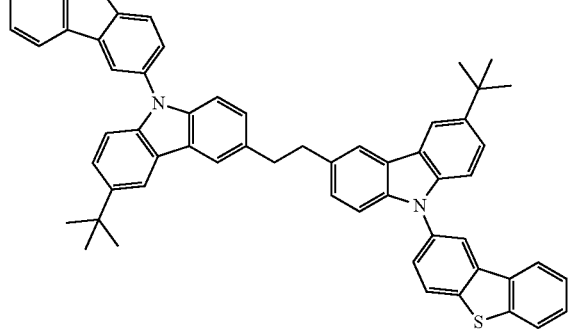

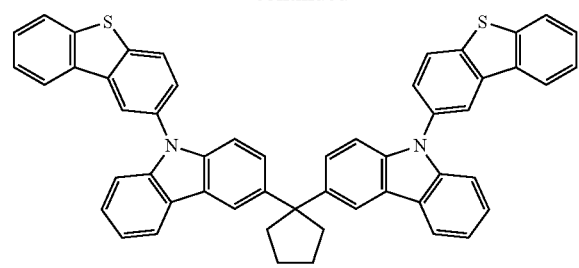
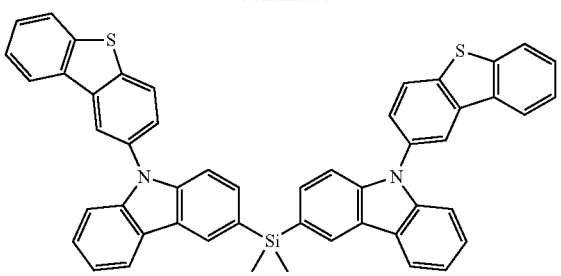
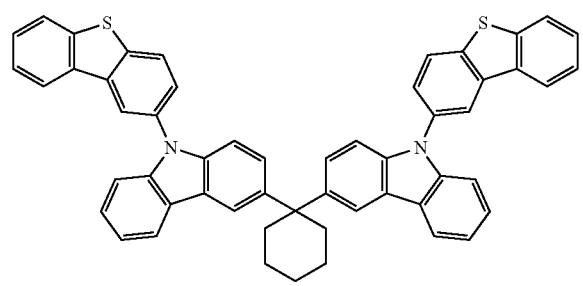
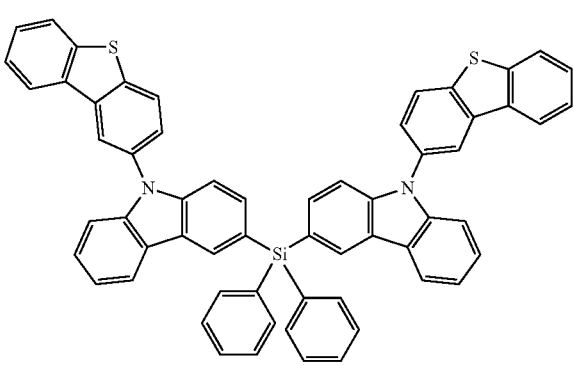
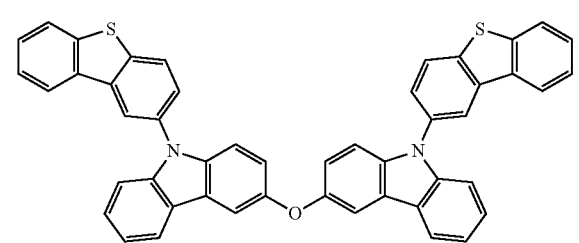
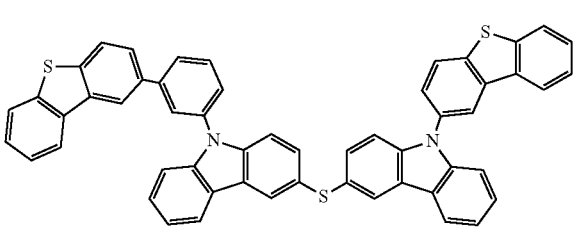
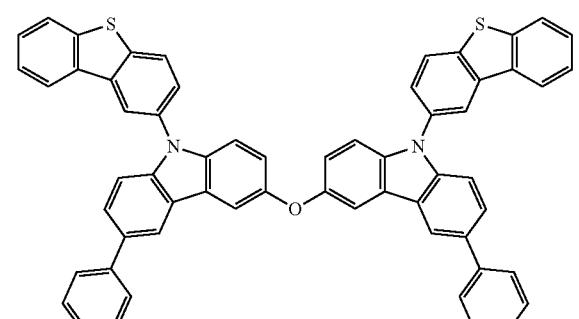
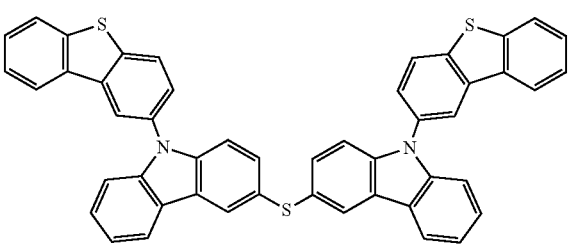
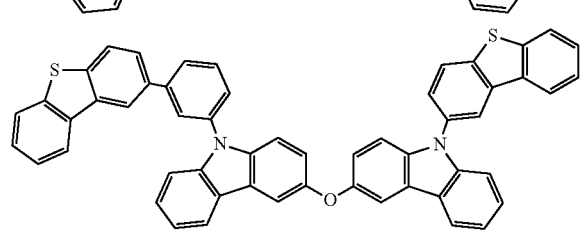
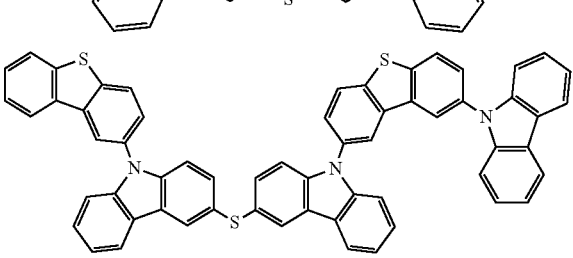
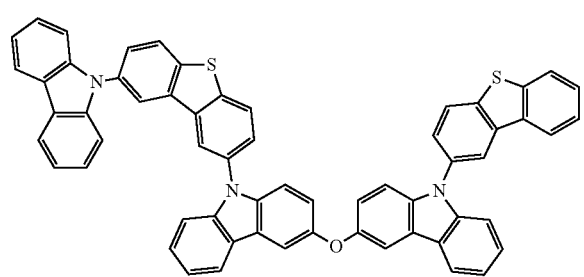
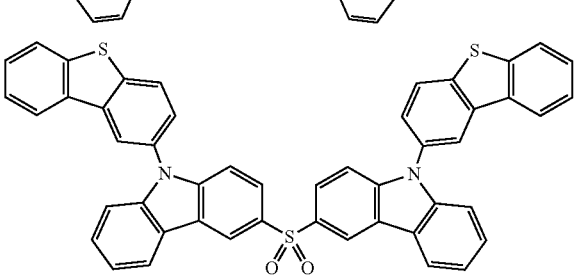

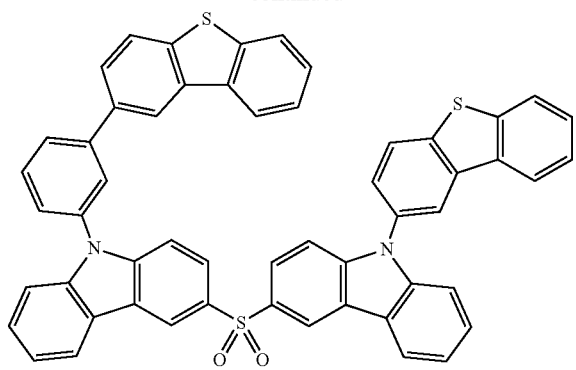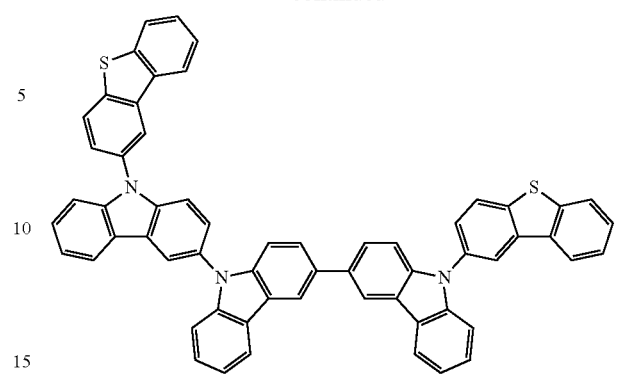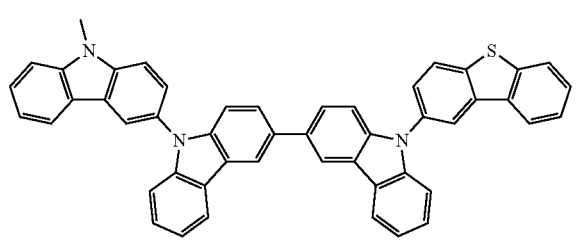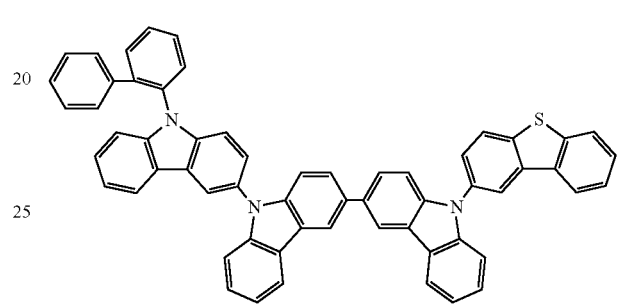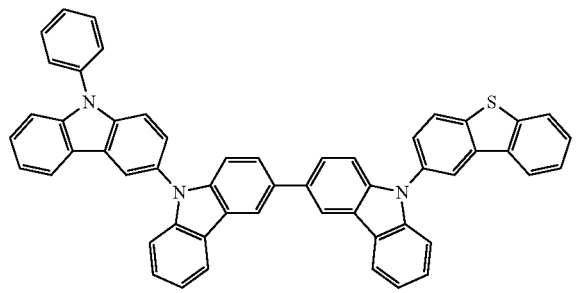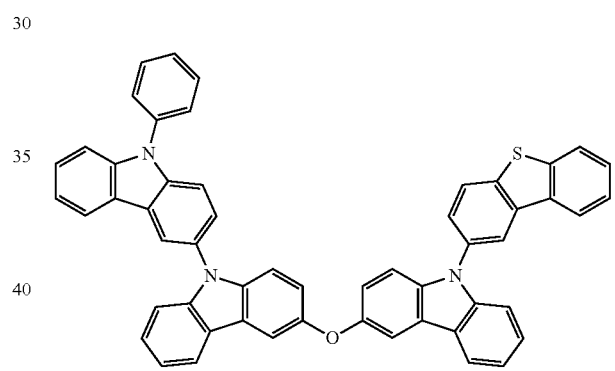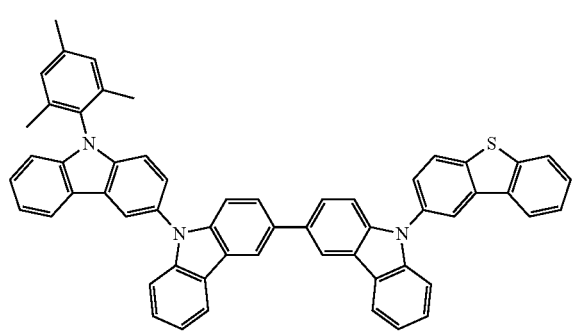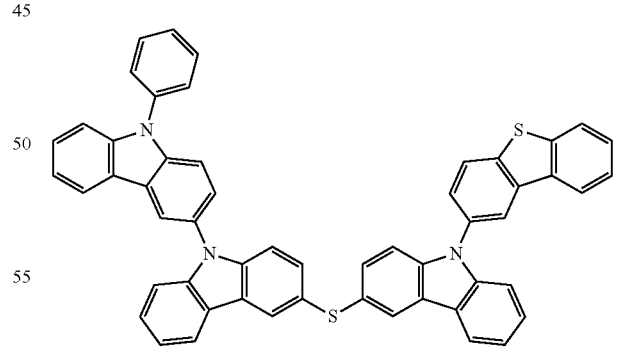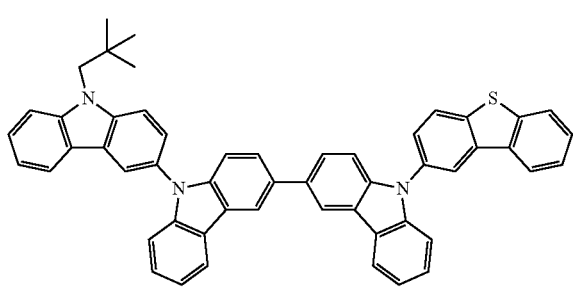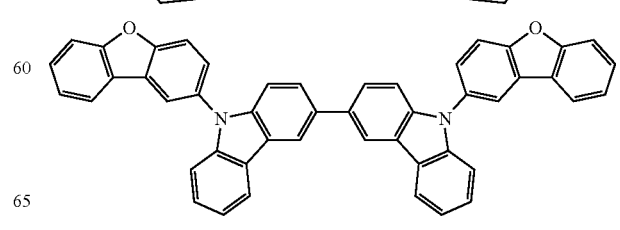

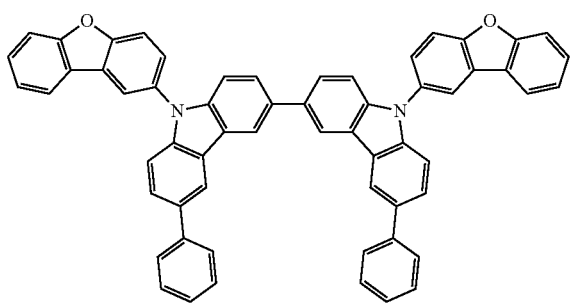
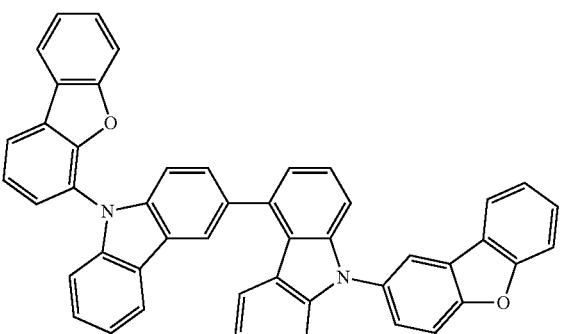
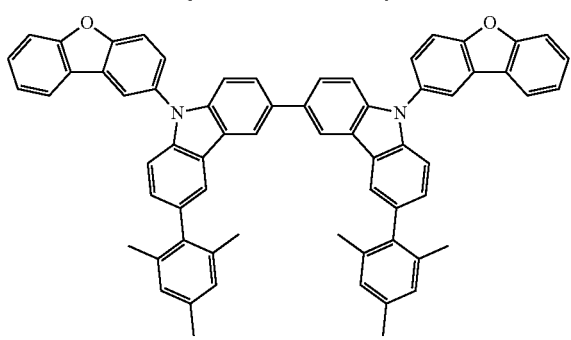
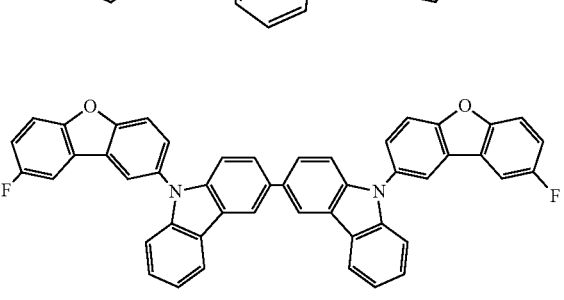
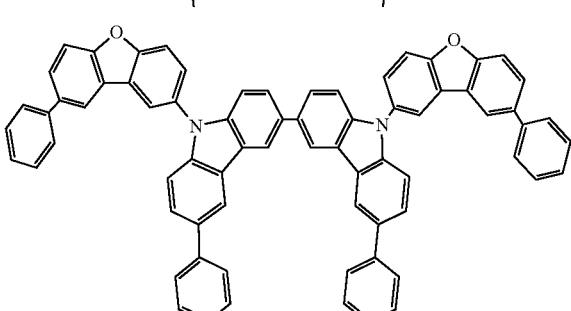
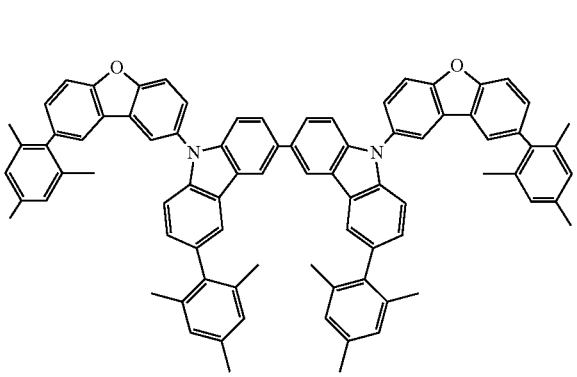
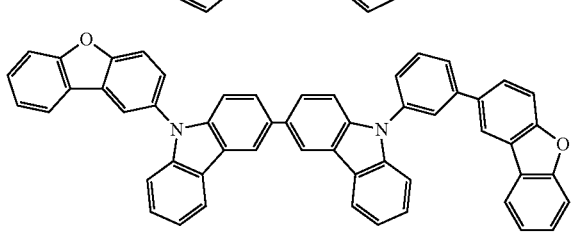
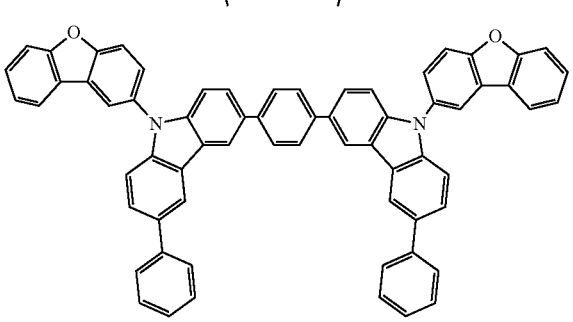
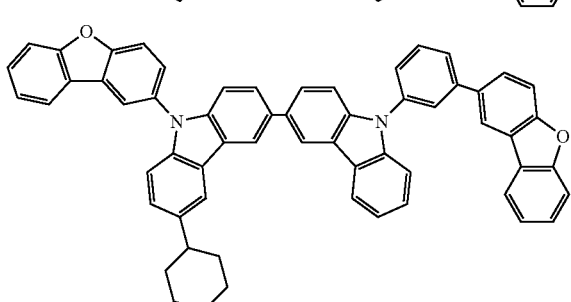
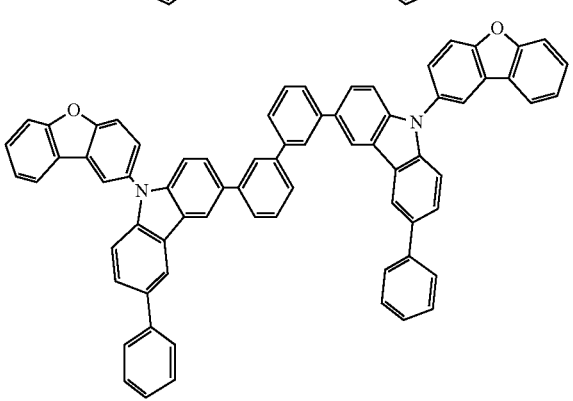
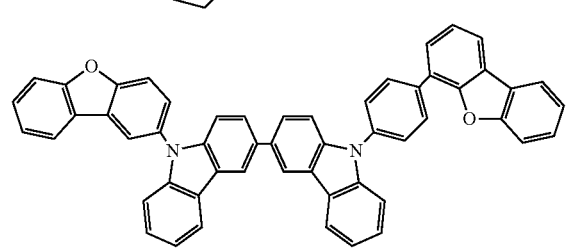

85
-continued
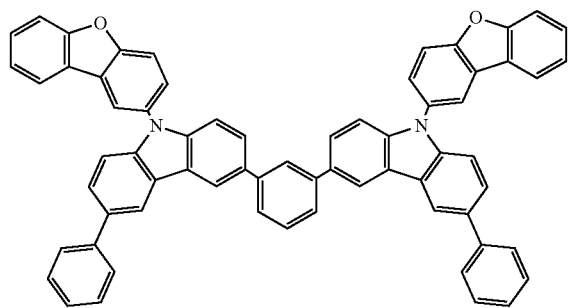
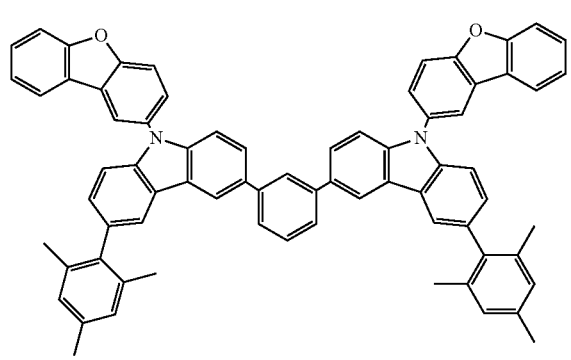
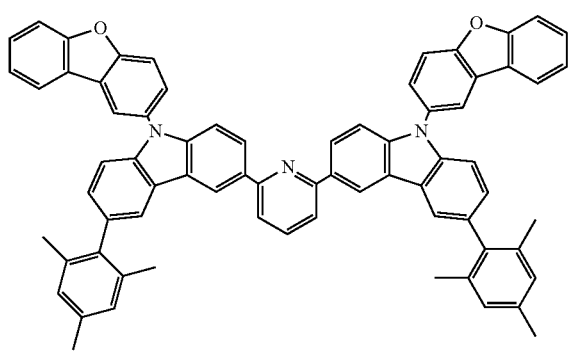
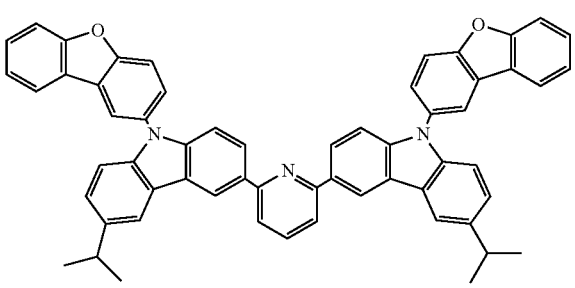
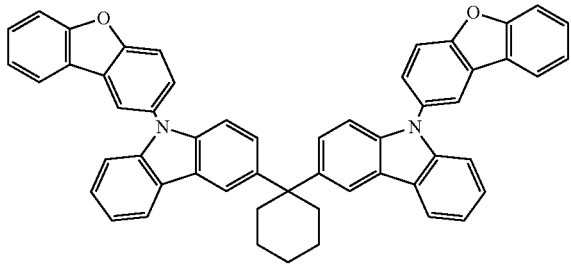
86
-continued
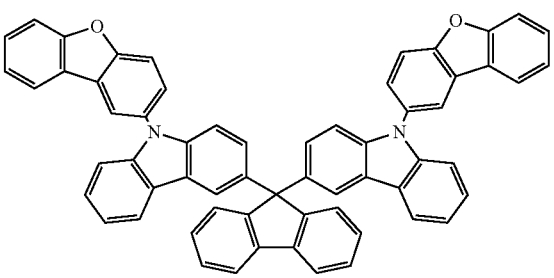
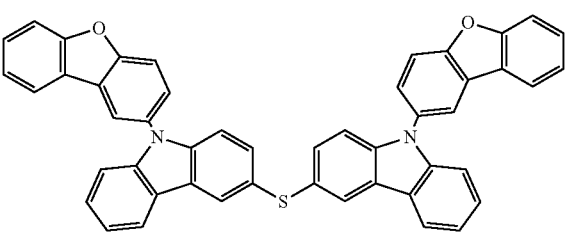
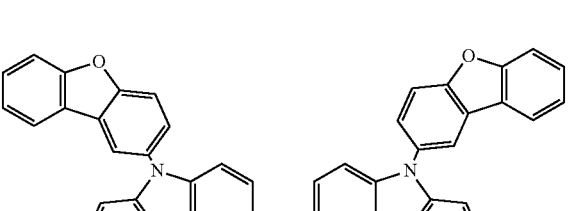
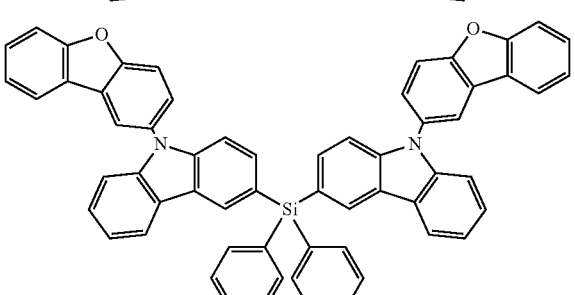
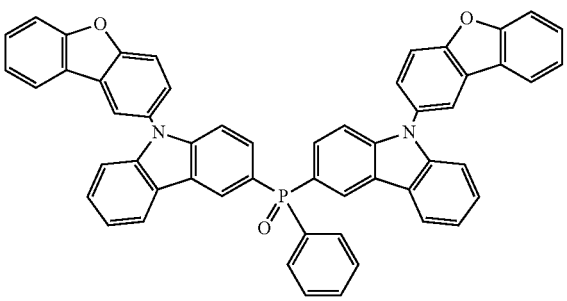
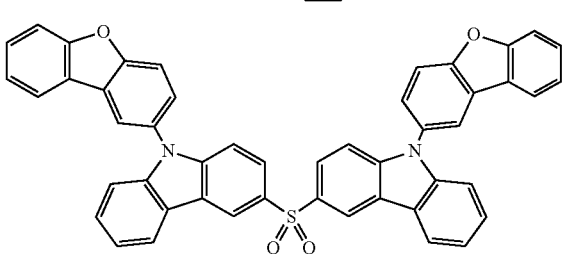

87
-continued
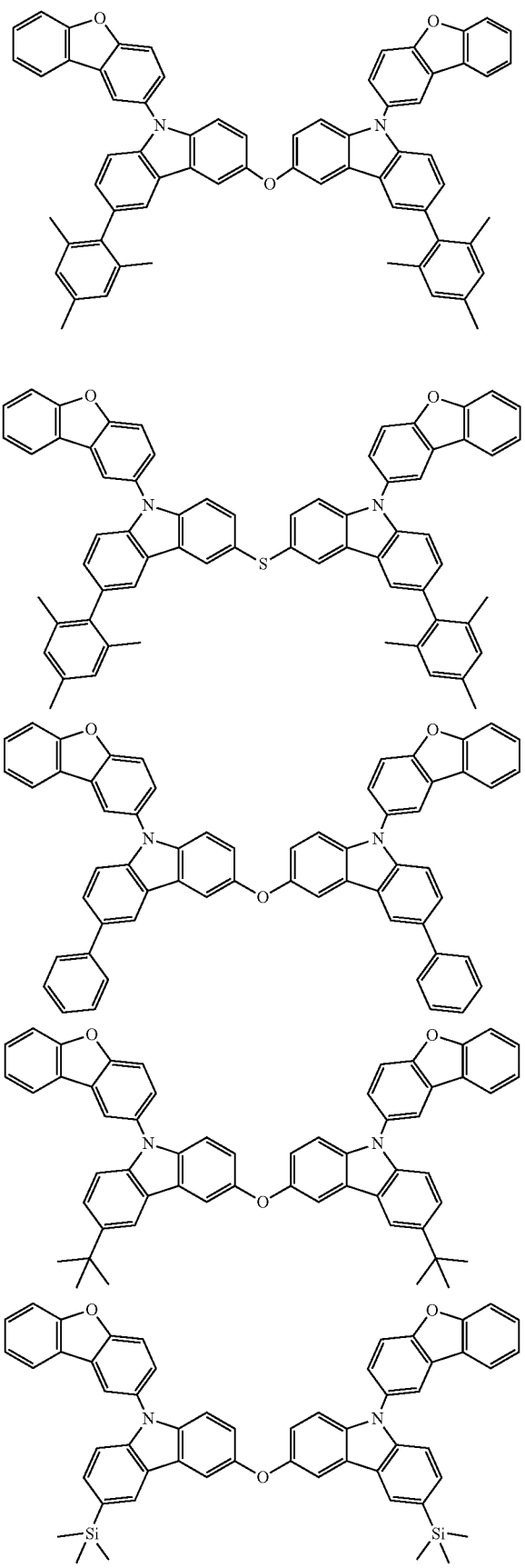
88
-continued
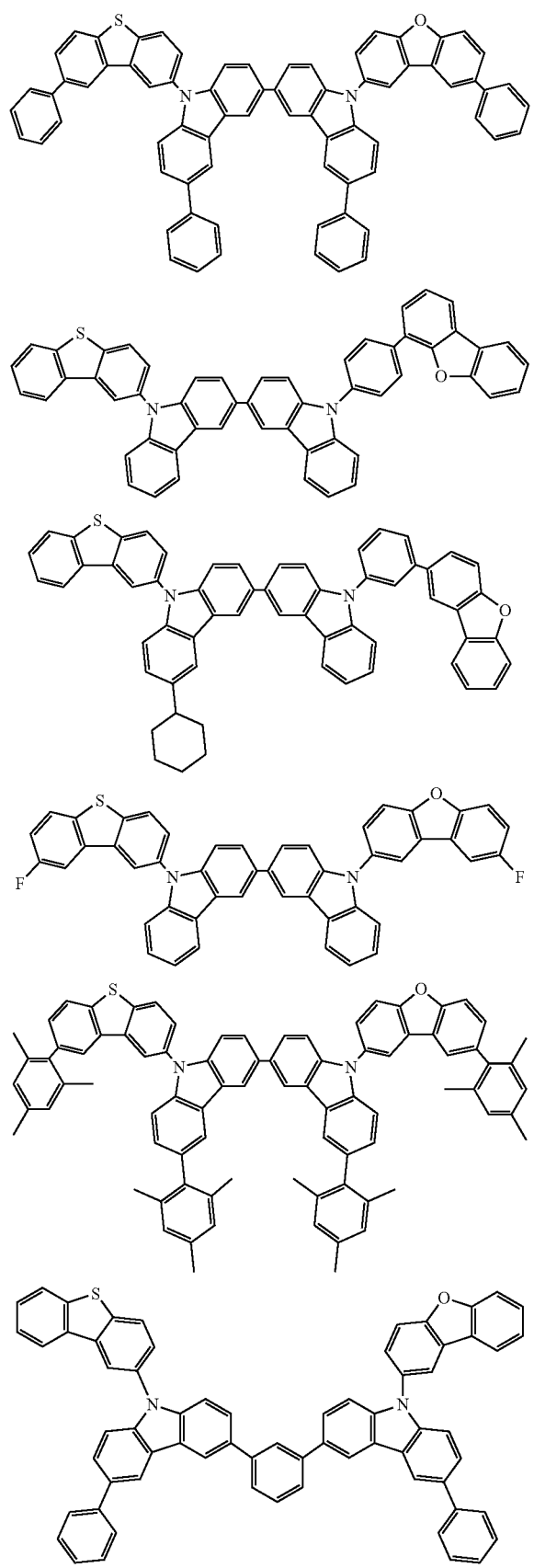

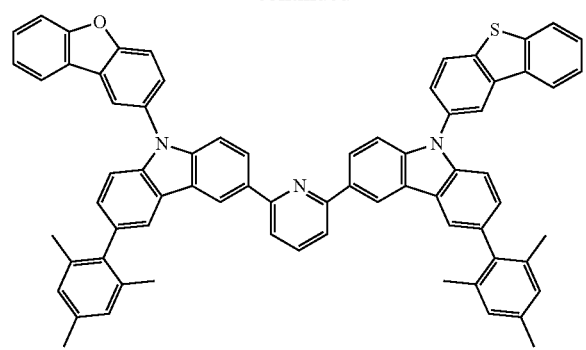
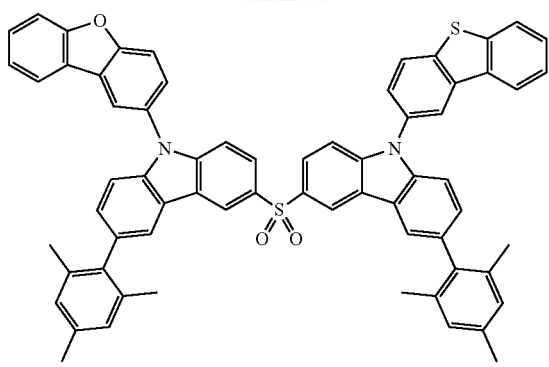
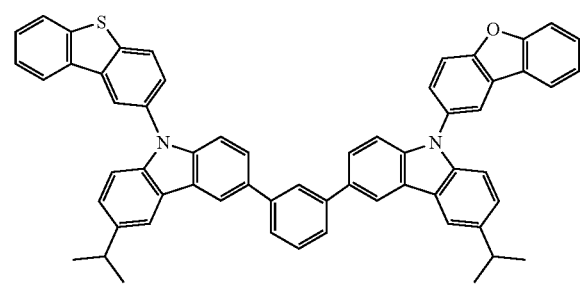
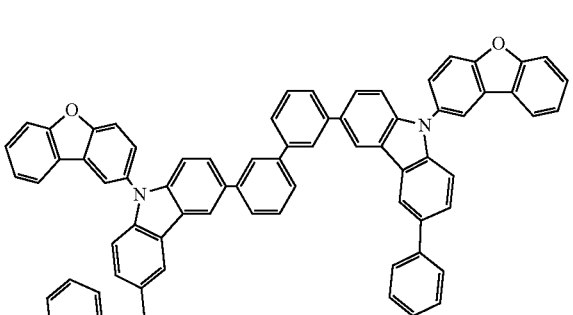
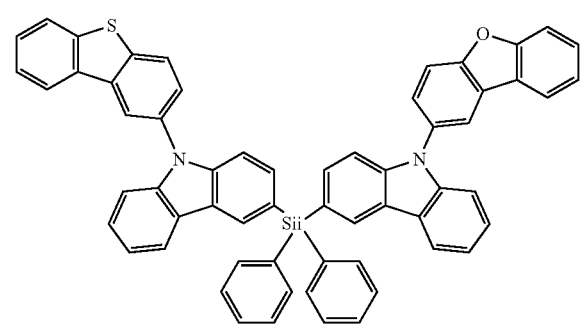
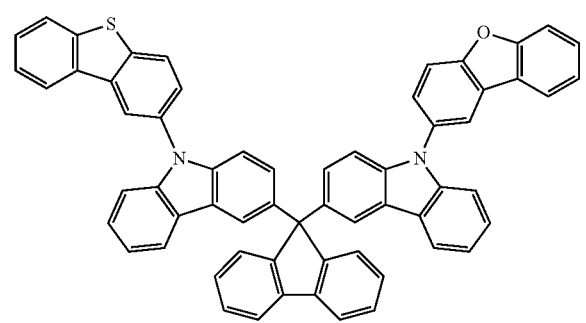
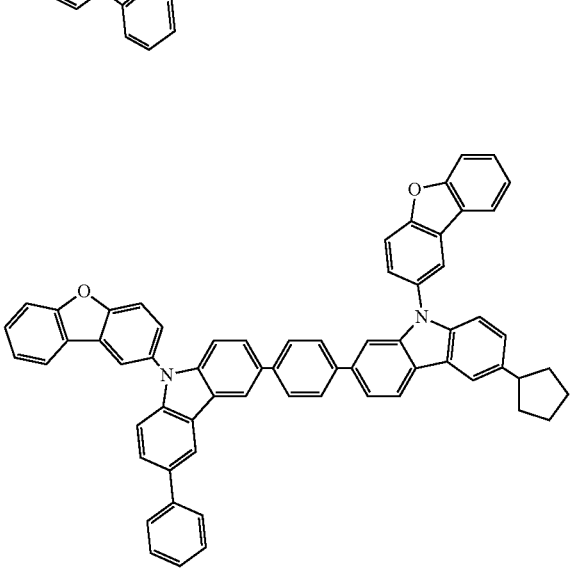
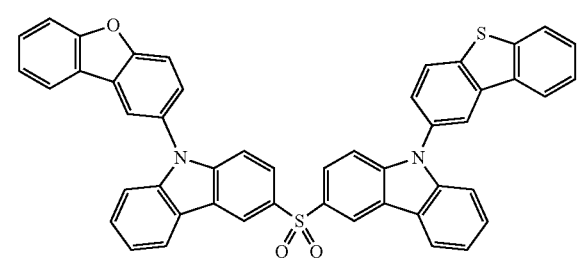

91
-continued
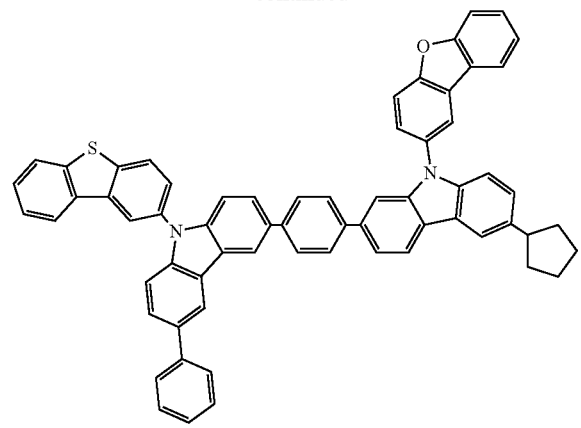
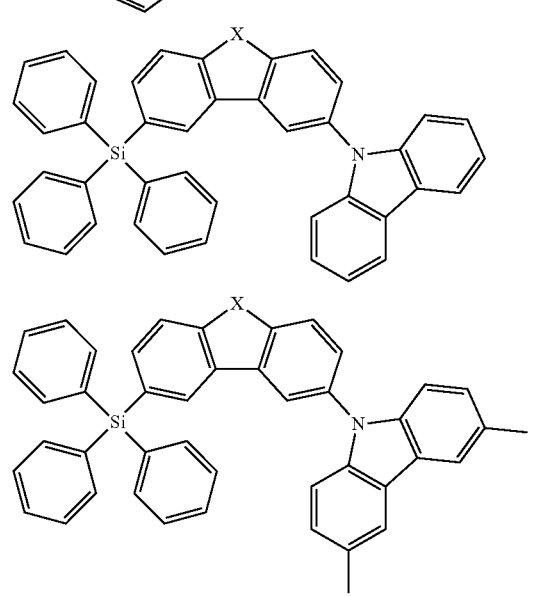
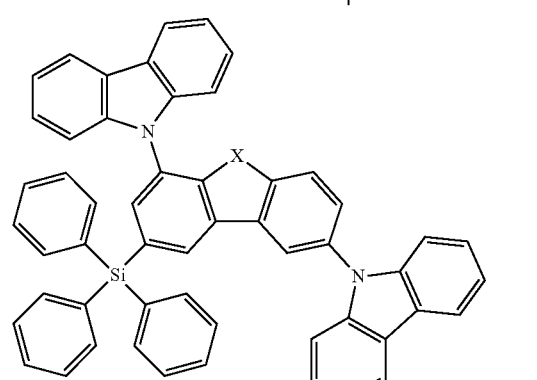
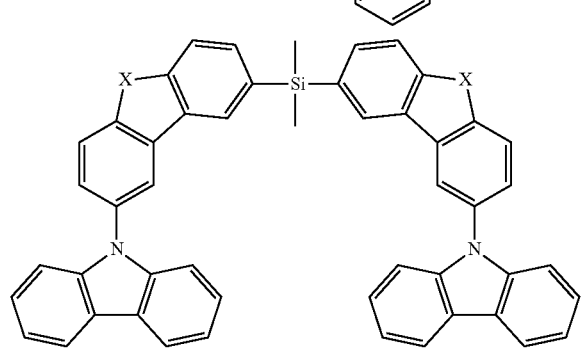
92
-continued
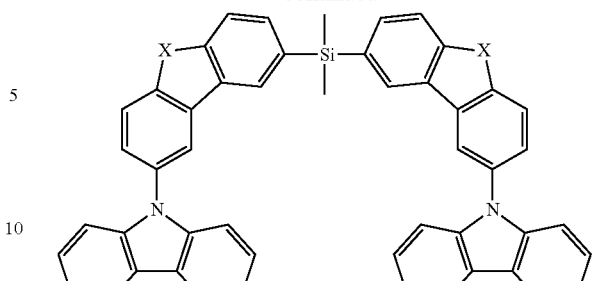
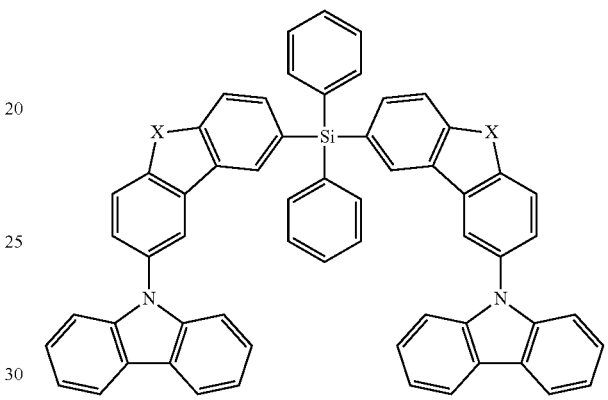
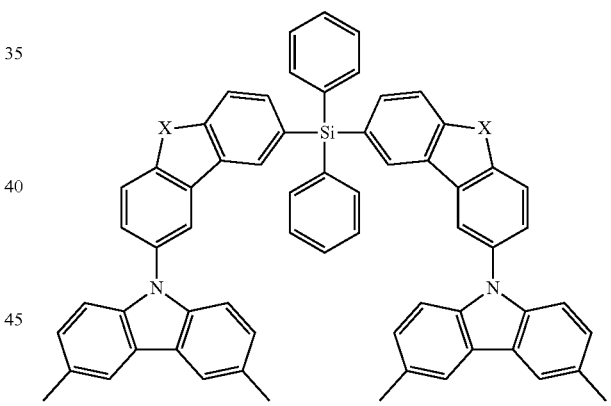
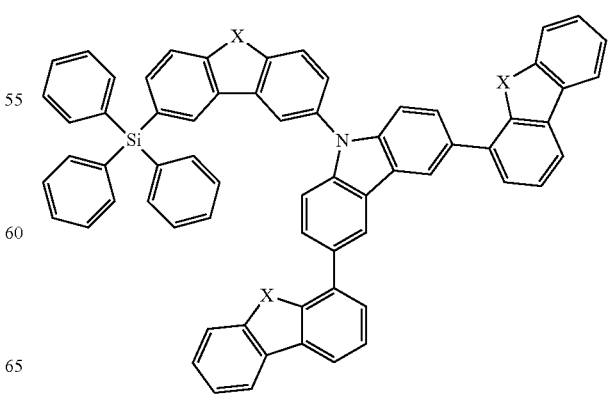

93
-continued
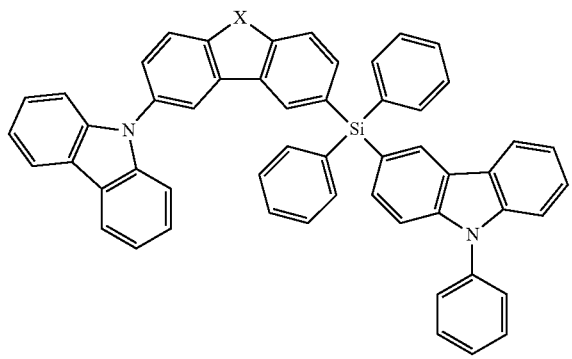
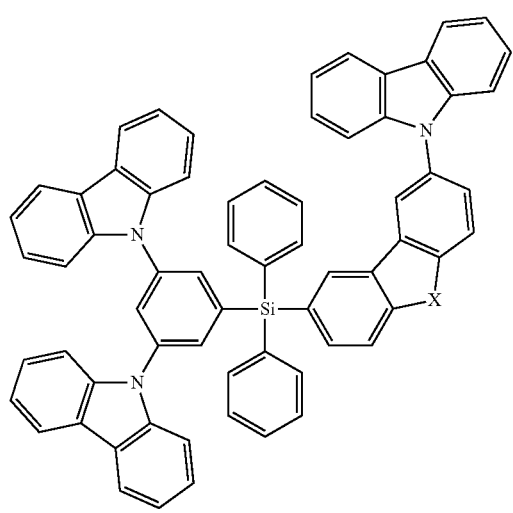
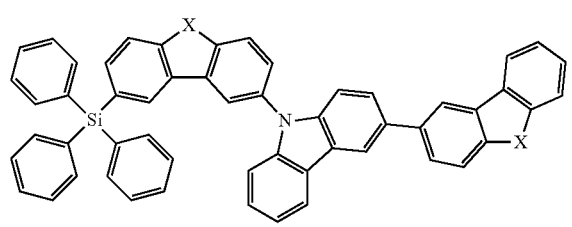
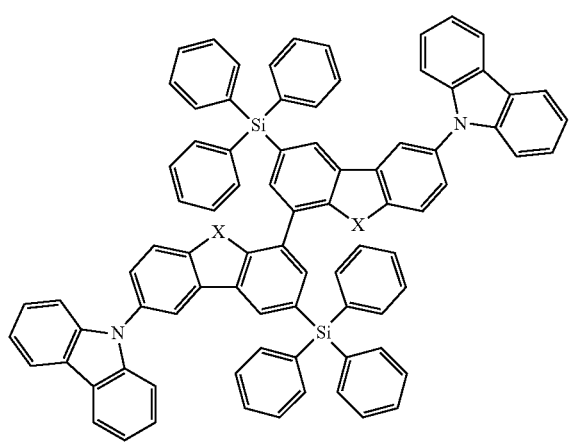
94
-continued
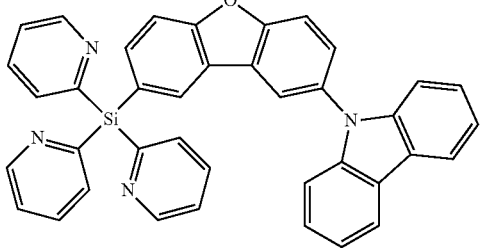
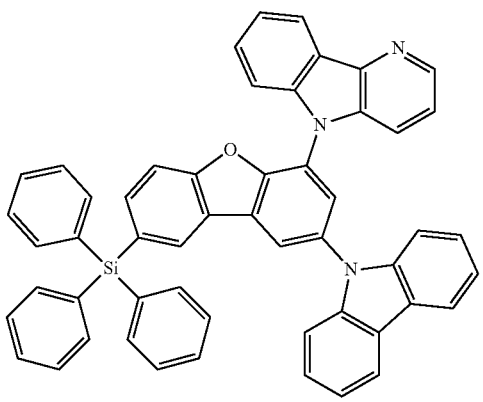
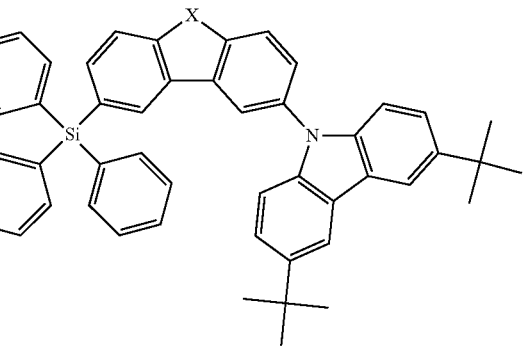

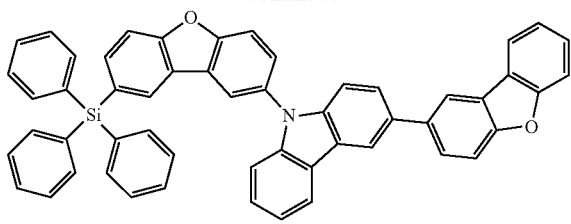
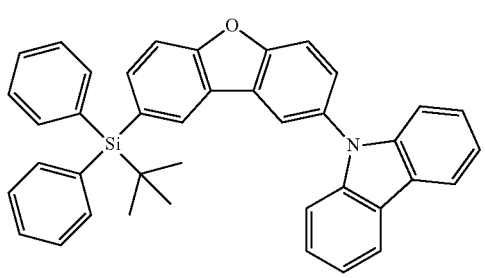
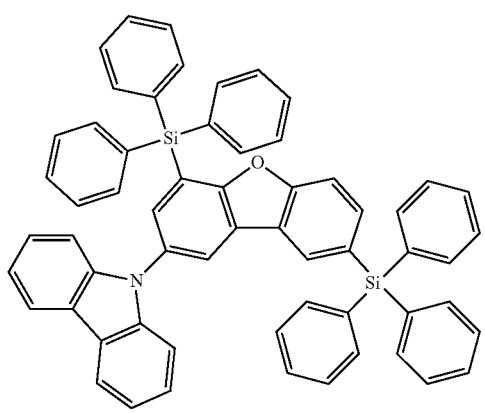
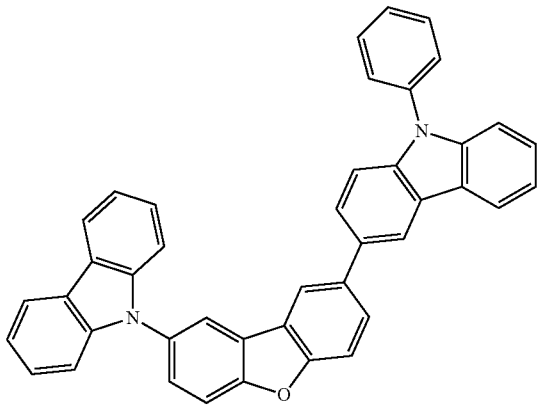
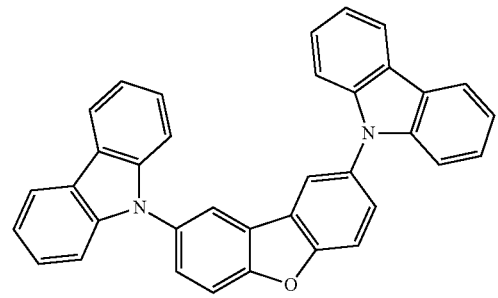
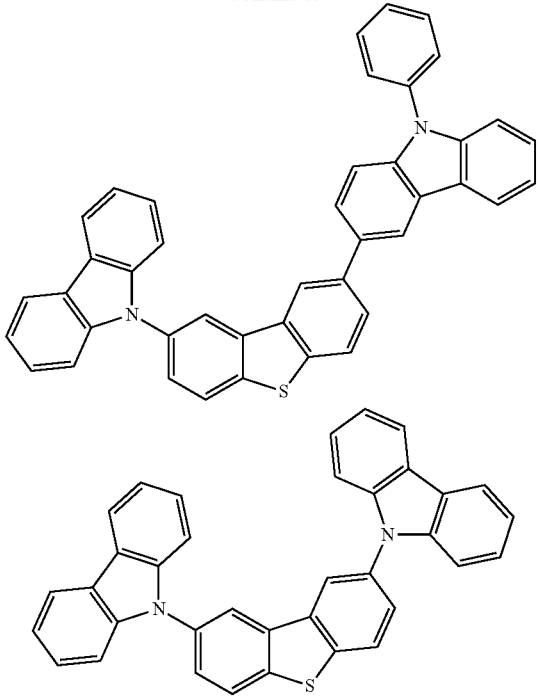

Hereinbelow, an explanation will be made on each substituent of the compounds represented by the formula (A), and the compounds represented by the formulas (1), (2a) to (2c), (3a) to (3c) and (4).

The "carbon atoms that form a ring" means carbon atoms that constitute a saturated ring, an unsaturated ring or an aromatic ring, and the "atoms that form a ring" means carbon atoms and hetero atoms that constitute a hetero ring (including a saturated ring, an unsaturated ring and an aromatic ring).

In the present application, a hydrogen atom includes protium, deuterium and tritium, which are isomers having a different number of neutrons.

Specific examples of the aryl group (aromatic hydrocarbon group) include a phenyl group, a tolyl group, a xylyl group, a naphthyl group, a phenanthryl group, a pyrenyl group, a crysenyl group, a benzo[c]phenanthryl group, a benzo[g]chrysenyl group, a benzoanthryl group, a triphenylenyl group, a fluorenyl group, a 9,9-dimethylfluorenyl group, a benzofluorenyl group, a dibenzofluorenyl group, a biphenyl group, a terphenyl group and a fluoranthenyl group. Of the above-mentioned aryl groups, a phenyl group, a biphenyl group and a naphthyl group are particularly preferable.

As the aromatic hydrocarbon group having a substituent, a tolyl group, a xylyl group, a 9,9-dimethylfluorenyl group or the like can be given.

As shown by the specific examples, the aryl group includes both a fused aryl group and non-fused aryl group.

Specific examples of the heteroaryl group (aromatic heterocyclic group, heteroaromatic ring group, heterocyclic group) include a pyrrolyl group, a pyrazolyl group, a pyrazinyl group, a pyrimidinyl group, a pyridazinyl group, pyridyl group, a triazinyl group, an indolyl group, an isoindolyl group, an imidazolyl group, a benzimidazolyl group, an indazolyl group, an imidazo[1,2-a]pyridinyl group, a furyl group, a benzofuranyl group, an isobenzofuranyl group, a dibenzofuranyl group, an azadibenzofuranyl group, a thiophenyl group, a benzothiophenyl group, a dibenzothiophenyl group, an azadibenzothiophenyl group, a quinolyl group, an isoquinolyl group, a quinoxaliny group, a quinazolinyl group, a naphthyridinyl group, a carbazolyl group, an azacarbazolyl group, a phenanthridinyl group, an acridinyl group, a phenanthrolinyl group, a phenazinyl group, a phenothiazinyl group, a phenoxazinyl group, an oxazolyl group, an oxadiazolyl group, a furazanyl group, a benzoxazolyl group, a thienyl group, a thiazolyl group, a thiadiazolyl group, a benzthiazolyl group, a triazolyl group, a tetrazolyl group or the like. Of these, a dibenzofuranyl group, a dibenzothiophenyl group and a carbazolyl group are preferable.

The above-mentioned azacarbazolyl group is an azacarbazolyl group containing 2 to 5 nitrogen atoms, for example. A monovalent group derived from the following azacarbazole can be mentioned. An atomic bonding may be present on any of nitrogen atoms or any of carbon atoms, and any of nitrogen atoms and any of carbon atoms may be substituted.

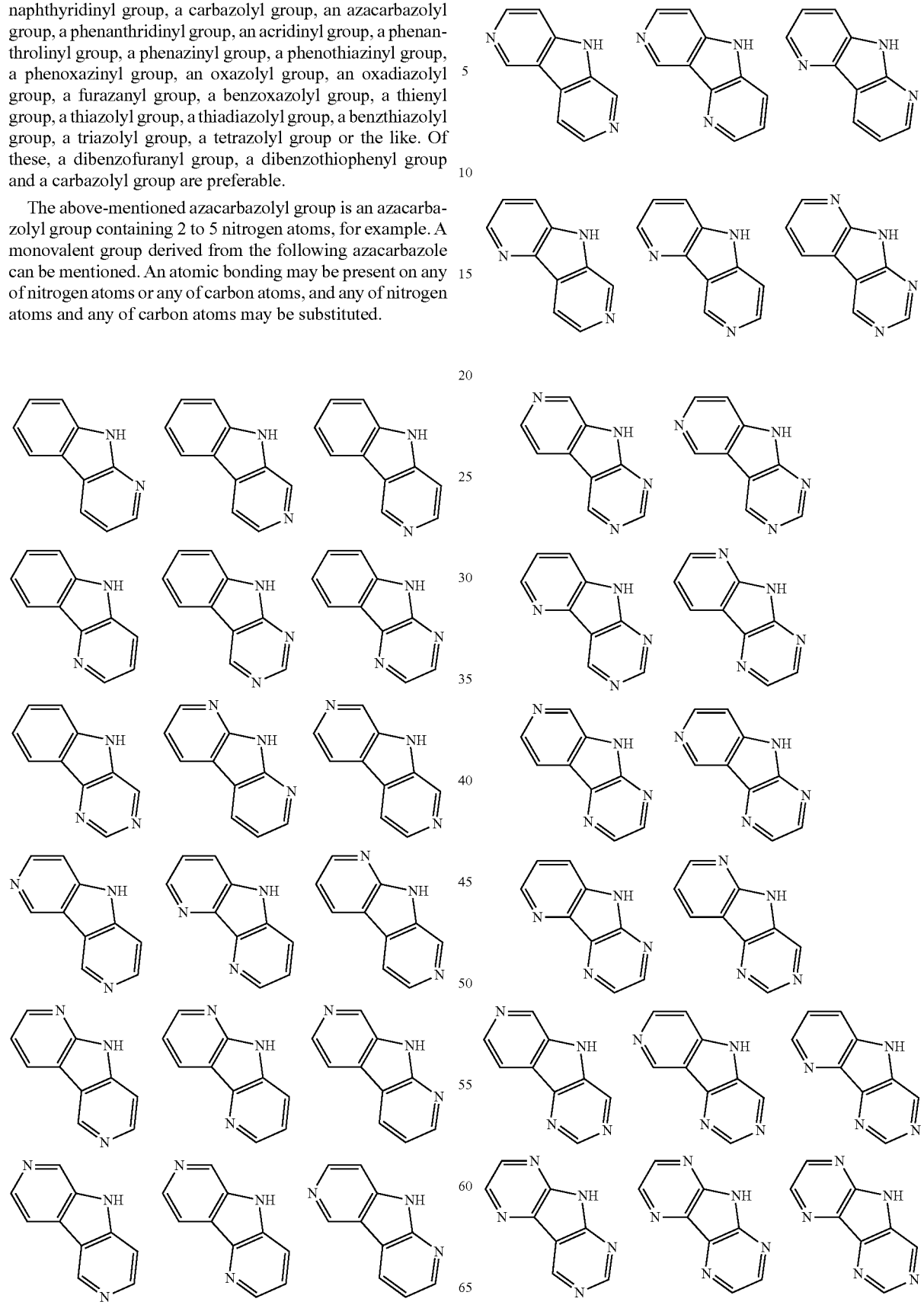

-continued

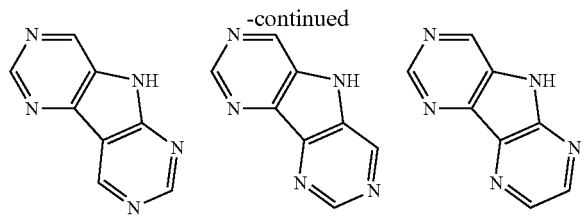

As the alkyl group, a linear, branched or cyclic alkyl group can be given. As the linear or branched alkyl group, a methyl group, an ethyl group, a propyl group, an isopropyl group, an n-butyl group, an isobutyl group, a sec-butyl group, a tert-butyl group, an n-pentyl group, an n-hexyl group, an n-heptyl group, an n-octyl group or the like can be given. Of these, a methyl group, an ethyl group, a propyl group, an isopropyl group, an n-butyl group, an isobutyl group, an sec-butyl group, a tert-butyl group are preferable. A methyl group, an ethyl group, a propyl group, an isopropyl group, an n-butyl group, an sec-butyl group and a tert-butyl group are further preferable.

As the cycloalkyl group, a cyclopropyl group, a cyclobutyl group, a cyclopentyl group, a cyclohexyl group, a 1-adamantyl group, a 2-adamantyl group, a 1-norbornyl group, a 2-norbornyl group or the like can be given. Of these, a cyclopentyl group and a cyclohexyl group are preferable.

The alkoxy group is represented by —OY. As examples of Y, those for the above-mentioned alkyl group can be given. Specific examples of the alkoxy group include a methoxy group and an ethoxy group or the like.

The cycloalkoxy group is represented by —OY². As examples of Y², those for the above-mentioned cycloalkyl group can be given. The cycloalkokyl group is a cyclopentyloxy group or a cyclohexyloxy group, for example.

The aryloxy group is represented by —OZ. As examples of Z, the above-mentioned aryl groups can be given. Specific examples of the aryloxy group include a phenoxy group and a naphthyloxy group.

The heteroaryloxy group is represented by —OZ'. As examples of Z', the above-mentioned heteroaryl group can be given. Specific examples of the heteroaryloxy group include a (carbazole-3-yl)oxy group, a (carbazole-4-yl)oxy group and a (dibenzofuran-2-yl)oxy group.

The arylcarbonyl group is represented by —COZ. As examples of Z, the above-mentioned aryl group can be given.

The arylthio group is represented by —SZ. As examples of Z, the above-mentioned aryl group can be given.

The heteroarylthio group is represented by —SZ'. As examples of Z', the above-mentioned heteroaryl group can be given. Specific examples of the heteroaryloxy group include a (carbazole-3-yl)thio group, a (carbazole-4-yl)thio group and a (dibenzofuran-2-yl)thio group.

The arylsulfonyl group is represented by —SO₂Z. As examples of Z, the above-mentioned aryl group can be given.

The heteroarylsulfonyl group is represented by —SO₂Z'. As examples of Z', the above-mentioned heteroaryl group can be given. Specific examples of the heteroaryloxy group include a (carbazole-3-yl)sulfonyl group, a (carbazole-4-yl)sulfonyl group, a (dibenzofuran-2-yl)sulfonyl group or the like.

The aralkyl group is represented by —Y—Z. As examples of Y, examples of alkylene corresponding to the above-mentioned examples of the alkyl can be given. As examples of Z, the above-mentioned examples of the aryl can be given. The aryl part of the aralkyl group has preferably 6 to 20 carbon atoms, particularly preferably 6 to 12 carbon atoms. The alkyl part has preferably 1 to 10 carbon atoms, particularly preferably 1 to 6 carbon atoms. A benzyl group, a phenylethyl group, a 2-phenylpropane-2-yl group or the like can be given.

As the halogenated alkyl group, a group in which the above-mentioned alkyl group is substituted by one or more halogen atoms (a fluorine atom, a chlorine atom and a bromine atom, with a fluorine atom being preferable) can be given. Specific examples include a fluoromethyl group, a difluoromethyl group, a trifluoromethyl group, a fluoroethyl group and a 2,2,2-trifluoroethyl group, a pentafluoroethyl group. A trifluoromethyl group and a pentafluoroethyl group are preferable.

As the fluoroalkyl group, a group in which the above-mentioned alkyl group is substituted by one or more fluorine atoms can be given. Specific examples include a fluoromethyl group, a difluoromethyl group, a trifluoromethyl group, a fluoroethyl group, a 2,2,2-trifluoroethyl group and a pentafluoromethyl group.

As the fluoroalkoxy group, a group in which the above-mentioned alkyl part of the alkoxy group is substituted by one or more fluorine atoms can be given. Specific examples include a fluoromethoxy group, a difluoromethoxy group, a trifluoromethoxy group, a fluoroethoxy group, a 2,2,2-trifluoroethoxy group, a pentafluoroethoxy group or the like. A trifluoroethoxy group and a pentafluoroethoxy group are preferable.

The substituted or unsubstituted silyl group includes a silyl group, an alkylsilyl group, a dialkylarylsilyl group, an alkyldiarylsilyl group and a triarylsilyl group, for example.

The substituted silyl group is represented by —Si(R$^a$)(R$^b$)(R$^c$), and as examples of (R$^a$), (R$^b$) and (R$^c$), the alkyl group, the aryl group, the heteroaryl group or the like mentioned above can be given.

The substituted or unsubstituted amino group includes an arylamino group, an alkylamino group and aralkylamino group, for example.

The substituted amino group is represented by —N(Q$^a$)(Q$^b$). As examples of (Q$^a$) and (Q$^b$), the alkyl group, the aryl group, the aralkyl group or the like mentioned above can be given.

As the alkylene group, the cycloalkylene group, the arylene group and the heteroarylene group, the divalent residues respectively corresponding the alkyl group, the cycloalkyl group, the aryl group and the heteroaryl group can be given.

A meta-biphenyl group, a meta-biphenylylene group, a meta-terphenyl group and a meta-terphenylylene group are respectively a group represented by the following formula.

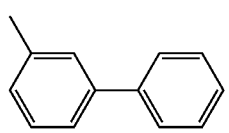
Meta-biphenylyl group

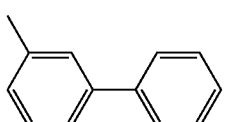
Meta-biphenylene group

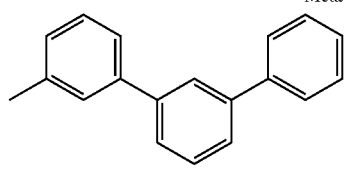
Meta-terphenylyl group

-continued

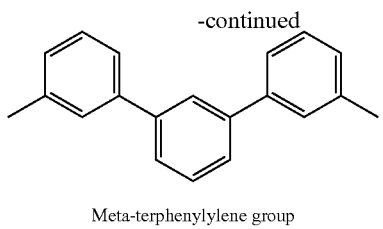

Meta-terphenylylene group

The compound represented by the formula (A) is a material for an organic thin film layer of an organic EL device, and can be preferably used as an electron-transportation region layer material. Of the electron-transportation region layer material, it can be used particularly preferably as the material for an electron-transporting layer.

The compound represented by the formulas (1) to (4) is a material for the emitting layer of an organic EL device, and can be preferably used as the host material of the emitting layer. This compound can be used particularly preferably as the host material of the blue phosphorescent emitting layer. The reason therefor is as follows. Since the compound represented by the formulas (1) to (4) have a sufficiently large triplet energy, even if a blue phosphorescent dopant material is used, the triplet energy of the phosphorescent dopant material can be efficiently confined in the emitting layer.

The compound represented by the formulas (1) to (4) can be used not only in the blue emitting layer but also in an emitting layer of a light having a longer wavelength (green to red, or the like).

[Device Configuration]

In the organic EL device of the invention, no specific restrictions are imposed on the device configuration, as long as it has the above-mentioned device configuration of the organic thin film layer and the emitting layer. The organic thin film layer comprising the compound represented by the formula (A) is in contact with the emitting layer on the cathode side.

The emitting layer may comprise the compound represented by the formulas (1) to (4) singly or in combination of two or more. It is preferred that the emitting layer comprise only one compound of the compounds represented by the formulas (1) to (4).

In the organic EL device of the invention, a known device structure can be used. Hereinbelow, one example of the embodiment of the organic EL device will be explained with reference to the drawings.

FIG. 1 is a schematic view showing a layer structure according to one embodiment of the organic EL device of the invention.

An organic EL device 1 has a structure in which, on a substrate 10, an anode 20, a hole-transportation region 30, a phosphorescent emitting layer 40, an electron-transportation region 50 and a cathode 60 are stacked in this sequence.

The hole-transportation region 30 means a hole-transporting layer and/or a hole-injecting layer or the like. Similarly, the electron-transportation region 50 means an electron-transporting layer and/or an electron-injecting layer, or the like. These layers may not necessarily be formed, but it is preferred that one or more of these layers be formed.

In this device 1, the organic thin film layer is each organic thin film layer which is provided in the hole-transportation region 30 and each organic thin film layer which is provided in the phosphorescent emitting layer 40 and the electron-transportation region 50.

Figure 2:
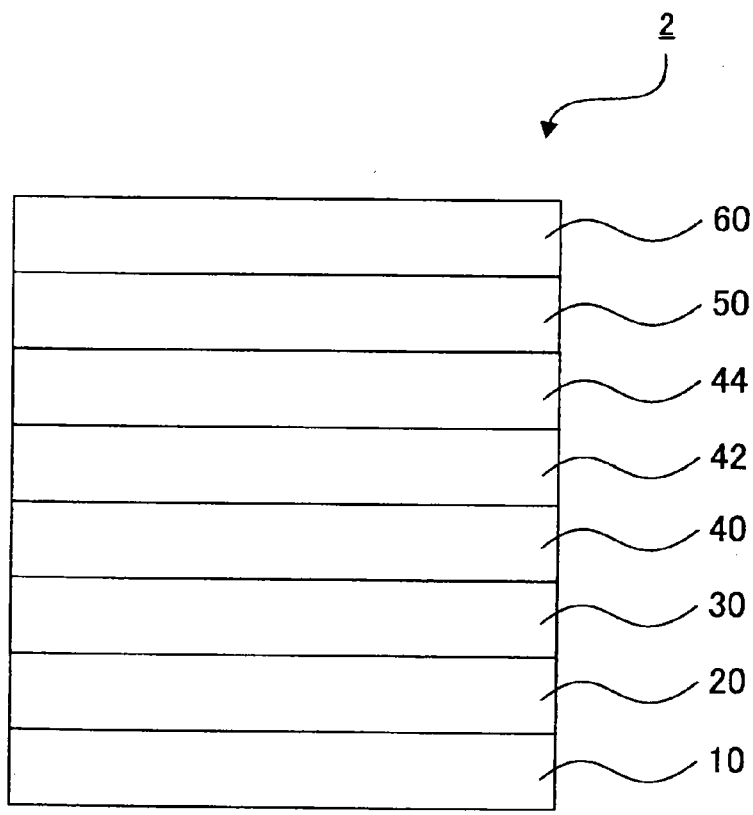
FIG. 2 is a view showing another embodiment of the organic EL device of the invention.

FIG. 2 is a schematic view showing the layer structure according to another embodiment of the organic EL device of the invention. An organic EL device 2 is an example of a hybrid-type organic EL device in which a phosphorescent emitting layer and a fluorescent emitting layer are stacked.

The organic EL device 2 has the same structure as the above-mentioned organic EL device 1, except that a space layer 42 and a fluorescent emitting layer 44 are formed between the phosphorescent emitting layer 40 and the electron-transportation region 50. In a structure in which the phosphorescent emitting layer 40 and the fluorescent emitting layer 44 are stacked, in order to prevent diffusion of excitons formed in the phosphorescent emitting layer 40 to the fluorescent emitting layer 44, the space layer 42 may be formed between the fluorescent emitting layer 44 and the phosphorescent emitting layer 40.

The compounds represented by the formulas (1) to (4) have a large triplet energy, and hence, can function as the space layer.

In the organic EL device 2, for example, by allowing the phosphorescent emitting layer 40 to be a yellow emitting layer and by allowing the fluorescent emitting layer 44 to be a blue emitting layer, it is possible to obtain a white-emitting organic EL device. In this embodiment, the phosphorescent emitting layer 40 and the fluorescent emitting layer 44 are each formed of a single layer, but the structure is not limited thereto. These layers may be respectively formed in two or more layers. The number of these layers can be appropriately set according to need, such as illumination, a display or the like. For example, when a white emitting device is used in combination with a color filter to obtain a full-color emitting device, in respect of color rendering property, it may be preferable to include emission of a plurality of wavelength regions such as red, green and blue (RGB), red, green, blue and yellow (RGBY) or the like.

In addition to the above-mentioned embodiment, the organic EL device of the invention may have various known configurations. Emission of the emitting layer may be outcoupled from the anode side, the cathode side or the both sides.

Hereinbelow, an explanation will be made on the material or the like of each layer. No particular restrictions are imposed on the material or the like, as long as the emitting layer and the organic thin film layer which is in contact with the emitting layer on the cathode side comprises the compound represented by the formula (A) and the emitting layer comprises one of more of the compounds represented by the formulas (1) to (4). Each layer of the organic EL device may use known materials or the like.

If the organic EL device has a plurality of emitting layers, it suffices that an organic thin film layer which is in contact with any one of the plurality of emitting layers on the cathode side contain the compound represented by the formula (A).

[Electron-Injecting Layer and Electron-Transporting Layer]

Electron-injecting/transporting layer helps injection of electrons to the emitting layer and transports the injected electrons to an emitting region, and has a large electron mobility. The compound represented by the formula (A) can be preferably used as an electron-transporting material to be used in the electron-injecting/transporting layer.

As the electron-transporting material other than the compound represented by the formula (A), an aromatic heterocyclic compound having one or more hetero atoms within the molecule can preferably be used. In particular, a nitrogen-containing ring derivative is preferable. As the nitrogen-containing ring derivative, an aromatic ring having a nitrogen-containing six-membered ring or a nitrogen-containing five-membered ring or a fused aromatic ring compound having a nitrogen-containing six-membered ring or a nitrogen-containing five-membered ring is preferable. For example, a compound having a pyridine ring, a pyrimidine ring, a triazine ring, a benzimidazole ring, a phenanthroline ring, a quinazoline ring or the like in a skeleton can be given.

In addition, an organic layer having semiconductivity may be formed by doping (n) of a doping material and doping (p) of an accepter material. As representative examples of N-doping, doping in which an electron-transporting material is doped with a metal such as Li and Cs can be given. As representative examples of P-doping, doping in which a hole-transporting material is doped with an acceptor material such as F4TCNQ (2,3,5,6-Tetrafluoro-7,7,8,8-tetracyanoquinodimethane) or the like (see Japanese Patent No. 3695714, for example).

In an organic EL device, since emitted light is reflected by an electrode (a cathode, for example), it is known that emission directly outcoupled from an anode and emission outcoupled through reflection by an electrode interfere. In order to use this interference effect efficiently, the thickness of the electron-injecting/transporting layer is appropriately selected in a thickness of several nm to several μm. If the film thickness is large, in particular, in order to avoid an increase in voltage, it is preferred that the electron mobility be at least $10^{-5}$ cm$^2$Ns or more when an electric field of $10^4$ to $10^6$ V/cm is applied.

[Emitting Layer]

The phosphorescent emitting layer containing one or more of the compounds represented by the formulas (1) to (4) as a host comprises a phosphorescent dopant (phosphorescent emitting material).

As the phosphorescent dopant, a metal complex compound can be used. A compound having a metal atom selected from Ir, Pt, Os, Au, Cu, Re and Ru and a ligand is preferable. It is preferred that the ligand have an orthometal bond.

In respect of a high phosphorescent quantum efficiency and a further improvement in external quantum yield of an emitting device, it is preferred that a phosphorescent dopant be a compound containing a metal element selected from Ir, Os and Pt. It is further preferred that the phosphorescent dopant be a metal complex such as an iridium complex, an osmium complex and a platinum complex. Of these, an iridium complex and a platinum complex are more preferable and an orthometalated iridium complex is most preferable.

A dopant may be used singly or in combination of two or more.

The concentration of the phosphorescent dopant in the phosphorescent emitting layer is not particular restricted, but is preferably 0.1 to 30 mass %, more preferably 0.1 to 20 mass %.

The emitting layer may be a double host (also referred to as "host/co-host") layer. Specifically, by combining an electron-transporting host and a hole-transporting host in the emitting layer, the carrier balance within the emitting layer may be adjusted.

Further, the emitting layer may be a double dopant layer. By using two or more dopant materials having a high quantum yield in the emitting layer, each dopant emits light. For example, by co-depositing a host and a red dopant and a green dopant, a yellow emitting layer may be realized.

When a phosphorescent emitting layer is formed by using a material other than the compounds represented by the formulas (1) to (4), a known material can be used as the phosphorescent emitting layer material. For details, see Japanese Patent Application No. 2005-517938.

The organic EL device of the invention may have a fluorescent emitting layer as in the case of a device shown in FIG. 2. As the fluorescent emitting layer, a known material can be used.

As the host material of the emitting layer other than the compounds represented by the formulas (1) to (4), a compound comprising any of a carbazole ring, a dibenzofuran ring and a dibenzothiophene ring is preferable.

As the host material of the emitting layer other than the compounds represented by the formulas (1) to (4), the compounds represented by the following formula (a) can preferably be given.

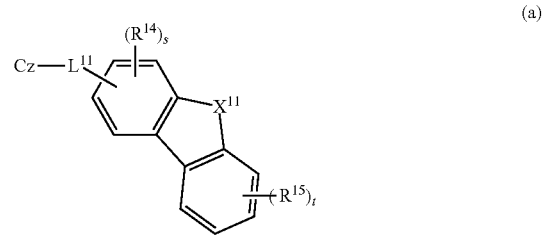

(a)

wherein $L^{11}$ is a single bond, a substituted or unsubstituted arylene group having 6 to 30 ring carbon atoms or a heteroarylene group having 5 to 30 ring atoms;

$X^{11}$ is O, S, Se or Te;

$R^{14}$ and $R^{15}$ are independently a substituted or unsubstituted aryl group having 6 to 30 ring carbon atoms, a heteroaryl group having 5 to 30 ring atoms, a substituted or unsubstituted alkyl group having 1 to 30 carbon atoms, a substituted or unsubstituted alkylsilyl group, a substituted or unsubstituted arylsilyl group or a substituted or unsubstituted heteroarylsilyl group;

s is an integer of 0 to 3;

t is an integer of 0 to 4; and

Cz is a group represented by the following formula (a-1) or the following formula (a-2).

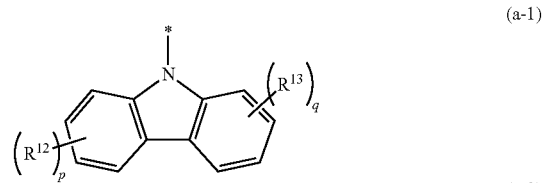

(a-1)

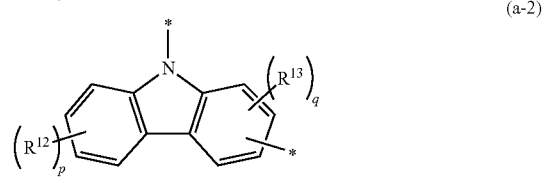

(a-2)

wherein * indicates the bonding position with $L^{11}$;

$R^{11}$ is a hydrogen atom, a substituted or unsubstituted aryl group having 6 to 30 ring carbon atoms, a heteroaryl group having 5 to 30 ring atoms or a substituted or unsubstituted alkyl group having 1 to 30 carbon atoms;

$R^{12}$ and $R^{13}$ are independently a substituted or unsubstituted aryl group having 6 to 30 ring carbon atom, a heteroaryl group having 5 to 30 ring atoms or a substituted or unsubstituted alkyl group having 1 to 30 carbon atoms;

p and q are independently an integer of 0 to 4; and r is an integer of 0 to 3.

As the arylene group having 6 to 30 ring carbon atoms and the heteroarylene group having 5 to 30 ring atoms of $L^{11}$ in the formula (a), the same as those for L in the formula (1) can be given.

As the aryl group having 6 to 30 ring carbon atoms, the heteroaryl group having 5 to 30 ring atoms and the alkyl group having 1 to 30 carbon atoms of $R^{11}$ in the formula (a), the same as those for $R_{401}$ and $R_a$ in the formula (4) can be given. The alkylsilly group, the arylsilyl group and the heteroarylsilyl group of $R^{11}$ are respectively a group obtained by combining the above-mentioned alkyl group, the above-mentioned aryl group, the above-mentioned heteroaryl group and a silyl group arbitrarily.

As the aryl group having 6 to 30 ring carbon atoms, the heteroaryl group having 5 to 30 ring atoms and the alkyl group having 1 to 30 carbon atoms of $R^{12}$ to $R^{15}$ in the formula (a), the same as those for $R_a$ in the formula (4) can be given.

Specific examples of the compound represented by the formula (a) are given below.

However, the compound represented by the formula (a) is not limited to those given below. Further, in the compound shown below, X is an oxygen atom or a sulfur atom, and R' is a hydrogen atom or a methyl group.

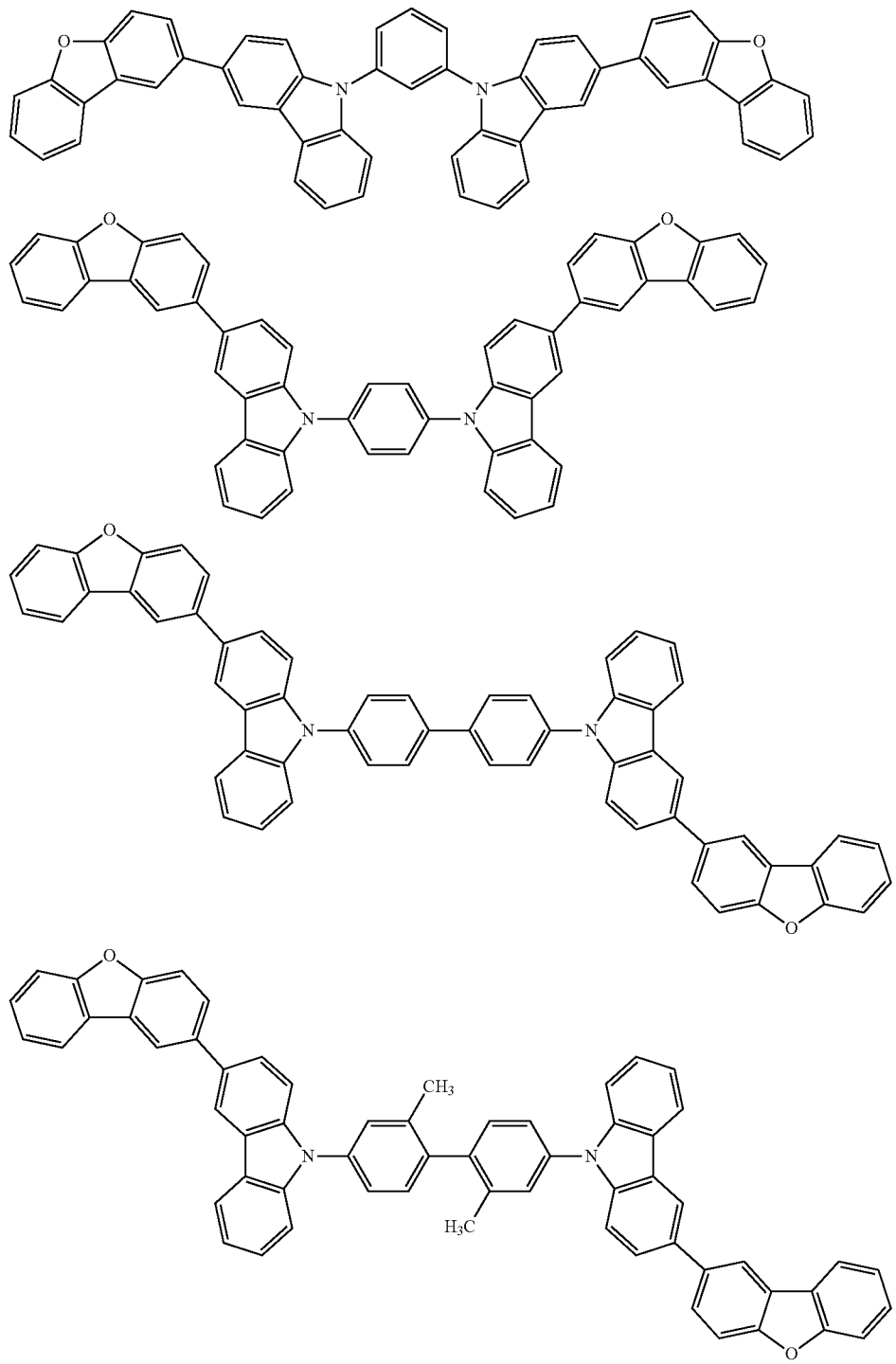

-continued
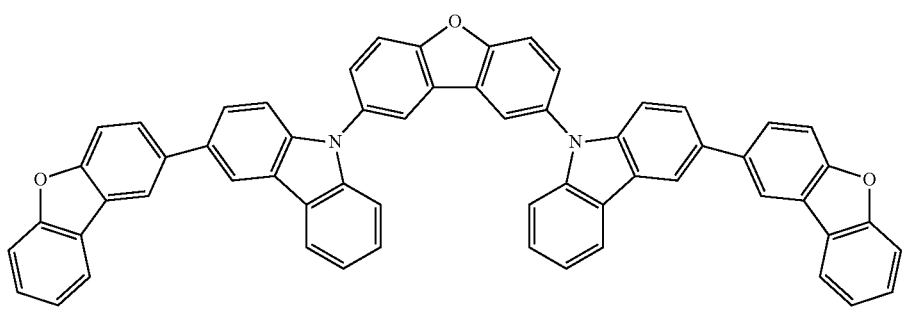
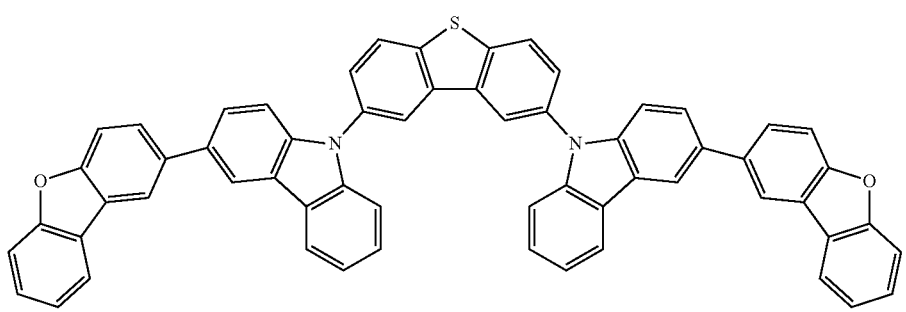
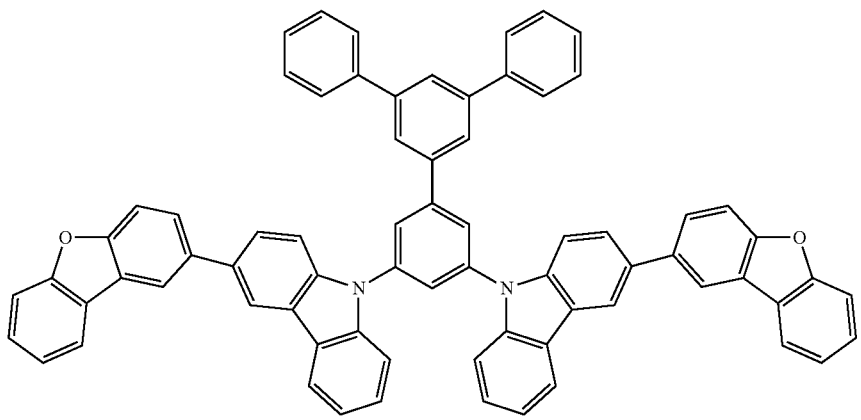
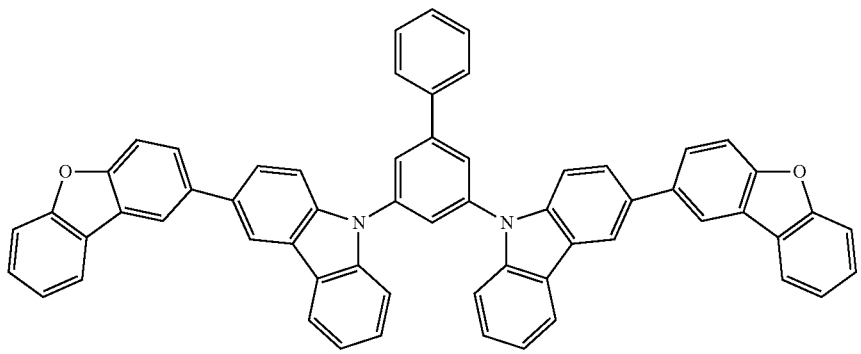

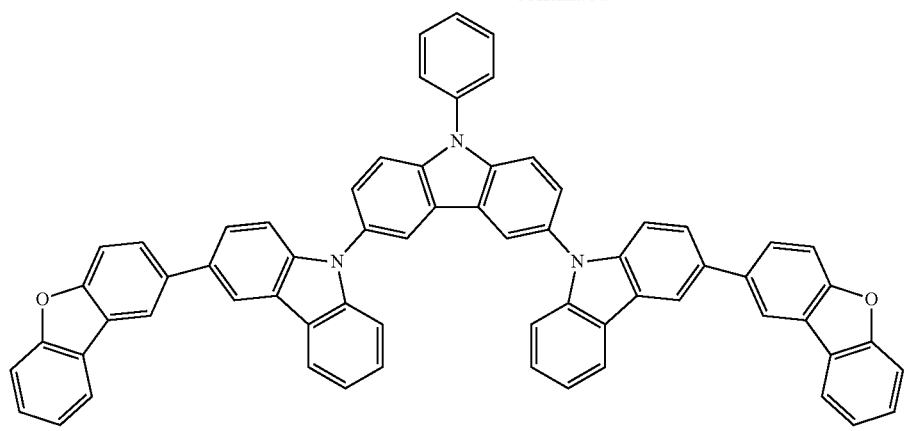
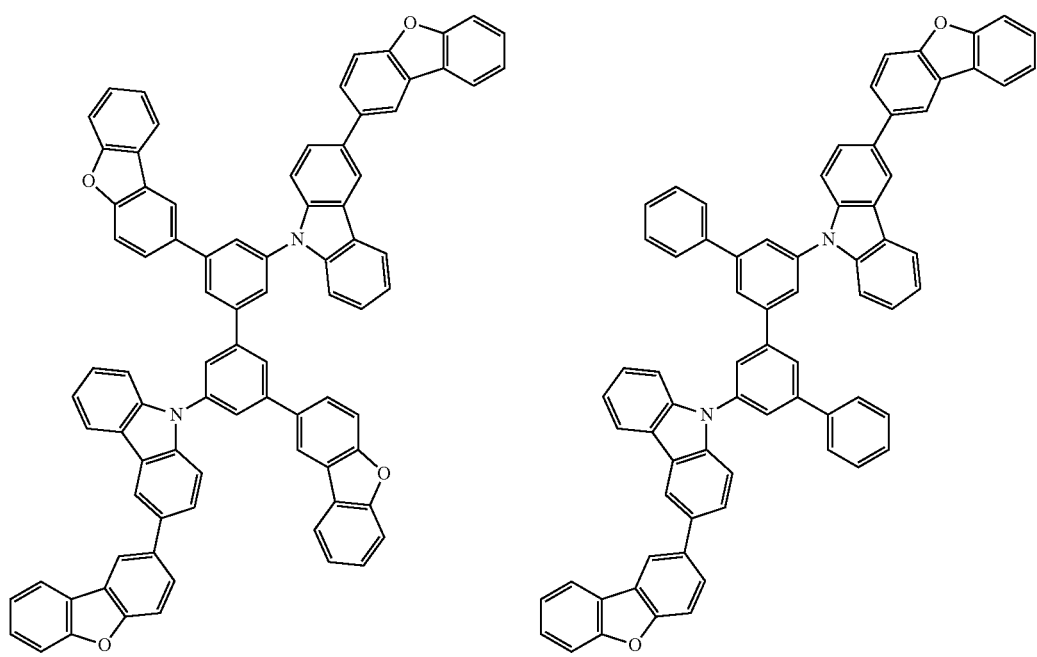
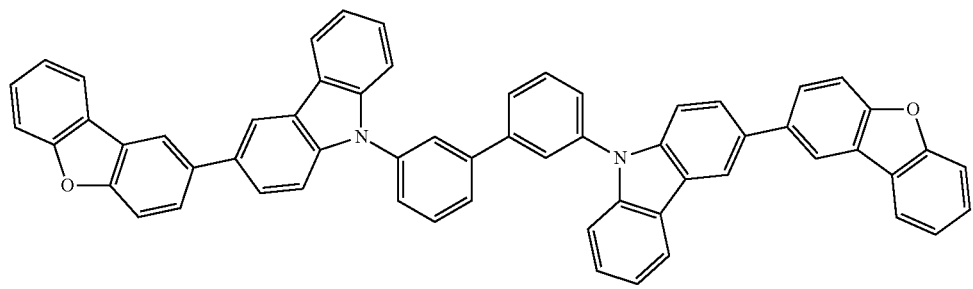

-continued
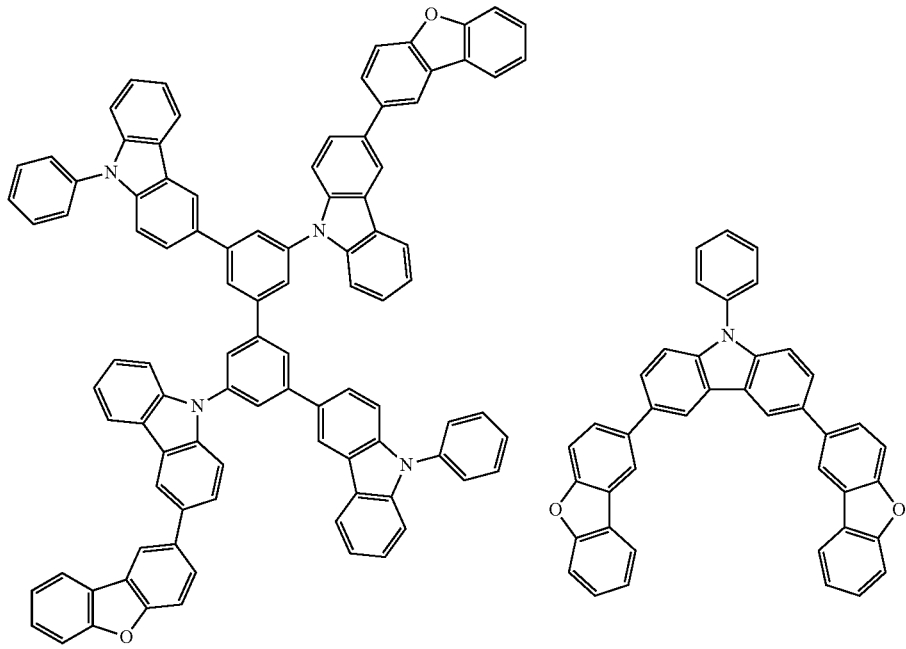
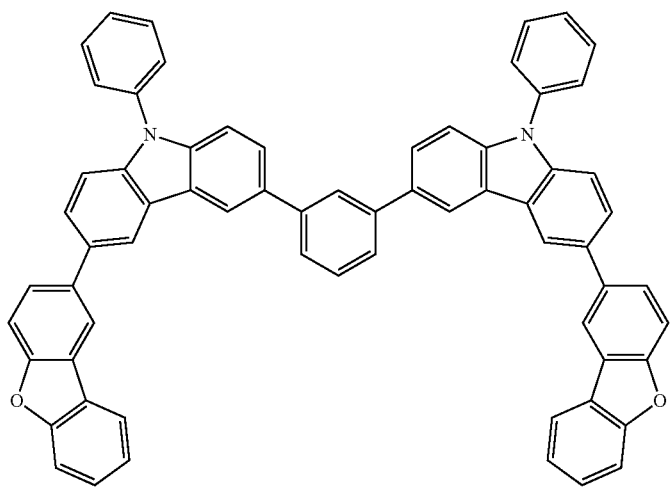
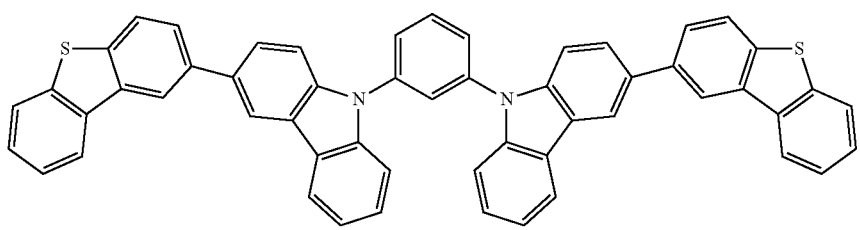
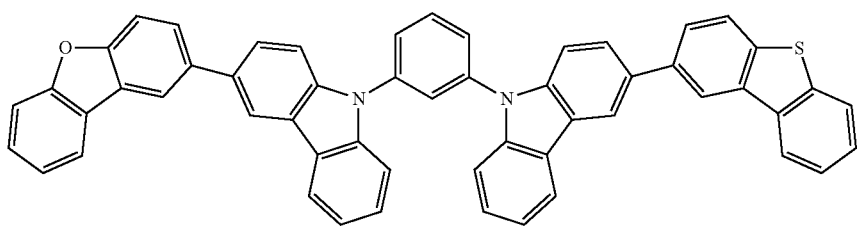

-continued
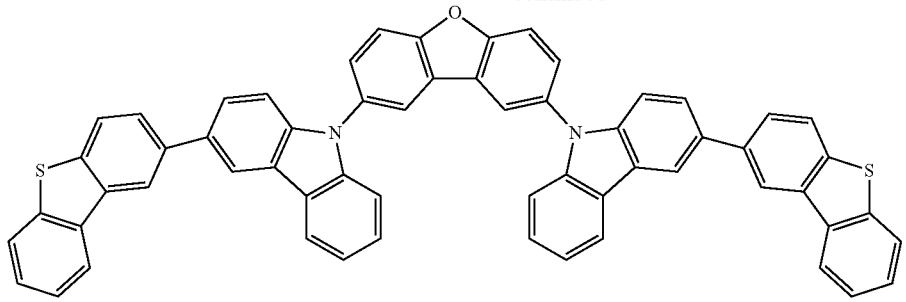
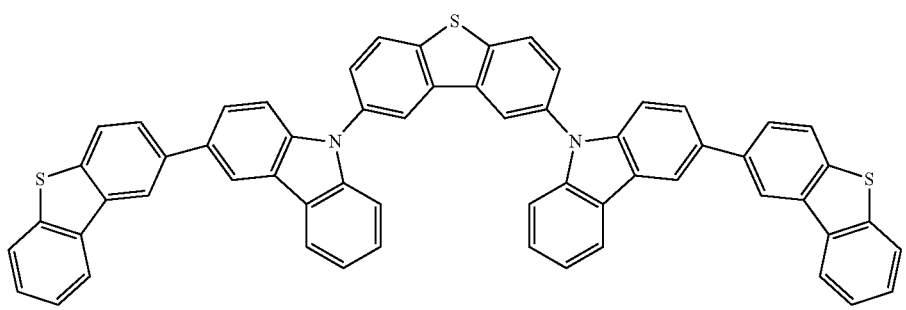
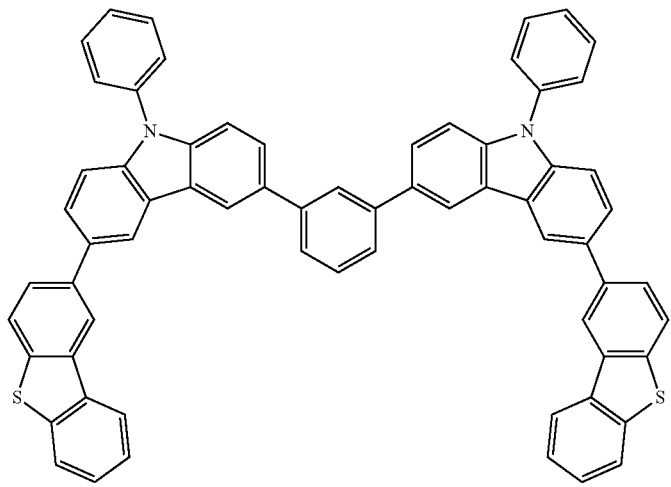
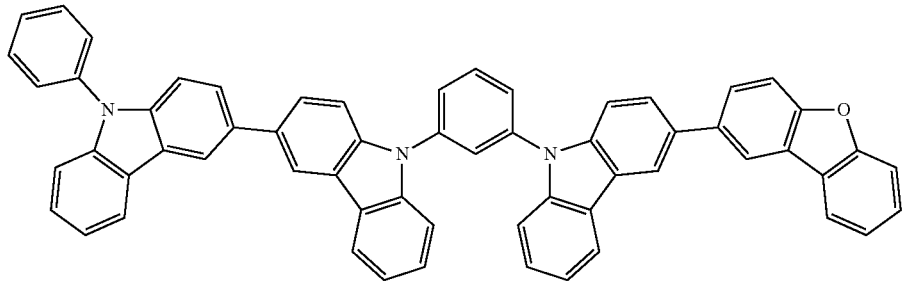
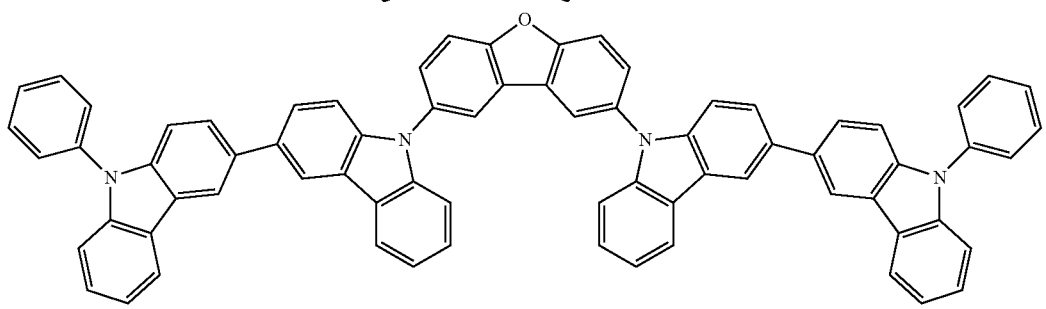

-continued
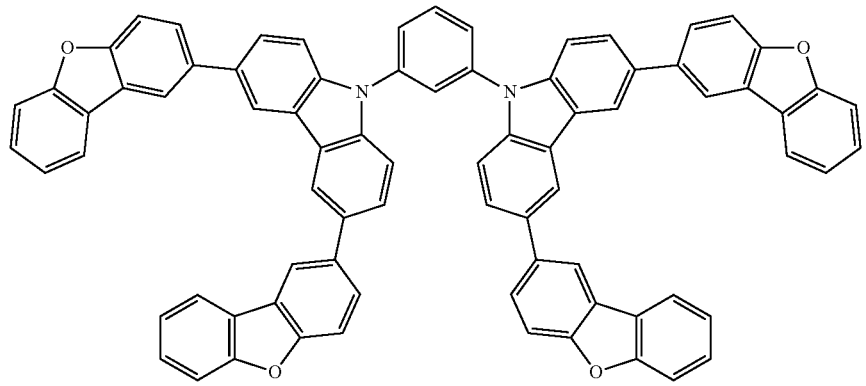
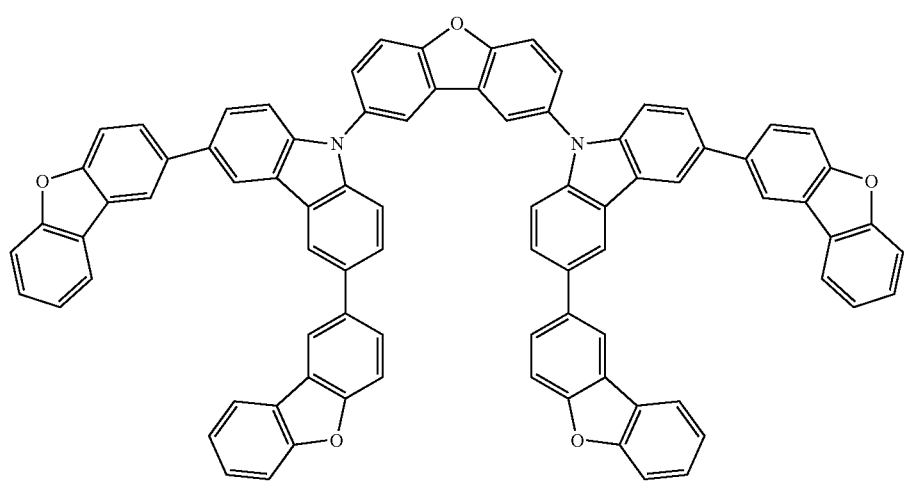
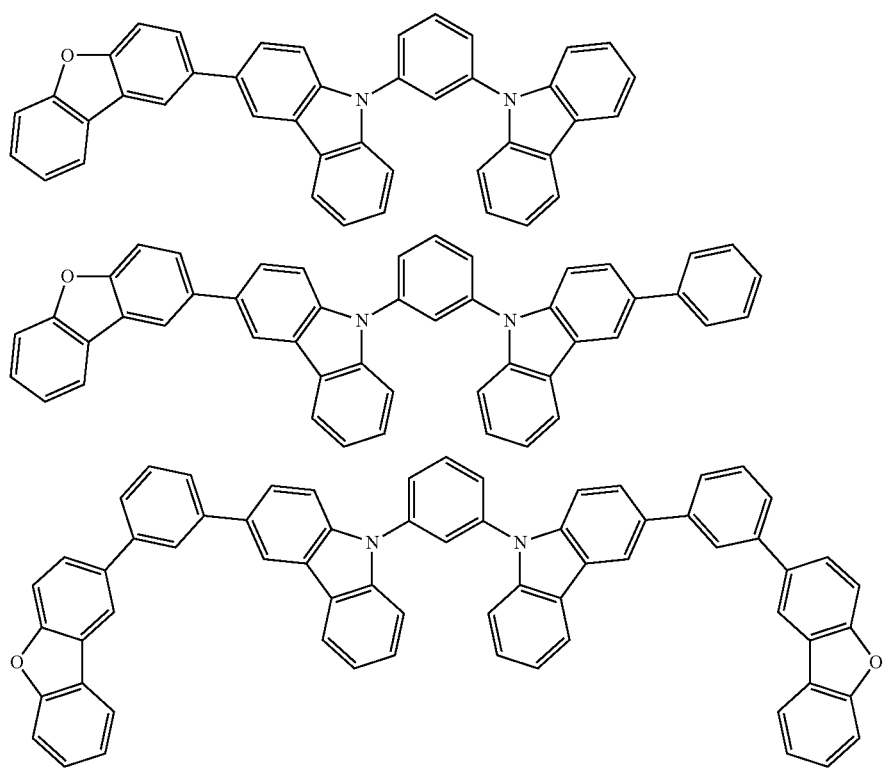

117 118
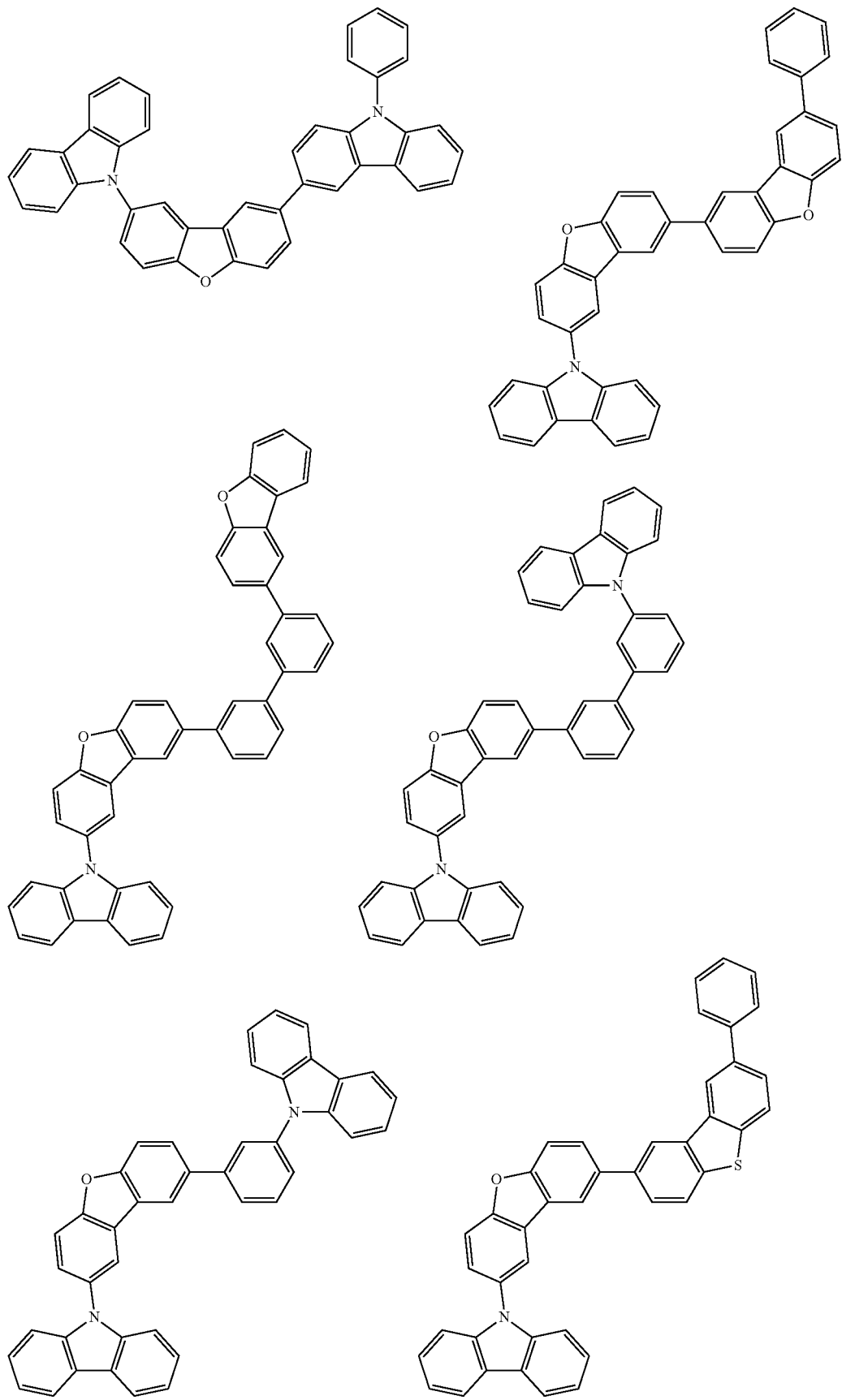
-continued

-continued
119
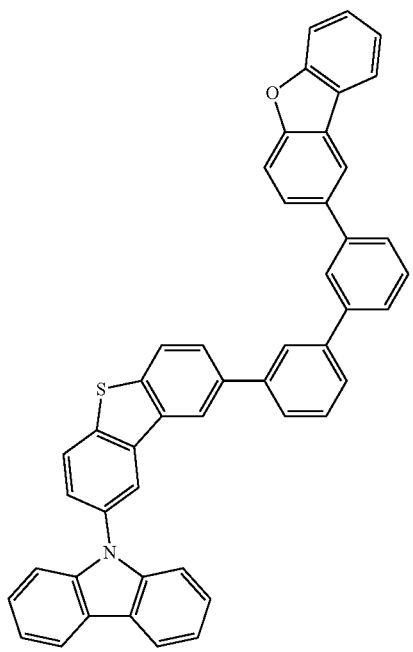
120
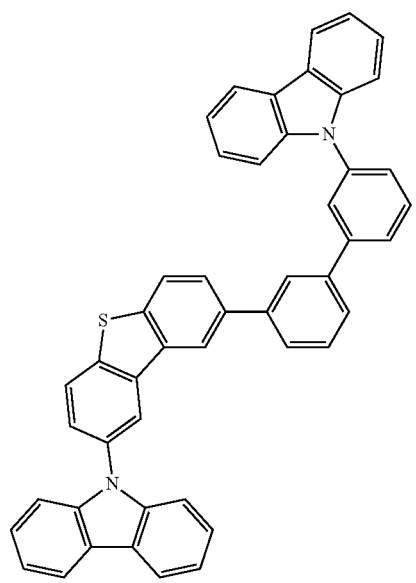
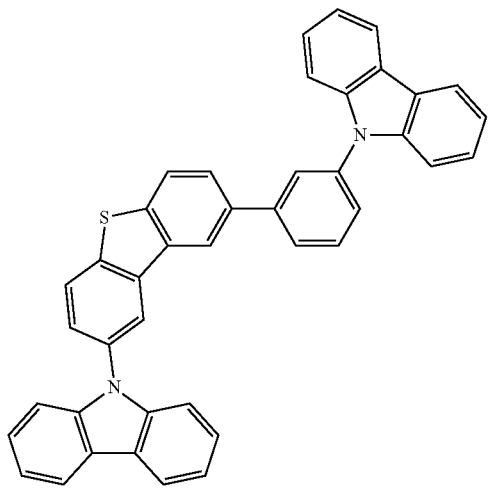
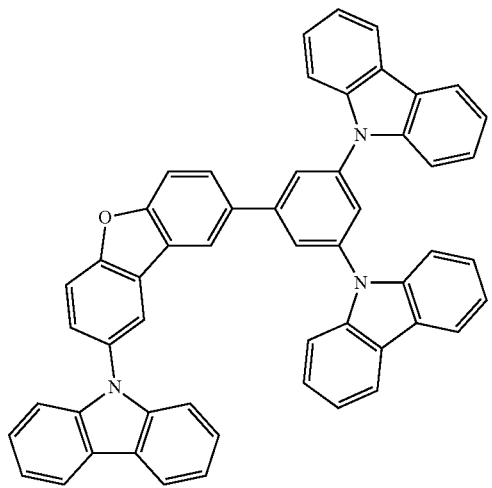
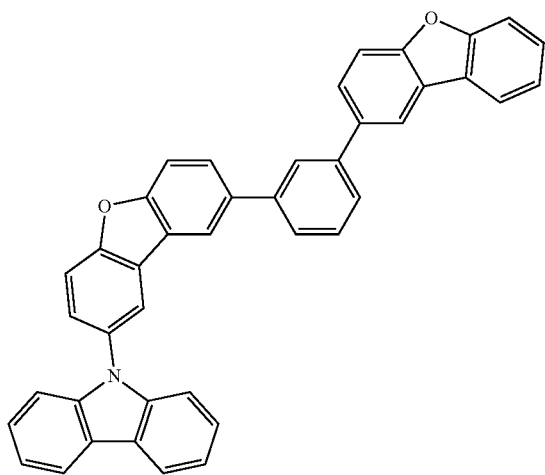
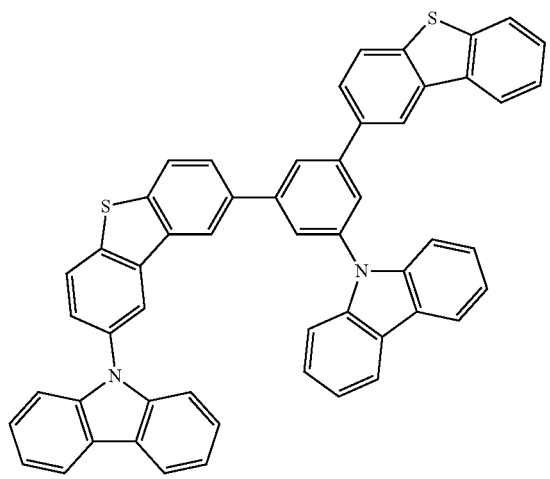

121
122
-continued
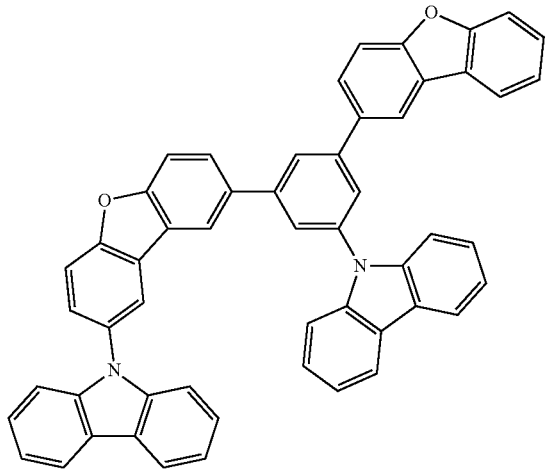
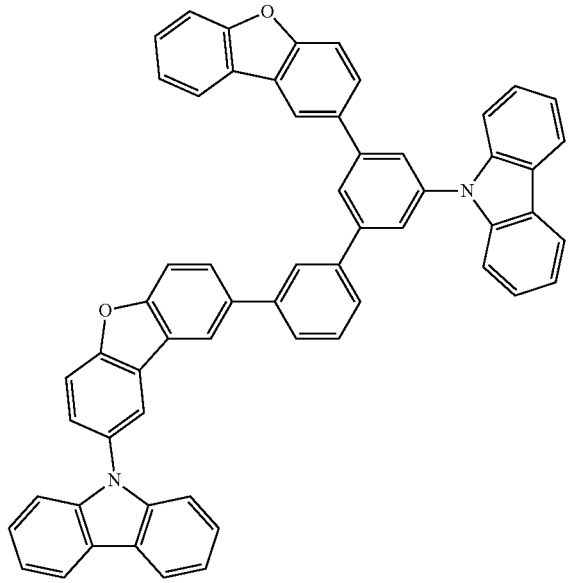
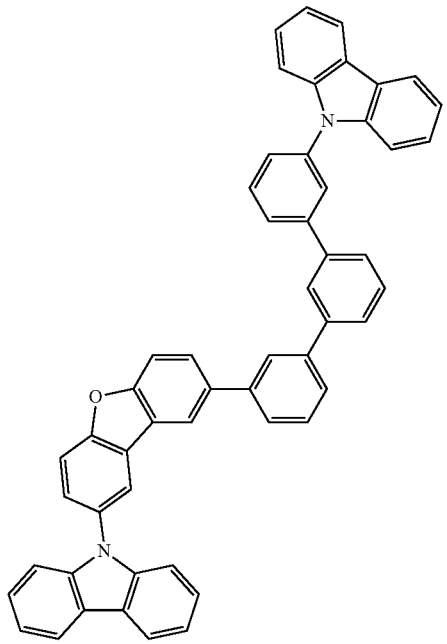
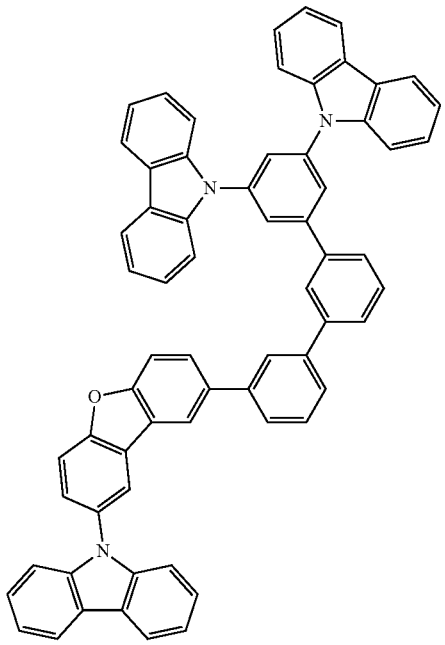
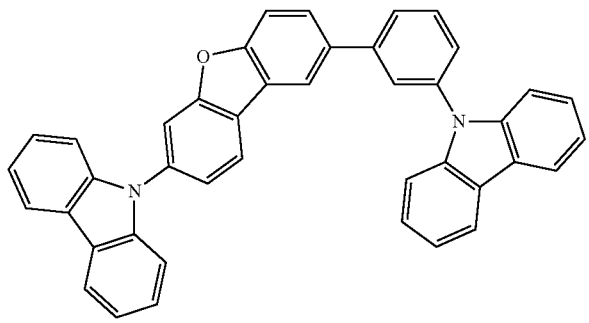
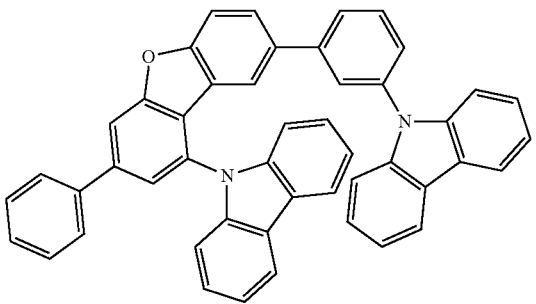

-continued
123
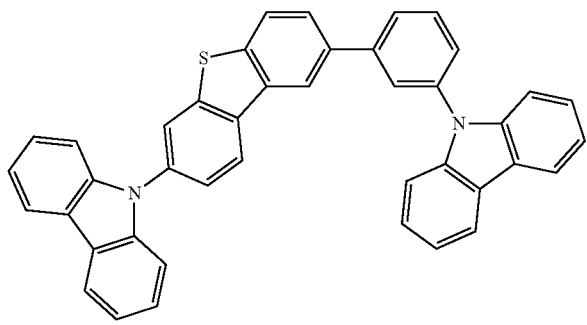
124
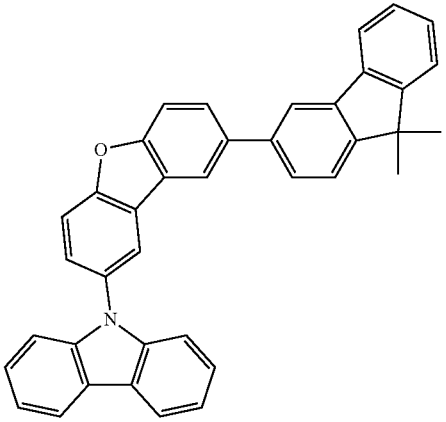
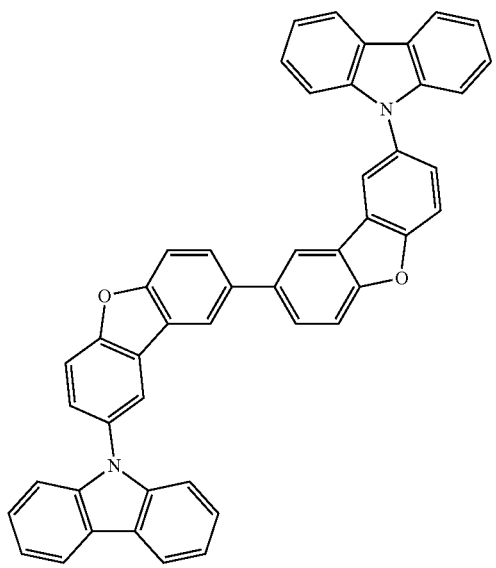
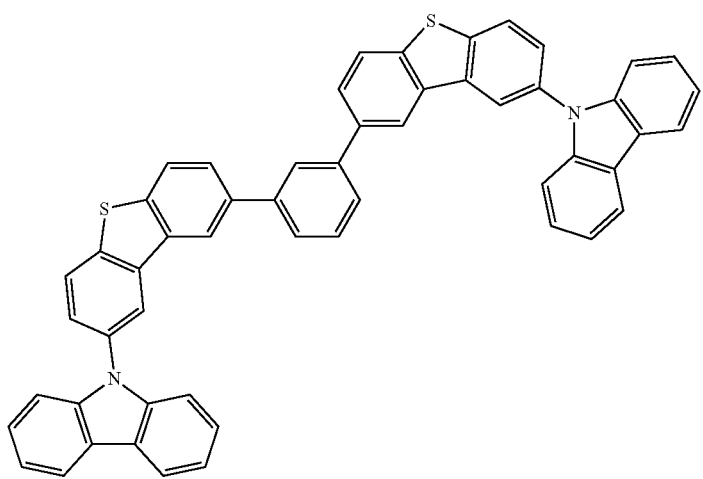

-continued
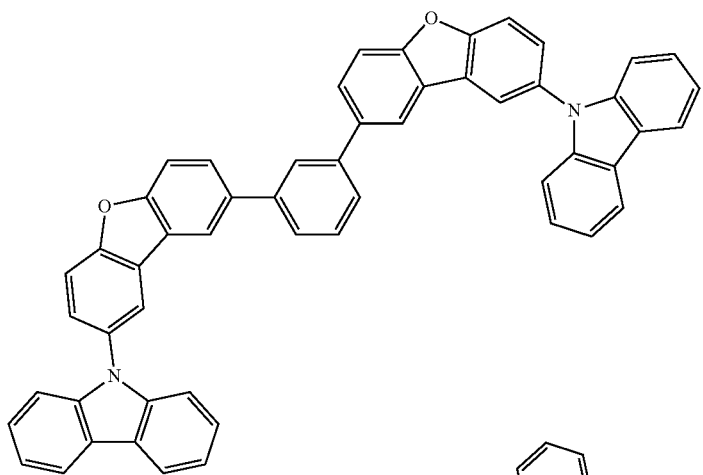
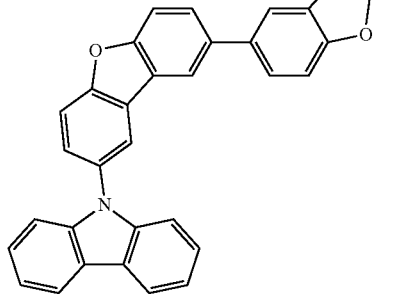
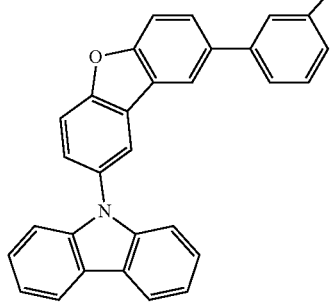

-continued

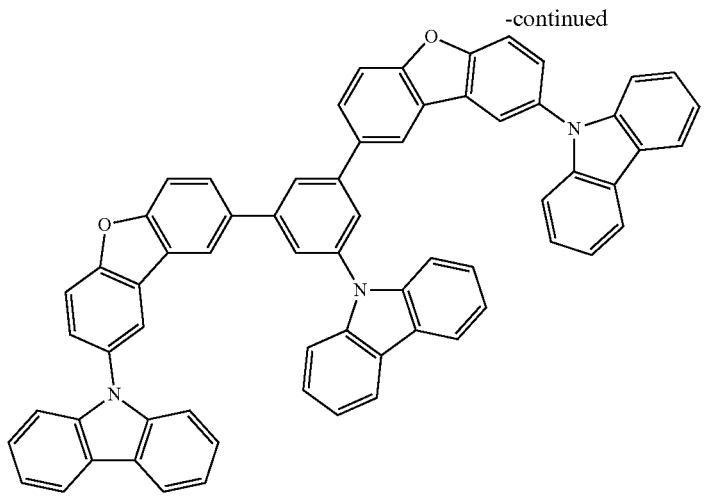

The emitting layer may be either a single layer or a stack. If the emitting layer has a stack structure, it is possible to allow the re-combination region to be concentrated in the emitting layer interface by accumulation of electrons and holes in the emitting layer interface. As a result, the quantum yield can be improved.

[Inhibiting Layer]

It is preferable to use the compound represented by the formulas (1) to (4) in a layer which is in contact with the phosphorescent emitting layer 40. For example, if a layer containing the material of the invention (anode side adjacent layer) is formed between the hole-transportation region 30 and the phosphorescent emitting layer 40 of the device shown in FIG. 1, this layer has a function as an electron-blocking layer or has a function as an exciton-blocking layer.

If a layer containing the compound represented by the formulas (1) to (4) (cathode side adjacent layer) is formed between the phosphorescent emitting layer 40 and the electron-transportation region 50, this layer has a function as a hole-blocking layer or a function as an exciton-blocking layer.

The blocking layer (inhibiting layer) is a layer having a function of blocking movement of carriers or blocking diffusion of excitons. An organic layer for preventing leakage of electrons from the emitting layer to the hole-transportation region is mainly defined as the "electron-blocking layer", and an organic layer for preventing leakage of holes from the emitting layer to the electron-transportation region may often be defined as a hole-blocking layer. Further, an organic layer which prevents diffusion of triplet excitons generated in the emitting layer to circumferential layers having a lower triplet energy than that of the emitting layer may often be defined as an exciton-blocking layer (triplet blocking layer).

Further, the compound represented by the formulas (1) to (4) may be used in a layer which is in contact with the phosphorescent emitting layer 40, and further, may be used in other organic thin film layers which are connected to this adjacent layer.

In addition, if two or more emitting layers are formed, the compound represented by the formulas (1) to (4) can preferably be used as a material for a space layer formed between the emitting layers.

In the organic EL device of the invention, it is preferred that at least one of an electron-donating dopant and an organic metal complex be used in the interface region of the cathode and the organic thin film layer.

Due to such a configuration, the luminance can be improved and the lifetime can be prolonged in the organic EL device.

Further, in the organic EL device of the invention, in the electron-transporting layer or the electron-injecting layer in the electron-transportation region 50, it is preferred that the compound represented by the formulas (1) to (4) and an electron-donating dopant be contained. As a result, the driving voltage of the organic EL device can be further decreased.

As the electron-donating dopant, at least one selected from an alkali metal, an alkali metal compound, an alkaline earth metal, an alkaline earth metal compound, a rare earth metal, a rare earth metal compound and the like can be given.

As the organic metal complex, at least one selected from an organic metal complex containing an alkali metal, an organic metal complex containing an alkaline earth metal, and an organic metal complex containing a rare earth metal can be given.

As the alkali metal, lithium (Li) (work function: 2.93 eV), sodium (Na) (work function: 2.36 eV), potassium (K) (work function: 2.28 eV), rubidium (Rb) (work function: 2.16 eV), cesium (Cs) (work function: 1.95 eV) or the like can be given. One having a work function of 2.9 eV or less is preferable. Of these, K, Rb and Cs are preferable, with Rb or Cs being further preferable. Cs is most preferable.

As the alkaline earth metal, calcium (Ca) (work function: 2.9 eV), strontium (Sr) (work function: 2.0 eV or more and 2.5 eV or less), barium (Ba) (work function: 2.52 eV) or the like can be given. One having a work function of 2.9 eV or less is particularly preferable.

As the rare earth metal, scandium (Sc), yttrium (Y), cerium (Ce), terbium (Tb) and ytterbium (Yb) or the like can be given. Of these, one having a work function of 2.9 eV or less is particularly preferable.

Of the above-mentioned metals, preferable metals have particularly high reduction power, and by addition of a relatively small amount thereof to the electron-injection region, improvement in the luminance or prolongation of the lifetime in the organic EL device can be attained.

As the alkali metal compound, an alkali oxide such as lithium oxide ($Li_2O$), cesium oxide ($Cs_2O$) and potassium oxide ($K_2O$) and an alkali halide such as lithium fluoride (LiF), sodium fluoride (NaF), cesium fluoride (CsF) and potassium fluoride (KF) can be given. Lithium fluoride (LiE), lithium oxide ($Li_2O$) and sodium fluoride (NaF) are preferable.

As the alkaline earth metal compound, barium oxide (BaO), strontium oxide (SrO), calcium oxide (CaO), a mixture of these, e.g. barium strontium oxide ($Ba_xSr_{1-x}O$) (0<x<1), barium calcium oxide ($Ba_xCa_{1-x}O$) (0<x<1), or the like can be given. Of these, BaO, SrO and CaO are preferable.

As the rare earth metal compound, ytterbium fluoride ($YbF_3$), scandium fluoride ($ScF_3$), scandium oxide ($ScO_3$), yttrium oxide ($Y_2O_3$), cerium oxide ($Ce_2O_3$), gadolinium fluoride ($GdF_3$), terbium fluoride ($TbF_3$) or the like can be given. Of these, $YbF_3$, $ScF_3$ and $TbF_3$ are preferable.

As for the organic metal complex, as mentioned above, no specific restrictions are imposed as long as they contain at least one of an alkali metal ion, an alkaline earth metal ion and a rare earth metal ion as the metal ion. As the ligand, quinolinol, benzoquinolinol, acrydinol, phenanthridinol, hydroxyphenyl oxazole, hydroxyphenyl thiazole, hydroxydiaryl oxadiazole, hydroxydiaryl thiadiazole, hydroxyphenyl pyridine, hydroxyphenyl benzimidazole, hydroxybenzo triazole, hyroxyfluborane, bipyridyl, phenanthroline, phthalocyanine, porphyrin, cyclopentadiene, 6-diketone, azomethine, and derivatives thereof are preferable, but not limited thereto.

The electron-donating dopant and the organic metal complex are preferably added in the form of a layer or an island in the interfacial region. As the method for forming a layer or an island of the dopant in the interfacial region, a method is preferable in which, while depositing at least one of an electron-donating dopant and an organic metal complex by the resistance heating evaporation method, an organic substance, which is an emitting material or an electron-injecting material that forms an interfacial region, is simultaneously deposited, whereby at least one of an electron-donating dopant and an organic metal complex is dispersed in the organic substance. The dispersion concentration is normally organic substance:electron-donating dopant and/or organic metal complex=100:1 to 1:100 in terms of molar ratio, with 5:1 to 1:5 being more preferable.

When forming at least one of an electron-donating dopant and an organic metal complex in the form of a layer, after forming into a layer the emitting material or the electron-injecting material which is the organic layer of the interface, at least one of the electron-donating dopant and the organic metal complex is singly deposited by the resistance heating evaporation method, preferably in a layer thickness of 0.1 nm to 15 nm.

When forming at least one of an electron-donating dopant and an organic metal oxide in the form of an island, after forming into an island the emitting material or the electron-injecting material which is the organic layer of the interface, at least one of the electron-donating dopant and the organic metal complex is singly deposited by the resistance heating evaporation method, preferably in an island thickness of 0.05 nm to 1 nm.

As for the ratio of the main component and at least one of the electron-donating dopant and the organic metal complex is further preferably main components:electron-donating dopant and/or organic metal complex=5:1 to 1:5, more preferably 2:1 to 1:2, in terms of mole.

[Hole-Injecting Layer and Hole-Transporting Layer (Hole-Injecting/Transporting Layer)]

A hole-injecting/transporting layer is a layer which helps injection of holes to the emitting layer and transports the injected holes to the emission region and has a large hole mobility and normally has a small ionizing energy of 5.6 eV or less.

Further, an inorganic compound such as a p-type Si and a p-type SiC can be used as a hole-injecting material.

[Substrate]

As the substrate, a glass plate, a polymer plate or the like can be used.

Examples of the glass plate, in particular, include soda-lime glass, barium/strontium-containing glass, lead glass, aluminosilicate glass, borosilicate glass, barium borosilicate glass and quartz. Examples of the polymer plate include polycarbonate, acrylic polymer, polyethylene terephthalate, polyethersulfone and polysulfone.

[Anode]

The anode is formed of a conductive material, for example, and one having a work function larger than 4 eV is suitable.

As the conductive material, carbon, aluminum, vanadium, iron, cobalt, nickel, tungsten, silver, gold, platinum and palladium, alloys thereof, oxidized metals such as tin oxide and indium oxide which are used for an ITO substrate and a NESA substrate and an organic conductive resin such as a polythiophene and polypyrrole are used.

The anode may be formed of two or more layers, if necessary.

[Cathode]

The cathode is formed of a conductive material, for example, and one having a work function smaller than 4 eV is suitable.

As the conductive material, magnesium, calcium, tin, lead, titanium, yttrium, lithium, ruthenium, manganese, aluminum, lithium fluoride and alloys thereof are used, but usable materials are not limited thereto.

Representative examples of the alloy include, though not limited thereto, a magnesium/silver alloy, a magnesium/indium alloy and a lithium/aluminum alloy. The amount ratio of an alloy is controlled by the temperature of the deposition source, atmosphere, vacuum degree or the like, and a suitable ratio is selected.

If necessary, the cathode may be formed of two or more layers. This cathode can be formed by making the conductive materials into a thin film by vapor deposition, sputtering or some other methods.

In the case where light is outcoupled from the emitting layer through the cathode, the cathode preferably has a light transmittance of larger than 10%.

The sheet resistance of the cathode is preferably several hundreds $\Omega/\square$ or less, and the film thickness thereof is usually from 10 nm to 1 μm, preferably from 50 to 200 nm.

Each layer of the organic EL device of the invention can be formed by a known dry film-forming method such as vacuum vapor deposition, sputtering, plasma coating and ion plating and a known wet film-forming method such as spin coating, dipping and flow coating.

Although no particular restrictions are imposed on the film thickness of each layer, it is required to set it to a suitable film thickness. If the film thickness is too large, a large voltage is required to be applied in order to obtain a certain optical output, resulting in poor efficiency. If the film thickness is too small, pinholes or the like are generated, and hence, a sufficient luminance cannot be obtained even if an electric field is

EXAMPLES

Synthesis Example 1

Synthesis of Compound 6

(1) Synthesis of Intermediate A

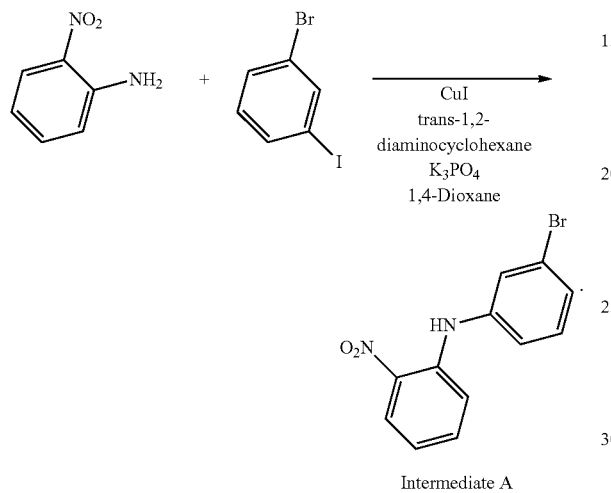

Intermediate A

Under an argon atmosphere, 35.0 g (253 mmol) of 2-nitroaniline, 86.1 g (304 mmol) of 1-bromo-3-iodobenzene, 4.8 g (25.3 mmol) of copper iodide, 5.8 g (50.6 mmol) of trans-1,2-diaminocyclohexane, and 118.2 g (557 mmol) of tripotassium phosphate were added to 400 ml of dehydrated 1,4-dioxane, and the mixture was heated and stirred at 90° C. for 20 hours. Water was added to the reaction solution to precipitate solids. The precipitated solids were collected and washed with water and methanol to obtain 71.1 g of Intermediate A (yield: 95%).

(2) Synthesis of Intermediate B

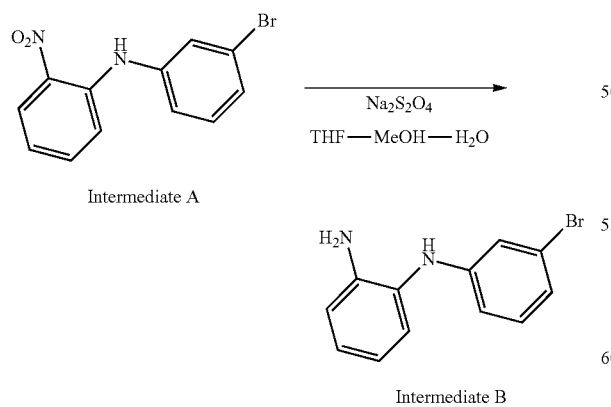

Intermediate B

Under an argon atmosphere, 71.1 g (242 mmol) of Intermediate A, 280 ml of tetrahydrofuran and 60 ml of methanol were reacted to obtain a reaction solution. To the reaction solution, 84.3 g (484 mmol) of sodium hydrosulfite dissolved in 300 ml of water was added dropwise at room temperature over 1 hour. After stirring for 2 hours, 42.1 g (242 mmol) of sodium hydrosulfite was further added and the mixture was stirred for 24 hours. An organic phase was isolated, and ethyl acetate and an aqueous sodium hydrogen carbonate solution were added to a water phase. To the resultant, the isolated organic phase was added. This organic phase was purified by means of silica gel column chromatography to obtain 30.2 g of Intermediate B (yield: 47%). As the eluent of silica gel column chromatography, heptane only, a solvent of heptane: toluene=1:1, and a solvent of toluene: ethyl acetate=10:1 were used in this order.

(3) Synthesis of Intermediate C

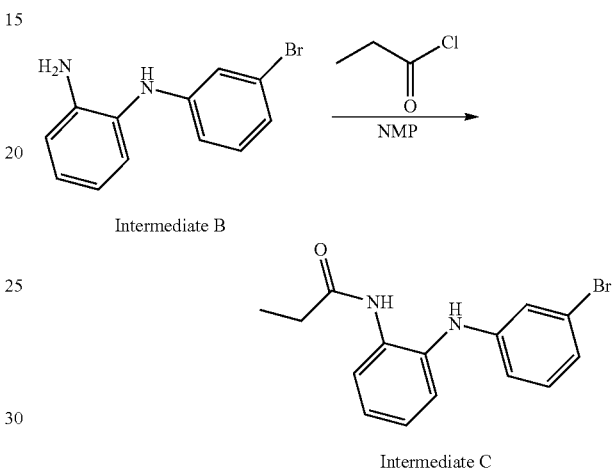

Intermediate C

Under an argon atmosphere, 30.2 g (115 mmol) of Intermediate B and 170 ml of N-methyl pyrrolidone (NMP) were reacted to obtain a reaction solution. To the reaction solution, 11.7 g (126 mmol) of propionyl chloride was added dropwise at 10 to 15° C. and the mixture was stirred at room temperature over 1 hour. Solids which had been precipitated by adding 200 ml of water were collected. The collected solids were washed with water to obtain 39.4 g of Intermediate C. Without further conducting purification, Intermediate C thus obtained was used in the next process.

(4) Synthesis of Intermediate D

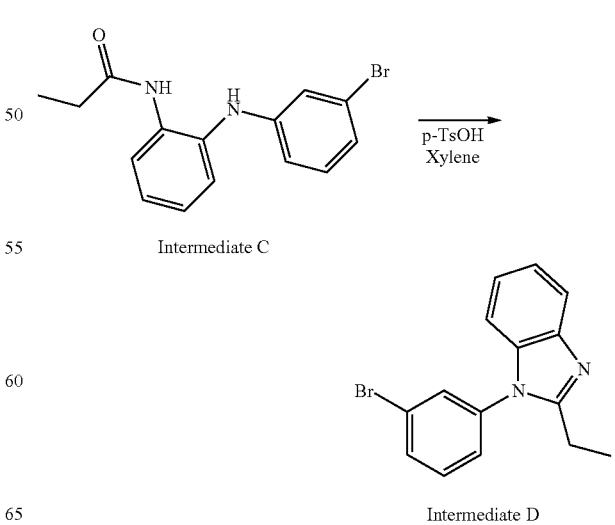

Intermediate D

Under an argon atmosphere, 39.4 g of Intermediate C, 6.5 g (34.2 mmol) of p-toluenesulfonic acid hydrate and 300 ml of xylene were mixed. The mixture was placed in a reactor provided with a Dean-Stark tube, and heated and stirred at 140° C. for 2 hours while removing generated water. After cooling to room temperature, 3 L of water was added. The resultant was separated to obtain an organic phase. The organic phase was concentrated under reduced pressure. The residue obtained was purified by means of silica gel column chromatography (eluent: toluene). By repeating recrystallization from toluene solvent, 25.5 g of Intermediate D was obtained (yield from Intermediate B: 74%).

(5) Synthesis of Compound 6

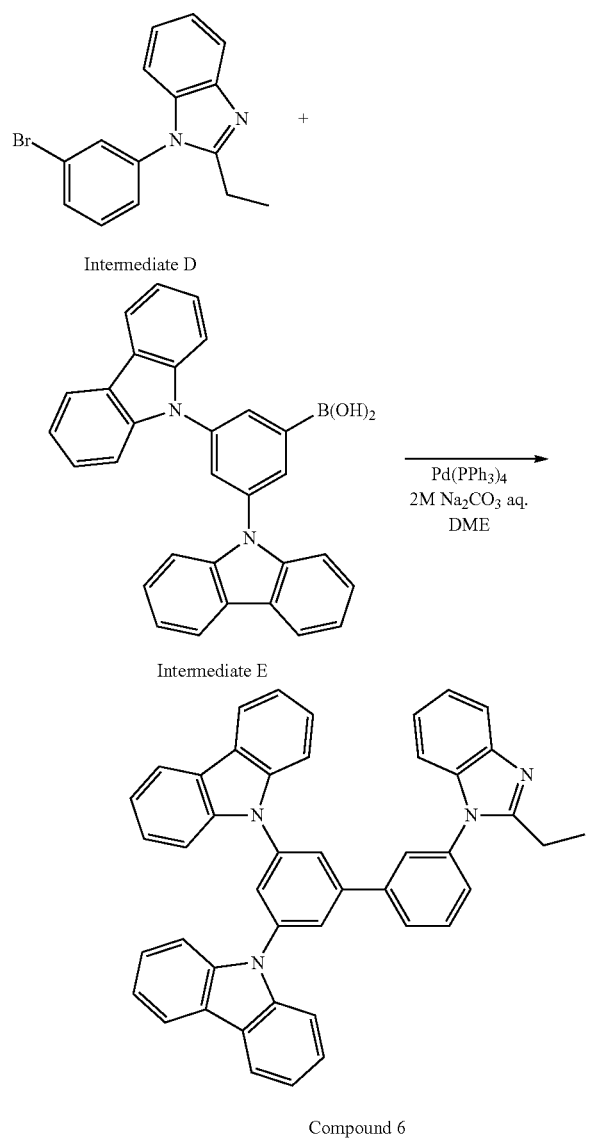

Intermediate D

Intermediate E

Compound 6

Under an argon atmosphere, 3.0 g (10 mmol) of Intermediate D, 4.5 g (10 mmol) of Intermediate E (which can be synthesized according to the method described in US2013/082591, for example), 0.23 g (0.2 mmol) of Pd(PPh$_3$)$_4$ and 10 ml of an aqueous 2M sodium carbonate solution were added to 50 ml of 1,2-dimethoxyethane (DME), and the mixture was heated and stirred under reflux. To the resultant, methanol was added to precipitate solids. The solids was collected and dissolved in dichloromethane to obtain an oily matter. The oily matter was purified by means of silica gel column chromatography to obtain 4.3 g of Compound 6 (yield: 68%). As the eluent of silica gel column chromatography, a solvent of hexane: dichloromethane=10:1, and a solvent of hexane: dichloromethane=3:1 were used in this sequence.

The result of FD-MS analysis was m/e=628 for molecule weight 628.

Synthesis Example 2

Synthesis of Compound 8

(1) Synthesis of Intermediate G

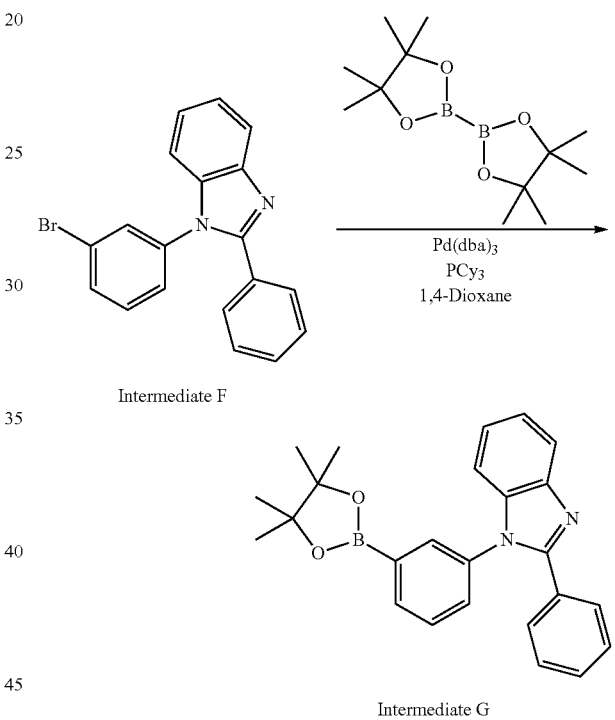

Intermediate F

Intermediate G

Under an argon atmosphere, 4.95 g (8.6 mmol) of Pd(dba)$_2$ and 5.8 g (21 mmol) of tricyclohexylphosphine were added to 1.5 L of 1,4-dioxane. Subsequently, 80.2 g (316 mmol) of bis(pinacolato)diboron, 42.2 g (420 mmol) of potassium acetate and 100 g (286 mmol) of Intermediate F were charged to the reaction solution at room temperature in this sequence. Intermediate F was synthesized in the same manner as in Synthesis Examples 1 (1) to (4), except that benzoyl chloride was used instead of propionyl chloride in Synthesis Example 1 (3).

After charging, the resultant was heated and stirred under reflux for 8 hours. After cooling to room temperature, toluene and water were added to the resultant, followed by separating an organic phase. The organic phase was washed with an aqueous sodium hydrogen carbonate solution until it became neutral. The solvent was distilled away under reduced pressure. The resulting solids were washed with heptane to obtain 91 g of Intermediate G (yield: 80%).

(2) Synthesis of Intermediate I

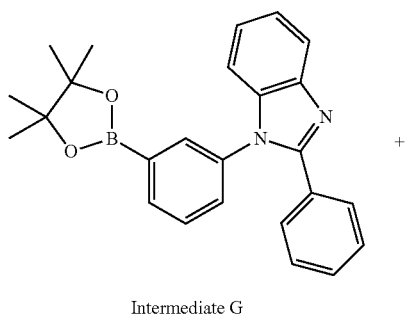

Intermediate G

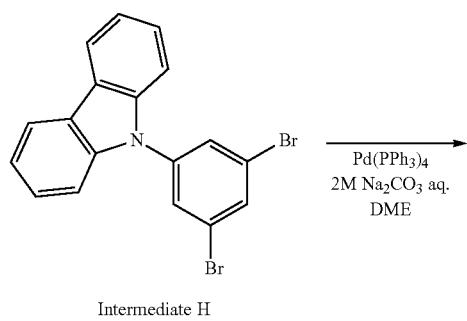

Intermediate H

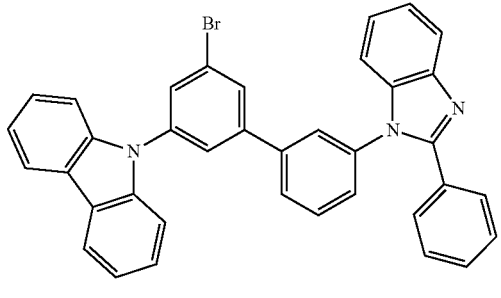

Intermediate I

Under an argon atmosphere, 4.0 g (10 mmol) of Intermediate G, 4.0 g (10 mmol) of Intermediate H (which can be synthesized according to the method described in Tetrahedron Letters, pages 6942 to 6947 (2011), for example), 0.23 g (0.2 mmol) of Pd(PPh$_3$)$_4$ and 10 ml of an aqueous 2M sodium carbonate solution were added to 50 ml of 1,2-dimethoxyethane (DME). The mixture was heated and stirred under reflux. To the resultant, methanol was added to precipitate solids. The solids was collected and dissolved in dichloromethane to obtain an oily matter. The oily matter was purified by means of silica gel column chromatography to obtain 1.6 g of Intermediate I (yield: 27%). As the eluent of silica gel column chromatography, a solvent of hexane: dichloromethane=10:1, and a solvent of hexane: dichloromethane=3:1 were used in this sequence.

(3) Synthesis of Compound 8

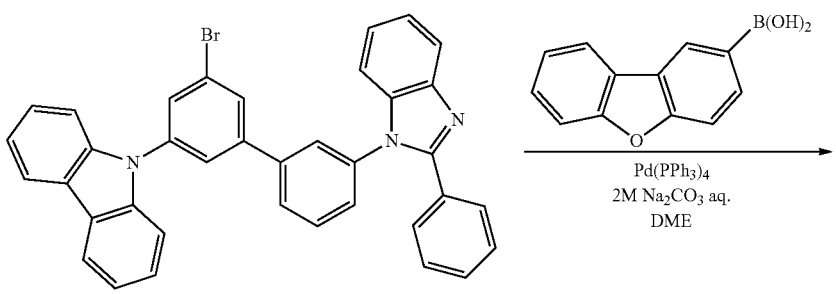

Intermediate I

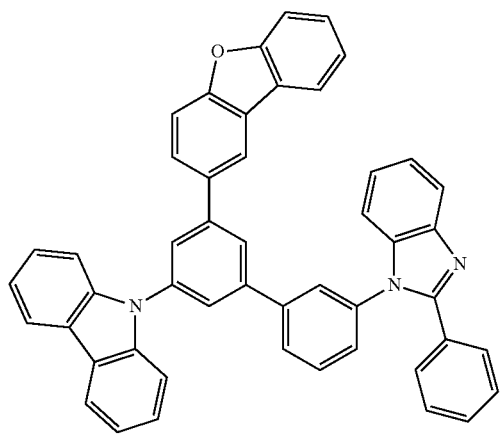

Compound 8

Under an argon atmosphere, 1.6 g (2.7 mmol) of Intermediate I, 0.57 g (2.7 mmol) of dibenzofuran-2-boronic acid, 94 mg (0.081 mmol) of Pd(PPh$_3$)$_4$ and 5 ml of an aqueous 2M sodium carbonate solution were added to 20 ml of 1,2-dimethoxyethane (DME). The mixture was heated and stirred under reflux. To the resultant, methanol was added to precipitate solids. The solids were collected and dissolved in dichloromethane to obtain an oily matter. The oily matter was purified by means of silica gel column chromatography to obtain 1.5 g of Compound 8 (yield: 82%). As the eluent of silica gel column chromatography, a solvent of hexane: dichloromethane=10:1, and a solvent of hexane: dichloromethane=3:1 were used in this sequence.

The result of FD-MS analysis was m/e=677 for molecule weight 677.

Synthesis Example 3

Synthesis of Compound 9

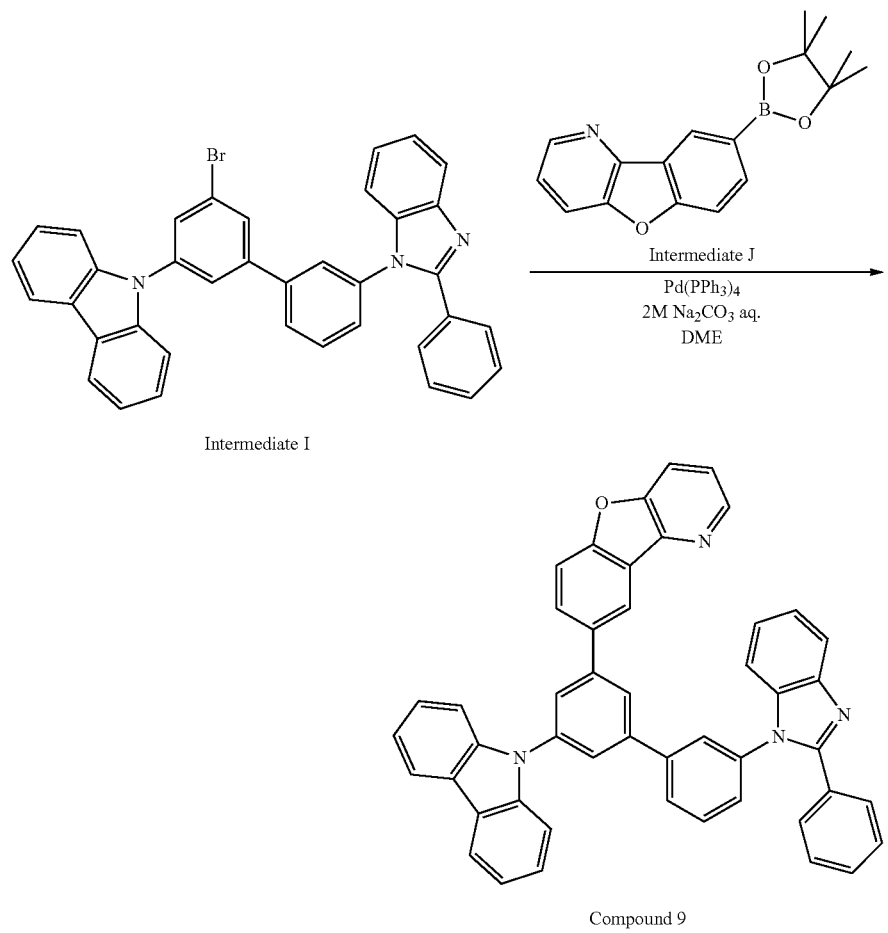

Compound 9 was synthesized in the same manner as in Synthesis Example 2 (3), except that Intermediate J (which can be synthesized according to the method described in WO2013-038650, for example) was used instead of dibenzofuran-2-boronic acid.

The result of FD-MS analysis was m/e=687 for molecule weight 678.

Synthesis Example 4

Synthesis of Compound 13

Compound 13 was synthesized in the same manner as in Synthesis Examples 1 (1) to (5), except that n-butyryl chloride was used instead of propionyl chloride in Synthesis Example 1 (3).

The result of FD-MS analysis was m/e=642 for molecule weight 642.

Synthesis Example 5

Synthesis of Compound 15

Compound 15 was synthesized in the same manner as in Synthesis Examples 1 (1) to (5), except that isobutyryl chloride was used instead of propionyl chloride in Synthesis Example 1 (3).

The result of FD-MS analysis was m/e=642 for molecule weight 642.

Synthesis Example 6

Synthesis of Compound 20

Compound 20 was synthesized in the same manner as in Synthesis Examples 1 (1) to (5), except that pivaloyl chloride was used instead of propyonyl chloride in Synthesis Example 1 (3).

The result of FD-MS analysis was m/e=656 for molecule weight 656.

Synthesis Example 7

Synthesis of Compound 21

Compound 21 was synthesized in the same manner as in Synthesis Examples 1 (1) to (5), except that 2-methylbutyryl chloride was used instead of propionyl chloride in Synthesis Example 1 (3).

The result of FD-MS analysis was m/e=656 for molecule weight 656.

Synthesis Example 8

Synthesis of Compound 5

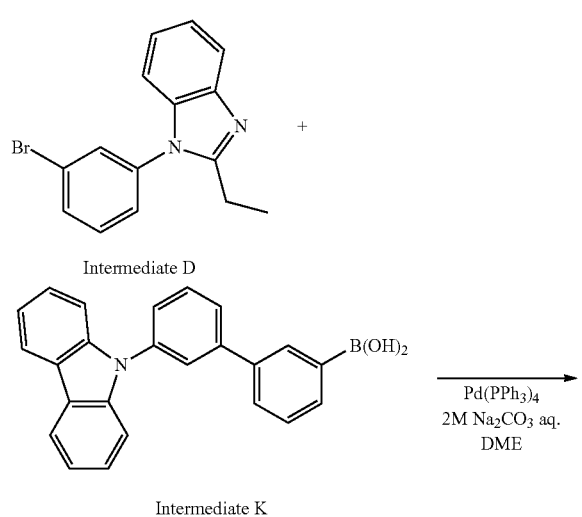

Intermediate D

Intermediate K

Pd(PPh₃)₄
2M Na₂CO₃ aq.
DME

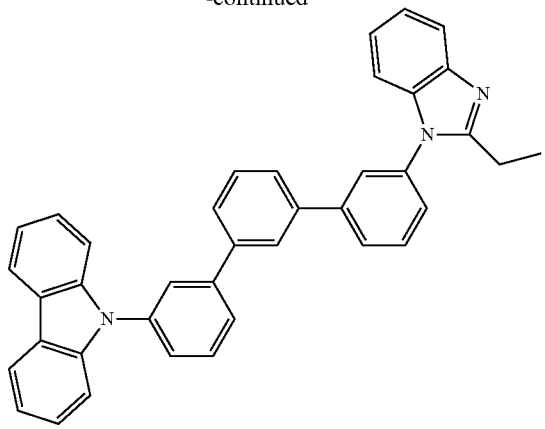

Compound 5

Compound 5 was synthesized in the same manner as in Synthesis Example 1 (5), except that Intermediate K (which can be synthesized according to the method described in EP2471772, for example) was used instead of Intermediate E.

The result of FD-MS analysis was m/e=539 for molecule weight 539.

Synthesis Example 9

Synthesis of Compound 3

Compound 3 was synthesized in the same manner as in Synthesis Example 2 (2), except that 8-(dibenzofuran-2-yl)dibenzofuran-2-boronic acid (which can be synthesized according to the method described in WO2013-038650, for example) was used instead of Intermediate H.

The result of FD-MS analysis was m/e=602 for molecule weight 602.

Synthesis Example 10

Synthesis of Compound 4

Compound 4 was synthesized in the same manner as in Synthesis Examples 1 (1) to (5), except that 1-bromo-4-iodobenzene was used instead of 1-bromo-3-iodobenzene in Synthesis Example 1 (1), and n-butyryl chloride was used instead of propionyl chloride in Synthesis Example 1 (3).

The result of FD-MS analysis was m/e=642 for molecule weight 642.

Example 1

A glass substrate of 25 mm by 75 mm by 1.1 mm with an ITO transparent electrode (GEOMATEC CO., LTD.) was subjected to ultrasonic cleaning in isopropyl alcohol for 5 minutes, and cleaning with ultraviolet rays and ozone for 30 minutes.

The cleaned substrate with transparent electrode lines was mounted on a substrate holder in a vacuum deposition device. First, HTM1 was deposited to form a 20 nm-thick film so as to cover the surface of the glass substrate on which the transparent electrode lines were formed, whereby a hole-injecting layer was obtained. Subsequently, on the HTM1 film, HTM2 was deposited to form a 60 nm-thick film, whereby a hole-transporting layer was obtained.

On the hole-transporting layer, H-1 as a phosphorescent host material and D-1 as a phosphorescent emitting material were co-deposited into a thickness of 50 nm to obtain a phosphorescent emitting layer. The concentration of H-1 was 80 mass %, and the concentration of D-1 was 20 mass %.

Subsequently, on the phosphorescent emitting layer, Compound 1 was deposited to form a 10 nm-thick film to obtain a first electron-transporting layer. Further, ETM1 was deposited to form a 10 nm-thick film to obtain a second electron-transporting layer. After that, on these layers, LIE with a thickness of 1 nm and metal Al with a thickness of 80 nm were stacked sequentially to obtain a cathode. LiF as an electron-injecting electrode was formed at a film forming rate of 1 Å/min.

The compounds used in Examples are as follows:

HTM1

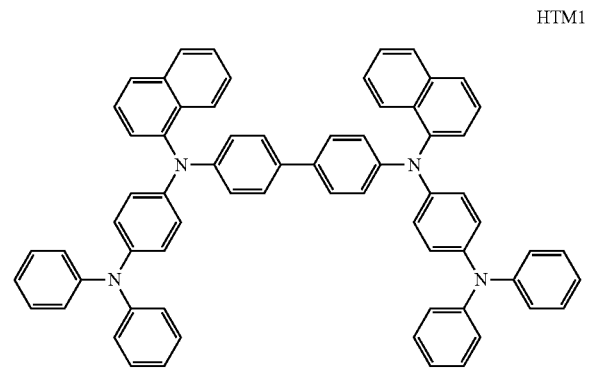

HTM2

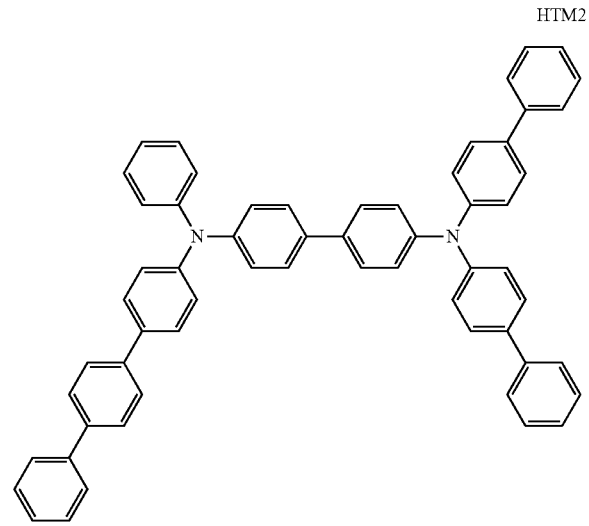

H-1

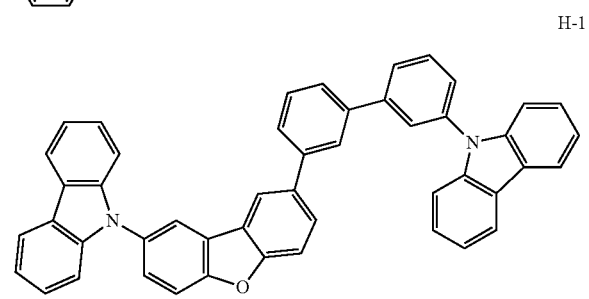

-continued

D1

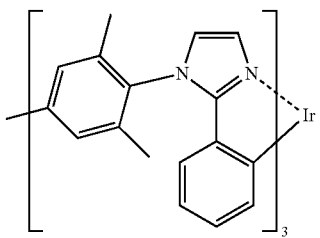

Compound 1

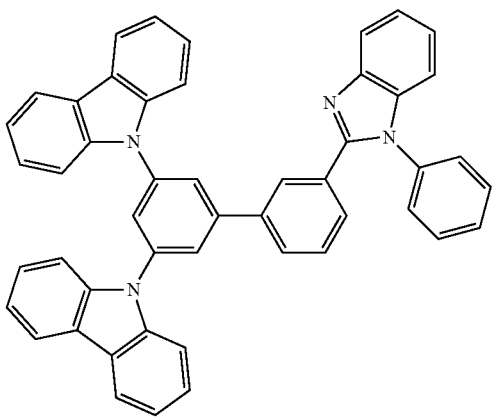

ETM1

[Luminescent Performance Evaluation of Organic EL Device]

By allowing the organic EL devices produced as above to be emitted by DC driving, the luminance and current density were measured to determine the driving voltage and luminous efficiency (external quantum efficiency) at a current density of 1 mA/cm$^2$. Furthermore, the 70% lifetime (the time spent until the luminance was reduced to 70%) at a 3,000 cd/m$^2$ of initial luminance was determined. Table 1 shows the results.

Example 2

An organic EL device was produced and evaluated in the same manner as in Example 1, except that Compound 1 was used instead of ETM1 as the second electron-transporting layer material. Table 1 shows the results.

Example 3

An organic EL device was produced and evaluated in the same manner as in Example 1, except that the following Compound 2 was used instead of Compound 1 as the first electron-transporting layer material. Table 1 shows the results.

Compound 2

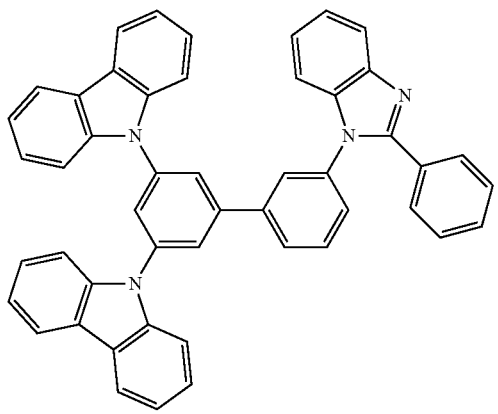

Example 4

An organic EL device was produced and evaluated in the same manner as in Example 1, except that Compound 2 was used instead of Compound 1 as the first electron-transporting layer material and Compound 2 was used instead of ETM1 as the second electron-transporting layer material. Table 1 shows the results.

Example 5

An organic EL device was produced and evaluated in the same manner as in Example 1, except that the following Compound H-2 was used instead of H-1 as the phosphorescent host material and Compound 2 was used instead of Compound 1 as the first electron-transporting layer material. Table 1 shows the results.

H-2

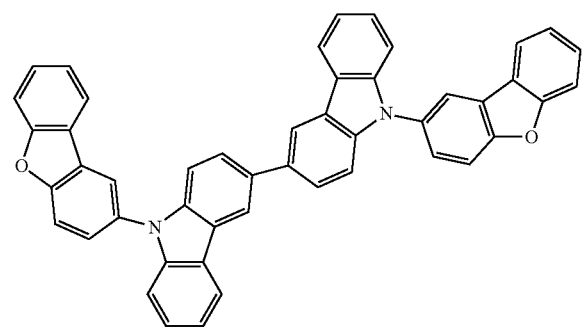

Example 6

An organic EL device was produced and evaluated in the same manner as in Example 1, except that the following Compound H-3 was used instead of H-1 as the phosphorescent host material and Compound 2 was used instead of Compound 1 as the first electron-transporting layer material. Table 1 shows the results.

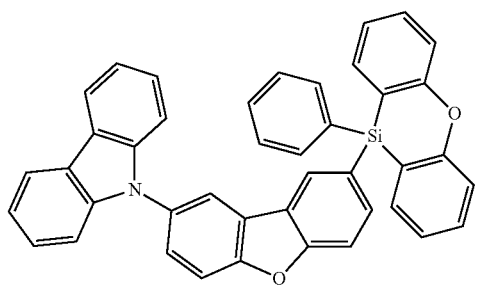 [SMILES: c1ccc([Si]2(c3ccc4oc5ccc(-n6c7ccccc7c7ccccc76)cc5c4c3)c3ccccc3Oc3ccccc32)cc1]

Comparative Example 1

An organic EL device was produced and evaluated in the same manner as in Example 1, except that Compound A was used instead of Compound 1 as the first electron-transporting layer material. Table 1 shows the results.

Compound A

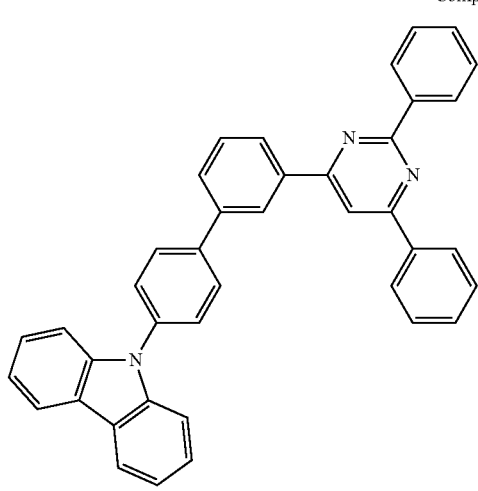

Comparative Example 2

An organic EL device was produced and evaluated in the same manner as in Example 1, except that Compound B was used instead of Compound 1 as the first electron-transporting layer material. Table 1 shows the results.

Compound B

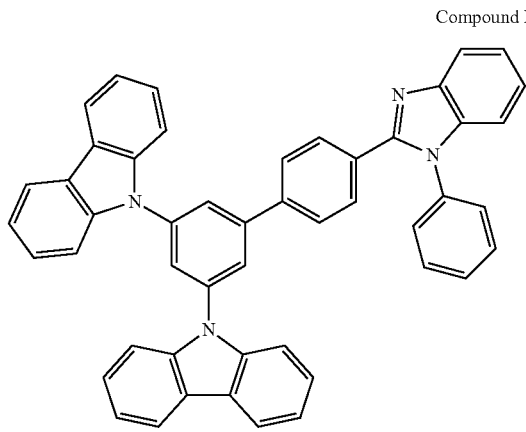

Comparative Example 3

An organic EL device was produced and evaluated in the same manner as in Example 1, except that the following Compound H-A was used instead of H-1 as the phosphorescent host material and Compound 2 was used instead of Compound 1 as the first electron-transporting layer material. Table 1 shows the results.

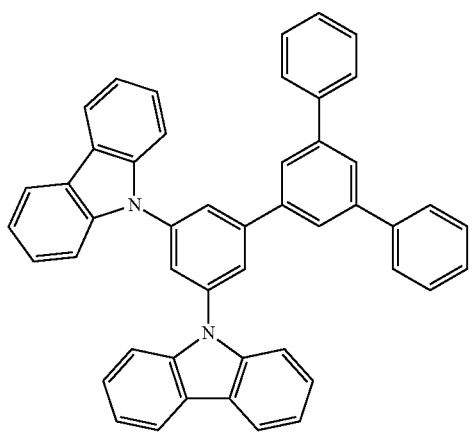

H-A

Further, the host materials and the first electron-transporting materials used in Examples and Comparative Examples were measured for the triplet energy. The results are shown in Table 2.

The triplet energy ($E^T$(eV)) was measured by the following method.

First, a sample was dissolved in an EPA (diethylether: isopentane:ethanol=5:5:2 (volume ratio)) in a concentration of 10 μmol/L, thereby to obtain a sample for measuring phosphorescent emission. This sample for measuring phosphorescent emission was put in a quarts cell, and the cell was irradiated with excited light at a temperature of 77K, and the radiated phosphorescent spectrum was measured. Based on the spectrum, a value obtained by a conversion formula $E^T(eV)=1239.85/\lambda_{edge}$ was defined as the triplet energy. The "$\lambda_{edge}$" means, when the phosphorescent intensity and the wavelength are taken at the vertical axis and the horizontal axis respectively to express a phosphorescent spectrum and a tangential line is drawn against the rise on the shorter wavelength side of the phosphorescent spectrum, a wavelength value of the tangential line and the horizontal axis (unit: nm).

For the measurement of the phosphorescent spectrum, a spectrofluorometer F-4500 main body and optional components for low-temperature measurement (manufactured by Hitachi High Technologies Corporation) were used.

TABLE 2

|  | Triplet energy [eV] |
|---|---|
| H-1 | 2.93 |
| H-2 | 2.94 |
| H-3 | 3.06 |
| H-A | 2.88 |
| Compound 1 | 2.90 |
| Compound 2 | 2.90 |
| Compound A (Non-benzimidazole compound) | 2.85 |
| Compound B | 2.75 |

From the results shown in Tables 1 and 2, it is found that the devices in Examples can be driven at lower voltages, are highly efficient and have a prolonged lifetime by compared with the devices in Comparative Examples. In particular, they have significant effects that they can be driven at a low voltage and have a high efficiency. The reason therefor is thought that a benzimidazole compound having a high triplet energy is used as an electron-transporting layer material and a host material having a high triplet energy which has a carbazole ring and a dibenzofuran ring (or a dibenzothiophene ring) in the same skeleton is appropriately combined. That is, it is due to confinement of high triplet energy required for blue phosphorescent emission in a device and appropriate adjustment of the carrier balance in the device.

TABLE 1

|  | Phophorescent host | First electron-transporting layer | Second electron-transporting layer | Voltage [V] | External quantum efficiency [%] | Luminance 70% life time [h] |
|---|---|---|---|---|---|---|
| Example 1 | H-1 | Compound 1 | ETM1 | 5.7 | 17.8 | 250 |
| Example 2 | H-1 | Compound 1 | Compound 1 | 5.4 | 18.5 | 250 |
| Example 3 | H-1 | Compound 2 | ETM1 | 4.9 | 19.4 | 350 |
| Example 4 | H-1 | Compound 2 | Compound 2 | 4.5 | 17.9 | 300 |
| Example 5 | H-2 | Compound 2 | ETM1 | 4.5 | 15.9 | 160 |
| Example 6 | H-3 | Compound 2 | ETM1 | 4.8 | 19.2 | 240 |
| Com. Exam. 1 | H-1 | Compound A | ETM1 | 6.5 | 10.8 | 140 |
| Com. Exam. 2 | H-1 | Compound B | ETM1 | 6.2 | 8.7 | 140 |
| Com. Exam. 3 | H-A | Compound 2 | ETM1 | 6 | 12.5 | 100 |

Examples 7 to 25

Organic EL devices were produced and evaluated in the same manner as in Example 1, except that Compounds 3 to 21 were used instead of Compound 1 as the first electron-transporting layer material. The results are shown in Table 3.

Examples 26 to 29

Organic EL devices were produced and evaluated in the same manner as in Example 1, except that H-2 was used instead of H-1 and Compound 4, 6, 9 or 19 was used instead of Compound 1 as the first electron-transporting layer material, respectively. The results are shown in Table 3.

-continued
Compound 3
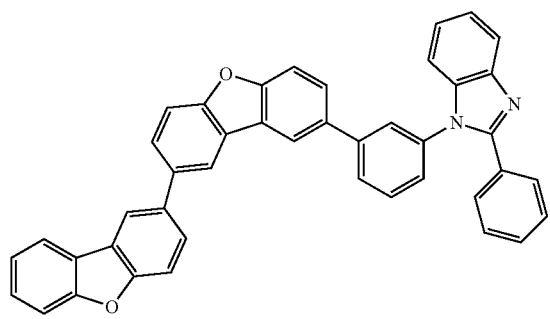
Compound 7
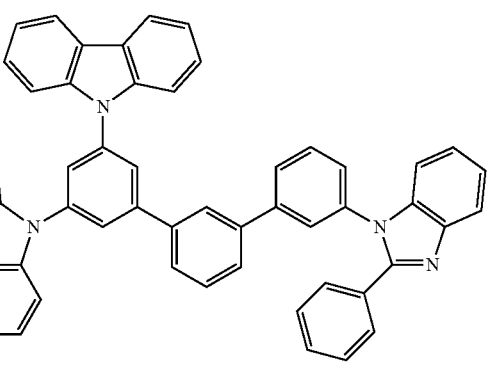
Compound 4
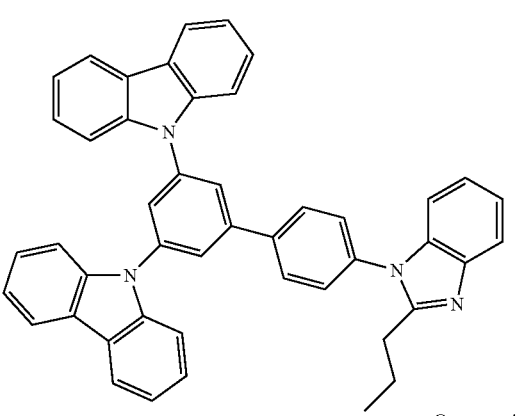
Compound 8
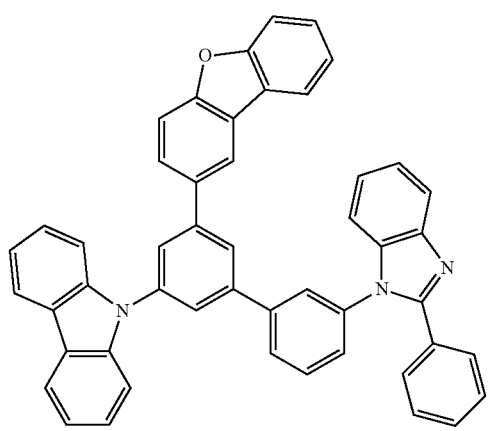
Compound 5
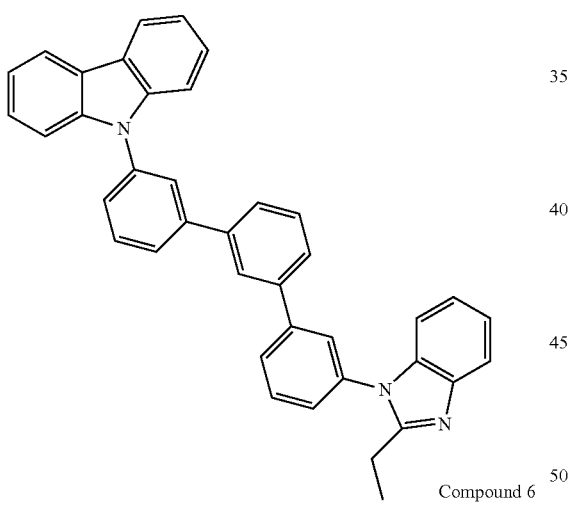
Compound 9
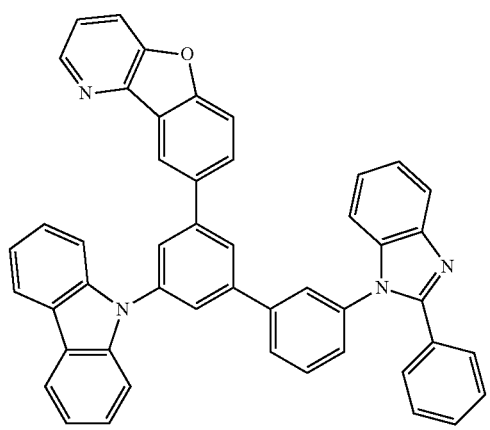
Compound 6
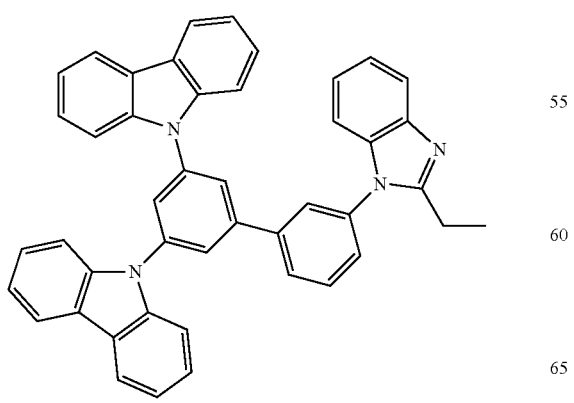

Compound 10
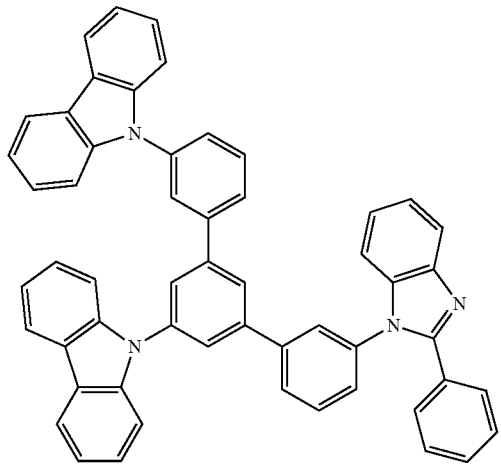
Compound 11
Compound 12
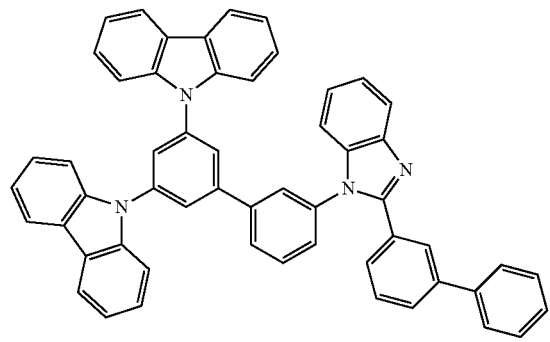
Compound 13
Compound 14
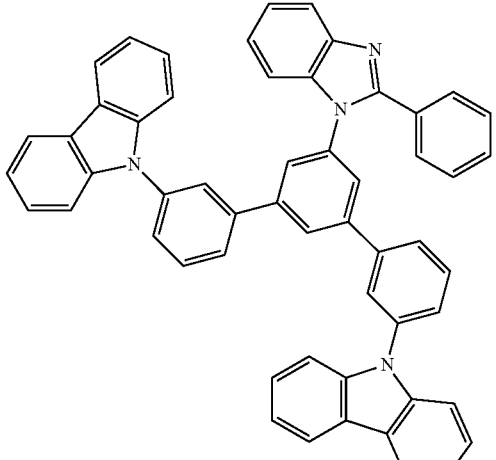
Compound 15
Compound 16
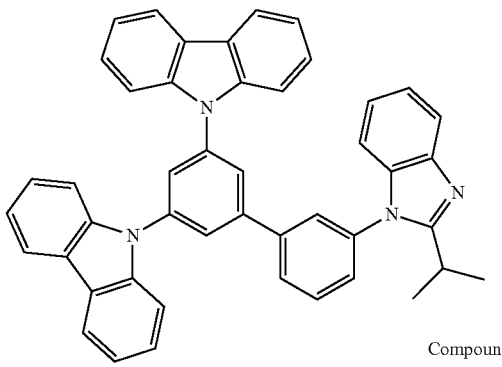
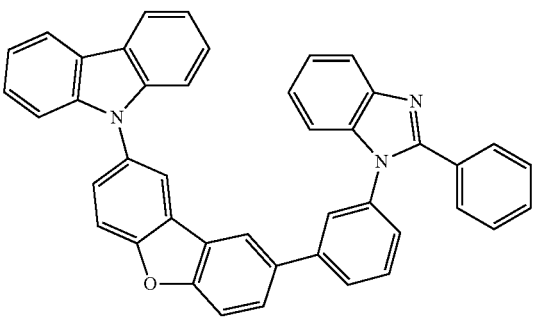
Compound 17
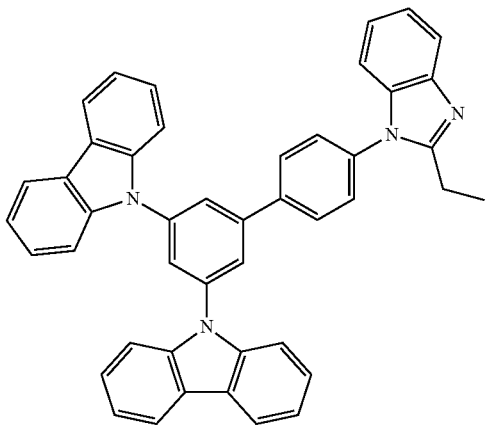

Compound 18
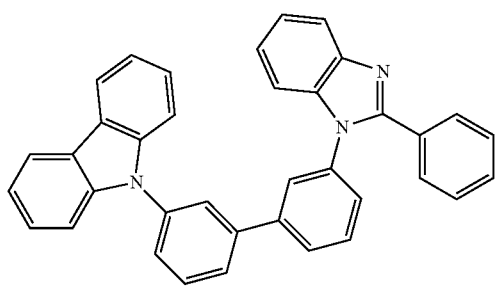

Compound 19
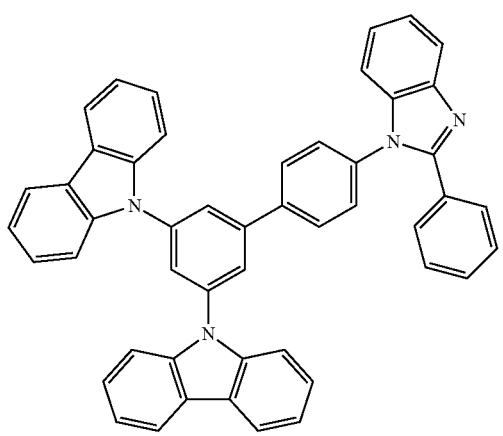

Compound 20
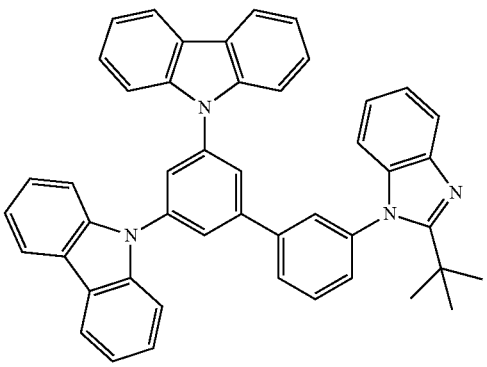

Compound 21
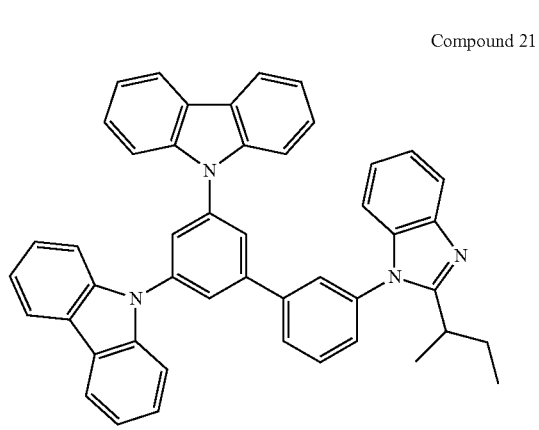

TABLE 3

| | Phophorescent host material | First electron-transporting layer material | Second electron-transporting layer material | Voltage (V) | External quantum efficiency (%) | Luminance 70% life time (hour) |
|---|---|---|---|---|---|---|
| Example 7 | H-1 | Compound 3 | ETM1 | 5.4 | 21.5 | 403 |
| Example 8 | H-1 | Compound 4 | ETM1 | 4.8 | 20.2 | 330 |
| Example 9 | H-1 | Compound 5 | ETM1 | 5.5 | 20.9 | 396 |
| Example 10 | H-1 | Compound 6 | ETM1 | 4.5 | 19.7 | 336 |
| Example 11 | H-1 | Compound 7 | ETM1 | 5.2 | 19.7 | 334 |
| Example 12 | H-1 | Compound 8 | ETM1 | 5.2 | 20.1 | 340 |
| Example 13 | H-1 | Compound 9 | ETM1 | 4.3 | 18.8 | 240 |
| Example 14 | H-1 | Compound 10 | ETM1 | 4.9 | 18.7 | 270 |
| Example 15 | H-1 | Compound 11 | ETM1 | 5.3 | 20.4 | 329 |
| Example 16 | H-1 | Compound 12 | ETM1 | 5.5 | 19.8 | 378 |
| Example 17 | H-1 | Compound 13 | ETM1 | 4.6 | 18.3 | 232 |
| Example 18 | H-1 | Compound 14 | ETM1 | 4.8 | 19.2 | 259 |
| Example 19 | H-1 | Compound 15 | ETM1 | 4.4 | 18.8 | 208 |
| Example 20 | H-1 | Compound 16 | ETM1 | 5.2 | 20.0 | 334 |
| Example 21 | H-1 | Compound 17 | ETM1 | 4.9 | 20.7 | 313 |
| Example 22 | H-1 | Compound 18 | ETM1 | 5.4 | 20.4 | 299 |
| Example 23 | H-1 | Compound 19 | ETM1 | 5.0 | 21.1 | 401 |
| Example 24 | H-1 | Compound 20 | ETM1 | 4.5 | 19.0 | 311 |
| Example 25 | H-1 | Compound 21 | ETM1 | 4.4 | 18.9 | 202 |
| Example 26 | H-2 | Compound 4 | ETM1 | 4.6 | 17.2 | 150 |
| Example 27 | H-2 | Compound 6 | ETM1 | 4.4 | 17.3 | 165 |
| Example 28 | H-2 | Compound 9 | ETM1 | 4.2 | 14.9 | 145 |
| Example 29 | H-2 | Compound 19 | ETM1 | 4.6 | 14.9 | 171 |

Further, the first electron-transporting layer materials used in Examples 7 to 29 were measured for the triplet energy as described above. The results were shown in Table 4.

TABLE 4

| | Triplet energy (eV) |
|---|---|
| Compound 3 | 2.92 |
| Compound 4 | 2.89 |
| Compound 5 | 2.93 |
| Compound 6 | 2.92 |
| Compound 7 | 2.89 |
| Compound 8 | 2.89 |
| Compound 9 | 2.91 |
| Compound 10 | 2.89 |
| Compound 11 | 2.90 |
| Compound 12 | 2.88 |
| Compound 13 | 2.93 |
| Compound 14 | 2.89 |
| Compound 15 | 2.91 |
| Compound 16 | 2.92 |
| Compound 17 | 2.89 |
| Compound 18 | 2.91 |
| Compound 19 | 2.87 |
| Compound 20 | 2.94 |
| Compound 21 | 2.93 |

From the results shown in Tables 3 and 4, it is found that the devices in Examples can be driven at lower voltages, are highly efficient and have a prolonged lifetime. In particular, they have significant effects that they can be driven at a low voltage and have a high efficiency. The reason therefor is thought that a benzimidazole compound having high triplet energy is used as an electron-transporting layer material and a host material having a high triplet energy which has a carbazole ring and a dibenzofuran ring (or dibenzothiophene ring) in the same skeleton is appropriately combined. That is, it is due to confinement of high triplet energy required for blue phosphorescent emission in a device and appropriate adjustment of the carrier balance in the device.

INDUSTRIAL APPLICABILITY

The organic EL device of the invention can be used as a planar emitting body such a flat panel display of a wall-mounted TV, a copier, a printer, a backlight of a liquid crystal display, a light resource of an instrument, a signboard, a marker lamp (light), a lightening or the like.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification of a Japanese application on the basis of which the present application claims Paris convention priority are incorporated herein by reference in its entirety.

The invention claimed is:

1. An organic electroluminescence device, comprising two or more organic thin film layers including an emitting layer between an anode and a cathode, wherein:
the emitting layer comprises at least one compound according to formula (2a), (2b), or (2c); and
an organic thin film layer that is in contact with the emitting layer on a cathode side comprises at least one benzimidazole compound according to formula (A):

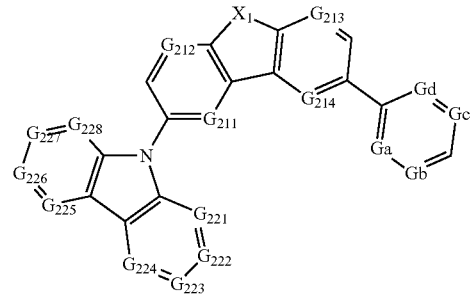

(2a)

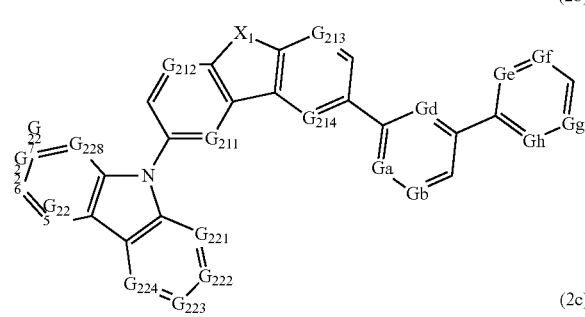

(2b)

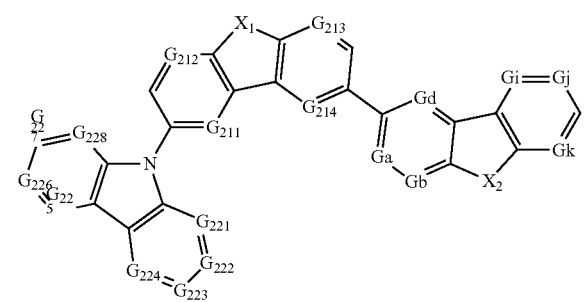

(2c)

wherein, in formulas (2a) to (2c):
$G_{211}$ to $G_{214}$ are independently C—$R_{21}$ or a nitrogen atom;
$G_{221}$ to $G_{228}$ are independently C—$R_{22}$ or a nitrogen atom;
Ga to Gk are independently C—$R_{23}$ or a nitrogen atom;
each $R_{21}$ is independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms, or a cyano group;
when plural C—$R_{21}$ are present, plural $R_{21}$ may be the same or different;
each $R_{22}$ is independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms, or a cyano group;

when plural C—$R_{22}$ are present, plural $R_{22}$ may be the same or different;

each $R_{23}$ is independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms, or a cyano group;

when plural C—$R_{23}$ are present, plural $R_{23}$ may be the same or different;

when $R_{21}$, $R_{22}$ and $R_{21}$ have a substituent, the substituent R' is a hydrogen atom, an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aromatic hydrocarbon ring group having 6 to 18 ring carbon atoms, an aryloxy group having 6 to 18 ring carbon atoms, a heteroaromatic ring group having 5 to 18 ring atoms, a silyl group, a fluorine atom, a fluoroalkyl group having 1 to 20 carbon atoms, a fluoroalkoxy group having 1 to 20 carbon atoms, or a cyano group;

$X_1$ is an oxygen atom or a sulfur atom; and $X_2$ is an oxygen atom, a sulfur atom or =C(CH$_3$)$_2$;

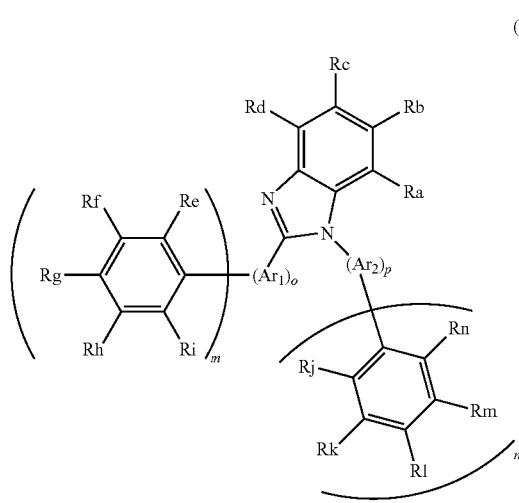

(A)

wherein, in formula (A):

Ra to Rd, Re to Rf, Rh to Ri, Rj to Rk, and Rm to Rn are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted amino group, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms, or a cyano group;

Rg and Rl are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted silyl group, a fluorine atom, a substituted or unsubstituted fluoroalkyl group having 1 to 20 carbon atoms, or a substituted or unsubstituted fluoroalkoxy group having 1 to 20 carbon atoms;

at least one of Re to Rf, Rh to Ri, Rj to Rk, and Rm to Rn is a substituted or unsubstituted carbazolyl group, a substituted or unsubstituted azacarbazolyl group, a substituted or unsubstituted dibenzofuranyl group, or a substituted or unsubstituted dibenzothiophenyl group;

$Ar_1$ is a single bond, a substituted or unsubstituted alkyl group or alkylene group having 1 to 20 carbon atoms, a substituted or unsubstituted phenyl group or meta-phenylene group, a substituted or unsubstituted meta-biphenylyl group or meta-biphenylylene group, a substituted or unsubstituted meta-terphenylyl group or meta-terphenylylene group, a substituted or unsubstituted 3-pyridyl group or 3,5-pyridylene group, a substituted or unsubstituted 2-pyridyl group or 2,6-pyridylene group, a substituted or unsubstituted 2-pyridyl group or 2,4-pyridylene group, a substituted or unsubstituted 2-dibenzofuranyl group or 2,8-dibenzofuranylene group, a substituted or unsubstituted 2-benzothiophenyl group or 2,8-dibenzothiophenylene group, or a substituted or unsubstituted 3-carbazolyl group or 3,6-carbazolylene group;

$Ar_2$ is a single bond, a substituted or unsubstituted alkyl group or alkylene group having 1 to 20 carbon atoms, a substituted or unsubstituted phenyl group or meta-phenylene group, a substituted or unsubstituted para-phenylene group, a substituted or unsubstituted meta-biphenylyl group or meta-biphenylylene group, a substituted or unsubstituted meta-terphenylyl group or meta-terphenylylene group, a substituted or unsubstituted 3-pyridyl group or 3,5-pyridylene group, a substituted or unsubstituted 2-pyridyl group or 2,6-pyridylene group, a substituted or unsubstituted 2-pyridyl group or 2,4-pyridylene group, a substituted or unsubstituted 2-dibenzofuranyl group or 2,8-dibenzofuranylene group, a substituted or unsubstituted 2-dibenzothiophenyl group or 2,8-dibenzothiophenylene group, or a substituted or unsubstituted 3-carbazolyl group or 3,6-carbazolylene group;

when Ra to Rn, $Ar_1$ and $Ar_2$ have a substituent, the substituent R" is a hydrogen atom, an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aromatic hydrocarbon ring group having 6 to 18 ring carbon atoms, an aryloxy group having 6 to 18 ring carbon atoms, a heteroaromatic ring group having 5 to 18 ring atoms, a silyl group, a fluorine atom, a fluoroalkyl group having 1 to 20 carbon atoms, a fluoroalkoxy group having 1 to 20 carbon atoms, or a cyano group;

m and n are independently 0 or 1;

o and p are independently an integer of 0 to 3;

m, n, o and p satisfy relationships: m+o is greater than or equal to 1, and n+p is greater than or equal to 1;

when o is 2 or 3, plural $Ar_1$ may be the same or different; and when p is 2 or 3, plural $Ar_2$ may be the same or different.

2. An organic electroluminescence device, comprising two or more organic thin film layers including an emitting layer between an anode and a cathode, wherein:

the emitting layer comprises at least one compound according to formula (3a), (3b), or (3c); and an organic thin film layer that is in contact with the emitting layer on a cathode side comprises at least one benzimidazole compound according to formula (A):

wherein, in formulas (3a) to (3c):
Y is a substituted or unsubstituted aromatic hydrocarbon ring group having 6 to 18 ring carbon atoms, a substituted or unsubstituted monocyclic heteroaromatic ring group having 5 to 7 ring atoms, or a group represented by the following formula (3-1);

$G_{311}$ to $G_{317}$, $G_{321}$ to $G_{327}$, and $G_{331}$ to $G_{337}$ are independently C—$R_{31}$ or a nitrogen atom;

each $R_{31}$ is independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms, or a cyano group;

when plural C—$R_{31}$ are present, plural $R_{31}$ may be the same or different;

$L_3$ is a single bond, a divalent linkage group containing an oxygen atom, a divalent linkage group containing a silicon atom, a divalent linkage group containing a sulfur atom, an alkylene group having 1 to 5 carbon atoms, a cycloalkylene group having 3 to 6 ring carbon atoms, an aromatic hydrocarbon ring group having 6 to 18 ring carbon atoms, or a heteroaromatic ring group having 5 to 18 ring atoms;

when $R_{31}$ has a substituent, the substituent R' is a hydrogen atom, an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aromatic hydrocarbon ring group having 6 to 18 ring carbon atoms, an aryloxy group having 6 to 18 ring carbon atoms, a heteroaromatic ring group having 5 to 18 ring atoms, a silyl group, a fluorine atom, a fluoroalkyl group, a fluoroalkoxy group, or a cyano group; and $X_3$ is an oxygen atom or a sulfur atom;

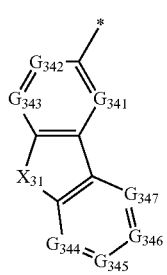

(3-1)

wherein, in formula (3-1):
* is a bonding with a nitrogen atom;
$G_{341}$ to $G_{347}$ are independently C—$R_{31}$ or a nitrogen atom, and $R_{31}$ is the same as $R_{31}$ in the formulas (3a) to (3c); and
$X_{31}$ is a nitrogen atom, an oxygen atom or a sulfur atom which has a substituent;

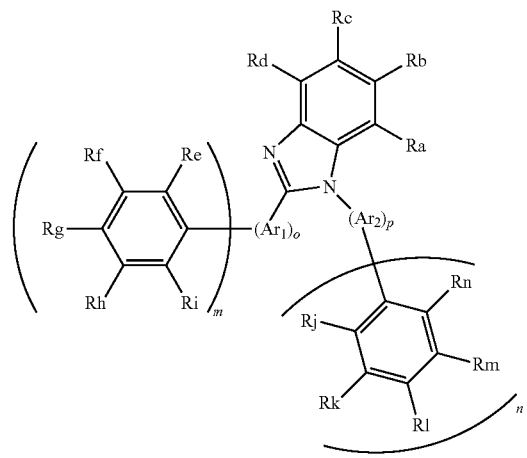

(A)

wherein, in formula (A):
Ra to Rd, Re to Rf, Rh to Ri, Rj to Rk, and Rm to Rn are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted amino group, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms, or a cyano group;

Rg and Rl are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted silyl group, a fluorine atom, a substituted or unsubstituted fluoroalkyl group having 1 to 20 carbon atoms, or a substituted or unsubstituted fluoroalkoxy group having 1 to 20 carbon atoms;

at least one of Re to Rf, Rh to Ri, Rj to Rk, and Rm to Rn is a substituted or unsubstituted carbazolyl group, a substituted or unsubstituted azacarbazolyl group, a substituted or unsubstituted dibenzofuranyl group, or a substituted or unsubstituted dibenzothiophenyl group;

$Ar_1$ is a single bond, a substituted or unsubstituted alkyl group or alkylene group having 1 to 20 carbon atoms, a substituted or unsubstituted phenyl group or meta-phenylene group, a substituted or unsubstituted meta-biphenylyl group or meta-biphenylylene group, a substituted or unsubstituted meta-terphenylyl group or meta-terphenylylene group, a substituted or unsubstituted 3-pyridyl group or 3,5-pyridylene group, a substituted or unsubstituted 2-pyridyl group or 2,6-pyridylene group, a substituted or unsubstituted 2-pyridyl group or 2,4-pyridylene group, a substituted or unsubstituted 2-dibenzofuranyl group or 2,8-dibenzofuranylene group, a substituted or unsubstituted 2-benzothiophenyl group or 2,8-dibenzothiophenylene group, or a substituted or unsubstituted 3-carbazolyl group or 3,6-carbazolylene group;

$Ar_2$ is a single bond, a substituted or unsubstituted alkyl group or alkylene group having 1 to 20 carbon atoms, a substituted or unsubstituted phenyl group or meta-phenylene group, a substituted or unsubstituted para-phenylene group, a substituted or unsubstituted meta-biphenylyl group or meta-biphenylylene group, a substituted or unsubstituted meta-terphenyl group or meta-terphenylylene group, a substituted or unsubstituted 3-pyridyl group or 3,5-pyridylene group, a substituted or unsubstituted 2-pyridyl group or 2,6-pyridylene group, a substituted or unsubstituted 2-pyridyl group or 2,4-pyridylene group, a substituted or unsubstituted 2-dibenzofuranyl group or 2,8-dibenzofuranylene group, a substituted or unsubstituted 2-dibenzothiophenyl group or 2,8-dibenzothiophenylene group, or a substituted or unsubstituted 3-carbazolyl group or 3,6-carbazolylene group;

when Ra to Rn, $Ar_1$ and $Ar_2$ have a substituent, the substituent R" is a hydrogen atom, an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aromatic hydrocarbon ring group having 6 to 18 ring carbon atoms, an aryloxy group having 6 to 18 ring carbon atoms, a heteroaromatic ring group having 5 to 18 ring atoms, a silyl group, a fluorine atom, a fluoroalkyl group having 1 to 20 carbon atoms, a fluoroalkoxy group having 1 to 20 carbon atoms, or a cyano group;

m and n are independently 0 or 1;

o and p are independently an integer of 0 to 3;

m, n, o and p satisfy relationships: m+o is greater than or equal to 1, and n+p is greater than or equal to 1;

when o is 2 or 3, plural $Ar_1$ may be the same or different; and when p is 2 or 3, plural $Ar_2$ may be the same or different.

3. An organic electroluminescence device, comprising two or more organic thin film layers including an emitting layer between an anode and a cathode, wherein:
the emitting layer comprises at least one compound according to formula (4); and
an organic thin film layer that is in contact with the emitting layer on a cathode side comprises at least one benzimidazole compound according to formula (A):

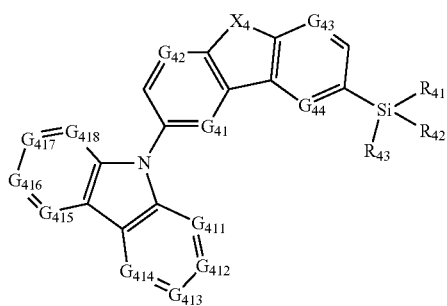

(4)

wherein, in formula (4):

$R_{41}$, $R_{42}$, and $R_{43}$ are independently a substituted or unsubstituted alkyl group having 1 to 20 carbon atoms, a substituted or unsubstituted cycloalkyl group having 3 to 20 ring carbon atoms, a substituted or unsubstituted aromatic hydrocarbon group having 6 to 18 ring carbon atoms, or a substituted or unsubstituted heteroaromatic ring group having 5 to 18 ring atoms;

$R_{41}$, $R_{42}$, and $R_{43}$ may be directly bonded to each other to form a ring, may be bonded to each other through an oxygen atom to form a ring, may be bonded to each other through a sulfur atom to form a ring, or may be bonded to each other through a silicon atom to form a ring;

$G_{41}$ to $G_{44}$ are independently C—$R_{44}$ or a nitrogen atom;

$R_{44}$ is a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms, or a cyano group;

when plural C—$R_{44}$ are present, plural $R_{44}$ may be the same or different;

$G_{411}$ to $G_{418}$ are independently C—$R_{45}$ or a nitrogen atom;

$R_{45}$ is a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms, or a cyano group;

when plural C—$R_{45}$ are present, plural $R_{45}$ may be the same or different;

when $R_{41}$, $R_{42}$, $R_{43}$, $R_{44}$ and $R_{45}$ have a substituent, the substituent R' is a hydrogen atom, an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aromatic hydrocarbon ring group having 6 to 18 ring carbon atoms, an aryloxy group having 6 to 18 ring carbon atoms, a heteroaromatic ring group having 5 to 18 ring atoms, a silyl group, a fluorine atom, a fluoroalkyl group having 1 to 20 carbon atoms, a fluoroalkoxy group having 1 to 20 carbon atoms, or a cyano group; and $X_4$ is an oxygen atom or a sulfur atom;

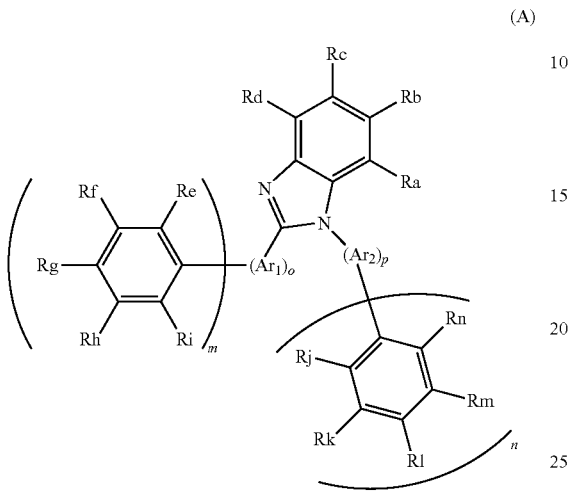

(A)

wherein, in formula (A):

Ra to Rd, Re to Rf, Rh to Ri, Rj to Rk, and Rm to Rn are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted amino group, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms, or a cyano group;

Rg and Rl are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted silyl group, a fluorine atom, a substituted or unsubstituted fluoroalkyl group having 1 to 20 carbon atoms, or a substituted or unsubstituted fluoroalkoxy group having 1 to 20 carbon atoms;

at least one of Re to Rf, Rh to Ri, Rj to Rk, and Rm to Rn is a substituted or unsubstituted carbazolyl group, a substituted or unsubstituted azacarbazolyl group, a substituted or unsubstituted dibenzofuranyl group, or a substituted or unsubstituted dibenzothiophenyl group;

$Ar_1$ is a single bond, a substituted or unsubstituted alkyl group or alkylene group having 1 to 20 carbon atoms, a substituted or unsubstituted phenyl group or meta-phenylene group, a substituted or unsubstituted meta-biphenylyl group or meta-biphenylylene group, a substituted or unsubstituted meta-terphenylyl group or meta-terphenylylene group, a substituted or unsubstituted 3-pyridyl group or 3,5-pyridylene group, a substituted or unsubstituted 2-pyridyl group or 2,6-pyridylene group, a substituted or unsubstituted 2-pyridyl group or 2,4-pyridylene group, a substituted or unsubstituted 2-dibenzofuranyl group or 2,8-dibenzofuranylene group, a substituted or unsubstituted 2-benzothiophenyl group or 2,8-dibenzothiophenylene group, or a substituted or unsubstituted 3-carbazolyl group or 3,6-carbazolylene group;

$Ar_2$ is a single bond, a substituted or unsubstituted alkyl group or alkylene group having 1 to 20 carbon atoms, a substituted or unsubstituted phenyl group or meta-phenylene group, a substituted or unsubstituted para-phenylene group, a substituted or unsubstituted meta-biphenylyl group or meta-biphenylylene group, a substituted or unsubstituted meta-terphenylyl group or meta-terphenylylene group, a substituted or unsubstituted 3-pyridyl group or 3,5-pyridylene group, a substituted or unsubstituted 2-pyridyl group or 2,6-pyridylene group, a substituted or unsubstituted 2-pyridyl group or 2,4-pyridylene group, a substituted or unsubstituted 2-dibenzofuranyl group or 2,8-dibenzofuranylene group, a substituted or unsubstituted 2-dibenzothiophenyl group or 2,8-dibenzothiophenylene group, or a substituted or unsubstituted 3-carbazolyl group or 3,6-carbazolylene group;

when Ra to Rn, $Ar_1$ and $Ar_2$ have a substituent, the substituent R" is a hydrogen atom, an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aromatic hydrocarbon ring group having 6 to 18 ring carbon atoms, an aryloxy group having 6 to 18 ring carbon atoms, a heteroaromatic ring group having 5 to 18 ring atoms, a silyl group, a fluorine atom, a fluoroalkyl group having 1 to 20 carbon atoms, a fluoroalkoxy group having 1 to 20 carbon atoms, or a cyano group;

m and n are independently 0 or 1;

o and p are independently an integer of 0 to 3;

m, n, o and p satisfy relationships: m+o is greater than or equal to 1, and n+p is greater than or equal to 1;

when o is 2 or 3, plural $Ar_1$ may be the same or different; and when p is 2 or 3, plural $Ar_2$ may be the same or different.

4. An organic electroluminescence device, comprising two or more organic thin film layers including an emitting layer between an anode and a cathode, wherein:

the emitting layer comprises at least one compound according to formula (1); and an organic thin film layer that is in contact with the emitting layer on a cathode side comprises at least one benzimidazole compound according to formula (A):

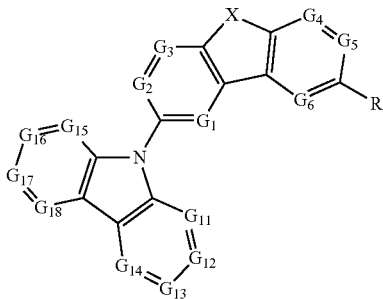

wherein, in formula (1):
  $G_1$ to $G_6$ are independently $C\text{—}R_1$ or a nitrogen atom;
  $G_{11}$ to $G_{18}$ are independently $C\text{—}R_2$ or a nitrogen atom;
  R and $R_1$ are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaryl oxy group having 5 to 18 ring atoms, a substituted or unsubstituted arylthio group having 6 to 18 ring carbon atoms, a substituted or unsubstituted heteroaryl thio group having 5 to 18 ring atoms, a substituted or unsubstituted arylsulfonyl group having 6 to 18 ring carbon atoms, a substituted or unsubstituted heteroaryl sulfonyl group having 5 to 18 ring atoms, a substituted or unsubstituted heteroaromatic ring group having 5 to 18 ring atoms, a substituted or unsubstituted silyl group, a fluorine atom, a substituted or unsubstituted fluoroalkyl group, a substituted or unsubstituted fluoroalkoxy group, or a cyano group;
  when plural $C\text{—}R_1$ are present, plural $R_1$ may be the same or different;
  when $G_2$ and/or $G_5$ is $C\text{—}R_1$, $R_1$ of $G_2$ and $G_5$ are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted silyl group, a fluorine atom, a substituted or unsubstituted fluoroalkyl group having 1 to 20 carbon atoms, or a substituted or unsubstituted fluoroalkoxy group having 1 to 20 carbon atoms;
  each $R_2$ is independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms, or a cyano group;
  when plural $C\text{—}R_2$ are present, plural $R_2$ may be the same or different;
  when R, $R_1$ and $R_2$ have a substituent, the substituent R' is a hydrogen atom, an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aromatic hydrocarbon ring group having 6 to 18 ring carbon atoms, an aryloxy group having 6 to 18 ring carbon atoms, a heteroaromatic ring group having 5 to 18 ring atoms, a silyl group, a fluorine atom, a fluoroalkyl group having 1 to 20 carbon atoms, a fluoroalkoxy group having 1 to 20 carbon atoms, or a cyano group; and
  X is an oxygen atom or a sulfur atom;

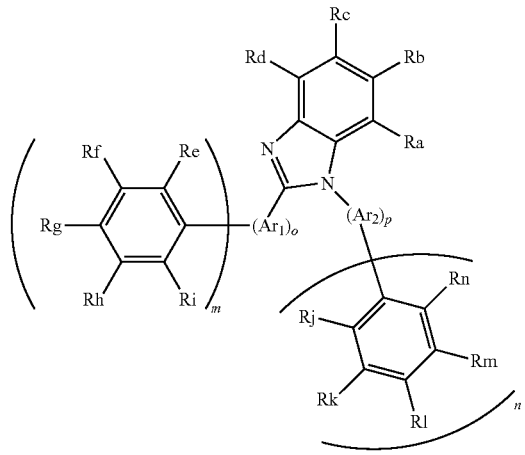

wherein, in formula (A):
  Ra to Rd, Re to Rf, Rh to Ri, Rj to Rk, and Rm to Rn are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted amino group, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms, or a cyano group;
  Rg and Rl are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted silyl group, a fluorine atom, a substituted or unsubstituted fluoroalkyl group having 1 to 20 carbon atoms, or a substituted or unsubstituted fluoroalkoxy group having 1 to 20 carbon atoms;

at least one of Rf, Rh, Rk, and Rm is a substituted or unsubstituted carbazolyl group, a substituted or unsubstituted azacarbazolyl group, a substituted or unsubstituted 2-dibenzofuranyl group, a substituted or unsubstituted 4-dibenzofuranyl group, a substituted or unsubstituted 2-dibenzothiophenyl group, or a substituted or unsubstituted 4-dibenzothiophenyl group;

Ar₁ is a single bond, a substituted or unsubstituted alkyl group or alkylene group having 1 to 20 carbon atoms, a substituted or unsubstituted phenyl group or meta-phenylene group, a substituted or unsubstituted meta-biphenylyl group or meta-biphenylylene group, a substituted or unsubstituted meta-terphenylyl group or meta-terphenylylene group, a substituted or unsubstituted 3-pyridyl group or 3,5-pyridylene group, a substituted or unsubstituted 2-pyridyl group or 2,6-pyridylene group, a substituted or unsubstituted 2-pyridyl group or 2,4-pyridylene group, a substituted or unsubstituted 2-dibenzofuranyl group or 2,8-dibenzofuranylene group, a substituted or unsubstituted 2-benzothiophenyl group or 2,8-dibenzothiophenylene group, or a substituted or unsubstituted 3-carbazolyl group or 3,6-carbazolylene group;

Ar₂ is a single bond, a substituted or unsubstituted alkyl group or alkylene group having 1 to 20 carbon atoms, a substituted or unsubstituted phenyl group or meta-phenylene group, a substituted or unsubstituted para-phenylene group, a substituted or unsubstituted meta-biphenylyl group or meta-biphenylylene group, a substituted or unsubstituted meta-terphenylyl group or meta-terphenylylene group, a substituted or unsubstituted 3-pyridyl group or 3,5-pyridylene group, a substituted or unsubstituted 2-pyridyl group or 2,6-pyridylene group, a substituted or unsubstituted 2-pyridyl group or 2,4-pyridylene group, a substituted or unsubstituted 2-dibenzofuranyl group or 2,8-dibenzofuranylene group, a substituted or unsubstituted 2-dibenzothiophenyl group or 2,8-dibenzothiophenylene group, or a substituted or unsubstituted 3-carbazolyl group or 3,6-carbazolylene group;

when Ra to Rn, Ar₁ and Ar₂ have a substituent, the substituent R" is a hydrogen atom, an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aromatic hydrocarbon ring group having 6 to 18 ring carbon atoms, an aryloxy group having 6 to 18 ring carbon atoms, a heteroaromatic ring group having 5 to 18 ring atoms, a silyl group, a fluorine atom, a fluoroalkyl group having 1 to 20 carbon atoms, a fluoroalkoxy group having 1 to 20 carbon atoms, or a cyano group;

m and n are independently 0 or 1;
o and p are independently an integer of 0 to 3,
m, n, o and p satisfy relationships: m+o is greater than or equal to 1, and n+p is greater than or equal to 1;
when o is 2 or 3, plural Ar₁ may be the same or different; and
when p is 2 or 3, plural Ar₂ may be the same or different.

5. An organic electroluminescence device, comprising two or more organic thin film layers including an emitting layer between an anode and a cathode, wherein:
the emitting layer comprises at least one compound according to formula (1); and
an organic thin film layer that is in contact with the emitting layer on a cathode side comprises at least one benzimidazole compound according to formula (A):

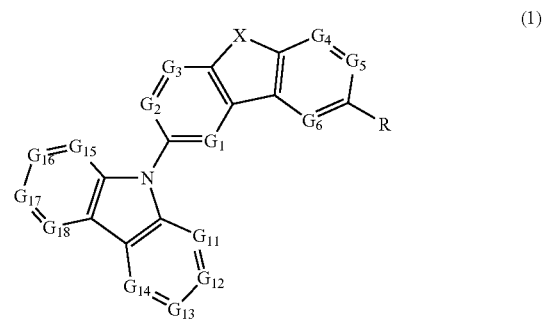

wherein, in formula (1):
G₁ to G₆ are independently C—R₁ or a nitrogen atom;
G₁₁ to G₁₈ are independently C—R₂ or a nitrogen atom;
R and R₁ are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaryl oxy group having 5 to 18 ring atoms, a substituted or unsubstituted arylthio group having 6 to 18 ring carbon atoms, a substituted or unsubstituted heteroaryl thio group having 5 to 18 ring atoms, a substituted or unsubstituted arylsulfonyl group having 6 to 18 ring carbon atoms, a substituted or unsubstituted heteroaryl sulfonyl group having 5 to 18 ring atoms, a substituted or unsubstituted heteroaromatic ring group having 5 to 18 ring atoms, a substituted or unsubstituted silyl group, a fluorine atom, a substituted or unsubstituted fluoroalkyl group, a substituted or unsubstituted fluoroalkoxy group, or a cyano group;

when plural C—R₁ are present, plural R₁ may be the same or different;

when G₂ and/or G₅ is C—R₁, R₁ of G₂ and G₅ are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted silyl group, a fluorine atom, a substituted or unsubstituted fluoroalkyl group having 1 to 20 carbon atoms, or a substituted or unsubstituted fluoroalkoxy group having 1 to 20 carbon atoms;

each R₂ is independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms, or a cyano group;

when plural C—$R_2$ are present, plural may be the same or different;

when R, $R_1$ and $R_2$ have a substituent, the substituent R' is a hydrogen atom, an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aromatic hydrocarbon ring group having 6 to 18 ring carbon atoms, an aryloxy group having 6 to 18 ring carbon atoms, a heteroaromatic ring group having 5 to 18 ring atoms, a silyl group, a fluorine atom, a fluoroalkyl group having 1 to 20 carbon atoms, a fluoroalkoxy group having 1 to 20 carbon atoms, or a cyano group; and X is an oxygen atom or a sulfur atom;

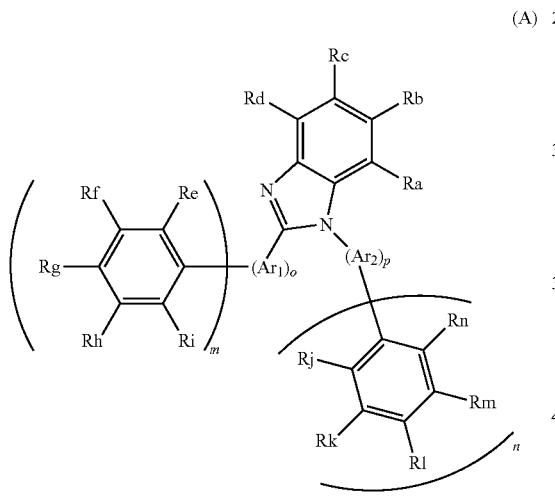

(A)

wherein, in formula (A):

Ra to Rd, Re to Rf, Rh to Ri, Rj to Rk, and Rm to Rn are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted amino group, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms, or a cyano group;

Rg and Rl are independently a hydrogen atom, a substituted or unsubstituted alkyl group having 1 to 20 carbon atoms, a substituted or unsubstituted cycloalkyl group having 3 to 20 ring carbon atoms a substituted or unsubstituted alkoxy group having 1 to 20 carbon atoms, a substituted or unsubstituted cycloalkoxy group having 3 to 20 ring carbon atoms, a substituted or unsubstituted silyl group, a fluorine atom, a substituted or unsubstituted fluoroalkyl group having 1 to 20 carbon atoms, or a substituted or unsubstituted fluoroalkoxy group having 1 to 20 carbon atoms;

both of Rf and Rh in formula (A) or both of Rk and Rm in formula (A) are independently a substituted or unsubstituted carbazolyl group, a substituted or unsubstituted azacarbazolyl group, a substituted or unsubstituted 2-dibenzofuranyl group, a substituted or unsubstituted 4-dibenzofuranyl group, a substituted or unsubstituted 2-dibenzothiophenyl group or a substituted or unsubstituted 4-dibenzothiophenyl group;

$Ar_1$ is a single bond, a substituted or unsubstituted alkyl group or alkylene group having 1 to 20 carbon atoms, a substituted or unsubstituted phenyl group or meta-phenylene group, a substituted or unsubstituted meta-biphenylyl group or meta-biphenylylene group, a substituted or unsubstituted meta-terphenylyl group or meta-terphenylylene group, a substituted or unsubstituted 3-pyridyl group or 3,5-pyridylene group, a substituted or unsubstituted 2-pyridyl group or 2,6-pyridylene group, a substituted or unsubstituted 2-pyridyl group or 2,4-pyridylene group, a substituted or unsubstituted 2-dibenzofuranyl group or 2,8-dibenzofuranylene group, a substituted or unsubstituted 2-benzothiophenyl group or 2,8-dibenzothiophenylene group, or a substituted or unsubstituted 3-carbazolyl group or 3,6-carbazolylene group;

$Ar_2$ is a single bond, a substituted or unsubstituted alkyl group or alkylene group having 1 to 20 carbon atoms, a substituted or unsubstituted phenyl group or meta-phenylene group, a substituted or unsubstituted para-phenylene group, a substituted or unsubstituted meta-biphenylyl group or meta-biphenylylene group, a substituted or unsubstituted meta-terphenylyl group or meta-terphenylylene group, a substituted or unsubstituted 3-pyridyl group or 3,5-pyridylene group, a substituted or unsubstituted 2-pyridyl group or 2,6-pyridylene group, a substituted or unsubstituted 2-pyridyl group or 2,4-pyridylene group, a substituted or unsubstituted 2-dibenzofuranyl group or 2,8-dibenzofuranylene group, a substituted or unsubstituted 2-dibenzothiophenyl group or 2,8-dibenzothiophenylene group, or a substituted or unsubstituted 3-carbazolyl group or 3,6-carbazolylene group;

when Ra to Rn, $Ar_1$ and $Ar_2$ have a substituent, the substituent R" is a hydrogen atom, an alkyl group having 1 to 20 carbon atoms, a cycloalkyl group having 3 to 20 ring carbon atoms, an alkoxy group having 1 to 20 carbon atoms, a cycloalkoxy group having 3 to 20 ring carbon atoms, an aromatic hydrocarbon ring group having 6 to 18 ring carbon atoms, an aryloxy group having 6 to 18 ring carbon atoms, a heteroaromatic ring group having 5 to 18 ring atoms, a silyl group, a fluorine atom, a fluoroalkyl group having 1 to 20 carbon atoms, a fluoroalkoxy group having 1 to 20 carbon atoms, or a cyano group;

m and n are independently 0 or 1;

o and p are independently an integer of 0 to 3, m, n, o and p satisfy relationships: m+o is greater than or equal to 1, and n+p is greater than or equal to 1;

when o is 2 or 3, plural $Ar_1$ may be the same or different; and when p is 2 or 3, plural $Ar_2$ may be the same or different.

6. A compound represented by the following formula (a);

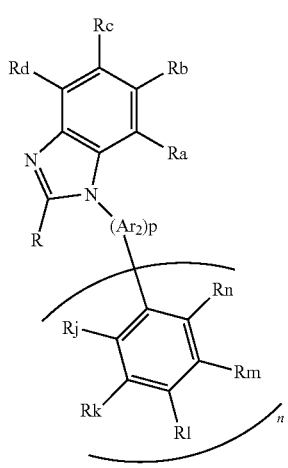

(a)

wherein, in the formula (a):
R is a substituted or unsubstituted alkyl group having 1 to 20 carbon atoms, or a substituted or unsubstituted cycloalkyl group having 3 to 20 ring carbon atoms;
Ra to Rd and Rj to Rn are independently a hydrogen atom, a substituted or unsubstituted alkyl group having 1 to 20 carbon atoms, a substituted or unsubstituted cycloalkyl group having 3 to 20 ring carbon atoms, a substituted or unsubstituted alkoxy group having 1 to 20 carbon atoms, a substituted or unsubstituted cycloalkoxy group having 3 to 20 ring carbon atoms, a substituted or unsubstituted aromatic hydrocarbon ring group having 6 to 18 ring carbon atoms, a substituted or unsubstituted aryloxy group having 6 to 18 ring carbon atoms, a substituted or unsubstituted heteroaromatic ring group having 5 to 18 ring atoms, a substituted or unsubstituted amino group, a substituted or unsubstituted silyl group, a fluorine atom, a substituted or unsubstituted fluoroalkyl group having 1 to 20 carbon atoms, a substituted or unsubstituted fluoroalkoxy group having 1 to 20 carbon atoms, or a cyano group;
at least one of Rm and Rk is a substituted or unsubstituted carbazolyl group, a substituted or unsubstituted azacarbazolyl group, a substituted or unsubstituted dibenzofuranyl group, a substituted or unsubstituted dibenzothiophenyl group, a substituted or unsubstituted azadibenzofuranyl group, or a substituted or unsubstituted azadibenzothiophenyl group;
Ar$_2$ is a single bond, a substituted or unsubstituted alkyl group or alkylene group having 1 to 20 carbon atoms, a substituted or unsubstituted phenyl group, or meta-phenylene group, or a substituted or unsubstituted para-phenylene group, a substituted or unsubstituted meta-biphenylyl group or meta-biphenylylene group, a substituted or unsubstituted meta-terphenylyl group or meta-terphenylylene group, a substituted or unsubstituted 3-pyridyl group or 3,5-pyridylene group, a substituted or unsubstituted 2-pyridyl group or 2,6-pyridylene group, a substituted or unsubstituted 2-pyridyl group or 2,4-pyridylene group, a substituted or unsubstituted 2-dibenzofuranyl group or 2,8-dibenzofuranylene group, a substituted or unsubstituted 2-dibenzothiophenyl group or 2,8-dibenzothiophenylene group, or a substituted or unsubstituted 3-carbazolyl group or 3,6-carbazolylene group;
n is 0 or 1;
p is 0 or 1; and
n+p is more than or equal to 1.

7. The compound according to claim 6, wherein in formula (a), both of Rm and Rk are independently a substituted or unsubstituted carbazolyl group, a substituted or unsubstituted azacarbazolyl group, a substituted or unsubstituted dibenzofuranyl group, a substituted or unsubstituted dibenzothiophenyl group, a substituted or unsubstituted azadibenzofuranyl group, or a substituted or unsubstituted azadibenzothiophenyl group.

8. The compound according to claim 6, wherein in formula (a), at least one of Rm and Rk is a substituted or unsubstituted carbazolyl group.

9. The organic electroluminescence device according to claim 1, wherein Ar$_1$ in formula (A) is a single bond, a substituted or unsubstituted alkyl group or alkylene group having 1 to 20 carbon atoms, a substituted or unsubstituted phenyl group or meta-phenylene group, a substituted or unsubstituted 2-dibenzofuranyl group or 2,8-dibenzofuranylene group, or a substituted or unsubstituted 2-dibenzothiophenyl group or 2,8-dibenzothiophenylene group.

10. The organic electroluminescence device according to claim 1, wherein Ar$_2$ in formula (A) is a single bond, a substituted or unsubstituted alkyl group having 1 to 20 carbon atoms, a substituted or unsubstituted phenyl group, or meta-phenylene group, or a substituted or unsubstituted para-phenylene group, a substituted or unsubstituted 2-dibenzofuranyl group or 2,8-dibenzofuranylene group, or a substituted or unsubstituted 2-dibenzothiophenyl group or 2,8-dibenzothiophenylene group.

11. The organic electroluminescence device according to claim 1, wherein:
the emitting layer comprises a phosphorescent material; and
the phosphorescent material is an ortho-metal complex of one or more metal atoms selected from iridium (Ir), osmium (Os), and platinum (Pt).

12. The organic electroluminescence device according to claim 1, wherein an electron donating dopant is contained in an interface region between the cathode and the organic thin film layers.

13. The organic electroluminescence device according to claim 2, wherein Ar$_1$ in formula (A) is a single bond, a substituted or unsubstituted alkyl group or alkylene group having 1 to 20 carbon atoms, a substituted or unsubstituted phenyl group or meta-phenylene group, a substituted or unsubstituted 2-dibenzofuranyl group or 2,8-dibenzofuranylene group, or a substituted or unsubstituted 2-dibenzothiophenyl group or 2,8-dibenzothiophenylene group.

14. The organic electroluminescence device according to claim 2, wherein Ar$_2$ in formula (A) is a single bond, a substituted or unsubstituted alkyl group having 1 to 20 carbon atoms, a substituted or unsubstituted phenyl group, or meta-phenylene group, or a substituted or unsubstituted para-phenylene group, a substituted or unsubstituted 2-dibenzofuranyl group or 2,8-dibenzofuranylene group, or a substituted or unsubstituted 2-dibenzothiophenyl group or 2,8-dibenzothiophenylene group.

15. The organic electroluminescence device according to claim 2, wherein:
the emitting layer comprises a phosphorescent material; and the phosphorescent material is an ortho-metal complex of one or more metal atoms selected from iridium (Ir), osmium (Os), and platinum (Pt).

16. The organic electroluminescence device according to claim 2, wherein an electron donating dopant is contained in an interface region between the cathode and the organic thin film layers.

17. The organic electroluminescence device according to claim 3, wherein $Ar_1$ in formula (A) is a single bond, a substituted or unsubstituted alkyl group or alkylene group having 1 to 20 carbon atoms, a substituted or unsubstituted phenyl group or meta-phenylene group, a substituted or unsubstituted 2-dibenzofuranyl group or 2,8-dibenzofuranylene group, or a substituted or unsubstituted 2-dibenzothiophenyl group or 2,8-dibenzothiophenylene group.

18. The organic electroluminescence device according to claim 3, wherein $Ar_2$ in formula (A) is a single bond, a substituted or unsubstituted alkyl group having 1 to 20 carbon atoms, a substituted or unsubstituted phenyl group, or meta-phenylene group, or a substituted or unsubstituted para-phenylene group, a substituted or unsubstituted 2-dibenzofuranyl group or 2,8-dibenzofuranylene group, or a substituted or unsubstituted 2-dibenzothiophenyl group or 2,8-dibenzothiophenylene group.

19. The organic electroluminescence device according to claim 3, wherein:
the emitting layer comprises a phosphorescent material; and
the phosphorescent material is an ortho-metal complex of one or more metal atoms selected from iridium (Ir), osmium (Os), and platinum (Pt).

20. The organic electroluminescence device according to claim 3, wherein an electron donating dopant is contained in an interface region between the cathode and the organic thin film layers.

21. The organic electroluminescence device according to claim 4, wherein $Ar_1$ in formula (A) is a single bond, a substituted or unsubstituted alkyl group or alkylene group having 1 to 20 carbon atoms, a substituted or unsubstituted phenyl group or meta-phenylene group, a substituted or unsubstituted 2-dibenzofuranyl group or 2,8-dibenzofuranylene group, or a substituted or unsubstituted 2-dibenzothiophenyl group or 2,8-dibenzothiophenylene group.

22. The organic electroluminescence device according to claim 4, wherein $Ar_2$ in formula (A) is a single bond, a substituted or unsubstituted alkyl group having 1 to 20 carbon atoms, a substituted or unsubstituted phenyl group, or meta-phenylene group, or a substituted or unsubstituted para-phenylene group, a substituted or unsubstituted 2-dibenzofuranyl group or 2,8-dibenzofuranylene group, or a substituted or unsubstituted 2-dibenzothiophenyl group or 2,8-dibenzothiophenylene group.

23. The organic electroluminescence device according to claim 4, wherein:
the emitting layer comprises a phosphorescent material; and
the phosphorescent material is an ortho-metal complex of one or more metal atoms selected from iridium (Ir), osmium (Os), and platinum (Pt).

24. The organic electroluminescence device according to claim 4, wherein an electron donating dopant is contained in an interface region between the cathode and the organic thin film layers.

25. The organic electroluminescence device according to claim 5, wherein $Ar_1$ in formula (A) is a single bond, a substituted or unsubstituted alkyl group or alkylene group having 1 to 20 carbon atoms, a substituted or unsubstituted phenyl group or meta-phenylene group, a substituted or unsubstituted 2-dibenzofuranyl group or 2,8-dibenzofuranylene group, or a substituted or unsubstituted 2-dibenzothiophenyl group or 2,8-dibenzothiophenylene group.

26. The organic electroluminescence device according to claim 5, wherein $Ar_2$ in formula (A) is a single bond, a substituted or unsubstituted alkyl group having 1 to 20 carbon atoms, a substituted or unsubstituted phenyl group, or meta-phenylene group, or a substituted or unsubstituted para-phenylene group, a substituted or unsubstituted 2-dibenzofuranyl group or 2,8-dibenzofuranylene group, or a substituted or unsubstituted 2-dibenzothiophenyl group or 2,8-dibenzothiophenylene group.

27. The organic electroluminescence device according to claim 5, wherein:
the emitting layer comprises a phosphorescent material; and
the phosphorescent material is an ortho-metal complex of one or more metal atoms selected from iridium (Ir), osmium (Os) and platinum (Pt).

28. The organic electroluminescence device according to claim 5, wherein an electron donating dopant is contained in an interface region between the cathode and the organic thin film layers.

* * * * *